(12) United States Patent
Yoshimori et al.

(10) Patent No.: US 9,460,929 B2
(45) Date of Patent: Oct. 4, 2016

(54) METHOD OF MANUFACTURING SEMICONDUCTOR DEVICE

(71) Applicant: Renesas Electronics Corporation, Kawasaki-shi, Kanagawa (JP)

(72) Inventors: Hiromasa Yoshimori, Kanagawa (JP); Hirofumi Tokita, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 39 days.

(21) Appl. No.: 14/634,736

(22) Filed: Feb. 28, 2015

(65) Prior Publication Data

US 2015/0249145 A1    Sep. 3, 2015

(30) Foreign Application Priority Data

Feb. 28, 2014   (JP) .................. 2014-037757

(51) Int. Cl.
| | |
|---|---|
| H01L 21/266 | (2006.01) |
| H01L 29/66 | (2006.01) |
| H01L 27/115 | (2006.01) |
| H01L 21/28 | (2006.01) |
| H01L 29/792 | (2006.01) |
| H01L 21/8234 | (2006.01) |
| H01L 29/78 | (2006.01) |

(52) U.S. Cl.
CPC ....... *H01L 21/266* (2013.01); *H01L 21/28282* (2013.01); *H01L 21/82345* (2013.01); *H01L 21/823468* (2013.01); *H01L 27/11568* (2013.01); *H01L 27/11573* (2013.01); *H01L 29/66545* (2013.01); *H01L 29/66833* (2013.01); *H01L 29/7833* (2013.01); *H01L 29/792* (2013.01); *H01L 21/823462* (2013.01); *H01L 29/6659* (2013.01)

(58) Field of Classification Search
None
See application file for complete search history.

(56) References Cited

U.S. PATENT DOCUMENTS

| | | |
|---|---|---|
| 7,767,522 B2 | 8/2010 | Toba et al. |
| 7,838,359 B2 | 11/2010 | Schwan et al. |
| 2015/0093864 A1* | 4/2015 | Perera ............... H01L 21/28273 438/257 |

FOREIGN PATENT DOCUMENTS

| | | |
|---|---|---|
| JP | 11-126900 A | 5/1999 |
| JP | 2006-49781 A | 2/2006 |
| JP | 2007-281092 A | 10/2007 |
| JP | 2009-500823 A | 1/2009 |
| JP | 2011-49282 A | 3/2011 |

* cited by examiner

*Primary Examiner* — Sonya D McCall Shepard
(74) *Attorney, Agent, or Firm* — Shapiro, Gabor and Rosenberger, PLLC

(57) ABSTRACT

Provided is a semiconductor device having improved performance. Over a semiconductor substrate, a dummy control gate electrode is formed via a first insulating film. Over the semiconductor substrate, a memory gate electrode for a memory cell is formed via a second insulating film having an internal charge storage portion so as to be adjacent to the dummy control gate electrode. At this time, the height of the memory gate electrode is adjusted to be lower than the height of the dummy control gate electrode. Then, a third insulating film is formed so as to cover the dummy control gate electrode and the memory gate electrode. Then, the third insulating film is polished to expose the dummy control gate electrode. At this time, the memory gate electrode is not exposed. Then, the dummy control gate electrode is removed and replaced with a metal gate electrode.

18 Claims, 74 Drawing Sheets

FIG. 35

| | OPERATION MODE WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI(WRITE)/BTBT(ERASE) | 10/5/1/0.5/0 | −6/6/0/open/0 | 0/0/1.5/1.5/0 |
| B | SSI(WRITE)/FN(ERASE) | 10/5/1/0.5/0 | 12/0/0/0/0 | 0/0/1.5/1.5/0 |
| C | FN(WRITE)/BTBT(ERASE) | −12/0/0/0/0 | −6/6/0/open/0 | 0/0/1.5/1.5/0 |
| D | FN(WRITE)/FN(ERASE) | −12/0/0/0/0 | 12/0/0/0/0 | 0/0/1.5/1.5/0 |

METHOD OF MANUFACTURING SEMICONDUCTOR DEVICE

CROSS-REFERENCE TO RELATED APPLICATIONS

The disclosure of Japanese Patent Application No. 2014-037757 filed on Feb. 28, 2014 including the specification, drawings and abstract is incorporated herein by reference in its entirety.

BACKGROUND

The present invention relates to a method of manufacturing a semiconductor device and can be used appropriately as a method of manufacturing, e.g., a semiconductor device having a nonvolatile memory.

As an electrically writable/erasable nonvolatile semiconductor storage device, an EEPROM (Electrically Erasable and Programmable Read Only Memory) has been used widely. Such a storage device represented by a flash memory which is currently used widely has a conductive floating gate electrode or a trapping insulating film surrounded by oxide films under the gate electrode of a MISFET. A charge storage state in the floating gate electrode or trapping insulating film is used as stored information and read as the threshold of the transistor. The trapping insulating refers to an insulating film capable of storing charges therein, and examples thereof include a silicon nitride film. By injection/release of charges into/from such a charge storage region, the threshold of the MISFET is shifted to allow the MISFET to operate as a storage element. Examples of the flash memory include a split-gate cell using a MONOS (Metal-Oxide-Nitride-Oxide-Semiconductor) film. In such a memory, a silicon nitride film is used as a charge storage region. This provides advantages over a conductive floating gate film such that, due to discrete storage of charges, data retention reliability is high, and the high data retention reliability allows the oxide films over and under the silicon nitride film to be thinned and allows a voltage for a write/erase operation to be reduced.

Each of Japanese Unexamined Patent Publications Nos. 2007-281092 (Patent Document 1) and 2011-49282 (Patent Document 2) describes a technique related to a nonvolatile semiconductor storage device. On the other hand, each of Japanese Unexamined Patent Publications Nos. 2006-049781 (Patent Document 3) and Hei 11(1999)-126900 (Patent Document 4) and Japanese Translation of PCT Application No. 2009-500823 (Patent Document 5) describes a technique for forming sidewall spacers over the side walls of a gate electrode.

RELATED ART DOCUMENTS

Patent Documents

[Patent Document 1]
Japanese Unexamined Patent Publication No. 2007-281092
[Patent Document 2]
Japanese Unexamined Patent Publication No. 2011-49282
[Patent Document 3]
Japanese Unexamined Patent Publication No. 2006-049781
[Patent Document 4]
Japanese Unexamined Patent Publication No. Hei 11(1999)-126900
[Patent Document 5]
Japanese Translation of PCT Application No. 2009-500823

SUMMARY

Even in a semiconductor device having a nonvolatile memory, it is desired to maximize the performance thereof or improve the manufacturing yield thereof. Alternatively, it is desired to improve each of the performance of the semiconductor device and the manufacturing yield thereof.

Other problems and novel features of the present invention will become apparent from a statement in the present specification and the accompanying drawings.

According to an embodiment, a first dummy gate electrode is formed over a semiconductor substrate via a first insulating film, and a first gate electrode for a memory cell is formed over the semiconductor substrate via a second insulating film having an internal charge storage portion so as to be adjacent to the first dummy gate electrode. At this time, a height of the first gate electrode is adjusted to be lower than a height of the first dummy gate electrode. Then, a first interlayer insulating film is formed so as to cover the first dummy gate electrode and the first gate electrode and then polished to expose the first dummy gate electrode. At this time, the first gate electrode is not exposed. Then, the first dummy gate electrode is removed to be replaced with a metal gate electrode.

According to the embodiment, it is possible to improve the performance of a semiconductor device or improve the manufacturing yield of the semiconductor device. Alternatively, it is possible to improve each the performance of the semiconductor device and the manufacturing yield thereof.

BRIEF DESCRIPTION OF THE DRAWINGS

FIG. 35 is a table showing an example of conditions under which voltages are applied to the individual portions of a selected memory cell during "Write", "Erase", and "Read" operations;

DETAILED DESCRIPTION

Figure 1:
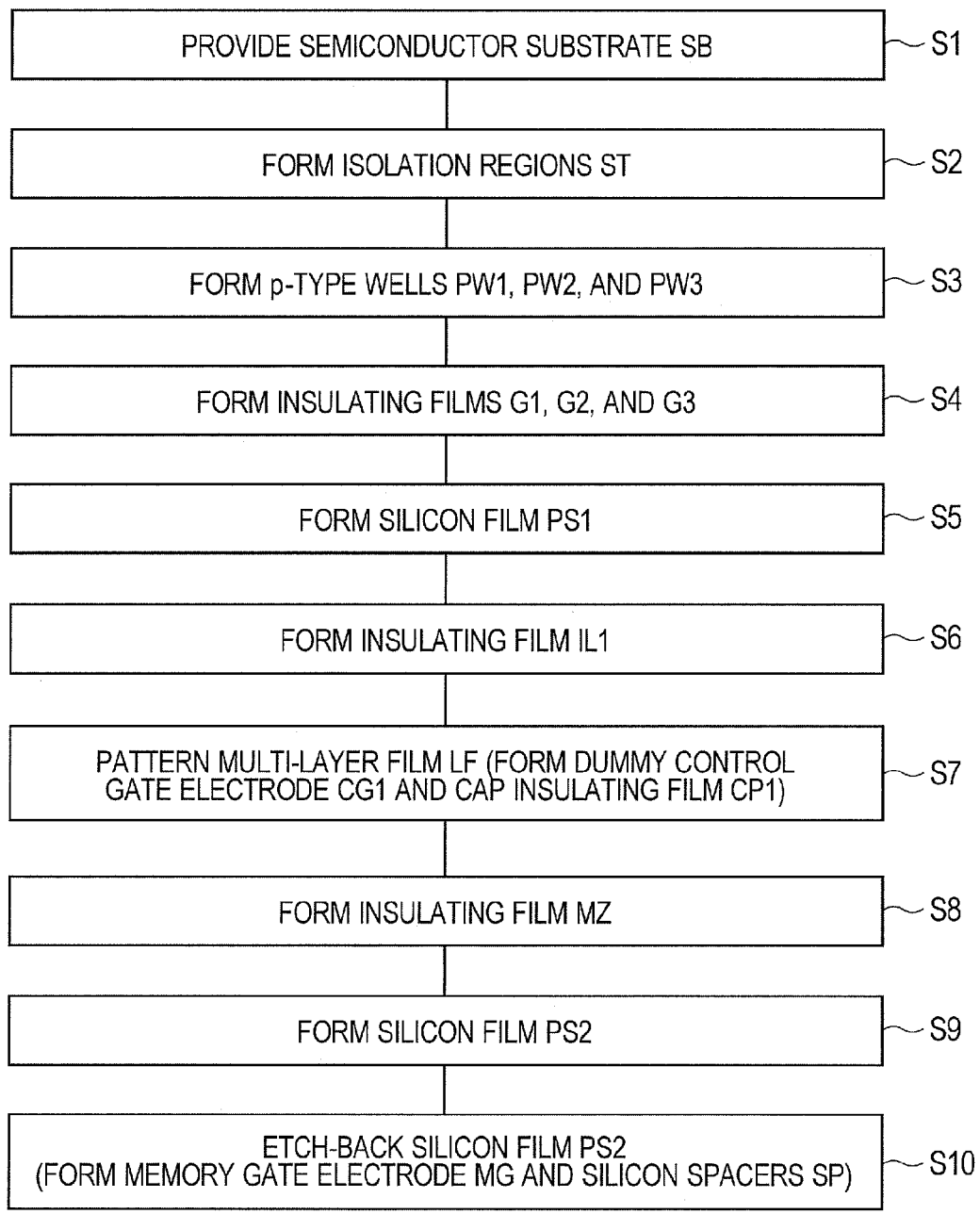
FIG. 1 is a process flow chart showing a part of a manufacturing process of a semiconductor device in an embodiment.

In the following embodiments, if necessary for the sake of convenience, each of the embodiments will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others. Also, in the following embodiments, when the number and the like (including the number, numerical value, amount, range, and the like) of elements are mentioned, they are not limited to specified numbers unless particularly explicitly described otherwise or unless they are obviously limited to the specified numbers in principle. The number and the like of the elements may be not less than or not more than the specified numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar to the shapes and the like unless particularly explicitly described otherwise or unless it can be considered that they obviously do not in principle. The same shall apply to the foregoing numerical value and range.

Hereinbelow, the embodiments will be described in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

About Manufacturing Process of Semiconductor Device

Each of semiconductor devices in the present and following embodiments is a semiconductor device including a nonvolatile memory (nonvolatile storage element, flash memory, or nonvolatile semiconductor storage device). In each of the present and following embodiments, the nonvolatile memory will be described on the basis of a memory cell based on n-channel MISFETs (Metal Insulator Semiconductor Field Effect Transistors). In each of the present and following embodiments, polarities (the polarities of voltages applied during write/erase/read operations and the polarities of carriers) are for illustrating operations when a memory cell is based on the n-channel MISFETs. When a memory cell is based on p-channel MISFETs, operations which are the same in principle can be obtained by inverting all the polarities such as the conductivity types of applied potentials and carriers.

Referring to the drawings, a method of manufacturing the semiconductor device in the present embodiment will be described.

Figure 2:
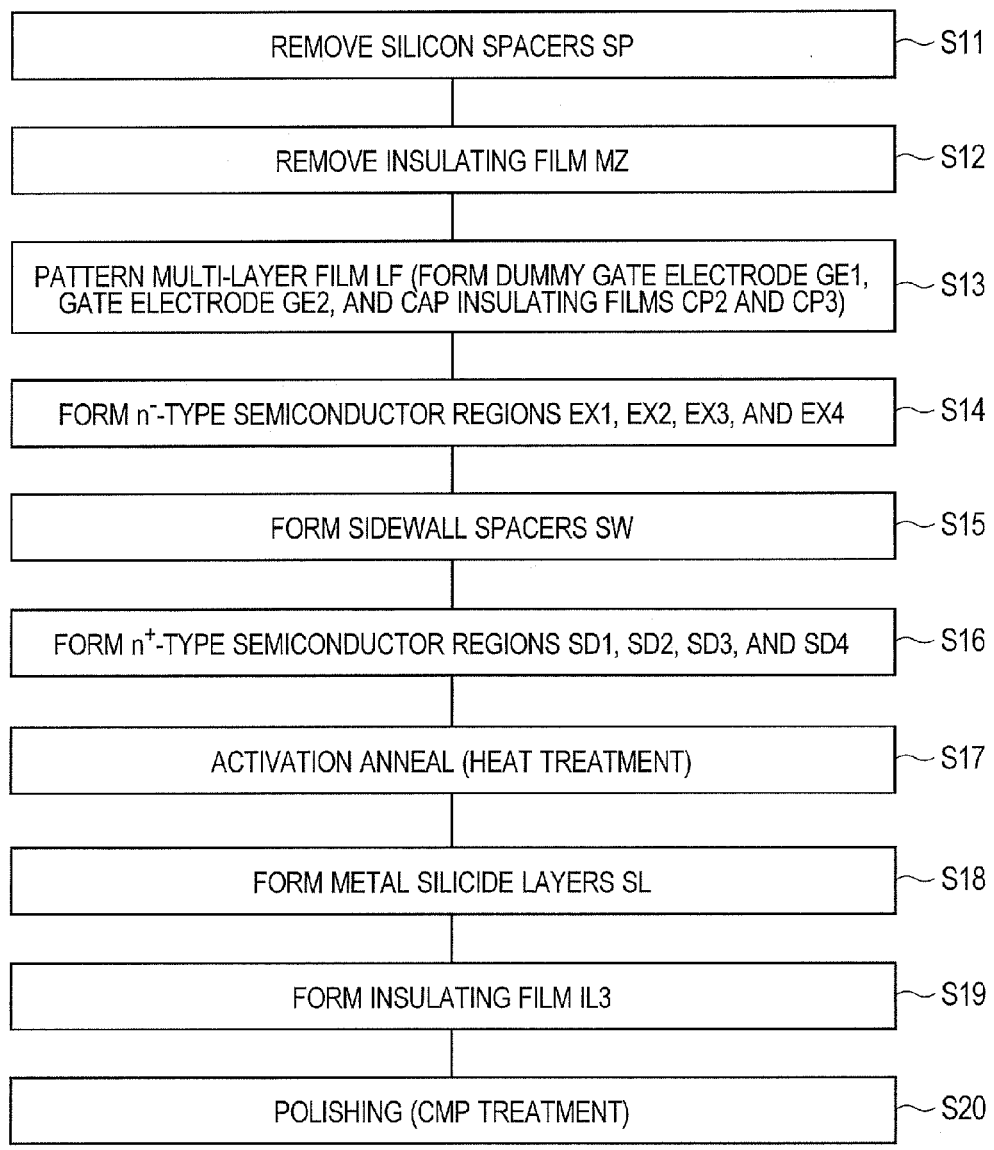
FIG. 2 is a process flow chart showing another part of the manufacturing process of the semiconductor device in the embodiment.
Figure 3:
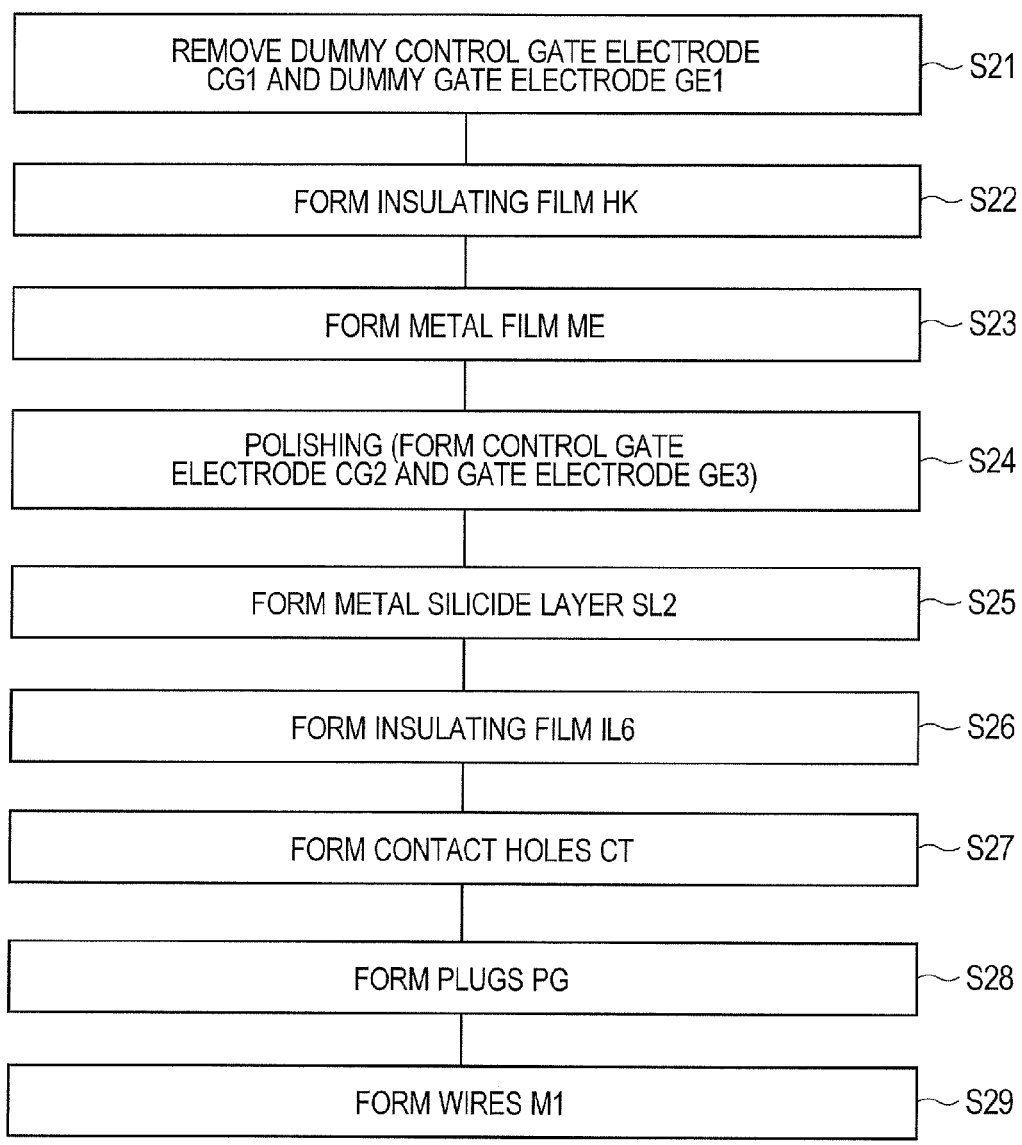
FIG. 3 is a process flow chart showing still another part of the manufacturing process of the semiconductor device in the embodiment.
Figure 7:
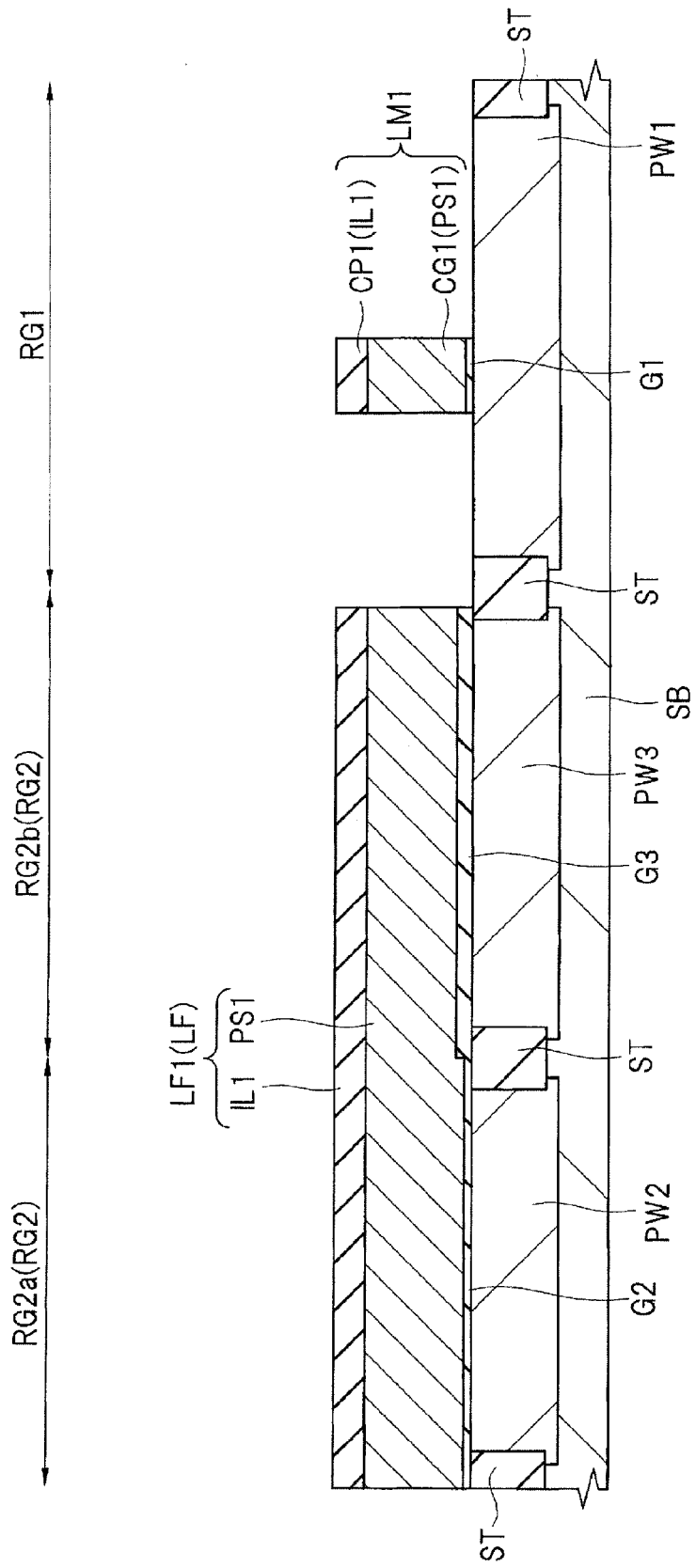
FIG. 7 is a main-portion cross-sectional view of the semiconductor device during the manufacturing process thereof, which is subsequent to FIG. 6.
Figure 8:
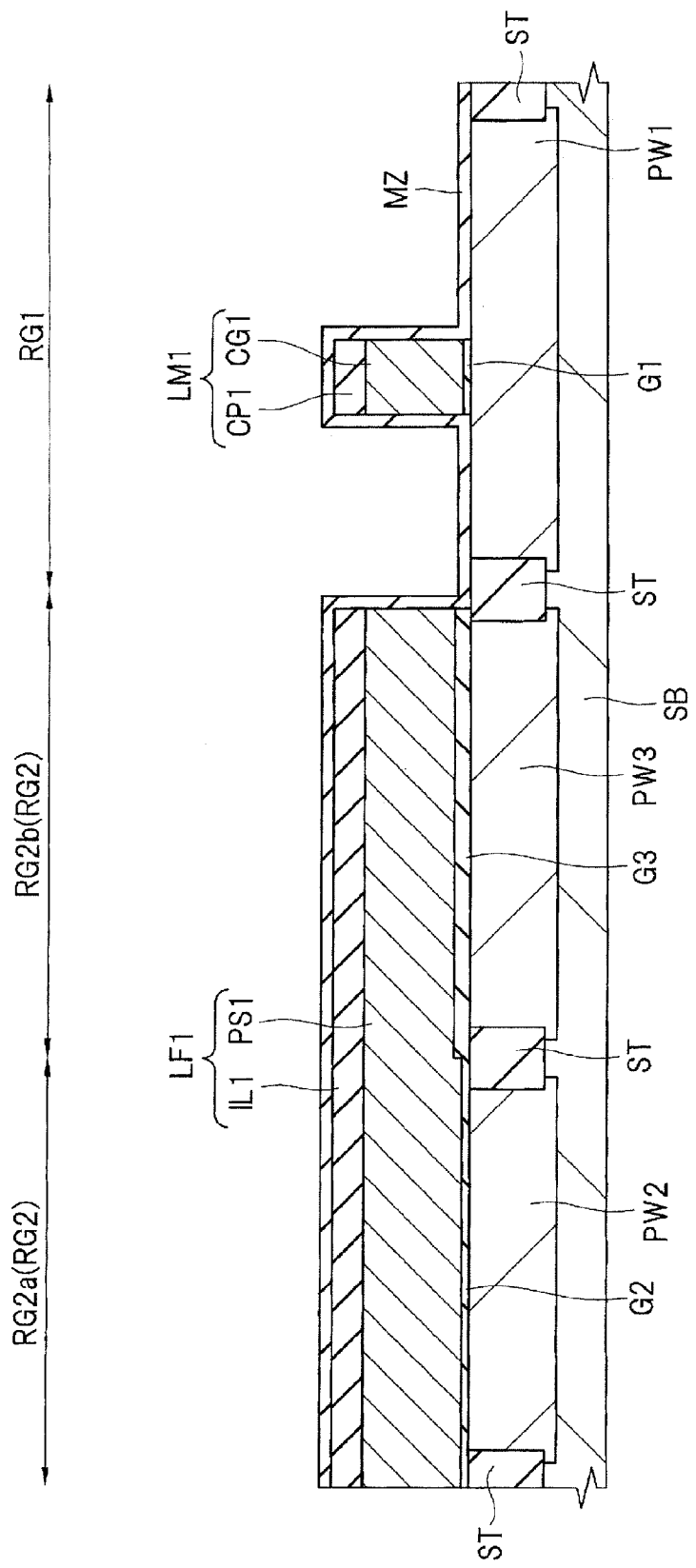
FIG. 8 is a main-portion cross-sectional view of the semiconductor device during the manufacturing process thereof, which is subsequent to FIG. 7.
Figure 9:
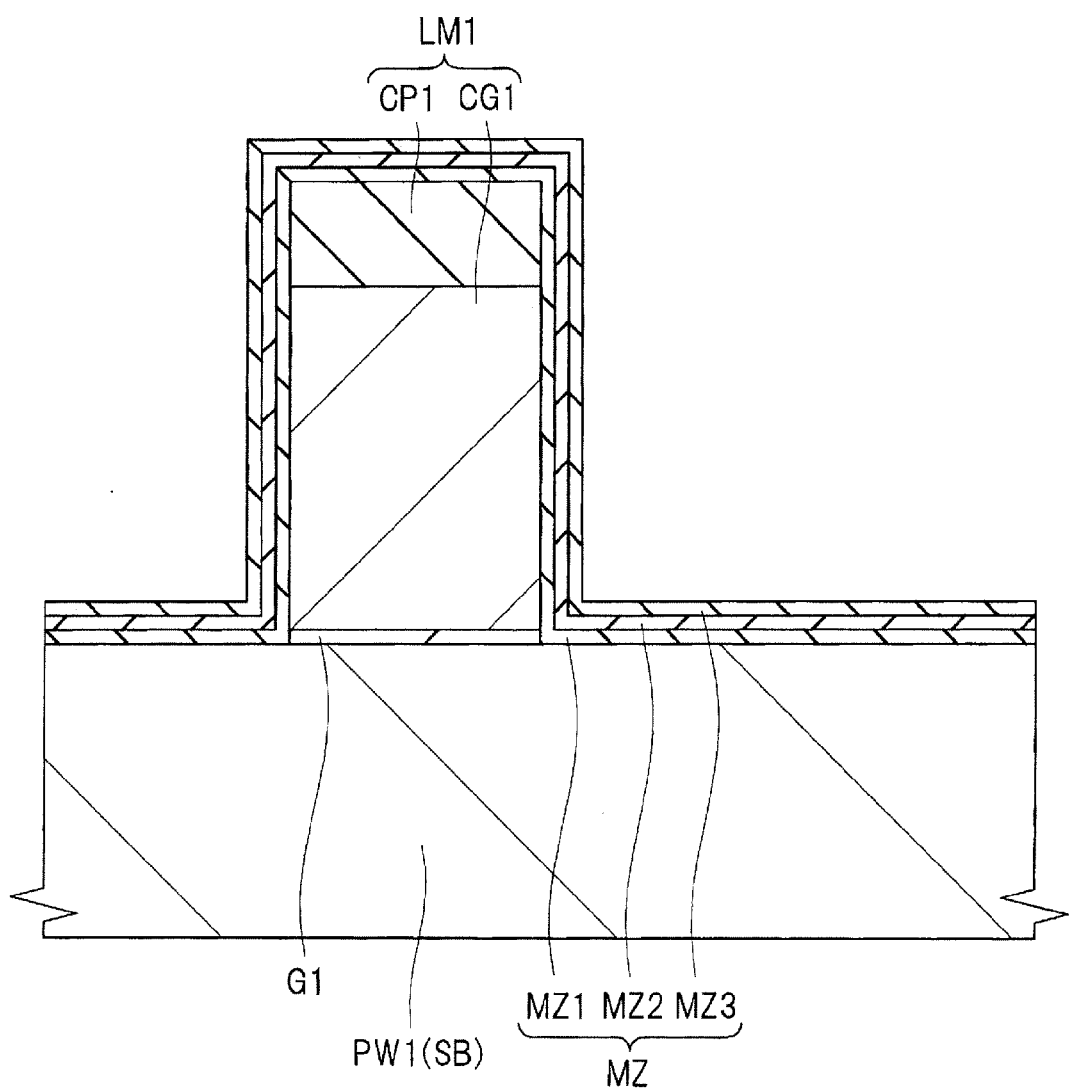
FIG. 9 is a partially enlarged cross-sectional view of FIG. 8.
Figure 12:
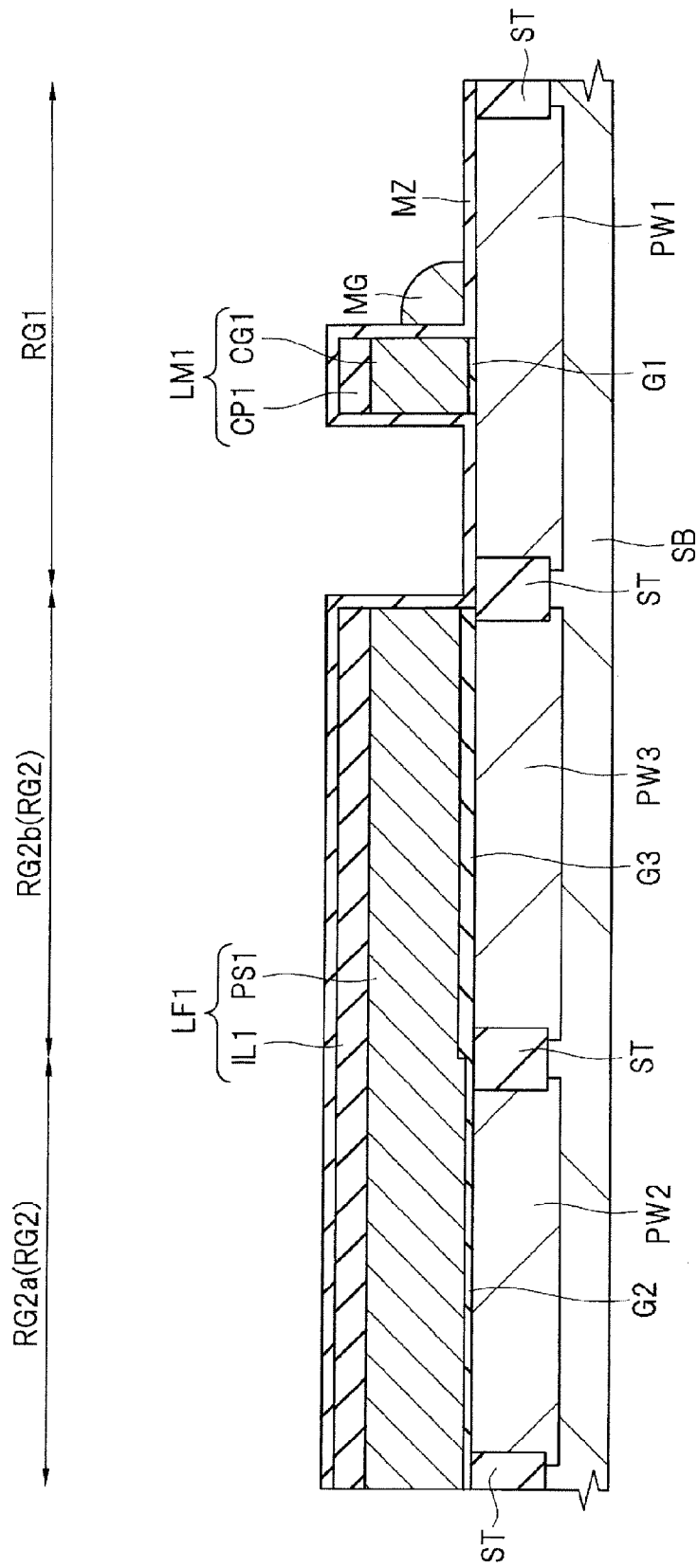
FIG. 12 is a main-portion cross-sectional view of the semiconductor device during the manufacturing process thereof, which is subsequent to FIG. 11.
Figure 13:
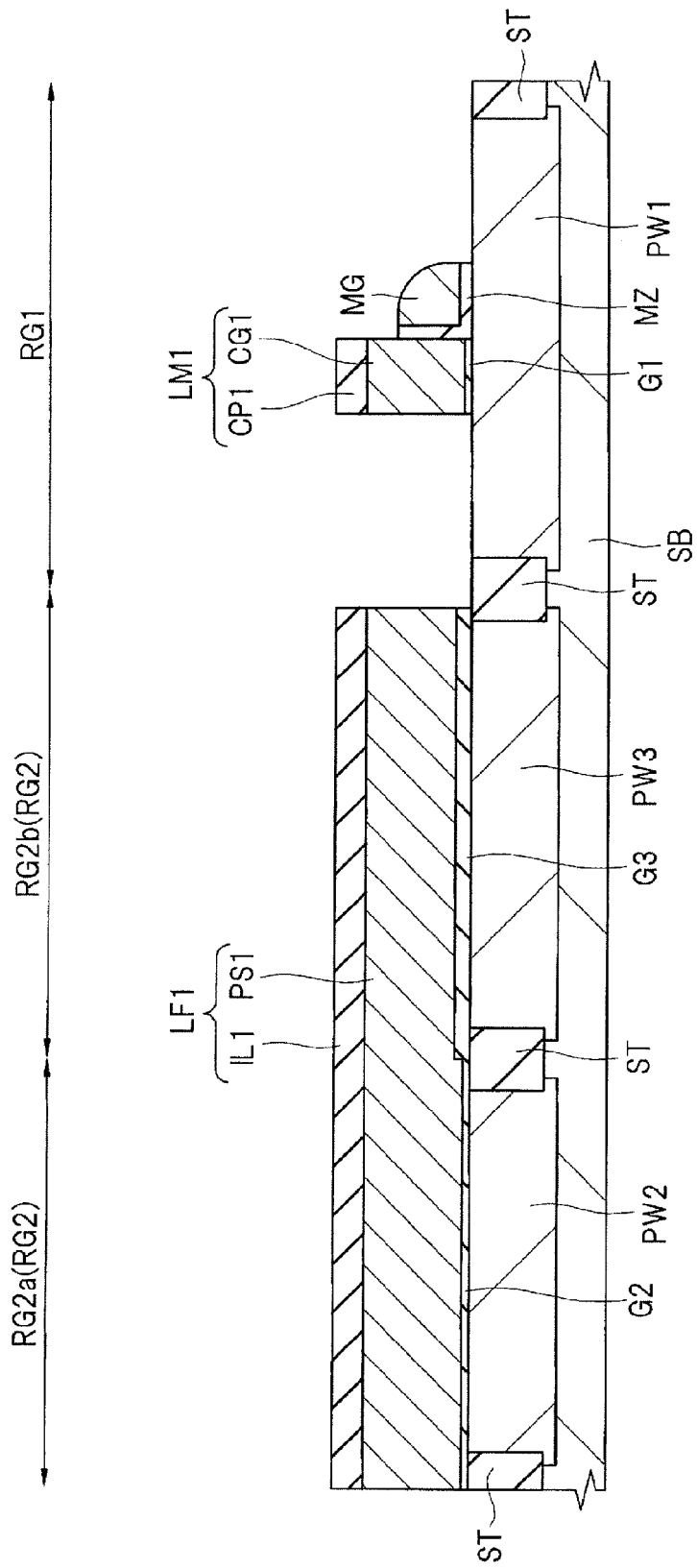
FIG. 13 is a main-portion cross-sectional view of the semiconductor device during the manufacturing process thereof, which is subsequent to FIG. 12.
Figure 14:
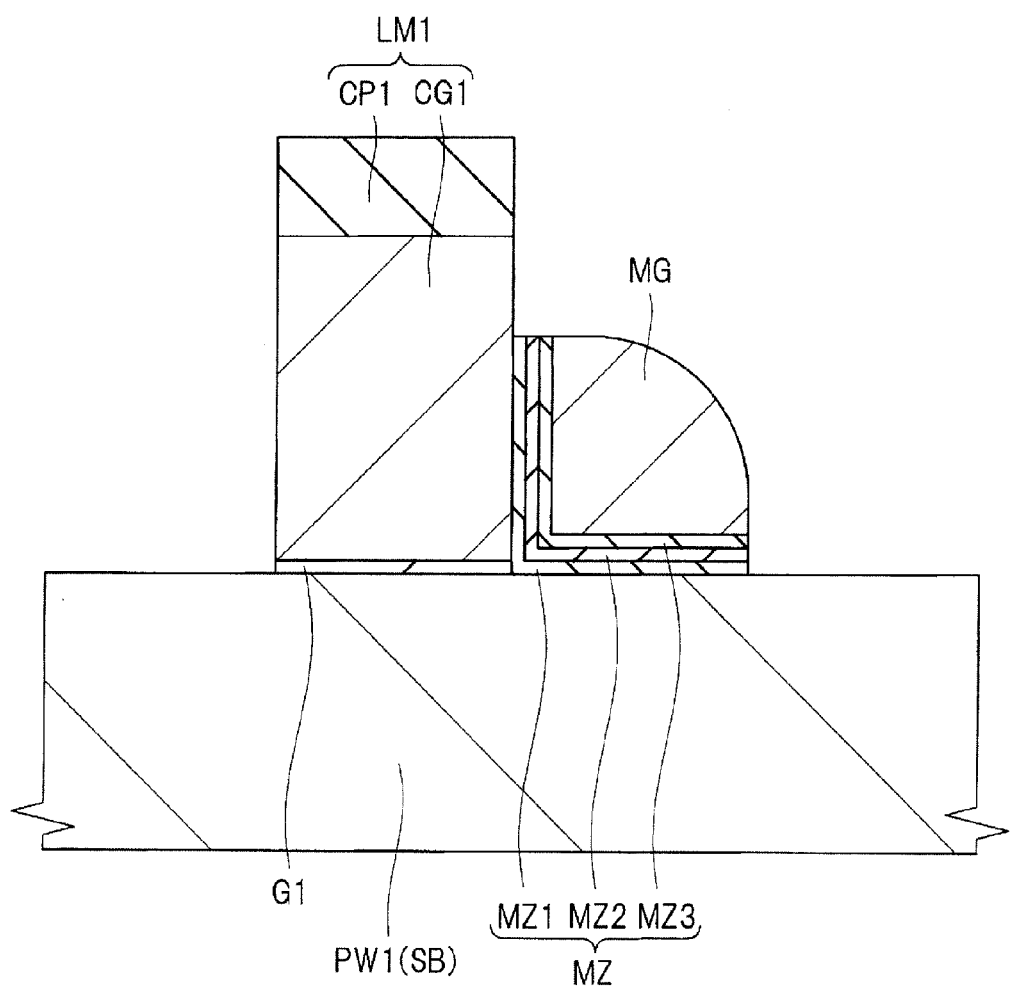
FIG. 14 is a partially enlarged cross-sectional view of FIG. 13.

FIGS. 1 to 3 are process flow charts each showing a part of a manufacturing process of the semiconductor device in the present embodiment. FIGS. 4 to 32 are main-portion cross-sectional views of the semiconductor device during the manufacturing process thereof. Among them, FIGS. 4 to 8, 10 to 13, and 15 to 32 are the main-portion cross-sectional views of a memory cell region RG1 and a peripheral circuit region RG2 which show the formation of a memory cell of a nonvolatile memory in the memory cell region RG1 and the formation of MISFETs in the peripheral circuit region RG2. Each of FIGS. 9 and 14 shows a part of the memory cell region RG1 in enlarged relation. FIG. 9 corresponds to the same process stage as shown in FIG. 8, while FIG. 14 corresponds to the same process stage as shown in FIG. 13. Accordingly, FIG. 9 is a partially enlarged cross-sectional view showing a part of FIG. 8 in enlarged relation, while FIG. 14 is a partially enlarged cross-sectional view showing a part of FIG. 13 in enlarged relation.

Here, the memory cell region RG1 is the region of a semiconductor substrate SB (the main surface thereof) where the memory cell of the nonvolatile memory is to be formed. The peripheral circuit region RG2 is the region of the semiconductor substrate SB (the main surface thereof) where peripheral circuits are to be formed. The memory cell region RG1 and the peripheral circuit region RG2 are present in the same semiconductor substrate SB. That is, the memory cell region RG1 and the peripheral circuit region RG2 correspond to the mutually different two-dimensional regions of the main surface of the same semiconductor substrate SB. Note that the memory cell region RG1 and the peripheral circuit region RG2 need not be adjacent to each other but, for easier understanding, each of the cross-sectional views of FIGS. 4 to 8, 10 to 13, and 15 to 32 shows the peripheral circuit region RG2 which is adjacent to the memory cell region RG1.

Here, the peripheral circuit is a circuit other than the nonvolatile memory. Examples of the peripheral circuit include a processor such as a CPU, a control circuit, a sense amplifier, a column decoder, a row decoder, and an input/output circuit. The MISFETs formed in the peripheral circuit region RG2 are MISFETs for the peripheral circuits.

In the present embodiment, a description will be given of the case where, in the memory cell region RG1, n-channel MISFETs (control transistor and memory transistor) are formed. However, it is also possible to invert the conductivity type thereof and form p-channel MISFETs (control transistor and memory transistor) in the memory cell region RG1. Likewise, in the present embodiment, a description will be given of the case where n-channel MISFETs are formed in the peripheral circuit region RG2. However, it is also possible to invert the conductivity type thereof and form p-channel MISFETs in the peripheral circuit region RG2. It is also possible to form both of an n-channel MISFET and a p-channel MISFET, i.e., a CMISFET (Complementary MISFET) in the peripheral circuit region RG2.

Also, in the present embodiment, in the peripheral circuit region RG2, a metal-gate MISFET and a silicon-gate MISFET are formed. Here, the metal-gate MISFET is a MISFET including a metal gate electrode (metallic gate electrode) as the gate electrode thereof, and the silicon-gate electrode is a MISFET including a silicon gate electrode (gate electrode made of silicon) as the gate electrode thereof. Accordingly, the peripheral circuit region RG2 includes a metal-gate MISFET formation region RG2a as a region where the metal-gate MISFET is to be formed, and a silicon-gate MISFET formation region RG2b as a region where the silicon-gate MISFET is to be formed.

By forming peripheral circuits by mainly using the metal-gate MISFET, it is possible to improve the performance of the semiconductor device. On the other hand, by using the silicon-gate MISFET as a MISFET having a high operating voltage and required to have high reliability, such as a MISFET used in an input/output circuit, it is also possible to improve the reliability of the semiconductor device. By thus providing the peripheral circuit region RG2 with the metal-gate MISFET formation region RG2a and the silicon-gate MISFET formation region RG2b, it is possible to improve the general performance and reliability of the semiconductor device.

As a result, e.g., the MISFET formed in the silicon-gate MISFET formation region RG2b has an operating voltage higher than the operating voltage of the MISFET formed in the metal-gate MISFET formation region RG2a. Also, the MISFET formed in the silicon-gate MISFET formation region RG2b has a breakdown voltage higher than the breakdown voltage of the MISFET formed in the metal-gate MISFET formation region RG2a.

Figure 4:
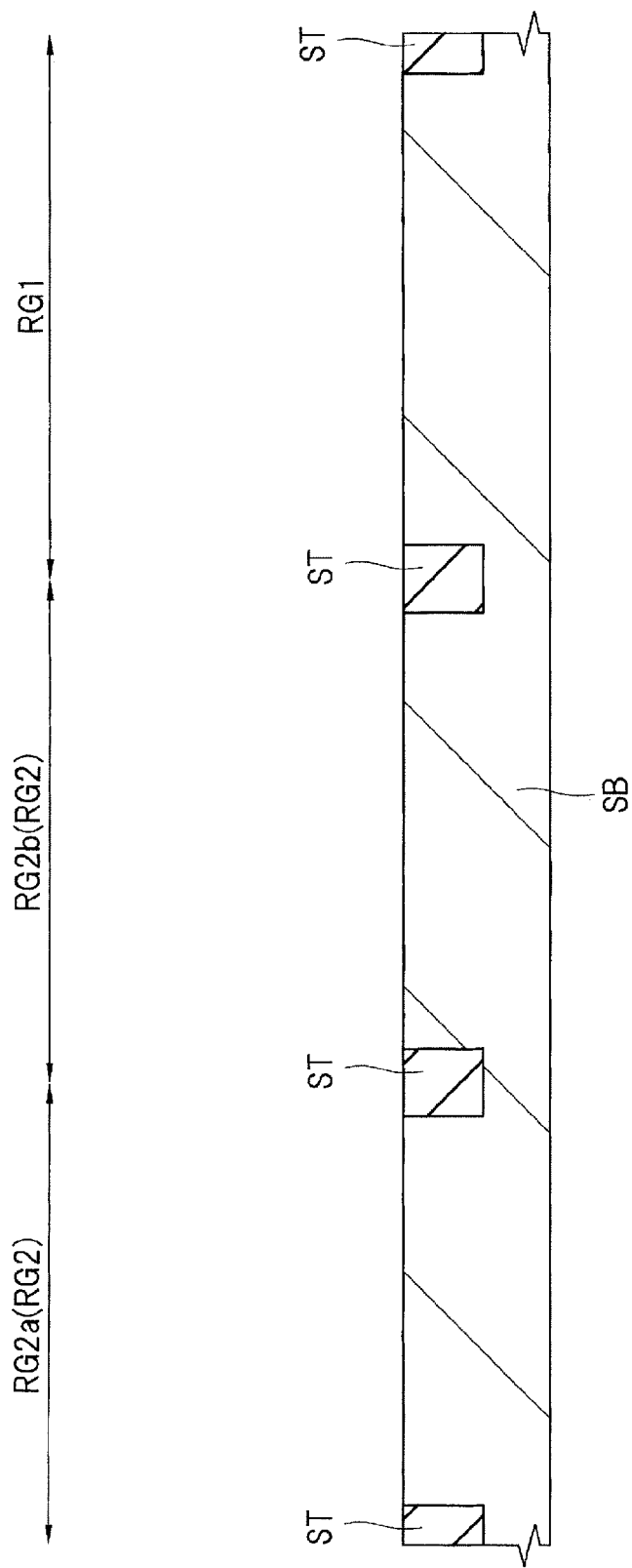
FIG. 4 is a main-portion cross-sectional view of the semiconductor device in the embodiment during the manufacturing process thereof.

To manufacture the semiconductor device, first, as shown in FIG. 4, a semiconductor substrate (semiconductor wafer) SB made of p-type single-crystal silicon having a specific resistance of, e.g., about 1 to 10 Ωcm is provided (prepared) first (Step S1 in FIG. 1). Then, in the main surface of the semiconductor substrate SB, isolation regions (inter-element isolation insulating regions) ST are formed to define (demarcate) active regions (Step S2 in FIG. 1).

The isolation regions ST are each made of an insulator such as silicon dioxide and can be formed by, e.g., a STI (Shallow Trench Isolation) method, a LOCOS (Local Oxidization of Silicon) method, or the like. By, e.g., forming trenches for isolation in the main surface of the semiconductor substrate SB and then embedding an insulating film made of, e.g., silicon dioxide in each of the trenches for isolation, the isolation regions ST can be formed. More specifically, after the formation of the trenches for isolation in the main surface of the semiconductor substrate SB, the insulating film (e.g., silicon dioxide film) for forming the isolation regions is formed over the semiconductor substrate SB so as to be embedded in the trenches for isolation. Then, by removing the insulating film (insulating film for forming the isolation regions) located outside the trenches for isolation, the isolation regions ST each made of the insulating film embedded in the trenches for isolation can be formed.

Figure 5:
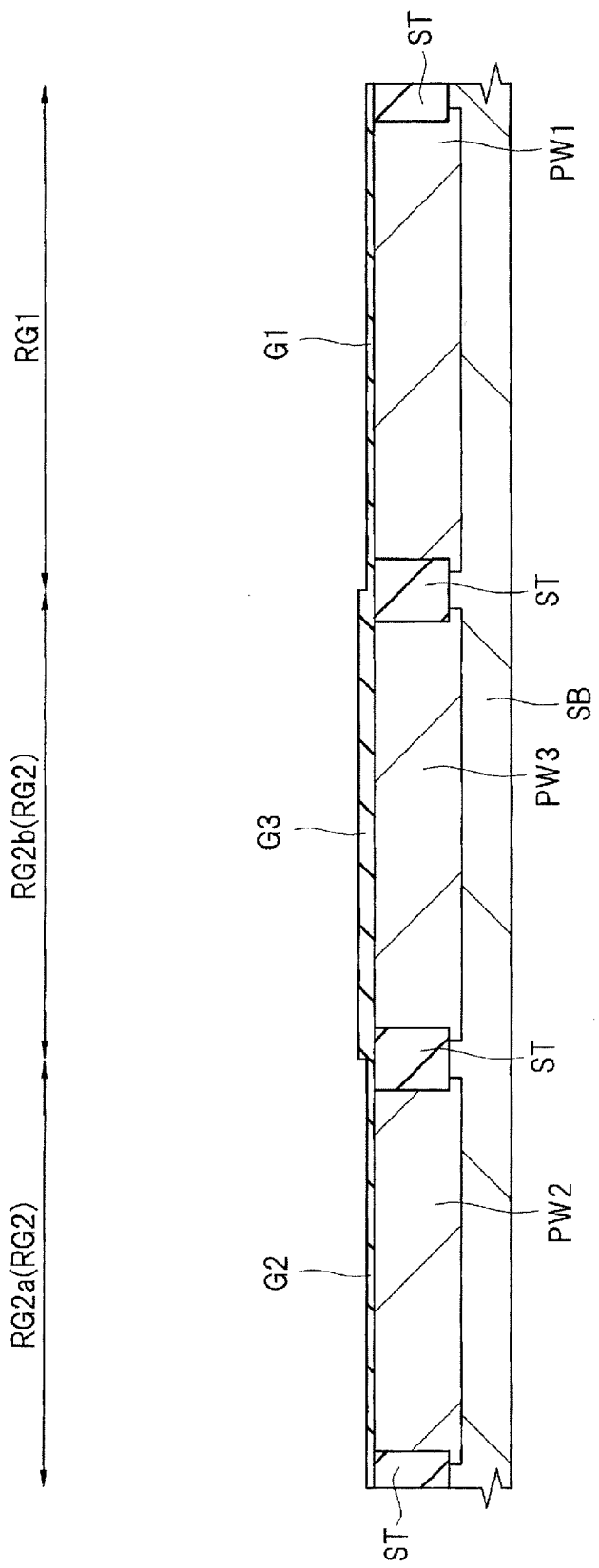
FIG. 5 is a main-portion cross-sectional view of the semiconductor device during the manufacturing process thereof, which is subsequent to FIG. 4.

Next, as shown in FIG. 5, a p-type well PW1, a p-type well PW2, and a p-type well PW3 are formed respectively in the memory cell region RG1 of the semiconductor substrate SB, the metal-gate MISFET formation region RG2a of the peripheral circuit region RG2 thereof, and the silicon-gate MISFET formation region RG2b of the peripheral circuit region RG2 thereof (Step S3 in FIG. 2).

The p-type wells PW1, PW2, and PW3 can be formed by ion-implanting a p-type impurity such as, e.g., boron (B) into the semiconductor substrate SB. Each of the p-type wells PW1, PW2, and PW3 is formed to extend from the main surface of the semiconductor substrate SB to a predetermined depth. Since the p-type wells PW1, PW2, and PW3 have the same conductivity type, the p-type wells PW1, PW2, and PW3 may be formed by either the same ion implantation step or different ion implantation steps.

Next, to adjust the threshold voltage of the control transistor to be formed later in the memory cell region RG1, the top surface portion (surface layer portion) of the p-type well PW1 of the memory cell region RG1 is subjected to channel doping ion implantation as necessary. Also, to adjust the threshold voltage of the MISFET to be formed later in the metal-gate MISFET formation region RG2a, the top surface portion (surface layer portion) of the p-type well PW2 of the metal-gate MISFET formation region RG2a is subjected to channel doping ion implantation as necessary. Also, to adjust the threshold voltage of the MISFET to be formed later in the silicon-gate MISFET formation region RG2b, the top surface portion (surface layer portion) of the p-type well PW3 of the silicon-gate MISFET formation region RG2b is subjected to channel doping ion implantation as necessary.

Next, the top surface of the semiconductor substrate SB (p-type wells PW1, PW2, and PW3) is cleaned by diluted hydrofluoric acid cleaning or the like. Then, over the main surface of the semiconductor substrate SB (top surfaces of the p-type wells PW1, PW2, and PW3), insulating films G1, G2, and G3 for gate insulating films are formed (Step S4 in FIG. 1). The gate insulating film G1 is formed over the top surface of the semiconductor substrate SB in the memory cell region RG1 (i.e., the upper surface of the p-type well PW1). The insulating film G2 is formed over the top surface of the semiconductor substrate SB in the metal-gate MISFET formation region RG2a (i.e., the upper surface of the p-type well PW2). The insulating film G3 is formed over the top surface of the semiconductor substrate SB in the silicon-gate MISFET formation region RG2b (i.e., the upper surface of the p-type well PW3). As each of the insulating films G1, G2, and G3, e.g., a silicon dioxide film can be used, but it is also possible to use a silicon oxynitride film. The insulating films G1, G2, and G3 can be formed by either the same step or different steps.

The thickness of the insulating film G3 can be set larger than the thickness of each of the insulating films G1 and G2. In this manner, it is possible to increase the thickness of the gate insulating film of the MISFET formed in the silicon-gate MISFET formation region RG2b and enhance the breakdown voltage thereof.

A description will be given of an example of the step of forming the insulating films G1, G2, and G3 when the thickness of the insulating film G3 is set larger than the thickness of each of the insulating films G1 and G2. First, the top surface of the semiconductor substrate SB is cleaned (washed) by wet etching using, e.g., an aqueous hydrofluoric acid (HF) solution or the like. Then, over the top surface of the semiconductor substrate SB (including also the top surfaces of the p-type wells PW1, PW2, and PW3), an insulating film (referred to as an insulating film for the insulating film G3) made of a silicon dioxide film or the like is formed. However, the insulating film for the insulating film G3 can be formed by, e.g., thermal oxidation treatment. The insulating film for the insulating film G3 can also be formed by forming a thermal oxide film and then further depositing a CVD film (silicon dioxide film formed by a CVD method) over the thermal oxide film. Then, by etching the insulating film for the insulating film G3 using a photoresist layer (not shown) formed using a photolithographic method as an etching mask, the insulating film for the insulating film G3 is removed from each of the memory cell region RG1 and the metal-gate MISFET formation region RG2, while the insulating film for the insulating film G3 is left in the silicon-gate MISFET formation region RG2b. Then, by subjecting the semiconductor substrate SB to thermal oxidation treatment, a silicon dioxide film is formed over the main surface of the semiconductor substrate SB. Thus, the insulating films G1 and G2 each made of a silicon dioxide film (thermal oxide film) are formed over the semiconductor substrate SB in the memory cell region RG1 and the metal-gate MISFET formation region RG2a (i.e., over the p-type wells PW1 and PW2), while the insulating film for the insulating film G3 in the silicon-gate MISFET formation region RG2b is thickened to form the insulating film G3. As a result, the structure shown in FIG. 5 is obtained. Consequently, the state is achieved where the thickness of the insulating film G3 formed in the silicon-gate MISFET formation region RG2b is larger than the thickness of the insulating film G1 formed in the memory cell region RG1 and also larger than the thickness of the insulating film G2 formed in the metal-gate MISFET formation region RG2a.

In this manner, the step of forming the insulating films G1, G2, and G3 in Step S4 is performed. As a result, a state can be obtained where the insulating films G1, G2, and G3 are respectively formed over the top surface of the semiconductor substrate SB in the memory cell region RG1, the top surface of the semiconductor substrate SB in the metal-gate MISFET formation region RG2a, and the top surface of the semiconductor substrate SB in the silicon-gate MISFET formation region RG2b.

Note that, for the sake of convenience, the insulating films G1, G2, and G3 illustrated in FIG. 5 seem to be formed also over the isolation regions ST. However, when the insulating films G1, G2, and G3 are formed by a thermal oxidation method, the insulating films G1, G2, and G3 are not actually formed over the isolation regions ST.

Figure 6:
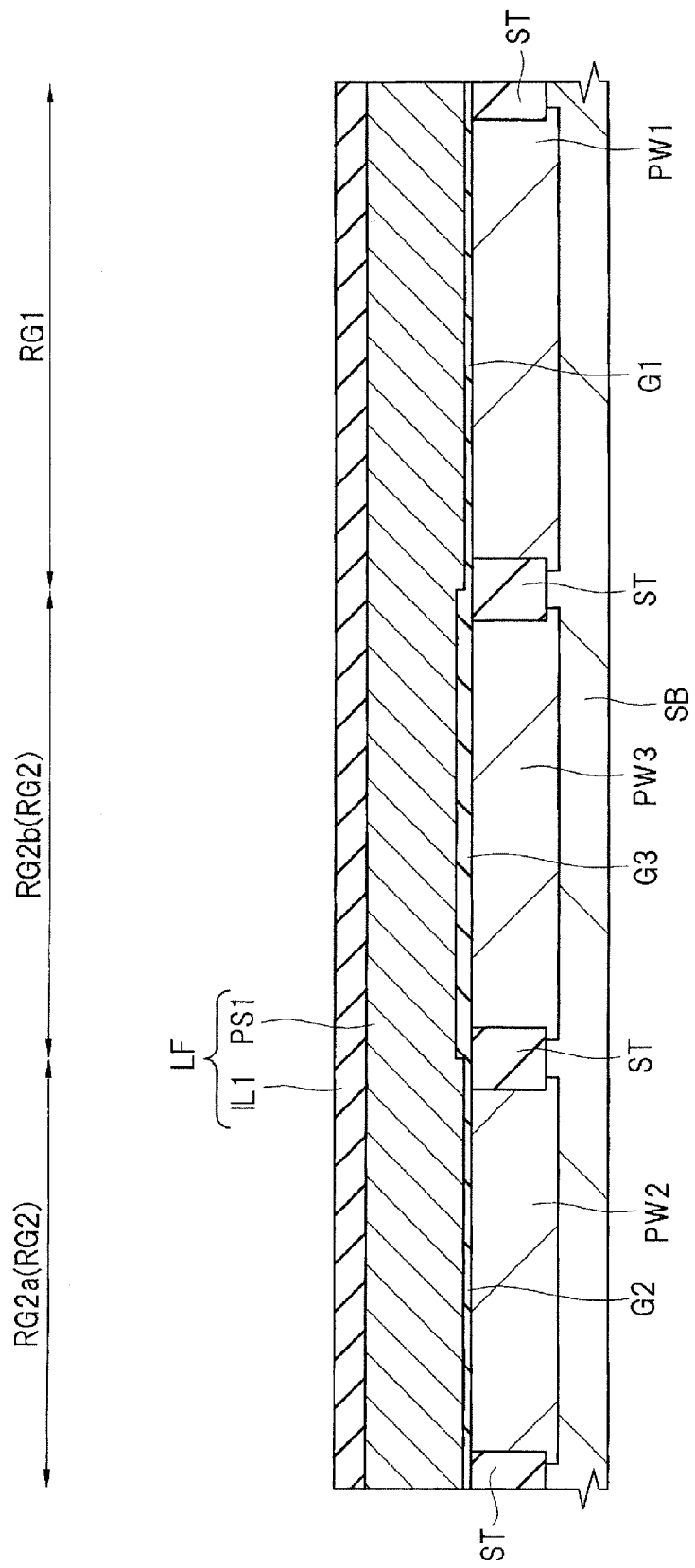
FIG. 6 is a main-portion cross-sectional view of the semiconductor device during the manufacturing process thereof, which is subsequent to FIG. 5.

Next, as shown in FIG. 6, over the main surface (entire main surface) of the semiconductor substrate SB, i.e., over each of the insulating film G1 in the memory cell region RG1, the insulating film G2 in the metal-gate MISFET formation region RG2a, and the insulating film G3 in the silicon-gate MISFET formation region RG2b, a silicon film PS1 is formed (deposited) (Step S5 in FIG. 1).

The silicon film PS1 is made of a polycrystalline silicon film (polysilicon film) and can be formed using a CVD (Chemical Vapor Deposition) method or the like. The film thickness (deposited film thickness) of the silicon film PS1 can be controlled to, e.g., about 50 to 250 nm. It is also possible to form the silicon film PS1 of an amorphous film during the deposition thereof and then change the silicon film PS1 made of the amorphous silicon film to the silicon film PS1 made of the polycrystalline silicon film by the subsequent heat treatment. It is also possible to form the silicon film PS1 as a low-resistance semiconductor film (doped polysilicon film) by introducing an impurity into the silicon film PS1 during the deposition thereof or ion-implanting an impurity into the silicon film PS1 after the deposition thereof.

Note that a dummy control gate electrode CG1 formed in the memory cell region RG1 using the silicon film PS1 and a dummy gate electrode GE1 formed in the metal-gate MISFET formation region RG2a using the silicon film PS1, each of which will be described later, are removed in Step S21 described later. Accordingly, into the silicon film PS1 in each of the memory cell region RG1 and the metal-gate MISFET formation region RG2a, an impurity need not be introduced in consideration of a resistance reduction, but an impurity is preferably introduced when consideration is given to etching in Step S21 described later. That is, since an n-type silicon film is easily removed by etching, by forming the silicon film PS1 of an n-type silicon film (silicon film into which an n-type impurity has been introduced) in each of the memory cell region RG1 and the metal-gate MISFET formation region RG2a, the dummy control gate electrode CG1 and the dummy gate electrode GE1 are easily removed in Step S21 described later. As the n-type impurity to be introduced into the silicon film PS1, e.g., phosphorus (P) can be used appropriately.

On the other hand, a gate electrode GE2 formed using the silicon film PS1 in the silicon-gate MISFET formation region RG2b, which will be described later, is used as the gate electrode of the MISFET of the peripheral circuit. Accordingly, into the silicon film PS1 in the silicon-gate MISFET formation region RG2b, an impurity is preferably introduced in consideration of a resistance reduction. That is, to reduce the resistance of the gate electrode GE2 described later, the silicon film PS1 in the silicon-gate MISFET formation region RG2b is preferably formed of a silicon film (doped polysilicon film) into which an impurity has been introduced. Here, the silicon film PS1 in the silicon-gate MISFET formation region RG2b is formed of an n-type silicon film (silicon film into which an n-type impurity has been introduced). This allows the silicon film PS1 to be formed of the n-type silicon film (silicon film into which an n-type impurity has been introduced) in each of the memory cell region RG1 and the peripheral circuit region RG2.

Next, over the main surface (entire main surface) of the semiconductor substrate SB, i.e., over the silicon film PS1, the insulating film IL1 is formed (deposited) (Step S6 in FIG. 1).

The insulating film IL1 is an insulating film for forming the cap insulating films CP1, CP2, and CP3 described later. The insulating film IL1 is made of, e.g., a silicon nitride film or the like and can be formed using a CVD method or the like. The deposited film thickness of the insulating film IL1 can be controlled to, e.g., about 20 to 50 nm. By performing Steps S5 and S6, a state is reached where a multi-layer film LF is formed of the silicon film PS1 and the insulating film IL1 over the silicon film PS1. Here, the multi-layer film LF includes the silicon film PS1, and the insulating film IL1 over the silicon film PS1.

Next, the multi-layer film LF, i.e., the insulating film IL1 and the silicon film PS1 are patterned using a photolithographic technique and an etching technique to form a multi-layer body (multi-layer structure) LM1 including the dummy control gate electrode CG1, and the cap insulating film CP1 over the dummy control gate electrode CG1 in the memory cell region RG1 (Step S7 in FIG. 1).

For example, Step S7 can be performed as follows. That is, first, over the insulating film IL1, a resist pattern (not shown) is formed using a photolithographic method. The photoresist pattern is formed in the area of the memory cell region RG1 where the dummy control gate electrode CG1 is to be formed and in the entire peripheral circuit region RG2. Then, using the photoresist pattern as an etching mask, the multi-layer film LF including the silicon film PS1, and the insulating film IL1 in the memory cell region RG1 is etched (preferably dry-etched) to be patterned. Thereafter, the photoresist pattern is removed. Thus, as shown in FIG. 7, the multi-layer body LM1 including the dummy control gate electrode CG1 made of the patterned silicon film PS1, and the cap insulating film CP1 made of the patterned insulating film IL1 is formed.

In another embodiment, the multi-layer body LM1 can also be formed as follows. First, over the insulating film IL1, a photoresist pattern (not shown) is formed using a photolithographic method. Then, using the photoresist pattern as an etching mask, the insulating film IL1 is etched (preferably dry-etched) to be patterned. Thus, the cap insulating film CP1 made of the patterned insulating film IL1 is formed in the memory cell region RG1. Then, after the photoresist pattern is removed, using the insulating film IL1 including the cap insulating film CP1 as an etching mask (hard mask), the silicon film PS1 is etched (preferably dry-etched) to be patterned. Thus, the multi-layer body LM1 including the dummy control gate electrode CG1 made of the patterned silicon film PS1, and the cap insulating film CP1 made of the patterned insulating film IL1 is formed.

The multi-layer body LM1 includes the dummy control gate electrode CG1, and the cap insulating film CP1 over the dummy control gate electrode CG1. The multi-layer body LM1 is formed over the semiconductor substrate SB (p-type well PW1) in the memory cell region RG1 via the insulating film G1. Thus, the dummy control gate electrode CG1 is formed over the semiconductor substrate SB (p-type well PW1) in the memory cell region RG1 via the insulating film G1. Each of the dummy control gate electrode CG1 and the cap insulating film CP1 has substantially the same two-dimensional shape in plan view and overlap each other in plan view.

Note that the dummy control gate electrode CG1 is a dummy-type gate electrode (pseudo gate electrode) and removed later. Since the dummy control gate electrode CG1 is removed later and replaced with a control gate electrode CG2 described later, the dummy control gate electrode CG1 can also be regarded as a replacement gate electrode or a gate electrode to be replaced.

The foregoing photoresist pattern used to form the multi-layer body LM1 is selectively formed in the area of the memory cell region RG1 where the dummy control gate electrode CG1 is to be formed. Accordingly, when Step S7 is performed, in the memory cell region RG1, the silicon film PS1 and the insulating film IL1 are removed, except for the portions thereof forming the multi-layer body LM1. On the other hand, the foregoing photoresist pattern used to form the multi-layer body LM1 is formed in the entire peripheral circuit region RG2. As a result, even when Step S7 is performed, in the peripheral circuit region RG2, the multi-layer film LF including the silicon film PS1 and the insulating film IL1 over the silicon film PS1 is not removed and, therefore, is not patterned, but entirely remains. The multi-layer film LF remaining in the peripheral circuit region RG2 is designated by a reference numeral LF1 and hereinafter referred to as a multi-layer film LF1.

The side surface (end portion) of the multi-layer film LF1 is preferably located over the isolation region ST. Accordingly, the active region (active region defined by the isolation region ST) of the peripheral circuit region RG2 is covered with the multi-layer film LF1. This can prevent the substrate region (Si substrate region) of the semiconductor substrate SB in the peripheral circuit region RG2 from being subjected to unneeded etching.

In the memory cell region RG1, the dummy control gate electrode CG1 made of the patterned silicon film PS1 is formed. In the memory cell region RG1, a state has been achieved where the dummy control gate electrode G1 made of the silicon film PS1 is formed over the semiconductor substrate SB (p-type well PW1) via the insulating film G1. In the memory cell region RG1, the insulating film G1 other than the portion thereof covered with the multi-layer body LM1 can be removed by dry etching performed in the patterning step in Step S7 or wet etching performed after the dry etching.

Thus, by Steps S4, S5, S6, and S7, over the semiconductor substrate SB, the multi-layer body LM1 including the dummy control gate electrode CG1, and the cap insulating film CP1 over the dummy control gate electrode CG1 is formed via the insulating film G1.

Next, to adjust the threshold voltage of the memory transistor to be formed later in the memory cell region RG1, the top surface portion (surface layer portion) of the p-type well PW1 in the memory cell region RG1 is subjected to channel doping ion implantation as necessary.

Next, washing treatment is performed to subject the main surface of the semiconductor substrate SB to cleaning treatment. Then, as shown in FIGS. 8 and 9, over the entire main surface of the semiconductor substrate SB, i.e., over the main surface (top surface) of the semiconductor substrate SB and the surfaces (upper and side surfaces) of the multi-layer body LM1, an insulating film MZ for the gate insulating film of the memory transistor is formed (Step S8 in FIG. 1).

In the peripheral circuit region RG2, the multi-layer film LF1 remains. Therefore, over the surfaces (upper and side surfaces) of the multi-layer film LF1 also, the insulating film MZ can be formed. Accordingly, in Step S8, the insulating film MZ is formed over the semiconductor substrate SB so as to cover the multi-layer body LM1 in the memory cell region RG and the multi-layer film LF1 in the peripheral circuit region RG2.

The insulating film MZ is an insulating film for the gate insulating film of the memory transistor and has an internal charge storage portion. The insulating film MZ is made of a multi-layer film including a silicon dioxide film (oxide film) MZ1, a silicon nitride film (nitride film) MZ2 formed over the silicon dioxide film MZ1, and a silicon dioxide film (oxide film) MZ3 formed over the silicon nitride film MZ2. The multi-layer film including the silicon dioxide film MZ1, the silicon nitride film MZ2, and the silicon dioxide film MZ3 can also be regarded as an ONO (oxide-nitride-oxide) film.

Note that, for improved clarity of illustration, in FIG. 8, the insulating film MZ including the silicon dioxide film MZ1, the silicon nitride film MZ2, and the silicon dioxide film MZ3 is shown as the single-layer silicon dioxide film MZ. However, as shown in FIG. 9, the insulating film MZ actually includes the silicon dioxide film MZ1, the silicon nitride film MZ2, and the silicon dioxide film MZ3.

Of the insulating film MZ, the silicon dioxide films MZ1 and MZ3 can be formed by oxidization treatment (thermal oxidation treatment), a CVD method, or a combination thereof. At this time, for the oxidation treatment, ISSG (In Situ Steam Generation) oxidation can also be used. Of the insulating film MZ, the silicon nitride film MZ2 can be formed by, e.g., a CVD method.

In the present embodiment, as an insulating film (charge storage layer) having a trap level, the silicon nitride film MZ2 is formed. In terms of reliability or the like, a silicon nitride film is appropriate, but the charge storage layer is not limited to the silicon nitride film. For example, a high-dielectric-constant film having a dielectric constant higher than that of the silicon nitride film, such as an aluminum oxide (alumina) film, a hafnium oxide film, or a tantalum oxide film, can also be used as the charge storage layer or charge storage portion. The charge storage layer or charge storage portion can also be formed of silicon nanodots.

To form the insulating film MZ, e.g., the silicon dioxide film MZ1 is formed first by a thermal oxidation method (preferably by ISSG oxidation). Then, over the silicon dioxide film MZ1, the silicon nitride film MZ2 is deposited by a CVD method. Further, over the silicon nitride film MZ2, the silicon dioxide film MZ3 is formed by a CVD method, a thermal oxidation method, or both of the CVD method and the thermal oxidation method. Thus, the insulating film MZ made of the multi-layer film including the silicon dioxide film MZ1, the silicon nitride film MZ2, and the silicon dioxide film MZ3 can be formed.

The thickness of the silicon dioxide film MZ1 can be controlled to, e.g., about 2 to 10 nm. The thickness of the silicon nitride film MZ2 can be controlled to, e.g., about 5 to 15 nm. The thickness of the silicon dioxide film MZ3 can be controlled to, e.g., about 2 to 10 nm. The last oxide film, i.e., the silicon dioxide film MZ3 in the uppermost layer of the insulating film MZ can also be formed of a high-breakdown-voltage film by, e.g., oxidizing the upper-layer portion of the nitride film (silicon nitride film MZ2 in the middle layer of the insulating film MZ).

The insulating film MZ functions as the gate insulating film of the memory gate electrode MG formed later and has a charge retaining (charge storing) function. Accordingly, the insulating film MZ has a multi-layer structure including at least three layers so as to be able to function as a gate insulating film having the charge retaining function of the memory transistor. The inner layer (which is the silicon nitride film MZ2 herein) functioning as the charge storage portion has a potential barrier height lower than the potential barrier height of each of the outer layers (which are the silicon dioxide films MZ1 and MZ3) functioning as a charge block layer. This can be achieved by forming the insulating film MZ of the multi-layer film including the silicon dioxide film MZ1, the silicon nitride film MZ2 over the silicon dioxide film MZ1, and the silicon dioxide film MZ3 over the silicon nitride film MZ2, as in the present embodiment.

Figure 10:
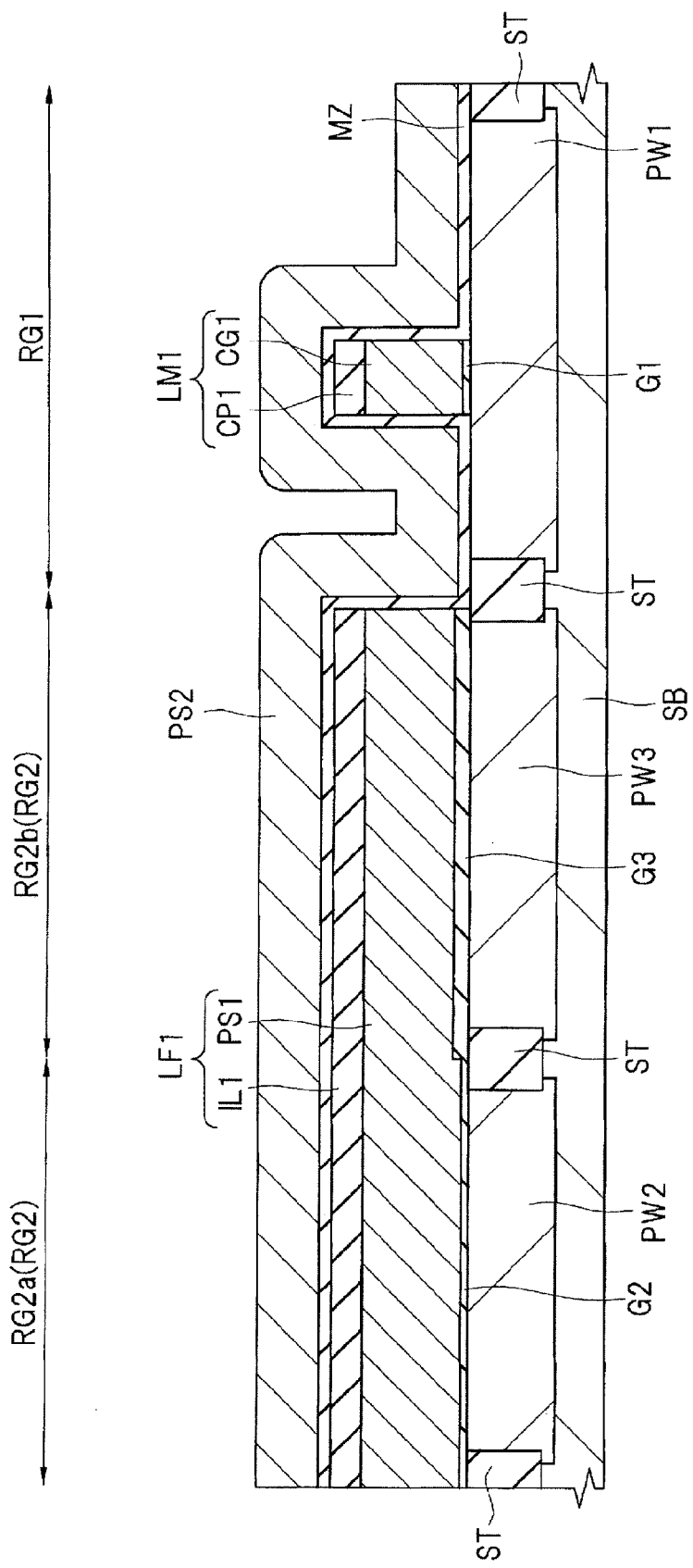
FIG. 10 is a main-portion cross-sectional view of the semiconductor device during the manufacturing process thereof, which is subsequent to FIG. 8.

Next, as shown in FIG. 10, over the main surface (entire main surface) of the semiconductor substrate SB, i.e., over the insulating film MZ, a silicon film PS2 is formed (deposited) so as to cover the multi-layer body LM1 in the memory cell region RG1 and cover the multi-layer film LF1 in the peripheral circuit region RG2 (Step S9 in FIG. 1).

The silicon film PS2 is a film for forming the memory gate electrode MG described later. The silicon film PS2 is made of a polycrystalline silicon film and can be formed using a CVD method or the like. The deposited film thickness of the silicon film PS2 can be controlled to, e.g., about 40 to 60 nm. It is also possible to form the silicon film PS2 of an amorphous film during the deposition thereof and then change the silicon film PS2 made of the amorphous silicon film to the silicon film PS2 made of the polycrystalline silicon film by the subsequent heat treatment. It is also possible to introduce an n-type or p-type impurity into the silicon film PS2 (to change the silicon film PS2 to a doped polysilicon film). However, more preferably, the silicon film PS2 is formed of a non-doped (undoped) silicon film (polysilicon film) into which no impurity has been introduced.

Next, by an anisotropic etching technique, the silicon film PS2 is etched back (etched, dry-etched, or anisotropically etched) (Step S10 in FIG. 1).

Figure 11:
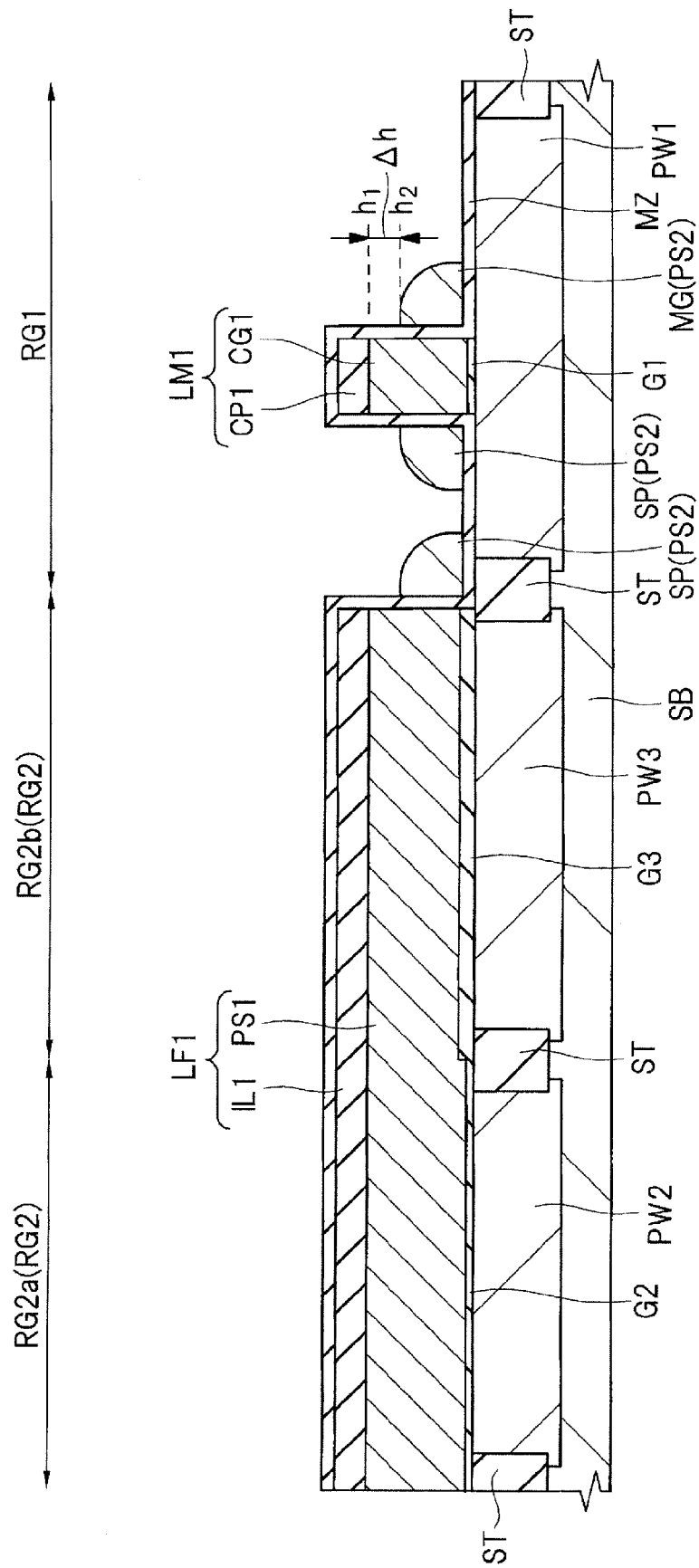
FIG. 11 is a main-portion cross-sectional view of the semiconductor device during the manufacturing process thereof, which is subsequent to FIG. 10.

In an etch-back step in Step S10, by anisotropically etching (etching back) the silicon film PS2, the silicon film PS2 is left into the form of sidewall spacers over the both side walls of the multi-layer body LM1, i.e., over the both side walls of the dummy control gate electrode CG1 via the insulating film MZ, while the silicon film PS2 is removed from the other region. As a result, as shown in FIG. 11, in the memory cell region RG1, the silicon film PS2 left in the form of the sidewall spacer over one of the both side walls of the multi-layer body LM1 (i.e., the both side walls of the dummy control gate electrode CG1) via the insulating film MZ forms the memory gate electrode MG. Also, in the memory cell region RG1, the silicon film PS2 left in the form of the sidewall spacer over the other of the both side walls of the multi-layer body LM1 (i.e., the both side walls of the dummy control gate electrode CG1) via the insulating film MZ forms the silicon spacer SP. The memory gate electrode MG is formed over the insulating film MZ so as to be adjacent to the multi-layer body LM1 via the insulating film MZ. Since the multi-layer body LM1 includes the dummy control gate electrode CG1, and the cap insulating film CP over the dummy control gate electrode CG1, the memory gate electrode MG is formed over the insulating film MZ so as to be adjacent to the dummy control gate electrode CG1 via the insulating film MZ.

The memory gate electrode MG is the gate electrode for the memory cell and, more specifically, the gate electrode for the memory transistor of the memory cell.

The silicon spacer SP can also be regarded as a sidewall spacer made of silicon. The memory gate electrode MG and the silicon spacer SP are formed over the side walls of the multi-layer body LM1 (dummy control gate electrode CG1) opposite to each other to have substantially symmetrical structures relative to the multi-layer body LM1 (dummy control gate electrode CG1) interposed therebetween. Over the side wall of the multi-layer film LF1 left in the peripheral circuit region RG2 also, the silicon spacer SP can be formed via the insulating film MZ.

By performing the etch-back step in Step S10, the insulating film MZ in the region uncovered with the memory gate electrode MG and the silicon spacer SP is exposed. Between the memory gate electrode MG formed in Step S10 and the semiconductor substrate SB (p-type well PW1) and between the memory gate electrode MG and the dummy control gate electrode CG1, the insulating film MZ is interposed. The insulating film MZ under the memory gate electrode MG in the memory cell region RG1 serves as the gate insulating film of the memory transistor. By adjusting the deposited film thickness of the silicon film PS2 deposited in Step S9 described above, the memory gate length (gate length of the memory gate electrode MG) can be adjusted.

In the present embodiment, by etching back the silicon film PS2 in Step S10, the memory gate electrode MG and the silicon spacer SP are formed. The height of each of the memory gate electrode MG and the silicon spacer SP which are formed over the both side walls of the multi-layer body LM1 (dummy control gate electrode CG1) is controlled to be lower than the height of the dummy control gate electrode CG1. That is, the step of etching back the silicon film PS2 is performed in Step S10 such that, at the stage where the step of etching back the silicon film PS2 in Step S10 has been ended, the height of each of the memory gate electrode MG and the silicon spacer SP is lower than the height of the dummy control gate electrode CG1. Specifically, in etching back the silicon film PS2 in Step S10, through the control of an etching time period, the silicon film PS2 is excessively anisotropically etched to have a thickness smaller than the deposited film thickness of the silicon film PS2. Thus, the upper surface of each of the silicon spacer SP and the memory gate electrode MG is set lower in level than the upper surface of the dummy control gate electrode CG1. Note that, since the silicon spacer SP is removed later, it is important to perform the step of etching back the silicon film PS2 in Step S10 such that the height of the memory gate electrode MG is lower than the height of the dummy control gate electrode CG1.

That is, in Step S10, the silicon film PS2 is etched back (etched) until a height $h_2$ of the memory gate electrode MG becomes lower than a height $h_1$ of the dummy control gate electrode CG1 (i.e., until $h_1 > h_2$ is satisfied). Accordingly, after the silicon film PS2 is etched back in Step S10, the height $h_2$ of the memory gate electrode MG made of the remaining silicon film PS2 is lower than the height $h_1$ of the dummy control gate electrode CG1 (i.e., $h_1 > h_2$ is satisfied).

Here, the height ($h_2$) of the memory gate electrode MG which is lower than the height ($h_1$) of the dummy control gate electrode CG1 means that the height position of the top portion (uppermost portion) of the memory gate electrode MG is lower than the height position of the upper surface of the dummy control gate electrode CG1. Also, the height of the silicon spacer SP which is lower than the height of the dummy control gate electrode CG1 means that the height position of the top portion (uppermost portion) of the silicon spacer SP is lower than the height position of the upper surface of the dummy control gate electrode CG1.

Note that, when a height is mentioned, it assumedly refers to a height in a direction generally perpendicular to the main surface of the semiconductor substrate SB. Accordingly, the height ($h_1$) of the dummy control gate electrode CG1 corresponds to a distance (height) from the main surface of the semiconductor substrate SB (top surface of the p-type well PW1) to the upper surface of the dummy control gate electrode CG1. Also, the height ($h_2$) of the memory gate electrode MG corresponds to a distance (height) from the main surface of the semiconductor substrate SB (top surface of the p-type well PW1) to the uppermost portion (top portion) of the memory gate electrode MG. The height of the silicon spacer SP is substantially the same as the height of the memory gate electrode MG.

The height ($h_2$) of the memory gate electrode MG is set lower than the height ($h_1$) of the dummy control gate electrode CG1 to expose the dummy control gate electrode CG1 and prevent the memory gate electrode MG from being exposed in Step S20 described later. It is preferable that a difference Δh between the height $h_1$ of the dummy control gate electrode CG1 and the height $h_2$ of the memory gate electrode MG ($\Delta h = h_1 - h_2$ is satisfied herein) is not less than 30 nm (i.e., $\Delta h \geq 30$ nm is satisfied). This makes it possible to easily and properly provide a situation where, in Step S20 described later, the dummy control gate electrode CG1 is exposed, but the memory gate electrode MG is not exposed.

Thus, in the present embodiment, the silicon film PS2 is etched back in Step S10 until the height of the silicon film PS2 remaining over each of the side walls of the multi-layer body LM1 via the insulating film MZ becomes lower than the height $h_1$ of the dummy control gate electrode CG1 to form the memory gate electrode MG having the height $h_2$ lower than the height $h_1$ of the dummy control gate electrode CG1.

Next, using a photolithographic technique, a photoresist pattern (not shown) which covers the memory gate electrode MG and exposes the silicon spacer SP is formed over the semiconductor substrate SB. Then, by dry etching using the photoresist pattern as an etching mask, the silicon spacer SP is removed (Step S11 in FIG. 2). Thereafter, the photoresist pattern is removed. By the etching process in Step S11, the silicon spacer SP is removed as shown in FIG. 12, but the memory gate electrode covered with the photoresist pattern is not etched and remains.

Next, as shown in FIGS. 13 and 14, of the insulating film MZ, the exposed portion uncovered with the memory gate electrode MG is removed by etching (e.g., wet etching) (Step S12 in FIG. 2). At this time, in the memory cell region RG1, the insulating film MZ located under the memory gate electrode MG and between the memory gate electrode MG and the multi-layer body LM1 (dummy control gate electrode CG1) is not removed and remains, while the insulating film MZ is removed from the other region. As can also be seen from FIGS. 13 and 14, in the memory cell region RG1, the insulating film MZ extends continuously over the region between the memory gate electrode MG and the semiconductor substrate SB (p-type well PW1) and the region between the memory gate electrode MG and the dummy control gate electrode CG1.

Thus, by Steps S8 to S12, over the semiconductor substrate SB (p-type well PW1), the memory gate electrode MG for the memory cell is formed via the insulating film MZ having the internal charge storage portion so as to be adjacent to the dummy control gate electrode CG1. More specifically, over the semiconductor substrate SB (p-type well PW1), the memory gate electrode MG for the memory cell is formed via the insulating film MZ having the internal charge storage portion so as to be adjacent to the dummy control gate electrode CG1 via the insulating film MZ.

Figure 15:
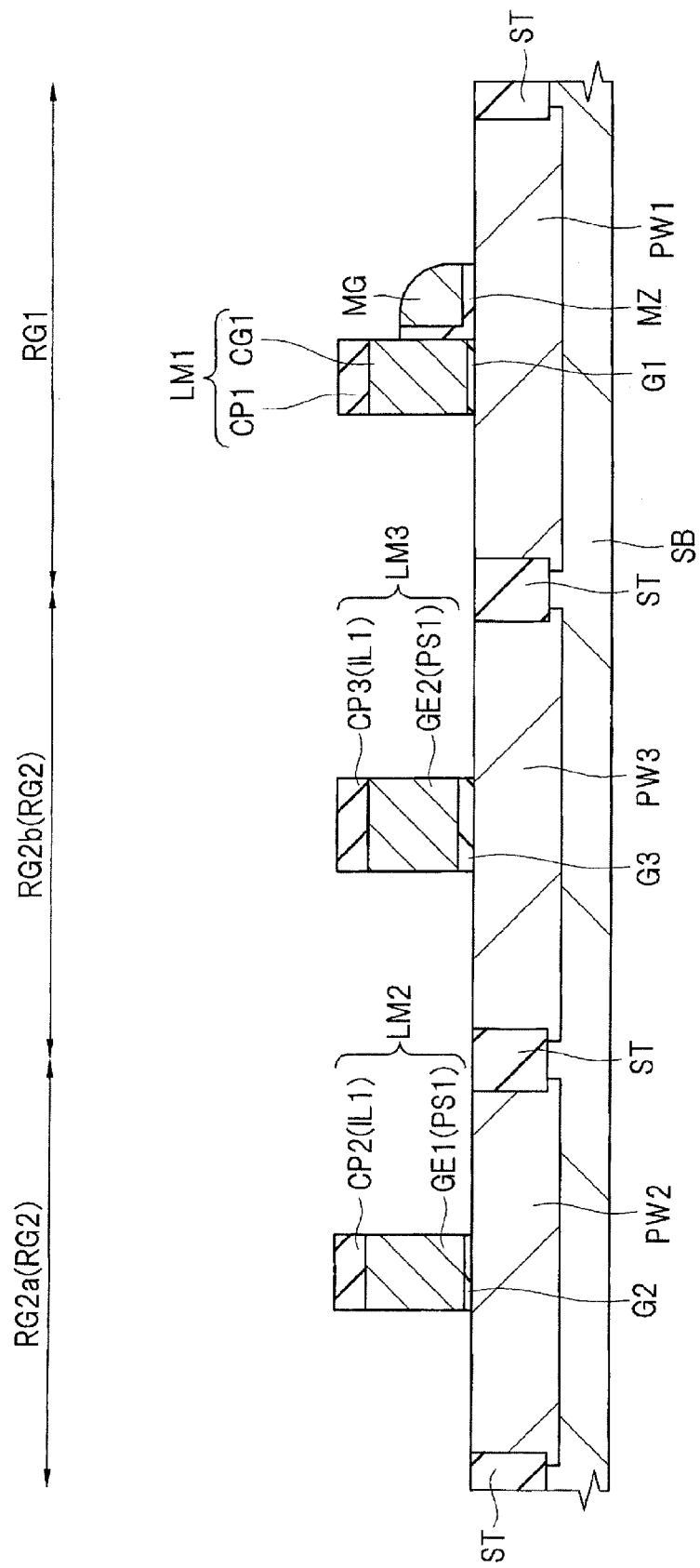
FIG. 15 is a main-portion cross-sectional view of the semiconductor device during the manufacturing process thereof, which is subsequent to FIG. 13.

Next, the multi-layer film LF1 in the peripheral circuit region RG2 is patterned using a photolithographic technique and an etching technique. Thus, as shown in FIG. 15, a multi-layer body (multi-layer structure) LM2 including the dummy gate electrode GE1 and the cap insulating film CP2 over the dummy gate electrode GE1 and a multi-layer body (multi-layer structure) LM3 including the gate electrode GE2 and the cap insulating film CP3 over the gate electrode GE2 are formed in the peripheral circuit region RG2 (Step S13 in FIG. 2). Note that the multi-layer body LM2 is formed in the metal-gate MISFET formation region RG2a of the peripheral circuit formation region RG2, and the multi-layer body LM3 is formed in the silicon-gate MISFET formation region RG2b of the peripheral circuit region RG2.

For example, the patterning step in Step S13 can be performed as follows. That is, first, over the main surface of the semiconductor substrate SB, a photoresist pattern (not shown) is formed using a photolithographic method. The photoresist pattern is formed over the entire memory cell region RG1, the area of the metal-gate MISFET formation region RG2a of the peripheral circuit region RG2 where the dummy gate electrode GE1 is to be formed, and the area of the silicon-gate MISFET formation region RG2b of the peripheral circuit region RG2 where the gate electrode GE2 is to be formed. Consequently, the memory gate electrode MG and the multi-layer body LM1 are covered with the photoresist pattern. Then, using the photoresist pattern as an etching mask, the multi-layer film LF1 including the silicon film PS1 and the insulating film IL1 and located in the peripheral circuit region RG2 is etched (preferably dry-etched) to be patterned. Thereafter, the photoresist pattern is removed. Thus, as shown in FIG. 15, the multi-layer body LM2 including the dummy gate electrode GE1 made of the patterned silicon film PS1, and the cap insulating film CP2 made of the patterned insulating film IL1 is formed in the metal-gate MISFET formation region RG2a of the peripheral circuit region RG2. On the other hand, the multi-layer body LM3 including the gate electrode GE2 made of the patterned silicon film PS1, and the cap insulating film CP3 made of the patterned insulating film IL1 is formed in the silicon-gate MISFET formation region RG2b of the peripheral circuit region RG2.

The multi-layer body LM2 includes the dummy gate electrode GE1, and the cap insulating film CP2 over the dummy gate electrode GE1. The multi-layer body LM2 is formed over the semiconductor substrate SB (p-type well PW2) in the metal-gate MISFET formation region RG2a via the insulating film G2. The dummy gate electrode GE1 and the cap insulating film CP2 have substantially the same two-dimensional shapes in plan view and overlap each other in plan view. On the other hand, the multi-layer body LM3 includes the gate electrode GE2, and the cap insulating film CP3 over the gate electrode GE2. The multi-layer body LM3 is formed over the semiconductor substrate SB (p-type well PW3) in the silicon-gate MISFET formation region RG2b via the insulating film G3. The gate electrode GE2 and the cap insulating film CP3 have substantially the same two-dimensional shapes in plan view and overlap each other in plan view.

Note that the dummy gate electrode GE1 is a dummy-type gate electrode (pseudo gate electrode) and removed later. Since the dummy gate electrode GE1 is removed later and replaced with a gate electrode GE3 described later, the dummy gate electrode GE1 can also be regarded as a replacement gate electrode or a gate electrode to be replaced. On the other hand, the gate electrode GE2 functions as the gate electrode of the MISFET, and the insulating film G3 under the gate electrode GE2 functions as the gate insulating film of the MISFET. That is, the gate electrode GE2 is the gate electrode for the MISFET in the peripheral circuit (i.e., the MISFET other than that of the memory cell).

In the peripheral circuit region RG2, the foregoing photoresist pattern used in the patterning step in Step S13 is formed selectively over the area where the dummy gate electrode GE1 is to be formed and the area where the gate electrode GE2 is to be formed. Accordingly, when Step S13 is performed, the silicon film PS1 and the insulating film IL1 are removed from the peripheral circuit region RG2, except for the portions thereof forming the multi-layer bodies LM2 and LM3. On the other hand, the foregoing photoresist pattern used in the patterning step in Step S13 is formed in the entire memory cell region RG1. Accordingly, even when the patterning step in Step S13 is performed, the multi-layer body LM1 and the memory gate electrode MG are not removed from the memory cell region RG1 and remains therein.

In the metal-gate MISFET formation region RG2a of the peripheral circuit region RG2, the insulating film G2 can be removed by dry etching performed in the patterning step in Step S13 or by wet etching performed after the dry etching, except for the portion thereof covered with the multi-layer body LM2. Likewise, in the silicon-gate MISFET formation region RG2b of the peripheral circuit region RG2, the insulating film G3 can be removed by the dry etching performed in the patterning step in Step S13 or by the wet etching performed after the dry etching, except for the portion thereof covered with the multi-layer body LM3.

Thus, in the metal-gate MISFET formation region RG2a, over the semiconductor substrate SB (p-type well PW2), the multi-layer body LM2 including the dummy gate electrode GE1, and the cap insulating film CP2 over the dummy gate electrode GE1 is formed via the insulating film G2. That is, in the metal-gate MISFET formation region RG2a, the state has been achieved where the dummy gate electrode GE1 is formed over the semiconductor substrate SB via the insulating film G2, and the cap insulating film CP2 is formed over the dummy gate electrode GE1. On the other hand, in the silicon-gate MISFET formation region RG2b, the state has been achieved where the multi-layer body LM3 including the gate electrode GE2, and the cap insulating film CP3 over the gate electrode GE2 is formed over the semiconductor substrate SB (p-type well PW3) via the insulating film G3, and the cap insulating film CP3 is formed over the gate electrode GE2.

Figure 16:
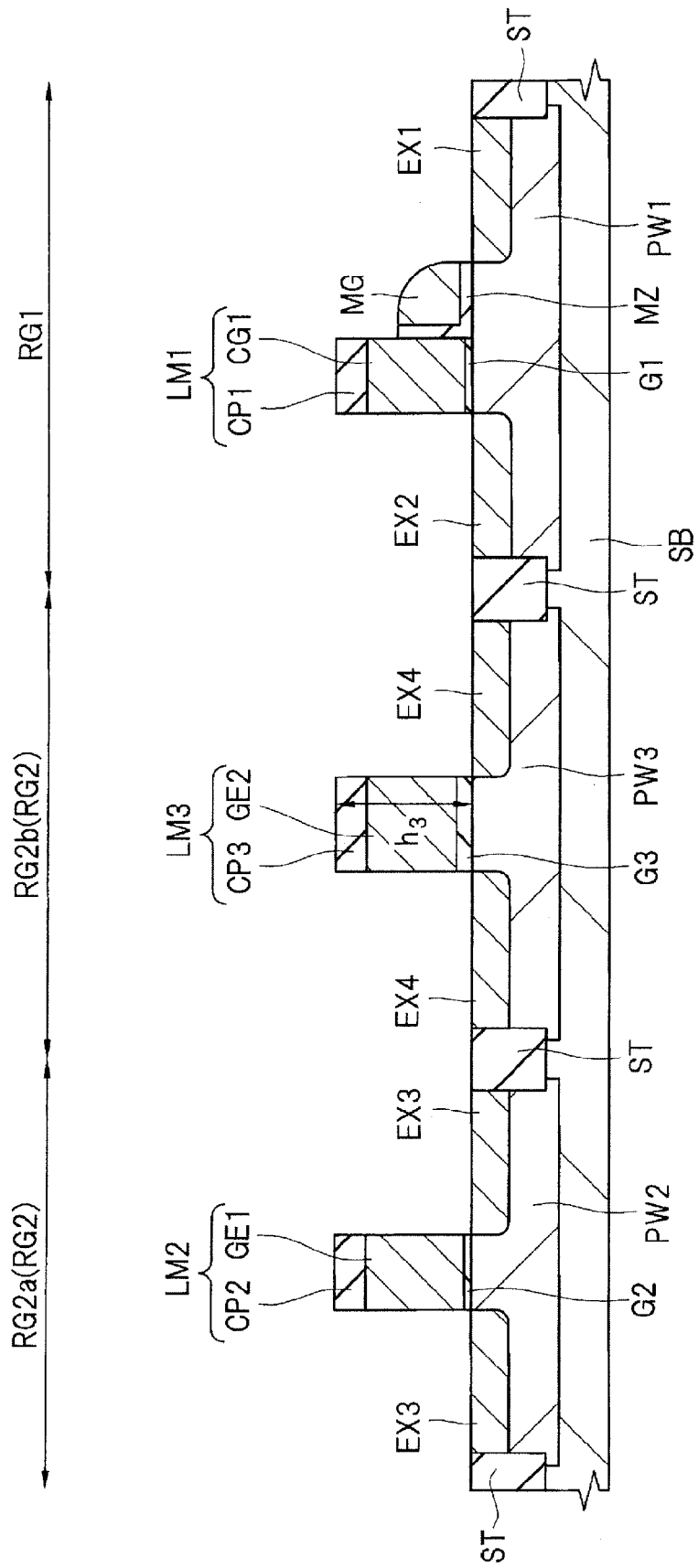
FIG. 16 is a main-portion cross-sectional view of the semiconductor device during the manufacturing process thereof, which is subsequent to FIG. 15.

Next, as shown in FIG. 16, $n^-$-type semiconductor regions (impurity diffusion layers) EX1, EX2, EX3, and EX4 are formed using an ion implantation method or the like (Step S14 in FIG. 2).

In Step S14, by introducing an n-type impurity such as, e.g., arsenic (As) or phosphorus (P) into the semiconductor substrate SB (p-type wells PW1, PW2, and PW3) using the multi-layer body LM1, the memory gate electrode MG, and the multi-layer bodies LM2 and LM3 as a mask (ion implantation inhibiting mask) by an ion implantation method, the $n^-$-type semiconductor regions EX1, EX2, EX3, and EX4 can be formed. At this time, in the memory cell region RG1, the memory gate electrode MG functions as a mask (ion implantation inhibiting mask). This allows the n⁻-type semiconductor region EX1 to be formed by self-alignment with the side wall (side wall opposite to the side wall adjacent to the dummy control gate electrode CG1 via the insulating film MZ) of the memory gate electrode MG. Also, in the memory cell region RG1, the multi-layer body LM1 functions as a mask (ion implantation inhibiting mask). This allows the n⁻-type semiconductor region EX2 to be formed by self-alignment with the side wall (side wall opposite to the side wall adjacent to the memory gate electrode MG via the insulating film MZ) of the dummy control gate electrode CG1. On the other hand, in the metal-gate MISFET formation region RG2a of the peripheral circuit region RG2, the multi-layer body LM2 functions as a mask (ion implantation inhibiting mask). This allows the n⁻-type semiconductor regions EX3 to be formed by self-aliyiment with the both side walls of the dummy gate electrode GE1. In the silicon-gate MISFET formation region RG2b of the peripheral circuit region RG2, the multi-layer body LM3 functions as a mask (ion implantation inhibiting mask). This allows the n⁻-type semiconductor regions EX4 to be formed by self-alignment with the both side walls of the gate electrode GE2.

Each of the n⁻-type semiconductor regions EX1 and EX2 can function as a part of the source/drain region (source or drain region) of the memory cell formed in the memory cell region RG1. Each of the n⁻-type semiconductor regions EX3 can function as a part of the source/drain region (source or drain region) of the MISFET formed in the metal-gate MISFET formation region RG2a. Each of the n⁻-type semiconductor regions EX4 can function as a part of the source/drain region (source or drain region) of the MISFET formed in the silicon-gate MISFET formation region RG2b. The n⁻-type semiconductor regions EX1, EX2, EX3, and EX4 can be formed by the same ion implantation step, but can also be formed by different ion implantation steps.

It is also possible that, after the formation of the multi-layer bodies LM2 and LM3 in Step S13 and before the formation of the n⁻-type semiconductor regions EX1, EX2, EX3, and EX4 in Step S14, an insulating film (not shown) made of a silicon nitride film or the like is formed over the semiconductor substrate SB so as to cover the multi-layer bodies LM2 and LM3, the memory gate electrode MG, and the multi-layer body LM1, and then the ion implantation in Step S14 is performed. In this case, the insulating film can function as an offset spacer and cooperate with the multi-layer body LM1, the memory gate electrode MG, and the multi-layer bodies LM2 and LM3 to function as a mask (ion implantation inhibiting mask) during ion implantation.

Next, over the respective side walls (side walls opposite to the side walls adjacent to each other via the insulating film MZ) of the multi-layer body LM1 and the memory gate electrode MG, over the side walls of the multi-layer body LM2, and over the side walls of the multi-layer body LM3, the sidewall spacers (sidewalls or side-wall insulating films) SW each made of an insulating film are formed as side-wall insulating films (Step S15 in FIG. 2). The sidewall spacers SW can be regarded as the side-wall insulating films.

Figure 17:
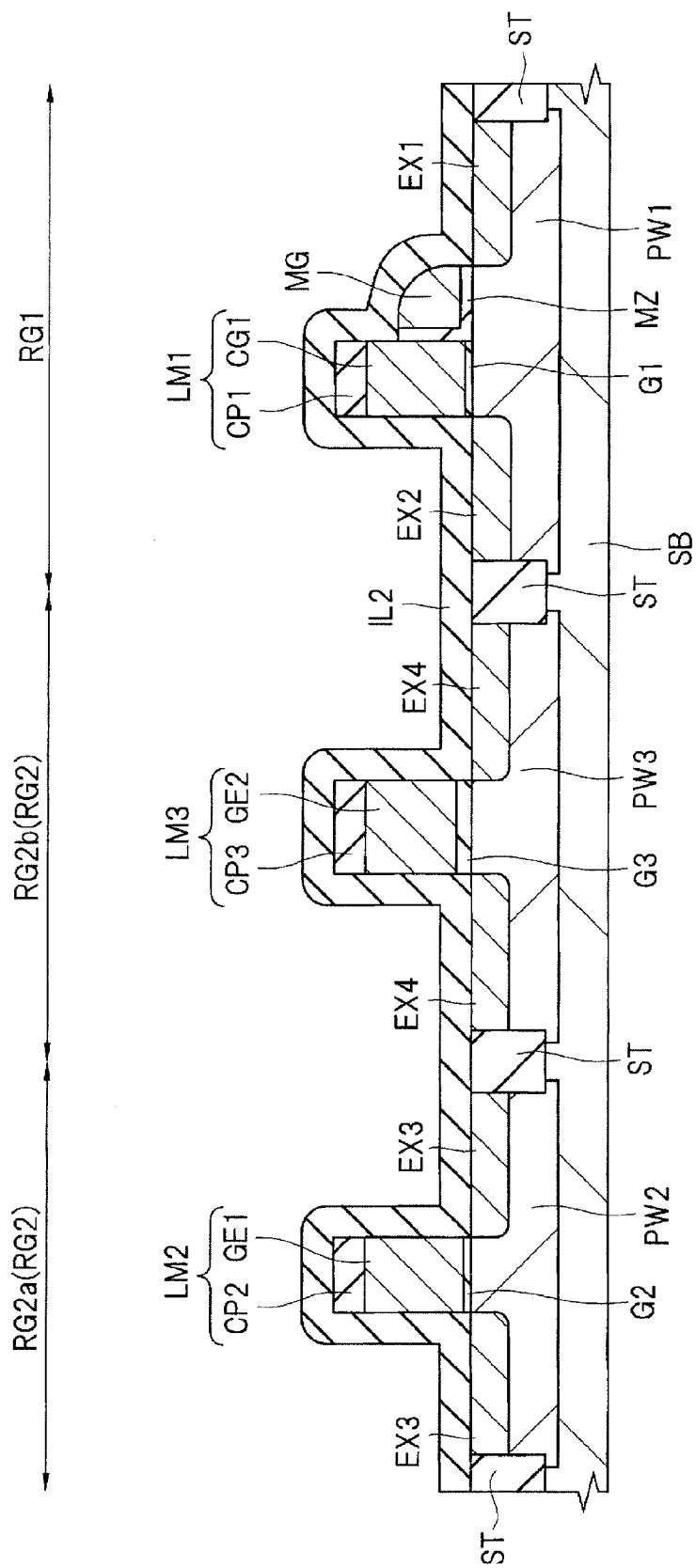
FIG. 17 is a main-portion cross-sectional view of the semiconductor device during the manufacturing process thereof, which is subsequent to FIG. 16.
Figure 18:
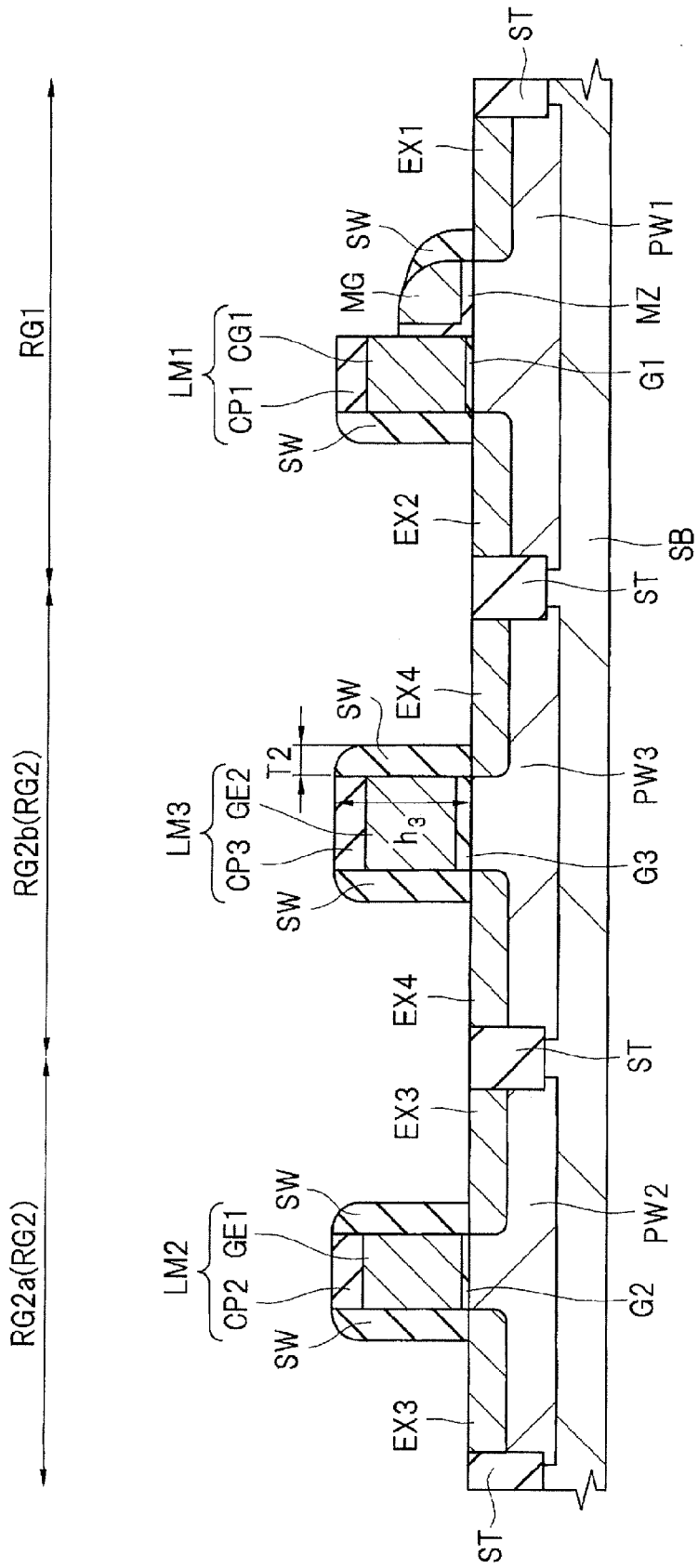
FIG. 18 is a main-portion cross-sectional view of the semiconductor device during the manufacturing process thereof, which is subsequent to FIG. 17.

For example, the step of forming the sidewall spacers SW in Step S15 can be performed as follows. That is, first, as shown in FIG. 17, over the entire main surface of the semiconductor substrate SB, the insulating film IL2 is formed (deposited). The insulating film IL2 is made of, e.g., a silicon dioxide film, a silicon nitride film, a multi-layer film thereof, or the like and can be formed using a CVD method or the like. The insulating film IL2 is formed over the semiconductor substrate SB so as to cover the memory gate electrode MG and the multi-layer bodies LM1, LM2, and LM3. Then, the insulating film IL2 is etched back (etched, dry-etched, or anisotropically etched) using an anisotropic etching technique. Thus, as shown in FIG. 18, over the respective side walls (side walls opposite to the side walls adjacent to each other via the insulating film MZ) of the multi-layer body LM1 and the memory gate electrode MG, over the side walls of the multi-layer body LM2, and over the side walls of the multi-layer body LM3, the insulating film IL2 is selectively left to form the sidewall spacers SW. The sidewall spacers SW are formed over the both side walls of the multi-layer body LM2, over the both side walls of the multi-layer body LM3, over the side wall of the multi-layer body LM1 opposite to the side wall thereof adjacent to the memory gate electrode MG via the insulating film MZ, and over the side wall of the memory gate electrode MG opposite to the side wall thereof adjacent to the multi-layer body LM1 via the insulating film MZ.

In the present embodiment, the height of the memory gate electrode MG is set lower than the height of the dummy control gate electrode CG1. Accordingly, there may be cases where the sidewall spacer SW is formed also over the memory gate electrode MG and where the sidewall spacer SW is not formed over the memory gate electrode MG. FIG. 18 shows the case where the sidewall spacer SW is not formed over the memory gate electrode MG. As a result, in the case shown in FIG. 18, the side wall of the memory gate electrode MG is covered with the sidewall spacer SW, but the upper surface of the memory gate electrode MG is not covered with the sidewall spacer SW. Note that the case where the sidewall spacer SW is formed also over the memory gate electrode MG corresponds to Embodiment 3 described later.

Figure 19:
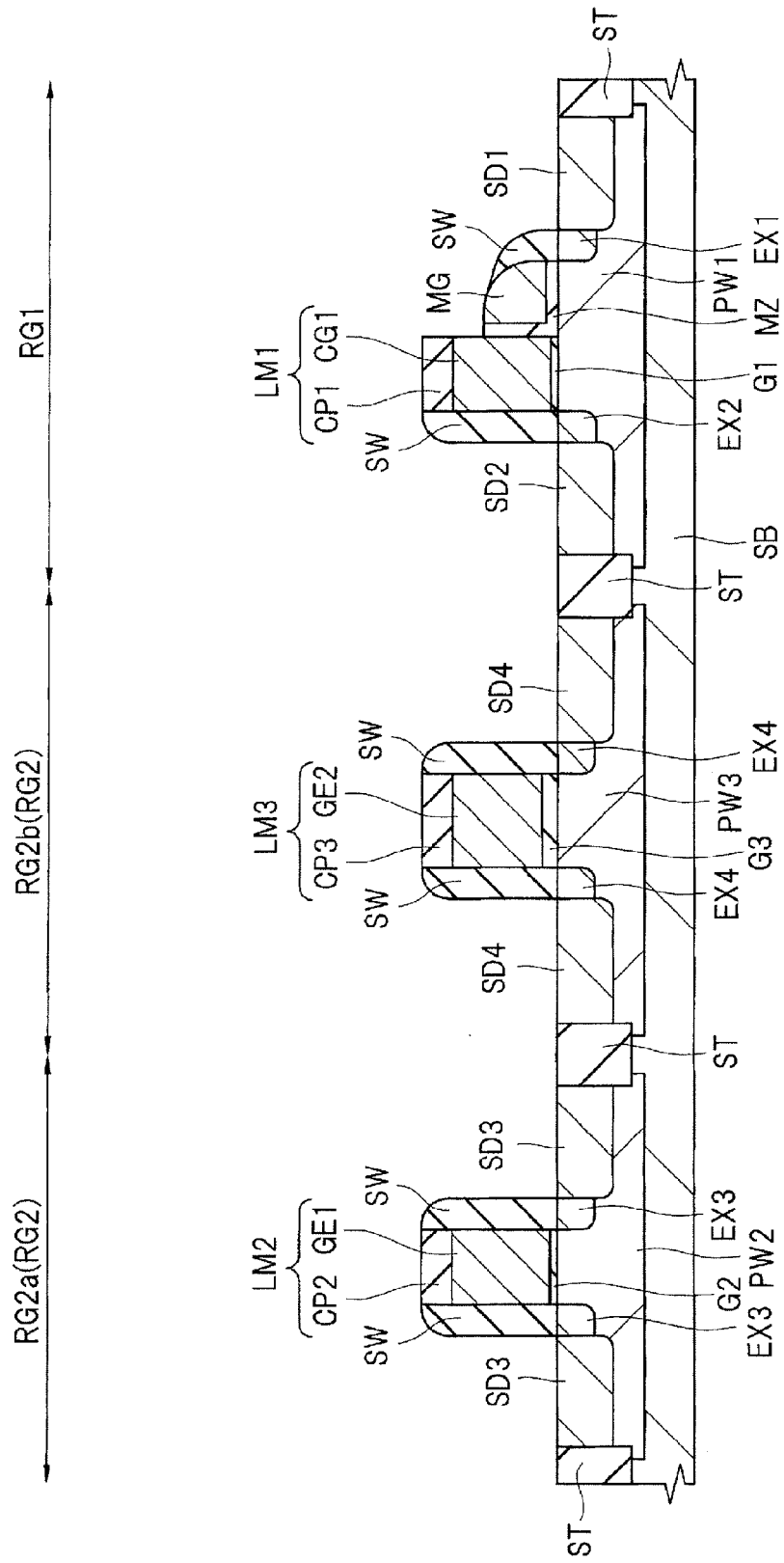
FIG. 19 is a main-portion cross-sectional view of the semiconductor device during the manufacturing process thereof, which is subsequent to FIG. 18.

Next, as shown in FIG. 19, n⁺-type semiconductor regions (impurity diffusion layers) SD1, SD2, SD3, and SD4 are formed using an ion implantation method or the like (Step S16 in FIG. 2).

In Step S16, by introducing an n-type impurity (such as, e.g., arsenic or phosphorus) into the semiconductor substrate (p-type wells PW1, PW2, and PW3) using the multi-layer body LM1, the memory gate electrode MG, the multi-layer bodies LM2 and LM3, and the sidewall spacers SW as a mask (ion implantation inhibiting mask), the n⁺-type semiconductor regions SD1, SD2, SD3, and SD4 can be formed. At this time, in the memory cell region RG1, the memory gate electrode MG and the sidewall spacer SW over the side wall of the memory gate electrode MG function as a mask (ion implantation inhibiting mask). This allows the n⁺-type semiconductor region SD1 to be formed by self-alignment with the sidewall spacer SW over the side wall of the memory gate electrode MG. Also, in the memory cell region RG1, the multi-layer body LM1 and the sidewall spacer SW over the side wall thereof function as a mask (ion implantation inhibiting mask). This allows the n⁺-type semiconductor region SD2 to be formed by self-alignment with the sidewall spacer SW over the side wall of the multi-layer body LM1. On the other hand, in the metal-gate MISFET formation region RG2a of the peripheral circuit region RG2, the multi-layer body LM2 and the sidewall spacers SW over the side walls thereof function as a mask (ion implantation inhibiting mask). This allows the n⁺-type semiconductor regions SD3 to be formed by self-alignment with the sidewall spacers SW over the both side walls of the multi-layer body LM2. In the silicon-gate MISFET formation region RG2b of the peripheral circuit region RG2, the multi-layer body LM3 and the sidewall spacers SW over the side walls thereof function as a mask (ion implantation inhibiting mask). This allows the n$^+$-type semiconductor regions SD4 to be formed by self-alignment with the sidewall spacers SW over the both side walls of the multi-layer body LM3. Thus, LDD (lightly doped Drain) structures are formed. The n$^+$-type semiconductor regions SD1, SD2, SD3, and SD4 can be formed by the same ion implantation step, but can also be formed by different ion implantation steps. It is also be possible to form the n$^+$-type semiconductor regions SD1 and SD2 by the same ion implantation and form the n$^+$-type semiconductor regions SD3 and SD4 by another ion implantation.

In this manner, the n$^-$-type semiconductor region EX1 and the n$^+$-type semiconductor region SD1 having an impurity concentration higher than that of the n$^-$-type semiconductor region EX1 form an n-type semiconductor region functioning as the source region of a memory transistor. The n$^-$-type semiconductor region EX2 and the n$^+$-type semiconductor region SD2 having an impurity concentration higher than that of the n$^-$-type semiconductor region EX2 form an n-type semiconductor region functioning as the drain region of a control transistor. The n$^-$-type semiconductor region EX3 and the n$^+$-type semiconductor region SD3 having an impurity concentration higher than that of the n$^-$-type semiconductor region EX3 form an n-type semiconductor region functioning as the source/drain region (source or drain semiconductor region) of the MISFET in the metal-gate MISFET formation region RG2$a$. The n$^-$-type semiconductor region EX4 and the n$^+$-type semiconductor region SD4 having an impurity concentration higher than that of the n$^-$-type semiconductor region EX4 form an n-type semiconductor region functioning as the source/drain region (source or drain semiconductor region) of the MISFET in the silicon-gate MISFET formation region RG2$b$. The n$^+$-type semiconductor region SD1 has an impurity concentration higher than that of the n$^-$-type semiconductor region EX1 and a junction depth deeper than that thereof. The n$^+$-type semiconductor region SD2 has an impurity concentration higher than that of the n$^-$-type semiconductor region EX2 and a junction depth deeper than that thereof. Each of the n$^+$-type semiconductor regions SD3 has an impurity concentration higher than that of each of the n$^-$-type semiconductor regions EX3 and a junction depth deeper than that thereof. Each of the n$^+$-type semiconductor regions SD4 has an impurity concentration higher than that of each of the n$^-$-type semiconductor regions EX4 and a junction depth deeper than that thereof.

Next, activation anneal as heat treatment for activating the impurities introduced into the source and drain semiconductor regions (the n$^-$-type semiconductor regions EX1, EX2, EX3, and EX4 and the n$^+$-type semiconductor regions SD1, SD2, SD3, and SD4) or the like is performed (Step S17 in FIG. 2).

Thus, in the memory cell region RG1, the memory gate electrode MG of the memory cell of the nonvolatile memory and the source/drain regions thereof have been formed. However, since the dummy control gate electrode CG1 is a dummy-type control gate electrode, a control gate electrode to be finally used (control gate electrode CG2 described later) has not been formed yet. Also, in the metal-gate MISFET formation region RG2$a$, the source/drain regions of the MISFET have been formed, but a gate electrode to be finally used (gate electrode GE3 described later) has not been formed yet. On the other hand, in the silicon-gate MISFET formation region RG2$b$, the gate electrode GE2 of the MISFET and the source/drain regions thereof have been formed.

Next, metal silicide layers SL are formed (Step S18 in FIG. 2).

The metal silicide layers SL can be formed by performing a so-called salicide (Self Aligned Silicide) process. Specifically, the metal silicide layers SL can be formed as follows.

Figure 20:
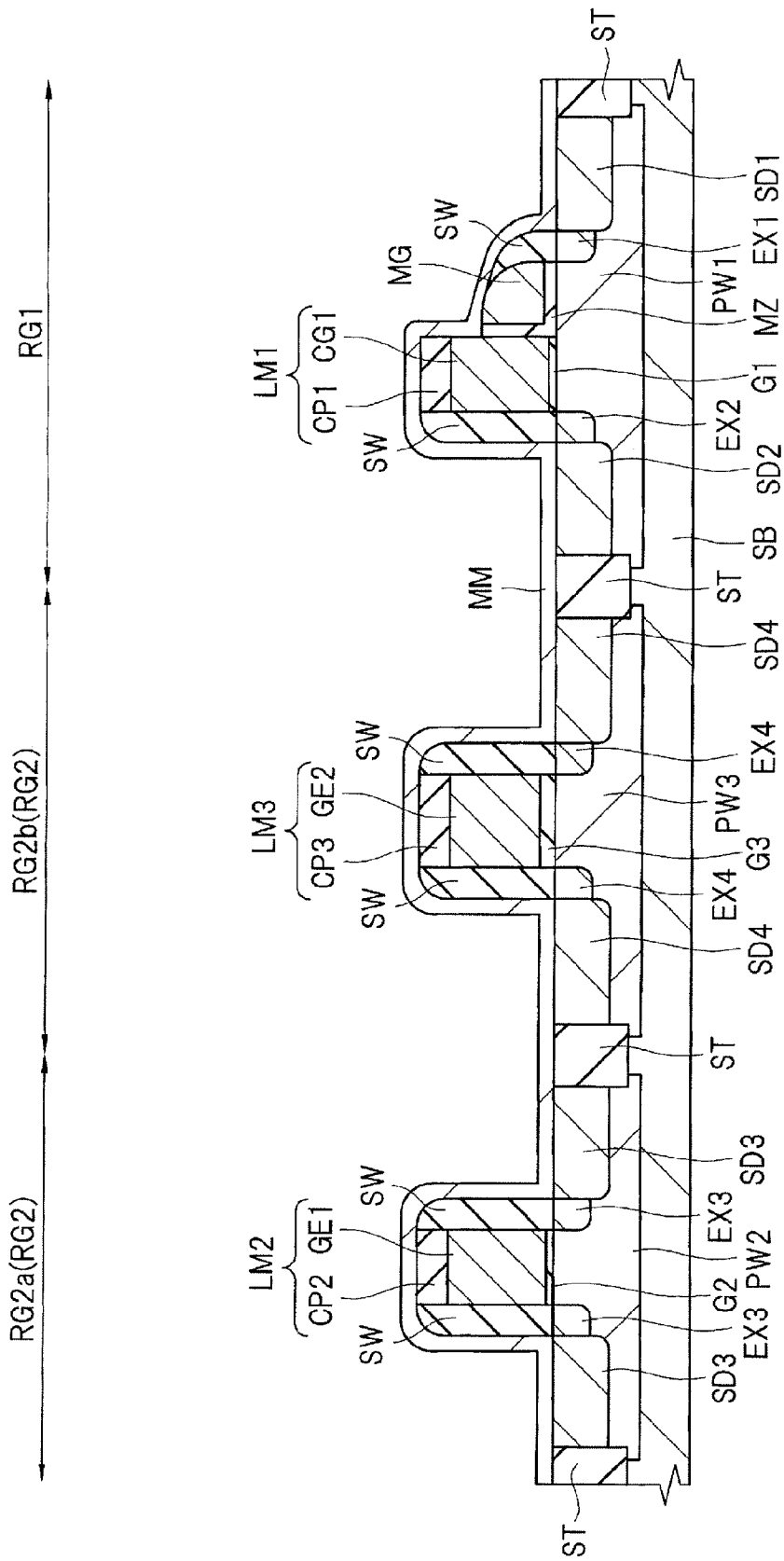
FIG. 20 is a main-portion cross-sectional view of the semiconductor device during the manufacturing process thereof, which is subsequent to FIG. 19.
Figure 21:
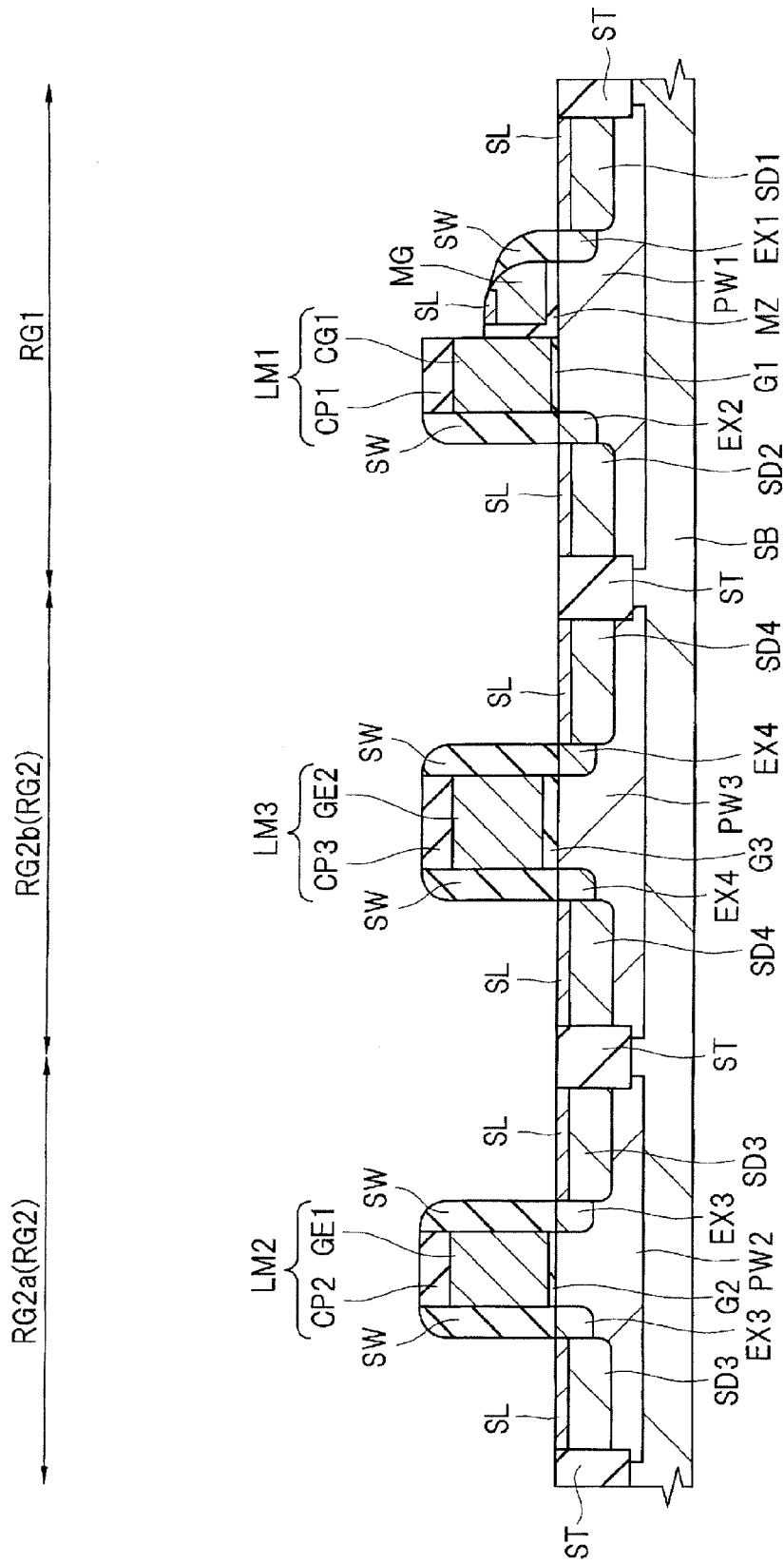
FIG. 21 is a main-portion cross-sectional view of the semiconductor device during the manufacturing process thereof, which is subsequent to FIG. 20.

That is, first, as shown in FIG. 20, over the entire main surface of the semiconductor substrate SB including the upper surfaces (top surfaces) of the n$^+$-type semiconductor regions SD1, SD2, SD3, and SD4, a metal film MM for forming the metal silicide layers SL is formed (deposited) so as to cover the multi-layer body LM1, the memory gate electrode MG, the multi-layer bodies LM2 and LM3, and the sidewall spacers SW. As the metal film MM for forming the metal silicide layers SL, a single-element metal film (pure metal film) or an alloy film can be used. For example, the metal film MM is made of a cobalt (Co) film, a nickel (Ni) film, or a nickel-platinum alloy film and can be formed using a sputtering method or the like. Then, heat treatment (heat treatment for forming the metal silicide layers SL) is performed on the semiconductor substrate SB to cause the respective upper-layer portions (surface layer portions) of the n$^+$-type semiconductor regions SD1, SD2, SD3, and SD4 to react with the metal film MM for forming the metal silicide layers SL. Thus, as shown in FIG. 21, in the respective upper portions (upper surfaces, top surfaces, or upper-layer portions) of the n$^+$-type semiconductor regions SD1, SD2, SD3, and SD4, the respective metal silicide layers SL are formed. Thereafter, the unreacted metal film (metal film for forming the metal silicide layers SL) is removed by wet etching or the like. FIG. 21 shows a cross-sectional view at this stage. After the removal of the unreacted metal film (metal film for forming the metal silicide layers SL), heat treatment can also be further performed.

Each of the metal silicide layers SL can be, e.g., a cobalt silicide layer (when the metal film MM for forming the metal silicide layers SL is a cobalt film), a nickel silicide layer (when the metal film MM for forming the metal silicide layers SL is a nickel film), or a nickel-platinum silicide layer (when the metal film MM for forming the metal silicide layers SL is a nickel-platinum alloy film).

By thus performing a so-called salicide process, the metal silicide layers SL are formed in the upper portions of the n$^+$-type semiconductor regions SD1, SD2, SD3, and SD4. This can reduce the resistance of the source/drain. By using the salicide process, the respective metal silicide layers SL can be formed by self-alignment over the n$^+$-type semiconductor regions SD1, SD2, SD3, and SD4.

In the case where the sidewall spacer SW is not formed over the memory gate electrode MG as shown in FIG. 18 described above, in Step S18, the metal silicide layer SL can be formed also in the upper portion of the memory gate electrode MG, as shown in FIG. 21. This is because, in the case where the sidewall spacer SW is not formed over the memory gate electrode MG, the heat treatment for forming the metal silicide layers SL is performed in the state where the upper surface of the portion of the memory gate electrode MG uncovered with the sidewall spacer SW is in contact with the metal film MM for forming the metal silicide layers SL. Consequently, the metal silicide layer SL is formed also in the upper portion of the memory gate electrode MG. This allows the metal silicide layers SL to be formed by self-alignment not only in the upper portions of the n$^+$-type semiconductor regions SD1, SD2, SD3, and SD4, but also in the upper portion of the memory gate electrode MG. By forming the metal silicide layer SL in the upper portion of the memory gate electrode MG, the resistance of the memory gate electrode MG can be reduced. On the other hand, the dummy gate electrode GE1 and the gate electrode GE2 are covered with the cap insulating films CP2 and CP3 and the sidewall spacers SW. Accordingly, it is possible to prevent the metal silicide layer SL from being formed in the upper surface of each of the dummy gate electrode GE1 and the gate electrode GE2. More preferably, the metal silicide layer SL is not formed in the top surface of the dummy control gate electrode CG1. This allows the dummy control gate electrode CG1 to be easily and reliably removed later.

Figure 22:
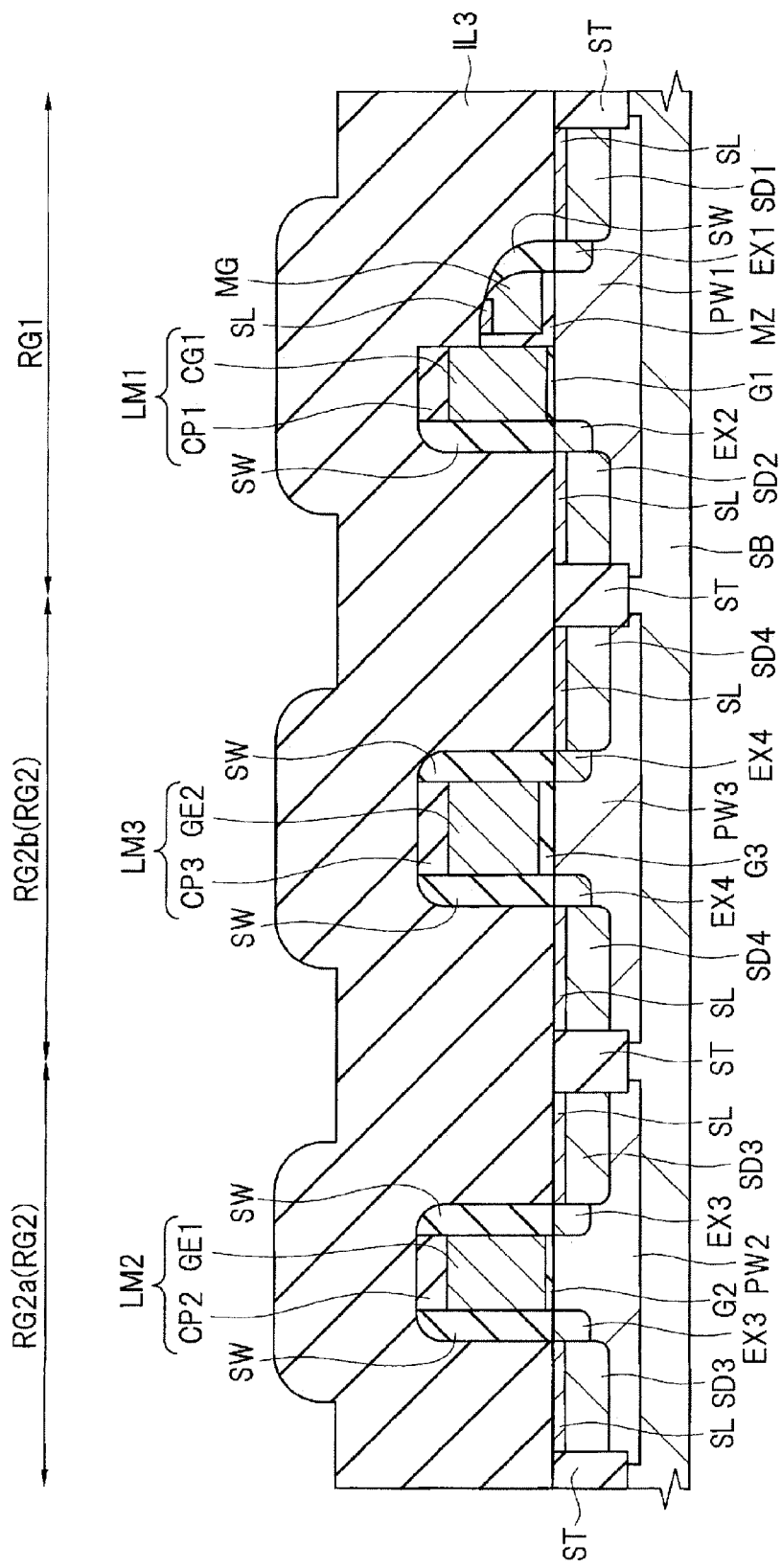
FIG. 22 is a main-portion cross-sectional view of the semiconductor device during the manufacturing process thereof, which is subsequent to FIG. 21.

Next, as shown in FIG. 22, over the entire main surface of the semiconductor substrate SB, an insulating film (interlayer insulating film) IL3 is formed (deposited) as an interlayer insulating film so as to cover the multi-layer body LM1, the memory gate electrode MG, the multi-layer bodies LM2 and LM3, and the sidewall spacers SW (Step S19 in FIG. 2).

The insulating film IL3 is made of a single-layer silicon dioxide film, a multi-layer film including a silicon nitride film, and a silicon dioxide film formed over the silicon nitride film to be thicker than the silicon nitride film, or the like. The insulating film IL3 can be formed using, e.g., a CVD method or the like.

In Step S19, the insulating film IL3 is formed so as to cover the multi-layer body LM1, the memory gate electrode MG, the multi-layer bodies LM2 and LM3, and the sidewall spacers SW. Consequently, the insulating film IL3 is formed so as to cover the dummy control gate electrode CG1, the memory gate electrode MG, the dummy gate electrode GE1, the gate electrode GE2, the cap insulating films CP1, CP2, and CP3, and the sidewall spacers SW.

Figure 23:
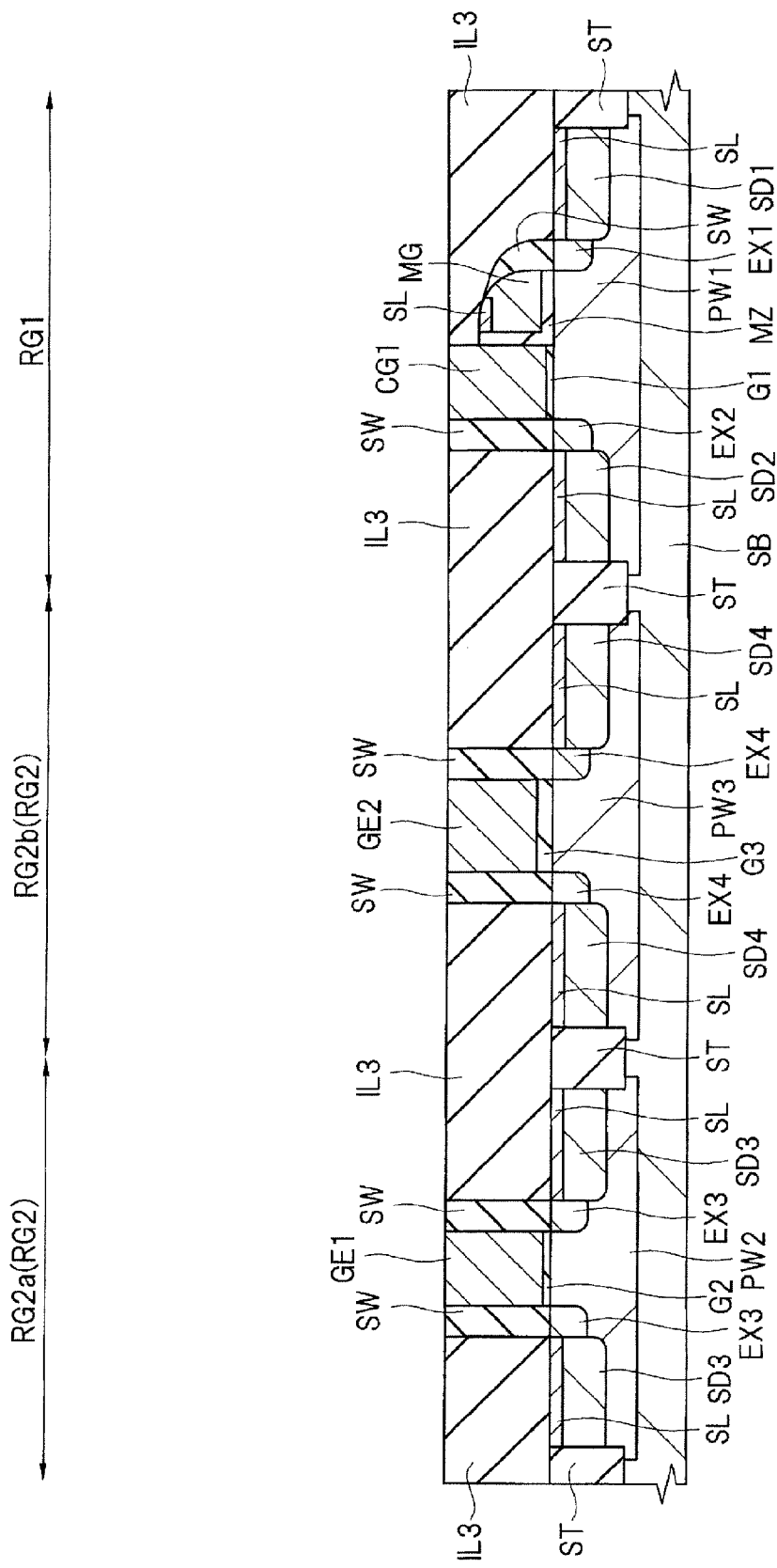
FIG. 23 is a main-portion cross-sectional view of the semiconductor device during the manufacturing process thereof, which is subsequent to FIG. 22.

Next, the upper surface of the insulating film IL3 is polished using a CMP (Chemical Mechanical Polishing) method or the like (Step S20 in FIG. 2). By the polishing step in Step S20, as shown in FIG. 23, the respective upper surfaces of the dummy control gate electrode CG1, the dummy gate electrode GE1, and the gate electrode GE2 are exposed. That is, in the polishing step in Step S20, the insulating film IL3 is polished until the respective upper surfaces of the dummy control gate electrode GG1, the dummy gate electrode GE1, and the gate electrode GE2 are exposed. However, in the polishing step in S20, polishing is stopped before the memory gate electrode MG is exposed to prevent the memory gate electrode MG from being exposed.

Note that, at the stage where the insulating film IL3 has been deposited in Step S19, the upper surface of the insulating film IL3 may be formed with roughness or a level difference reflecting the multi-layer body LM1, the memory gate electrode MG, the multi-layer bodies LM2 and LM3, the sidewall spacers SW, and the like, as shown in FIG. 22. However, after the polishing step in Step S20, the upper surface of the insulating film IL3 has been planarized, as shown in FIG. 23.

In Step S19, the insulating film IL3 is formed in the state where the cap insulating film CP1 is formed over the dummy control gate electrode CG1, the cap insulating film CP2 is formed over the dummy gate electrode GE1, and the cap insulating film CP3 is formed over the gate electrode GE2. Then, the polishing step in Step S20 is performed. Accordingly, in the polishing step in Step S20, the insulating film IL3 is polished first until the respective upper surfaces of the cap insulating films CP1, CP2, and CP3 are exposed. Then, by further performing polishing, as shown in FIG. 23, the respective upper surfaces of the dummy control gate electrode CG1, the dummy gate electrode GE1, and the gate electrode GE2 are exposed. By the polishing after the respective upper surfaces of the cap insulating films CP1, CP2, and CP3 are exposed, not only the insulating film IL3, but also the respective upper portions of the cap insulating film CP1 over the dummy control gate electrode CG1, the cap insulating film CP2 over the dummy gate electrode GE1, the cap insulating film CP3 over the gate electrode GE2, and the sidewall spacers SW are polished.

In the present embodiment, when the silicon film PS2 is etched back in Step S10 described above, the height ($h_2$) of the memory gate electrode MG is controlled to be lower than the height ($h_1$) of the dummy control gate electrode CG1. Each of the dummy control gate electrode CG1, the dummy gate electrode GE1, and the gate electrode GE2 is formed of the patterned silicon film PS1. The respective heights of the dummy control gate electrode CG1, the dummy gate electrode GE1, and the gate electrode GE2 are approximately the same. Consequently, at the stage before the polishing step in Step S20 is performed, the height of the memory gate electrode MG is lower than the respective heights of the dummy control gate electrode CG1, the dummy gate electrode GE1, and the gate electrode GE2.

Accordingly, if the polishing treatment is continued in Step S20 even after the respective upper surfaces of the dummy control gate electrode CG1, the dummy gate electrode GE1, and the gate electrode GE2 are exposed, the upper surface of the memory gate electrode MG will be eventually exposed. However, in the present embodiment, after the respective upper surfaces of the dummy control gate electrode CG1, the dummy gate electrode GE1, and the gate electrode GE2 are exposed in Step S20, at the stage before the memory gate electrode MG is exposed, the polishing treatment is stopped (ended). As a result, the memory gate electrode MG retains the state covered with the sidewall spacer SW and the insulating film IL3. Even after Step S20 is ended, the memory gate electrode MG is not exposed. Thus, the state can be obtained where the respective upper surfaces of the dummy control gate electrode CG1, the dummy gate electrode GE1, and the gate electrode GE2 are exposed, but the memory gate electrode MGE is not exposed.

If the metal silicide layers SL are not formed in the respective top surfaces of the dummy control gate electrode CG1, the dummy gate electrode GE1, and the gate electrode GE2, the metal silicide layers SL need not be polished when the dummy control gate electrode CG1, the dummy gate electrode GE1, and the gate electrode GE2 are exposed in the polishing step in Step S20. This allows the polishing step in Step S20 to be more easily performed.

In another embodiment, the polishing step in Step S20 can also be performed by combining polishing treatment such as CMP with dry etching or wet etching.

In the present embodiment, the cap insulating film CP1 is formed over the dummy control gate electrode CG1, the cap insulating film CP2 is formed over the dummy gate electrode GE1, and the cap insulating film CP3 is formed over the gate electrode GE2. In another embodiment, the formation of the cap insulating films CP1, CP2, and CP3 can also be omitted. In that case, the step of forming the insulating film IL1 in Step S6 described above may be omitted appropriately. In the case where the formation of the cap insulating films CP1, CP2, and CP3 is omitted, by polishing the insulating film IL3 in Step S20, the dummy control gate electrode CG1, the dummy gate electrode GE1, and the gate electrode GE2 are exposed, while the memory gate electrode MG is not exposed.

However, in the case where the cap insulating films CP1, CP2, and CP3 are formed as in the present embodiment, the cap insulating films CP1, CP2, and CP3 can function to prevent the metal silicide layer SL from being formed in the underlay of each of the cap insulating films CP1, CP2, and CP3. Thus, in the case where the cap insulating films CP1, CP2, and CP3 are formed, it is possible to prevent the metal silicide layers SL from being polished in Step S20. This allows polishing treatment to be easily performed in Step S20 and allows the dummy control gate electrode CG1 and the dummy gate electrode GE1 to be easily removed in Step S21 described later.

Next, the dummy control gate electrode CG1 and the dummy gate electrode GE1 are etched and removed (Step S21 in FIG. 3).

Figure 24:
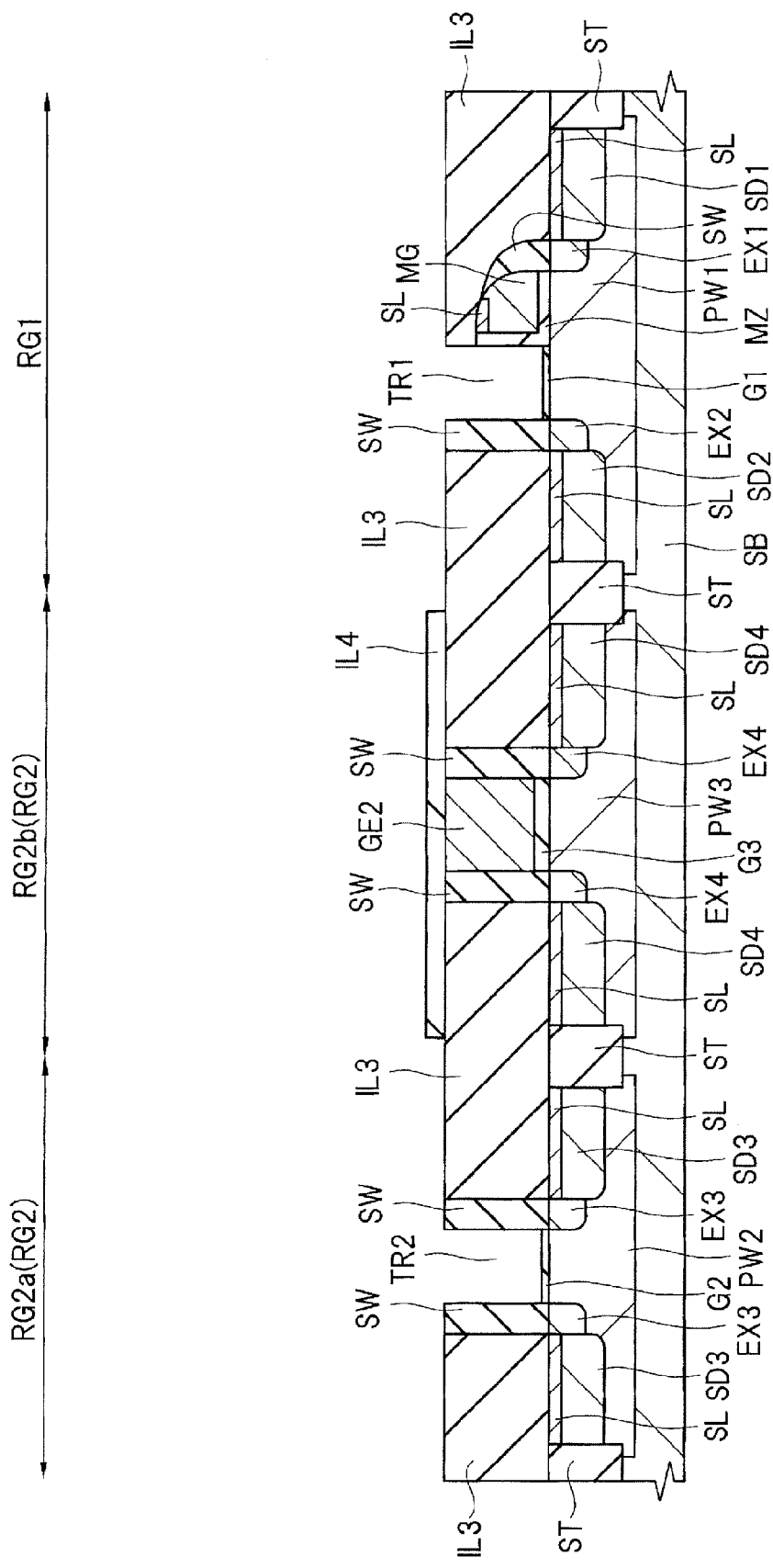
FIG. 24 is a main-portion cross-sectional view of the semiconductor device during the manufacturing process thereof, which is subsequent to FIG. 23.

For example, Step S21 can be performed as follows. That is, first, as shown in FIG. 24, an insulating film (mask layer) IL4 which covers the gate electrode GE2 and uncovers and exposes the dummy control gate electrode CG1 and the dummy gate electrode GE1 is formed over the insulating film IL3. The insulating film IL4 can be formed by, e.g., forming an insulating film (insulating film for forming the insulating film IL4) over the semiconductor substrate SB, i.e., over the insulating film IL3 so as to cover the dummy control gate electrode CG1, the dummy gate electrode GE1, and the gate electrode GE2 and then patterning the insulating film using a photolithographic technique and an etching technique. By the polishing step in Step S20, the dummy control gate electrode CG1, the dummy gate electrode GE1, and the gate electrode GE2 have been exposed. However, when the insulating film IL4 is formed, the respective upper surfaces of the dummy control gate electrode CG1 and the dummy gate electrode BG1 are brought into a state uncovered with the insulating film IL4 and exposed, while the gate electrode GE2 is brought into a state covered with the insulating film IL4 and unexposed. Accordingly, the insulating film IL4 can be regarded as a mask layer which covers the gate electrode GE2 and exposes the dummy control gate electrode CG1 and the dummy gate electrode GE1. On the other hand, before and after the formation of the insulating film IL4, the memory gate electrode MG retains an unexposed state. Then, the dummy control gate electrode CG1 and the dummy gate electrode GE1 are etched and removed. This stage is shown in FIG. 24. As the etching in Step S21, dry etching, wet etching, or a combination of dry etching and wet etching can be used.

Note that, when the etching or etching step in Step S21 is mentioned, it refers to the etching performed to selectively remove the dummy control gate electrode CG1 and the dummy gate electrode GE1 after the insulating film IL4 is formed as the mask layer, not to the etching performed when the insulating film IL4 is formed (patterned).

As a result of the removal of the dummy control gate electrode CG1 and the dummy gate electrode GE1 in Step S21, trenches (depressed portions or recessed portions) TR1 and TR2 are formed. The trench TE1 corresponds to a region resulting from the removal of the dummy control gate electrode CG1 where the dummy control gate electrode CG1 had been present until the removal thereof. The trench TR2 corresponds to a region resulting from the removal of the dummy gate electrode GE1 where the dummy gate electrode GE1 had been present until the removal thereof. The bottom surface of the trench TR1 is formed of the upper surface of the insulating film G1. One of the side walls (side surfaces) of the trench TR1 is formed of the side surface (side surface that had been in contact with the dummy control gate electrode CG1 until the removal thereof) of the sidewall spacer SW. The other side wall (side surface) of the trench TR1 is formed of the bottom surface (surface that had been in contact with the dummy control gate electrode CG1 until the removal thereof) of the insulating film MZ and the side surface of the insulating film IL3. Here, the bottom surface of the insulating film MZ corresponds to the surface of the silicon dioxide film MZ1 forming the insulating film MZ (lowermost layer of the insulating film MZ) opposite to the surface thereof in contact with the silicon nitride film MZ2. The bottom surface of the trench TR2 is formed of the upper surface of the insulating film G2. The side wall (side surface) of the trench TR2 is formed of the side surface (side surface that had been in contact with the dummy gate electrode GE1 until the removal thereof) of the sidewall spacer SW.

In the etching step in Step S21 (step of etching the dummy control gate electrode CG1 and the dummy gate electrode GE1), etching is preferably performed under conditions under which the insulating films IL3 and IL4, the insulating films G1 and G2, the silicon dioxide film MZ1 (lowermost layer of the insulating film MZ), and the sidewall spacers SW are less likely to be etched than the dummy control gate electrode CG1 and the dummy gate electrode GE1. That is, the dummy control gate electrode CG1 and the dummy gate electrode GE1 are preferably etched under conditions under which the speed of etching the insulating films IL3 and IL4, the insulating films G1 and G2, the silicon dioxide film MZ1 (lowermost layer of the insulating film MZ), and the sidewall spacers SW is lower than the speed of etching the dummy control gate electrode CG1 and the dummy gate electrode GE1. This allows the dummy control gate electrode CG1 and the dummy gate electrode GE1 to be selectively etched in the etching step in Step S21 (step of etching the dummy control gate electrode CG1 and the dummy gate electrode GE1).

By forming each of the dummy control gate electrode CG1 and the dummy gate electrode GE1 of silicon (polysilicon), in the etching step in Step S21, it is easier to ensure a high etching selectivity between the dummy control gate electrode CG1 and the dummy gate electrode GE1. This allows selective removal of the dummy control gate electrode CG1 and the dummy gate electrode GE1 to be easily and properly performed in the etching step in Step S21.

In the etching step in Step S21 (step of etching the dummy control gate electrode CG1 and the dummy gate electrode GE1), the gate electrode GE2 and the memory gate electrode MG, which are not exposed, are kept from being etched. As a result, in Step S21, the dummy control gate electrode CG1 and the dummy gate electrode GE1 are etched and removed, while the gate electrode GE2 and the memory gate electrode MG remain without being etched.

More preferably, the insulating film IL4 is formed of an insulating material different from the insulating material forming the insulating film IL3. This allows easier formation of the insulating film IL4 having an intended two-dimensional shape. For example, when the insulating film IL3 is formed of a silicon dioxide film, the insulating film IL4 can be formed of a silicon nitride film.

Figure 25:
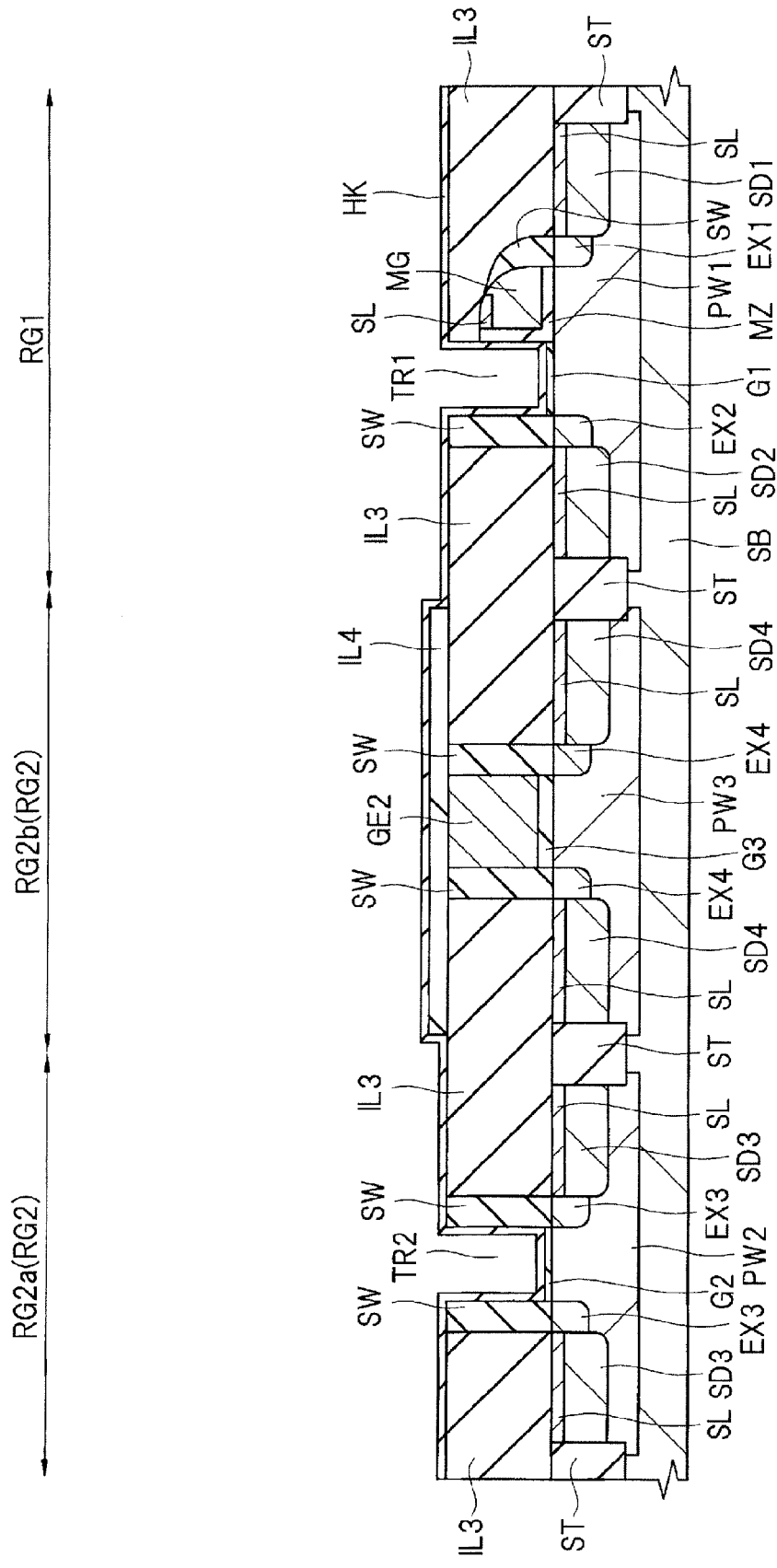
FIG. 25 is a main-portion cross-sectional view of the semiconductor device during the manufacturing process thereof, which is subsequent to FIG. 24.
Figure 26:
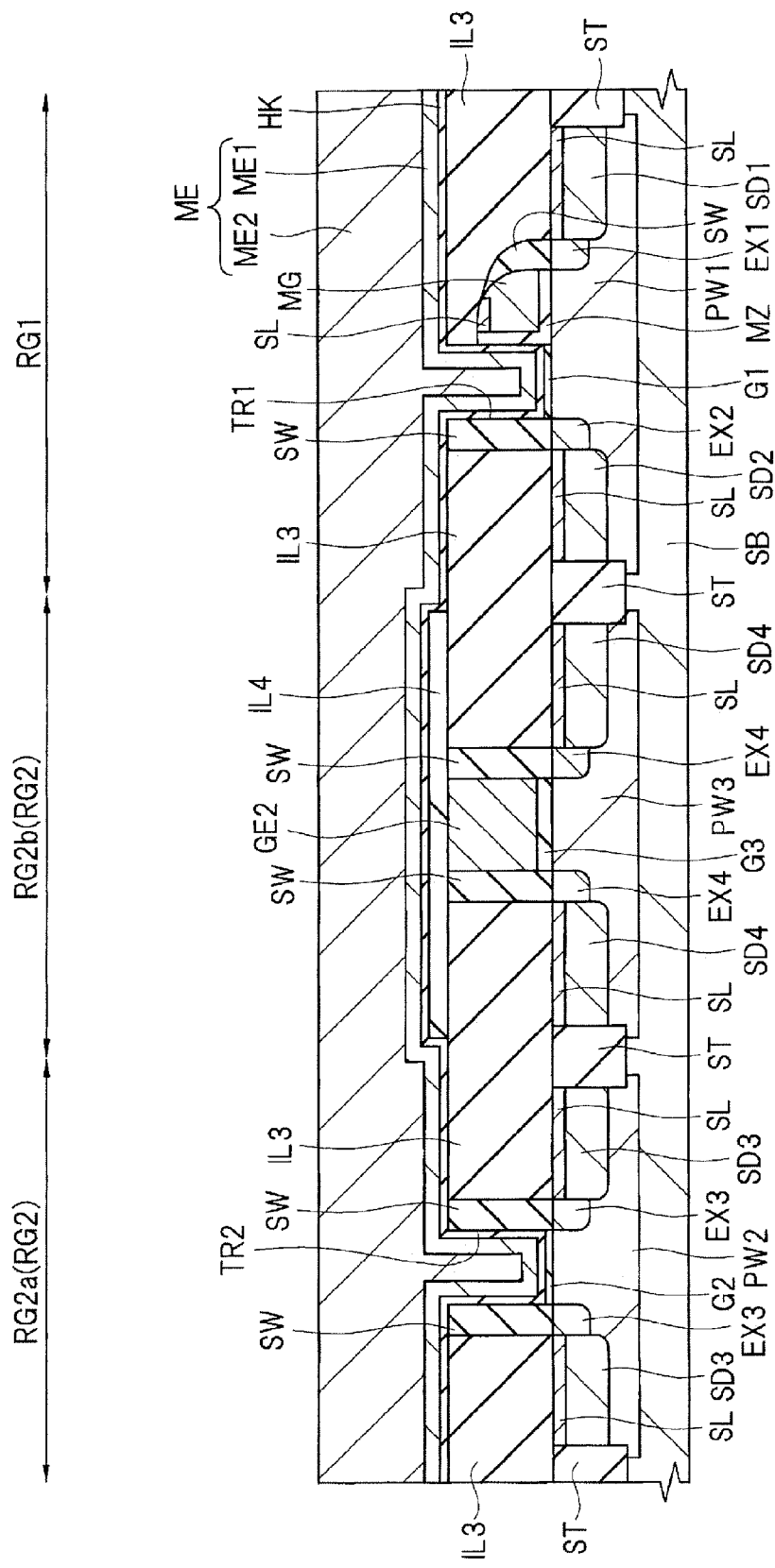
FIG. 26 is a main-portion cross-sectional view of the semiconductor device during the manufacturing process thereof, which is subsequent to FIG. 25.

Next, as shown in FIG. 25, over the semiconductor substrate SB, i.e., over the insulating films IL3 and IL4 including the inner surfaces (bottom surfaces and side walls) of the trenches TR1 and TR2, an insulating film HK is formed (Step S22 in FIG. 3). Then, as shown in FIG. 26, over the semiconductor substrate SB, i.e., over the insulating film HK, a metal film (conductive film) ME is formed as a conductive film for the gate electrodes so as to fill the trenches TR1 and TR2 (Step S23 in FIG. 3).

In Step S22, the insulating film HK is formed over the bottom surface and the side walls (side surfaces) of the trench TR1, but the trench TR1 is not completely filled with the insulating film HK. By forming the metal film ME in Step S23, the state is reached where the trench TR1 is completely filled with the insulating film HK and the metal film ME. Likewise, the insulating film HK is formed over the bottom surface and the side walls (side surfaces) of the trench TR2 in Step S22, while the trench TR2 is not completely filled with the insulating film HK. By forming the metal film ME in Step S23, the state is reached where the trench TR2 is completely filled with the insulating film HK and the metal film ME.

The insulating film HK is an insulating film for the gate insulating films. The metal film ME is a conductive film for the gate electrodes. Specifically, the insulating film HK serves as each of an insulating film for the gate insulating film of the MISFET formed in the metal-gate MISFET formation region RG2a and an insulating film for the gate insulating film of the control transistor formed in the memory cell region RG1. Also, the metal film ME serves as each of a conductive film for the gate electrode of the MISFET formed in the metal-gate MISFET formation region RG2a and a conductive film for the gate electrode of the control transistor formed in the memory cell region RG1.

The insulating film HK1 is an insulating material film having a dielectric constant (relative permittivity) higher than that of silicon nitride, which is a so-called High-k film (high-dielectric-constant film). Note that, when the High-k film, the high-dielectric-constant film, a high-dielectric-constant insulating film, or a high-dielectric-constant gate insulating film is mentioned in the present application, it means a film having a dielectric constant (relative permittivity) higher than that of silicon nitride.

As the insulating film HK, a metal oxide film such as a hafnium oxide film, a zirconium oxide film, an aluminum oxide film, a tantalum oxide film, or a lanthanum oxide film can be used. Such a metal oxide film can further contain one or both of nitrogen (N) and silicon (Si). The insulating film HK can be formed by, e.g., an ALD (Atomic layer Deposition) method or a CVD method. In the case where a high-dielectric-constant film (which is the insulating film HK) is used as a gate insulating film, the physical film thickness of the gate insulating film can be increased compared to the case where the silicon dioxide film is used. This allows the advantage of being able to reduce a leakage current to be obtained.

As the metal film ME, a metal film such as, e.g., a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide nitride (TaCN) film, a titanium (Ti) film, a tantalum (Ta) film, a titanium aluminum (TiAl) film, or an aluminum (Al) film can be used. Note that the metal films mentioned herein are conductive films each showing metal conduction and assumedly include not only a single-element metal film (pure metal film) and an alloy film, but also a metal compound film (such as a metal nitride film or a metal carbide film) showing metal conduction. Accordingly, the metal film ME is a conductive film showing metal conduction, which is not limited to a single-element metal film (pure metal film) and an alloy film and may also be a metal compound film (such as a metal nitride film or a metal carbide film) showing metal conduction. The metal film ME can also be a multi-layer film (multi-layer film in which a plurality of films are stacked). In that case, a metal film (conductive film showing metal conduction) is provided in the lowermost layer of the multi-layer film. The multi-layer film can also include a plurality of metal films (conductive films each showing metal conduction). The metal film ME can be formed using, e.g., a sputtering method or the like.

FIG. 26 shows the case where, as a preferred example of the metal film ME, the metal film ME is provided as a multi-layer film including a titanium nitride (TiN) film ME1, and an aluminum (Al) film ME2 over the titanium nitride film ME1. In this case, in Step S23, the titanium nitride film ME1 is formed first over the insulating film HK, and then the aluminum film ME2 is formed over the titanium nitride film ME1 so as to fill the trenches TR1 and TR2. At this time, the aluminum film ME2 is preferably formed to be thicker than the titanium nitride film ME1. Since the aluminum film ME2 has a low resistance, it is possible to reduce the respective resistances of the gate electrode GE3 and the control gate electrode CG2 each formed later. It is possible to control the threshold voltage of each of the MISFETs including the gate electrodes (GE3 and CG2) using the work function of the material of the portion (which is the titanium nitride film ME1 herein) of each of the gate electrode GE3 and the control gate electrode CG2 each formed later which are in contact with the gate insulating film.

Figure 27:
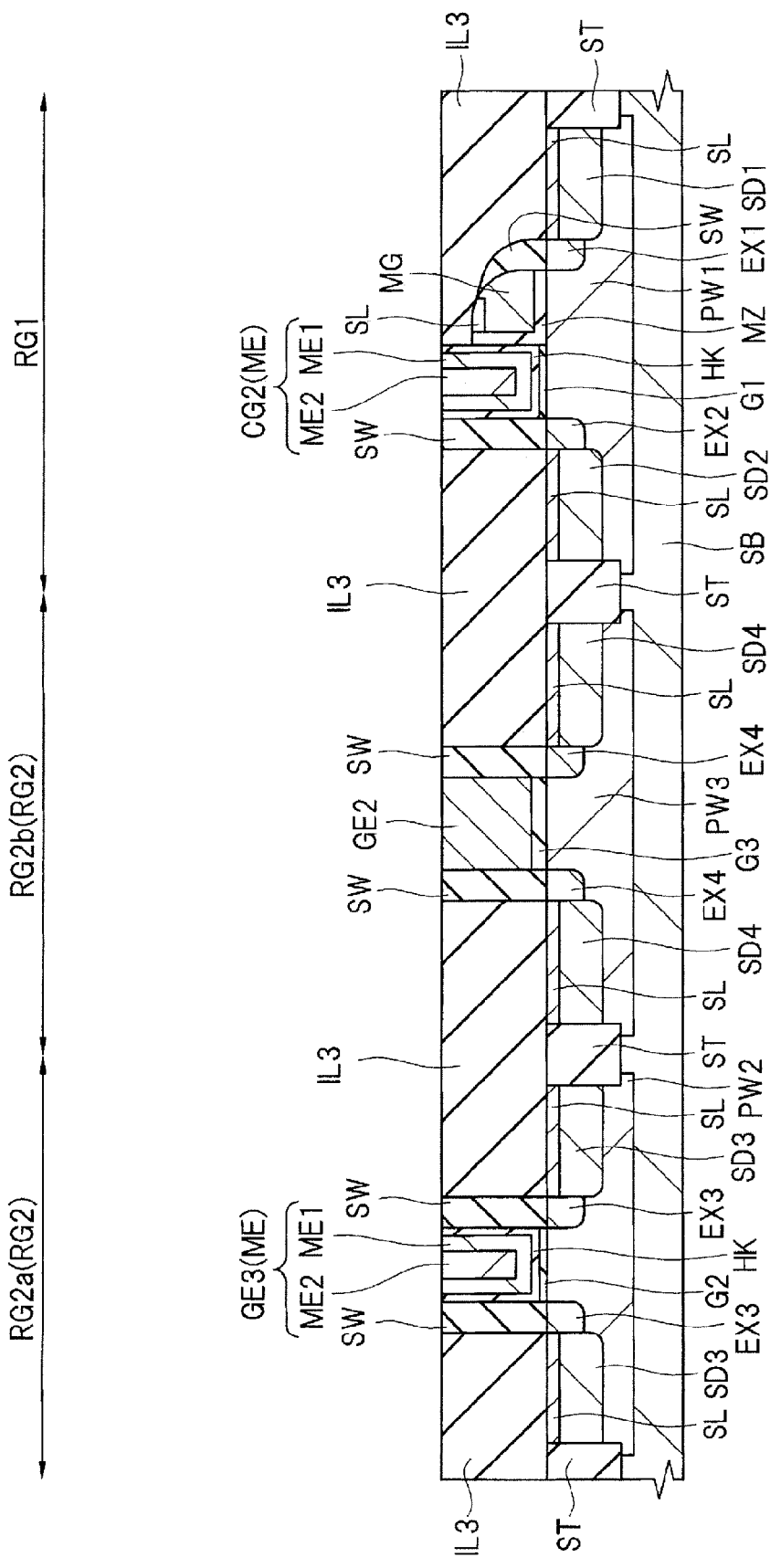
FIG. 27 is a main-portion cross-sectional view of the semiconductor device during the manufacturing process thereof, which is subsequent to FIG. 26.

Next, as shown in FIG. 27, by removing the respective unneeded portions of the metal film ME and the insulating film HK which are located outside the trenches TR1 and TR2 by a CMP method or the like, the insulating film HK and the metal film ME are embedded in the trenches TR1 and TR2 (Step S24 in FIG. 3).

That is, in Step S24, the portions of the metal film ME and the insulating film HK which are located outside the trenches TR1 and TR2 are removed, while the insulating film HK and the metal film ME are left in the trenches TR1 and TR2. This provides the state where the insulating film HK and the metal film ME are left and embedded in the trenches TR1 and TR2. That is, the state is provided where the metal film ME is embedded in each of the trenches TR1 and TR2 via the insulating film HK. It is preferable that, in Step S24, by polishing the metal film ME and the insulating film HK by polishing treatment such as a CMP method, the portions of the metal film ME and the insulating film HK which are located outside the trenches TR1 and TR2 are removed.

The metal film ME embedded in the trench TR1 serves as the control gate electrode CG2 as the gate electrode of the control transistor. The insulating film HK embedded in the trench TR1 functions as the gate insulating film of the control transistor. That is, by embedding the metal film ME into the trench TR1 via the insulating film HK, the control gate electrode CG2 is formed. On the other hand, the metal film ME embedded in the trench TR2 serves as the gate electrode GE3 of the MISFET. The insulating film HK embedded in the trench TR2 functions as the gate insulating film of the MISFET. That is, by embedding the metal film ME into the trench TR2 via the insulating film HK, the gate electrode GE3 is formed.

Thus, in the trench TR1 as the region resulting from the removal of the dummy control gate electrode CG1 in Step S21, the control gate electrode CG2 is formed by Steps S23 and S24. More specifically, in the trench TE1 as the region resulting from the removal of the dummy control gate electrode CG1 in Step S21, the control gate electrode CG2 is formed via the insulating film HK as a high-dielectric-constant insulating film by Steps S22, S23, and S24. The control gate electrode CG2 is a gate electrode for the memory cell, and is more specifically a gate electrode for the control transistor of the memory cell. The control gate electrode CG2 is a metal gate electrode. On the other hand, in the trench TR2 as the region resulting from the removal of the dummy gate electrode GE1 in Step S21, the gate electrode GE3 is formed by Steps S23 and S24. More specifically, in the trench TR2 as the region resulting from the removal of the dummy gate electrode GE1 in Step S21, the gate electrode GE3 is formed via the insulating film HK as the high-dielectric-constant insulating film by Steps S22, S23, and S24. The gate electrode GE3 is a gate electrode for the MISFET of the peripheral circuit (i.e., for the MISFET other than that of the memory cell). The gate electrode GE3 is a metal gate electrode.

In the present embodiment, the dummy control gate electrode CG1 is removed and replaced with the control gate electrode CG2. The control gate electrode CG2 is used as the gate electrode of the control transistor in the memory cell region RG1. Accordingly, the foregoing dummy control gate electrode CG1 is a dummy-type gate electrode (pseudo gate electrode) and can be regarded as a replacement gate electrode or a gate electrode to be replaced, while the control gate electrode CG2 can be regarded as the gate electrode forming the control transistor.

Also, in the present embodiment, the dummy gate electrode GE1 is removed and replaced with the gate electrode GE3. The gate electrode GE3 is used as the gate electrode of the MISFET in the metal-gate MISFET formation region RG2a. Accordingly, the foregoing dummy gate electrode GE1 is a dummy-type gate electrode (pseudo gate electrode) and can be regarded as a replacement gate electrode or a gate electrode to be replaced, while the gate electrode GE3 can be regarded as the gate electrode forming the MISFET.

In the present embodiment, the metal film ME is used to form the control gate electrode CG2 and the gate electrode GE3. This allows each of the control gate electrode CG2 and the gate electrode GE3 to be formed as a metal gate electrode. By forming each of the control gate electrode CG2 and the gate electrode GE3 as a metal gate electrode, it is possible to obtain the advantage of being able to suppress the phenomenon of depletion of the control gate electrode CG2 and the gate electrode GE3 and eliminate a parasitic capacitance. It is also possible to obtain the advantage of being able to reduce the size of a transistor element (reduce the thickness of a gate insulating film).

In the memory cell region RG1, the insulating film HK is formed over the bottom surface and side walls of the trench TR1, and the bottom surface and side walls (side surfaces) of the control gate electrode CG2 are adjacent to the insulating film HK. Between the control gate electrode CG2 and the semiconductor substrate SB (p-type well PW1), the insulating films G1 and HK are interposed. Between the control gate electrode CG2 and the sidewall spacer SW, the insulating film HK is interposed. Between the control gate electrode CG2 and the memory gate electrode MG, the insulating films HK and MZ are interposed. The insulating films G1 and HK immediately under the control gate electrode CG2 function as the gate insulating film of the control transistor. However, since the insulating film HK is the high-dielectric-constant film, the insulating film HK functions as the high-dielectric-constant gate insulating film.

In the metal-gate MISFET formation region RG2a, the insulating film HK is formed over the bottom surface and side walls of the trench TR2, and the bottom surface and side walls (side surfaces) of the gate electrode GE3 are adjacent to the insulating film HK. Between the gate electrode GE3 and the semiconductor substrate SB (p-type well PW2), the insulating films G2 and HK are interposed. Between the gate electrode GE3 and each of the sidewall spacers SW, the insulating film HK is interposed. The insulating films G2 and HK immediately under the gate electrode GE3 function as the gate insulating film of the MISFET. However, since the insulating film HK is the high-dielectric-constant film, the insulating film HK functions as the high-dielectric-constant gate insulating film.

In the case where the insulating film IL4 has been formed, the insulating film IL4 can also be polished and removed by a CMP method or the like in Step S24. Accordingly, when Step S24 is performed, the upper surface of the gate electrode GE2 is exposed.

Thus, when Step S24 is performed, in the memory cell region RG1, the control gate electrode CG2 is embedded in the trench TR1 so that the upper surface of the control gate electrode CG2 is brought into an exposed state. In the metal-gate MISFET formation region RG2a, the gate electrode GE3 is embedded in the trench TR2 so that the upper surface of the gate electrode GE3 is brought into an exposed state. In the silicon-gate MISFET formation region RG2b, the upper surface of the gate electrode GE2 is brought into an exposed state. On the other hand, the memory gate electrode MG is not exposed.

In the present embodiment, the description has been given of the case where, after the dummy control gate electrode CG1 and the dummy gate electrode GE1 are etched in Step S21, the insulating film G1 at the bottom portion of the trench TR1 and the insulating film G2 at the bottom portion of the trench TR2 are not removed, and the insulating film HK is formed in Step S22. In this case, in the memory cell region RG1, the insulating film G1 is interposed as an interfacial layer between the insulating film HK and the semiconductor substrate SB (p-type well PW1) (at the interface therebetween). On the other hand, in the metal-gate MISFET formation region RG2a, the insulating film G2 is interposed as an interfacial layer between the insulating film HK and the semiconductor substrate SB (p-type well PW2) (at the interface therebetween). As each of the insulating films G1 and G2 as the interfacial layer, a silicon dioxide film or a silicon oxynitride film is preferred.

In another embodiment, it is also possible that, after the dummy control gate electrode CG1 and the dummy gate electrode GE1 are etched in Step S21 and before the insulating film HK is formed in Step S22, the insulating film G1 at the bottom portion of the trench TR1 and the insulating film G2 at the bottom portion of the trench TR2 are removed. In this case, it is more preferable that, after the insulating films G1 and G2 at the bottom portions of the trenches TE1 and TR2 are removed, an interfacial layer made of a silicon dioxide film or a silicon oxynitride film is formed over the top surface of the semiconductor substrate SB (each of the p-type wells PW1 and PW2) exposed at the bottom portion of each of the trenches TR1 and TR2, and then the insulating film HK is formed in Step S22. As a result, between the insulating film HK and the semiconductor substrate SB (each of the p-type wells PW1 and PW2) (at the interface therebetween), the interfacial layer made of a silicon dioxide film or a silicon oxynitride film is interposed.

In the case where the insulating film HK as the high-dielectric-constant film is not formed directly over the top surface (silicon surface) of the semiconductor substrate SB and the interfacial layer made of a thin silicon dioxide film or silicon oxynitride film is provided at the interface between the insulating film HK and the semiconductor substrate SB (each of the p-type wells PW1 and PW2), the following advantage can be obtained. That is, in each of the control transistor formed in the memory cell region RG1 and the MISFET formed in the metal-gate MISFET formation region RG2a, it is possible to provide the interface between the gate insulating film and the semiconductor substrate (silicon surface thereof) with a SiO$_2$/Si (or SiON/Si) structure, reduce the number of defects such as trap levels, and improve a driving ability and reliability.

In the present embodiment, the high-dielectric-constant gate insulating film (which is the insulating film HK herein) is formed after the dummy control gate electrode CG1 and the dummy gate electrode GE1 are removed by etching in Step S21.

In another embodiment, it is also possible to preliminarily form the high-dielectric-constant gate insulating film for the control transistor and the high-dielectric-constant gate insulating film for the metal-gate MISFET to be formed in the metal-gate MISFET formation region RG2a at the stage where the dummy control gate electrode CG1 and the dummy-gate electrode GE1 have been formed. In this case, after the dummy control gate electrode CG1 and the dummy gate electrode GE1 are removed by etching in Step S21, it is possible to perform the step of forming the metal film ME in Step S23 without performing the step of forming the insulating film HK in Step S22. For example, after the high-dielectric-constant film (high-dielectric-constant insulating film) corresponding to the insulating film HK is formed over each of the insulating film G1 in the memory cell region RG1 and the insulating film G2 in the metal-gate MISFET formation region RG2a, the foregoing silicon film PS1 is formed. Specifically, after the insulating films G1, G2, and G3 are formed in Step S4 described above, a high-dielectric-constant film corresponding to the insulating film HK is formed over the entire main surface of the semiconductor substrate SB. Then, the high-dielectric-constant film is selectively removed from the silicon-gate MISFET formation region RG2b, while the high-dielectric-constant film is left in each of the memory cell region RG1 and the metal-gate MISFET formation region RG2a. In this state, the silicon film PS1 may be formed appropriately. When the dummy control gate electrode CG1 and the dummy gate electrode GE1 are thus formed, the state is achieved where the high-dielectric-constant gate insulating film is present under each of the dummy control gate electrode CG1 and the dummy gate electrode GE1. In this case, since the high-dielectric-constant gate insulating film has already been formed, after the dummy control gate electrode CG1 and the dummy gate electrode GE1 are removed by etching in Step S21, the step of forming the metal film ME in Step S23 may be performed appropriately without performing the step of forming the insulating film HK in Step S22.

In the case of forming each of an n-channel MISFET and a p-channel MISFET in the metal-gate MISFET formation region RG2a, it may also be possible to use different metal materials for a metal gate electrode (corresponding to the gate electrode GE3) for the re-channel MISFET and a metal-gate electrode (corresponding to the gate electrode GE3) for the p-channel MISFET. In that case, the following procedure may be performed appropriately. That is, in the metal-gate MISFET formation region RG2a, using the metal film ME, the metal gate electrode (corresponding to the gate electrode GE3) for the n-channel MISFET and the metal-gate electrode (corresponding to the gate electrode GE3) for the p-channel MISFET are formed. Then, after the metal gate electrode for the p-channel MISFET in the metal-gate MISFET formation region RG2a is removed by etching, another metal film is embedded in the region (trench) resulting from the removal of the metal gate electrode for the p-channel MISFET to form the metal gate electrode for the p-channel MISFET again. The method of embedding the other metal film mentioned above is the same as the method (method of embedding the metal film ME in each of the trenches TR1 and TR2) described with reference to FIGS. 26 and 27. Note that the control gate electrode CG2 and the metal gate electrode MG in the memory cell region RG1, the gate electrode GE2 in the silicon-gate MISFET formation region RG2b, and the metal gate electrode for the n-channel MISFET in the metal-gate MISFET formation region RG2a may be covered appropriately with an insulating film so as not to be etched or polished by CMP. Alternatively, it is also possible to form a metal gate electrode for the n-channel MISFET and a metal gate electrode for the p-channel MISFET using the same metal film in the metal-gate MISFET formation region RG2a, then remove the metal gate electrode for the n-channel MISFET, embed another metal film in a region resulting from the removal of the metal gate electrode for the n-channel MISFET, and thus form the metal gate electrode for the n-channel MISFET again.

Figure 28:
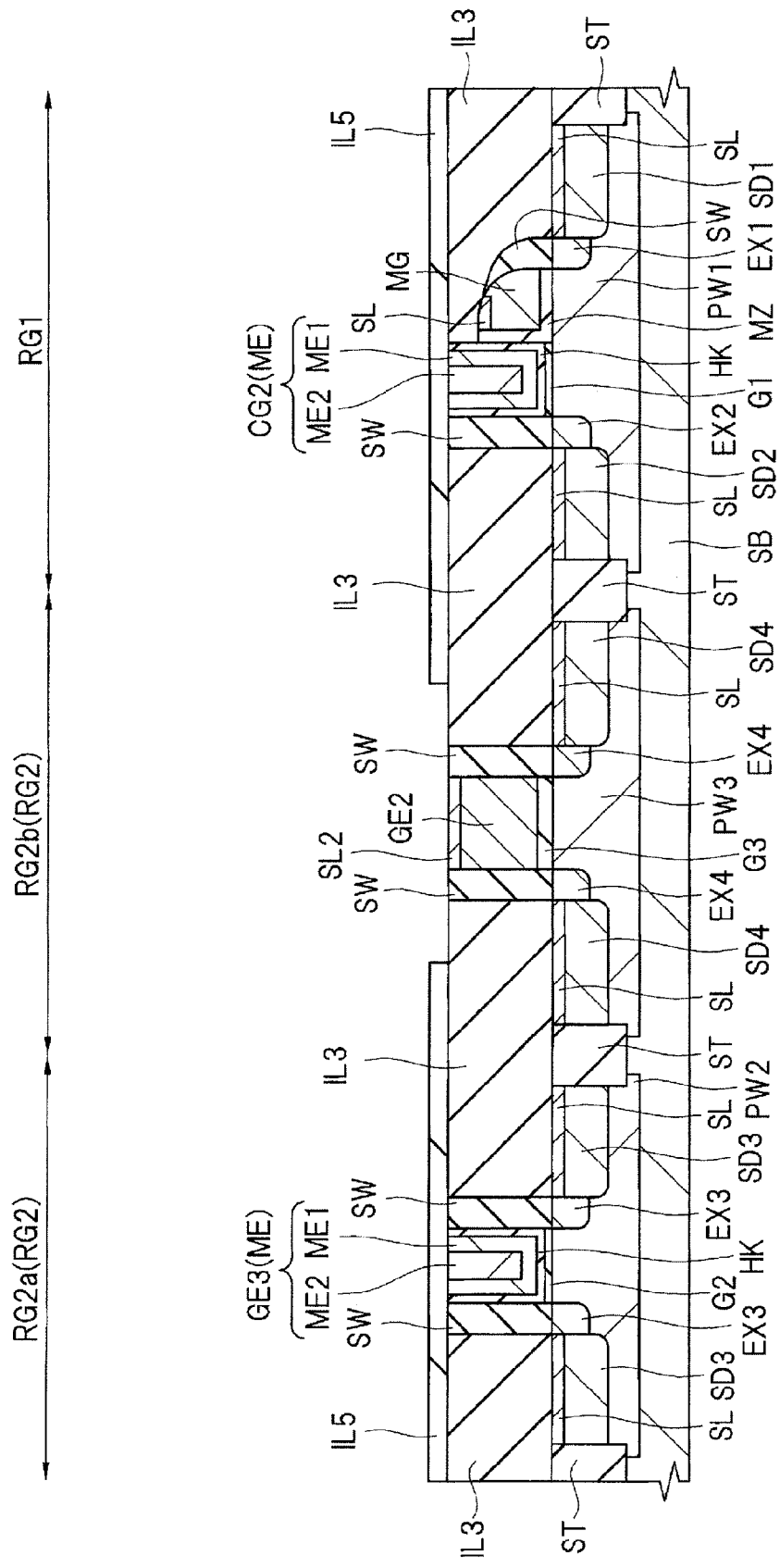
FIG. 28 is a main-portion cross-sectional view of the semiconductor device during the manufacturing process thereof, which is subsequent to FIG. 27.

Next, as shown in FIG. 28, an insulating film (mask layer) IL5 which covers the entire memory cell region RG1 and the entire metal-gate MISFET formation region RG2a and exposes the gate electrode GE2 in the silicon-gate MISFET formation region RG2b is formed over the insulating film IL3. The insulating film IL5 can be formed by, e.g., forming an insulating film (insulating film for forming the insulating film IL5) over the semiconductor substrate SB, i.e., over the insulating film IL3 so as to cover the entire memory cell region RG1 and the entire peripheral circuit region RG2 therewith and then patterning the insulating film using a photolithographic technique and an etching technique. When the insulating film IL5 is formed, the upper surface of the gate electrode GE2 is brought into a state uncovered with the insulating film IL5 and exposed, while the gate electrode GE3 and the control gate electrode CG2 are brought into a state covered with the insulating film IL5 and unexposed. On the other hand, before and after the formation of the insulating film IL5, the memory gate electrode MG retains an unexposed state.

It is more preferable that the insulating film IL5 is formed of an insulating material different from that of the insulating film IL3. This allows easy formation of the insulating film IL5 having an intended two-dimensional shape. For example, when the insulating film IL3 is formed of a silicon dioxide film, the insulating film IL5 can be formed of a silicon nitride film.

Next, in the upper portion of the gate electrode GE2, a metal silicide layer SL2 is formed (Step S25 in FIG. 3).

The metal silicide layer SL2 can be formed by performing a so-called silicide process. Specifically, the metal silicide layer SL2 can be formed as follows.

That is, first, over the insulating films IL3 and IL5 including the upper surface (top surface) of the gate electrode GE2, a metal film for forming the metal silicide layer SL2 is formed (deposited). As the metal film for forming the metal silicide layer SL2, a single-element metal film (pure metal film) or an alloy film can be used. For example, the metal film for forming the metal silicide layer SL2 is made of a cobalt (Co) film, a nickel (Ni) film, or a nickel-platinum alloy film and can be formed using a sputtering method or the like. Then, heat treatment (heat treatment for forming the metal silicide layer SL2) is performed on the semiconductor substrate SB to cause the upper-layer portion (surface layer portion) of the gate electrode GE2 to react with the metal film for forming the metal silicide layer SL2. Thus, as shown in FIG. 28, in the upper portion (upper surface, top surface, or upper-layer portion) of the gate electrode GE2, the metal silicide layer SL2 is formed. Then, the unreacted metal film (metal film for forming the metal silicide layer SL2) is removed by wet etching or the like. FIG. 28 shows the cross-sectional view at this stage. After the removal of the unreacted metal film (metal film for forming the metal silicide layer SL2), heat treatment can also be further performed.

The metal silicide layer SL2 can be, e.g., a cobalt silicide layer (when the metal film for forming the metal silicide layer SL2 is a cobalt film), a nickel silicide layer (when the metal film for forming the metal silicide layer SL2 is a nickel film), or a nickel-platinum silicide layer (when the metal film for forming the metal silicide layer SL2 is a nickel-platinum alloy film).

By thus performing a so-called salicide process, the metal silicide layer SL2 is formed in the upper portion of the gate electrode GE2. This can reduce the resistance of the gate electrode GE2. By using a salicide process, the metal silicide layer SL2 can be formed self-alignedly over the gate electrode GE2. By forming the metal silicide layer SL2 in the upper portion of the gate electrode GE2, it is possible to reduce the resistance of the gate electrode GE2.

In addition, in the state where the entire memory cell region RG1 and the entire metal-gate MISFET formation region RG2a are covered with the insulating film IL5, the metal silicide layer SL2 is formed by a salicide process. This can reliably prevent the memory gate electrode MG and the control gate electrode CG2 in the memory cell region RG1 and the gate electrode GE3 in the metal-gate MISFET formation region RG2a from being affected by the salicide process.

In the present embodiment, the description has been given of the case where the metal silicide layer LS2 is formed in the upper portion of the gate electrode GE2. In another embodiment, there may also be a case where the metal silicide layer LS2 is not formed in the upper portion of the gate electrode GE2. In the case where the metal silicide layer LS2 is not formed in the upper portion of the gate electrode GE2, it may be appropriate to omit the step of forming the insulating film IL5 and the step of forming the metal silicide layer SL2 by the salicide process in Step S25.

Figure 29:
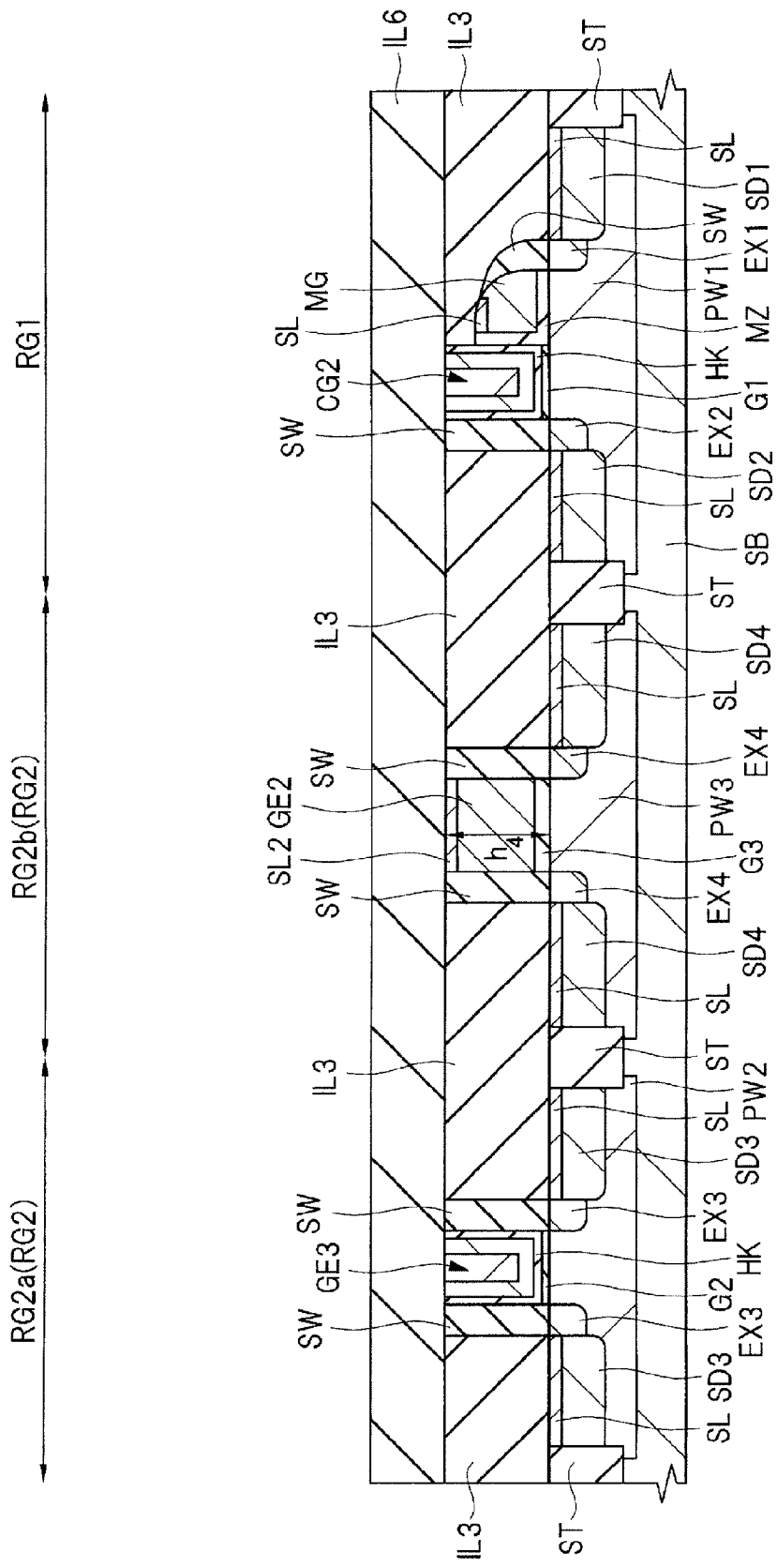
FIG. 29 is a main-portion cross-sectional view of the semiconductor device during the manufacturing process thereof, which is subsequent to FIG. 28.

Next, as shown in FIG. 29, over the entire main surface of the semiconductor substrate SB, an insulating film (interlayer insulating film) IL6 is formed (deposited) as an interlayer insulating film (Step S26 in FIG. 3).

Note that, in FIG. 29, the case is shown where the insulating film IL5 is removed by etching or the like and then the insulating film IL6 is formed. In this case, the insulating film IL6 is formed over the insulating film IL3 so as to cover the gate electrodes GE2 and GE3, the control gate electrode CG2, and the sidewall spacers SW. In another embodiment, it is also possible to form the insulating film IL6 without removing the insulating film IL5. In that case, the insulating film IL6 is formed over the insulating films IL3 and IL5 so as to cover the gate electrode GE2 and the sidewall spacers SW.

As the insulating film IL6, e.g., a silicon-dioxide-based insulating film formed mainly of silicon dioxide can be used. After the formation of the insulating film IL6, it is also possible to enhance the planarity of the upper surface of the insulating film IL6 by subjecting the upper surface of the insulating film IL6 to polishing using a CMP method or the like.

Figure 30:
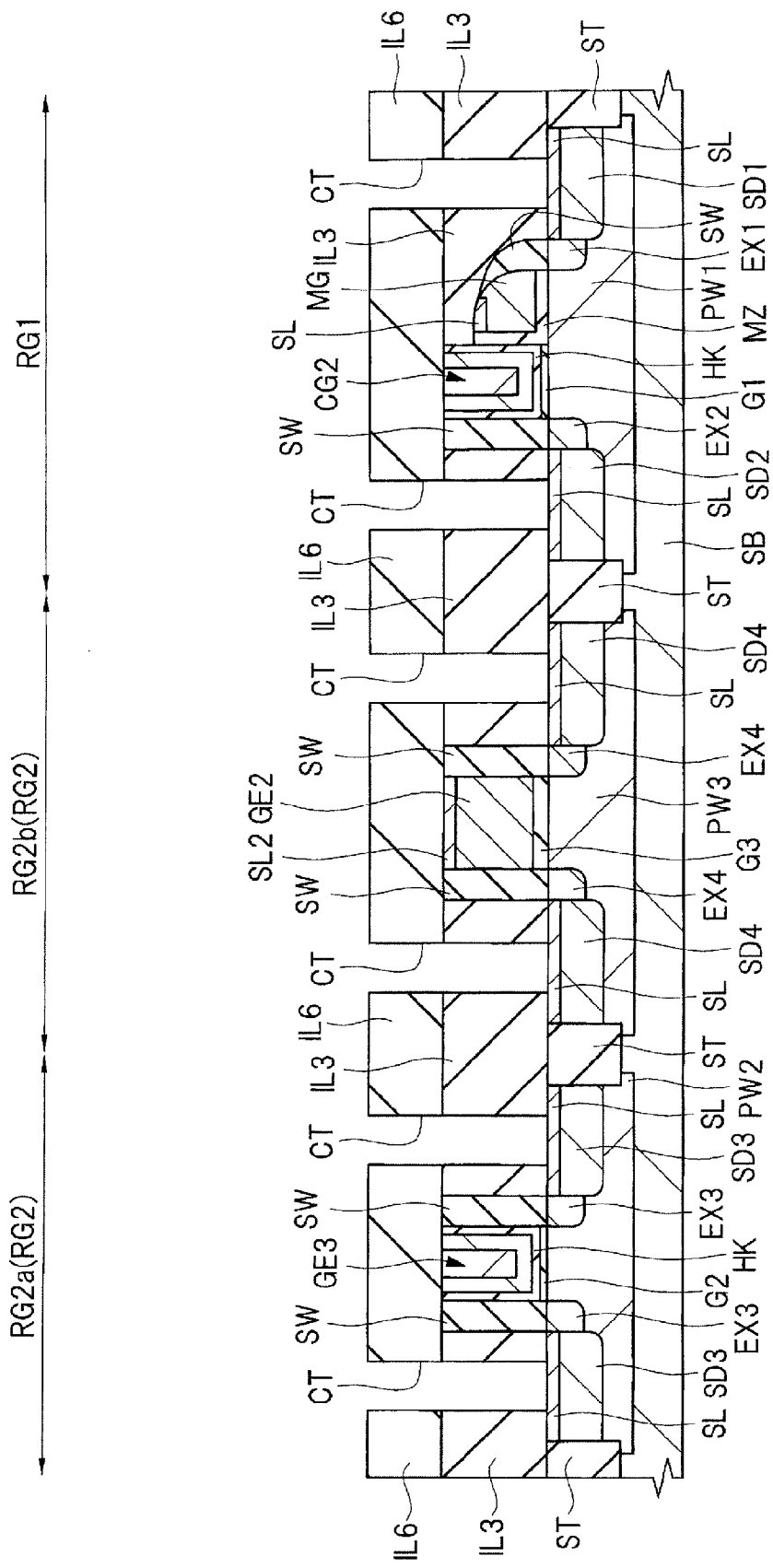
FIG. 30 is a main-portion cross-sectional view of the semiconductor device during the manufacturing process thereof, which is subsequent to FIG. 29.

Next, using a photoresist pattern (not shown) formed over the insulating film IL6 by using a photolithographic method as an etching mask, the insulating films IL6 and IL3 are dry-etched. Thus, as shown in FIG. 30, contact holes (openings or through holes) CT are formed in the insulating films IL6 and IL3 (Step S27 in FIG. 3).

Figure 31:
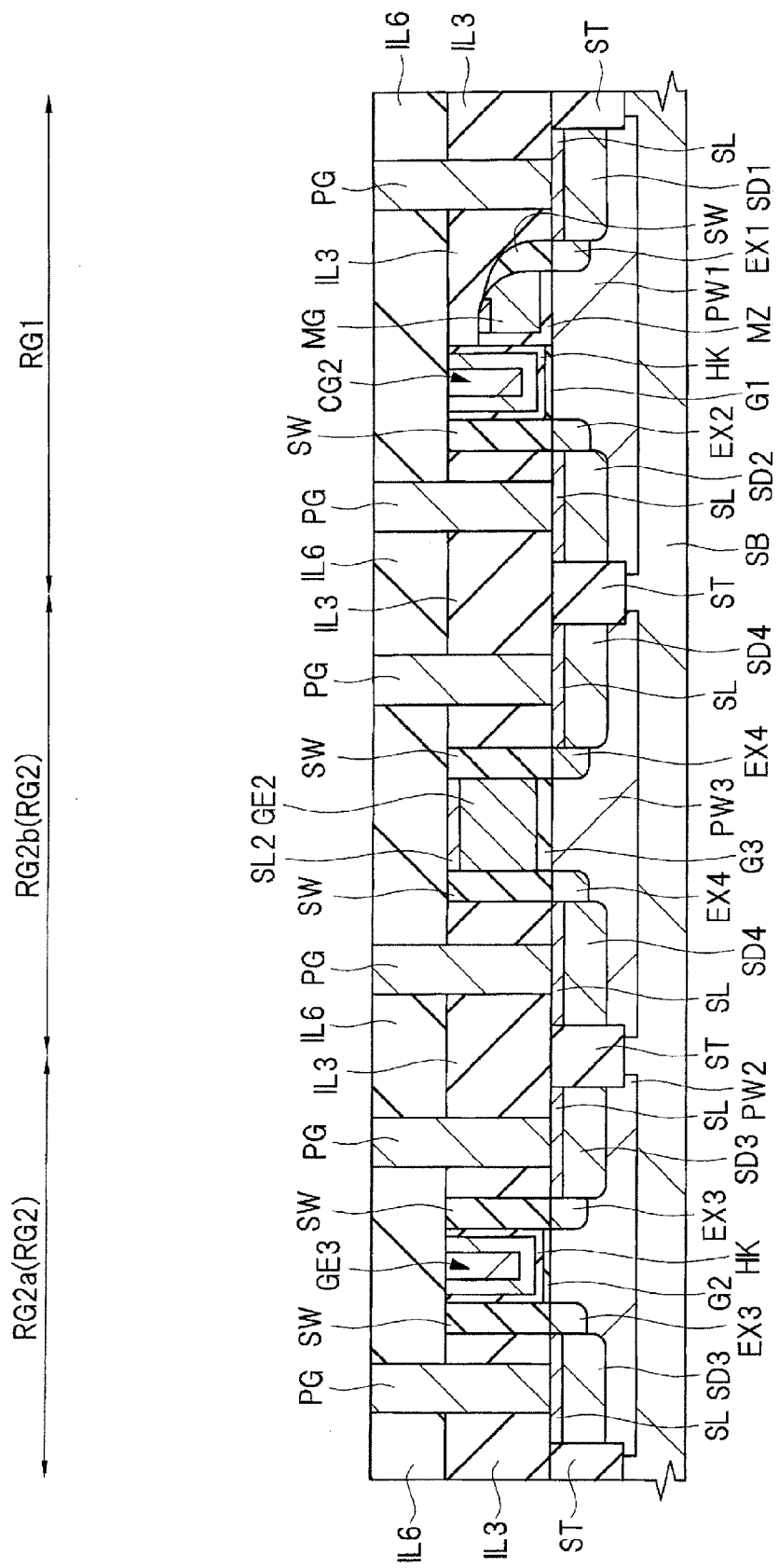
FIG. 31 is a main-portion cross-sectional view of the semiconductor device during the manufacturing process thereof, which is subsequent to FIG. 30.

Next, as shown in FIG. 31, in the contact holes CT, conductive plugs PG each made of tungsten (W) or the like are formed as coupling conductor portions (Step S28 in FIG. 3).

To form the plugs PG, e.g., over the insulating film IL6 including the portions thereof located inside the contact holes CT (over the bottom surfaces and side walls thereof), a barrier conductor film (e.g., a titanium film, a titanium nitride film, or a multi-layer film thereof) is formed. Then, over the barrier conductor film, a main conductor film made of a tungsten film or the like is formed to be embedded in the contact holes CT. Then, the unneeded portions of the main conductor film and the barrier conductor film which are located outside the contact holes CT are removed by a CMP method, an etch-back method, or the like to allow the plugs PG to be formed. Note that, for simpler illustration, in FIG. 31, the barrier conductor film and the main conductor film (tungsten film) which form each of the plugs PG are integrally shown.

The contact holes CT and the plugs PG embedded therein are formed over the $n^+$-type semiconductor regions SD1, SD2, SD3, and SD4, the control gate electrode CG2, the memory gate electrode MG, the gate electrodes GE2 and GE3, and the like. At the bottom portions of the contact holes CT, parts of the main surface of the semiconductor substrates SB, e.g., parts of the $n^+$-type semiconductor regions SD1, SD2, SD3, and SD4 (metal silicide layers SL over the top surfaces thereof), a part of the control gate electrode CG2, a part of the memory gate electrode MG (metal silicide layer SL over the top surface thereof), a part of the gate electrode GE2 (metal silicide layer SL2 over the top surface thereof), a part of the gate electrode GE3, and the like are exposed. Note that the cross-sectional view of FIG. 31 shows a cross section in which parts of the $n^+$-type semiconductor regions SD1, SD2, SD3, and SD4 (metal silicide layers SL over the top surfaces thereof) are exposed at the bottom portions of the contact holes CT and electrically coupled to the plugs PG embedded in the contact holes CT.

Next, over the insulating film IL6 in which the plugs PG are embedded, wires (wiring layer) M1 as first-layer wires are formed (Step S29 in FIG. 3). A description will be given of the case where the wires M1 are formed using a damascene technique (which is a single damascene technique herein).

Figure 32:
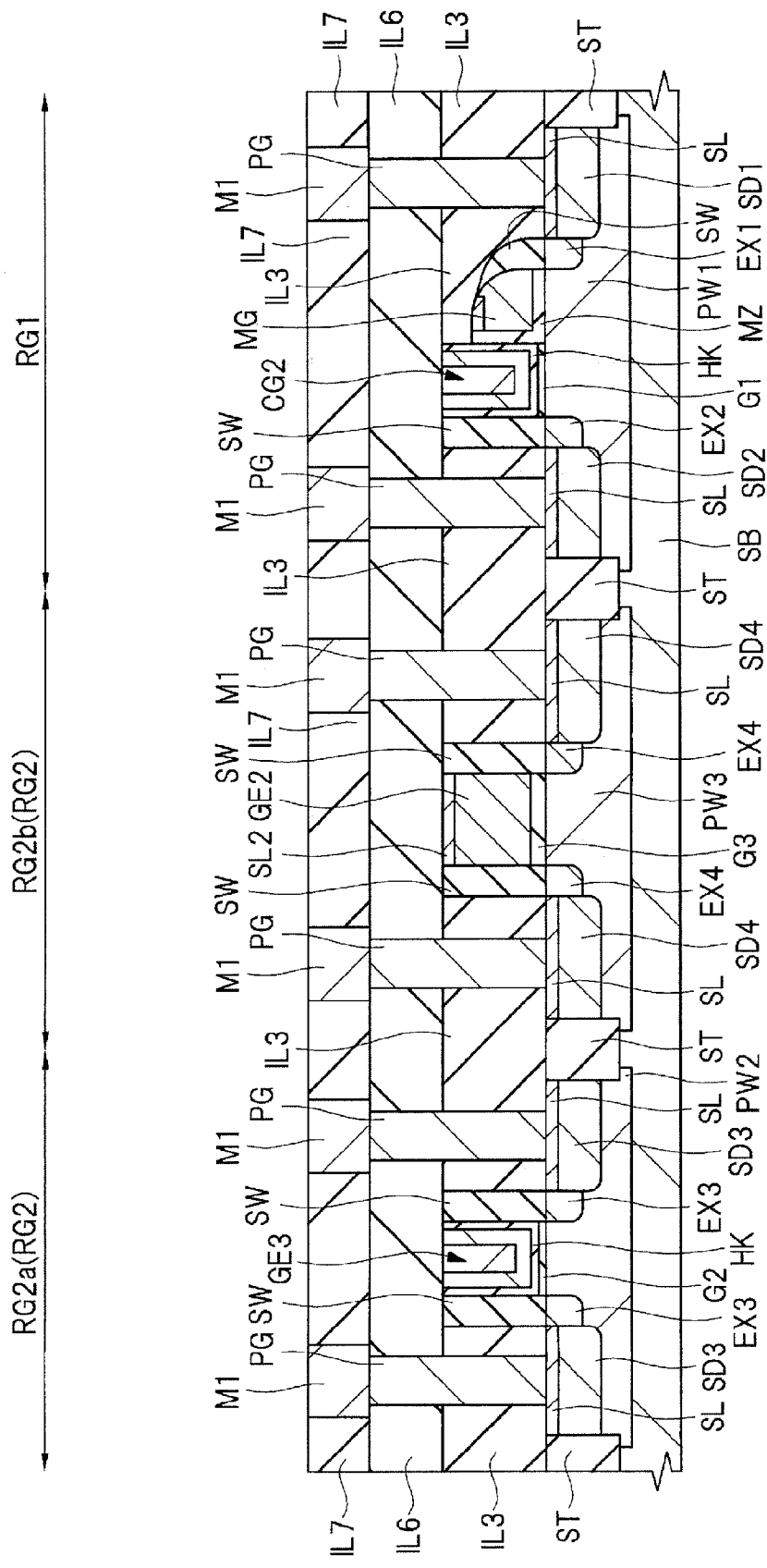
FIG. 32 is a main-portion cross-sectional view of the semiconductor device during the manufacturing process thereof, which is subsequent to FIG. 31.

First, as shown in FIG. 32, over the insulating film IL6 in which the plugs PG are embedded, an insulating film IL7 is formed. The insulating film IL7 can also be formed of a multi-layer film including a plurality of insulating films. Then, by dry etching using a photoresist pattern (not shown) as an etching mask, wire trenches (trenches for wires) are formed in the predetermined regions of the insulating film IL7. Then, over the insulating film IL7 including the bottom surfaces and side walls of the wire trenches, a barrier conductor film (such as, e.g., a titanium nitride film, a tantalum film, or a tantalum nitride film) is formed. Then, by a CVD method, a sputtering method, or the like, a copper seed layer is formed over the barrier conductor film. Then, using an electrolytic plating method or the like, a copper plating film is formed over the seed layer to be embedded in the wire trenches. Then, the main conductor film (copper plating film and seed layer) and the barrier conductor film are removed from the region other than the wire trenches by a CMP method to form the first-layer wires M1 each containing copper embedded in the wire trenches as a main conductive material. In FIG. 32, for simpler illustration, in each of the wires M1, the barrier conductor film, the seed film, and the copper plating film are integrally shown.

The wires M1 are electrically coupled to the n⁺-type semiconductor regions SD1, SD2, SD3, and SD4, the control gate electrode CG2, the memory gate electrode MG, the gate electrodes GE2 and GE3, and the like via the plugs PG. Then, by a dual damascene method or the like, wires in the second and subsequent layers are formed, but the depiction and description thereof is omitted herein. The wires M1 and the wires in the layers located thereabove are not limited to damascene wires and can also be formed by patterning conductor films for wires. For example, tungsten wires, aluminum wires, or the like can also be used as the wires M1 and the wires in the layers located thereabove.

In this manner, the semiconductor device in the present embodiment is manufactured.

<About Structure of Semiconductor Device>

Next, a description will be given of a configuration of the memory cell of the nonvolatile memory in the semiconductor device in the present embodiment with reference to FIGS. 33 and 34.

Figure 33:
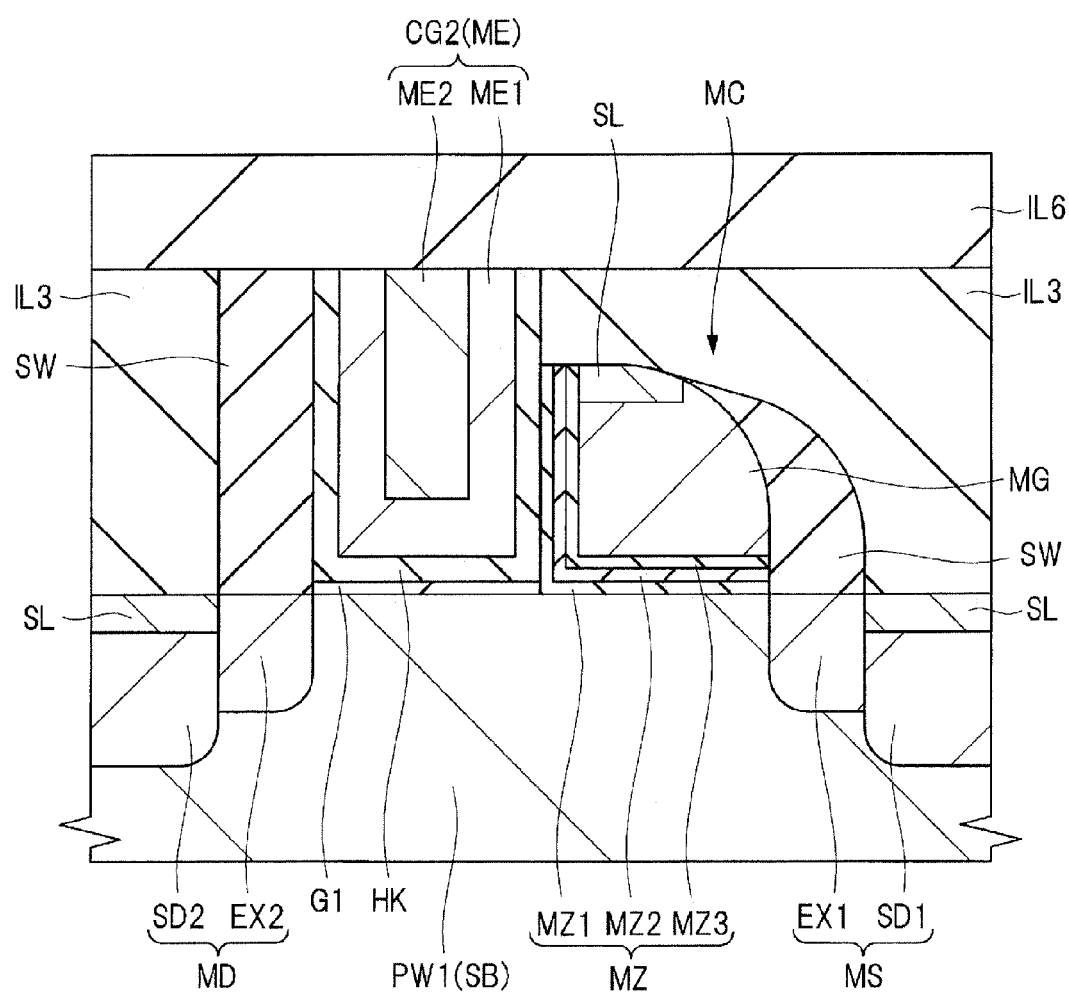
FIG. 33 is a main-portion cross-sectional view of the semiconductor device in the embodiment.

FIG. 33 is a main-portion cross-sectional view of the semiconductor device in the present embodiment. FIG. 33 shows a main-portion cross-sectional view of a memory cell region in the nonvolatile memory. FIG. 34 is an equivalent circuit diagram of the memory cell. Note that, in FIG. 33, for simpler illustration, the depiction of the contact holes CT, the plugs PG, the insulating film IL7, and the wires M1 of the structure shown in FIG. 32 described above is omitted.

As shown in FIG. 33, in the semiconductor substrate SB, the memory cell MC of the nonvolatile memory including the memory transistor and the control transistor is formed. In an actual situation, in the semiconductor substrate SB, a plurality of the memory cells MC are formed in an array configuration, and each of the memory cell regions is isolated by an isolation region (corresponding to the foregoing isolation region ST, but not shown in FIG. 33) from the other region.

Figure 34:
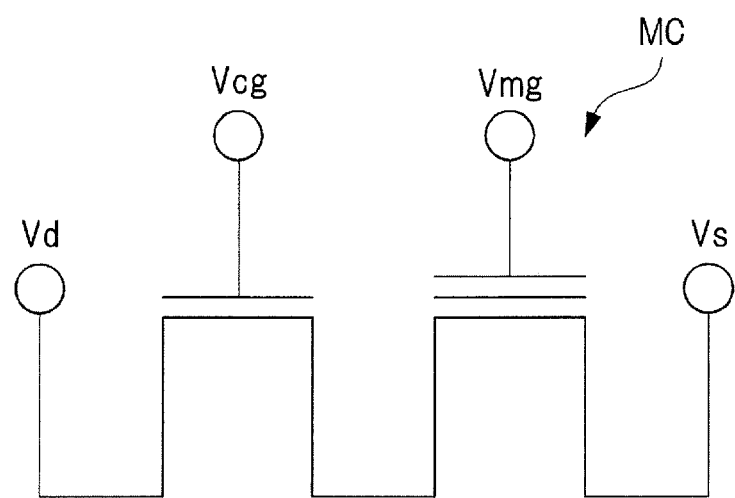
FIG. 34 is an equivalent circuit diagram of a memory cell.

As shown in FIGS. 33 and 34, the memory cell MC of the nonvolatile memory in the semiconductor device in the present embodiment is a split-gate memory cell in which the two MISFETs of the control transistor having the control gate electrode CG2 and the memory transistor having the memory gate electrode MG are coupled to each other.

Here, the MISFET including the gate insulating film including the charge storage portion (charge storage layer) and the memory gate electrode MG is referred to as the memory transistor, and the MISFET including the gate insulating film and the control gate electrode CG2 is referred to as the control transistor. Accordingly, the memory gate electrode MG is the gate electrode of the memory transistor, the control gate electrode CG2 is the gate electrode of the control transistor, and the control gate electrode CG2 and the memory gate electrode MG are the gate electrodes forming the memory cell of the nonvolatile memory.

Since the control transistor is a transistor for selecting the memory cell, the control transistor can also be regarded as a selection transistor. This allows the control gate electrode CG2 to be regarded also as the selection gate electrode. The memory transistor is a transistor for storage.

A configuration of the memory cell MC will be specifically described below.

As shown in FIG. 33, the memory cell MC of the nonvolatile memory has source/drain n-type semiconductor regions MS and MD formed in the p-type well PW1 of the semiconductor substrate SB, the control gate electrode CG2 formed over the semiconductor substrate SB (p-type well PW1), and the memory gate electrode MG formed over the semiconductor substrate SB (p-type well PW1) to be adjacent to the control gate electrode CG2. The memory cell MC of the nonvolatile memory further has the insulating films (gate insulating film) G1 and HK which are formed between the control gate electrode CG2 and the semiconductor substrate SB (p-type well PW1), and the insulating film MZ formed between the memory gate electrode MG and the semiconductor substrate (p-type well PW1).

The control gate electrode CG2 and the memory gate electrode MG are arranged side by side to extend along the main surface of the semiconductor substrate SB with the insulating films MZ and HK being interposed between the opposing side surfaces thereof. The directions in which the control gate electrode CG2 and the memory gate electrode MG extend are perpendicular to the surface of the paper sheet with FIG. 33. The control gate electrode CG2 and the memory gate electrode MG are formed over the semiconductor substrate SB (p-type well PW1) between the semiconductor regions MD and MS via the insulating films G1 and HK or the semiconductor film MZ. The memory gate electrode MG is located closer to the semiconductor region MS. The control gate electrode CG2 is located closer to the semiconductor region MD. Note that the control gate electrode CG2 is formed over the semiconductor substrate SB via the gate insulating films G1 and HK, while the memory gate electrode MG is formed over the semiconductor substrate SB via the insulating film MZ.

The control gate electrode CG2 and the memory gate electrode MG are adjacent to each other with the insulating films MZ and HK being interposed therebetween. The insulating film MZ extends over the region between the memory gate electrode MG and the semiconductor substrate SB (p-type well PW1) and the region between the memory gate electrode MG and the control gate electrode CG2 to be in contact with the bottom surface and side walls (side surfaces) of the memory gate electrode MG. The insulating film HK extends over the region between the control gate electrode CG2 and the sidewall spacer SW, the region between the control gate electrode CG2 and the semiconductor substrate SB (p-type well PW1), and the region between the control gate electrode CG2 and the memory gate electrode MG to be in contact with the bottom surface and both side walls (side surfaces) of the control gate electrode CG2.

Between the memory gate electrode MG and the control gate electrode CG2, the insulating films MZ and HK are interposed. The insulating films MZ and HK are in contact with each other. The insulating film MZ is located adjacent to the memory gate electrode MG, while the insulating film HK is located adjacent to the control gate electrode CG2. That is, between the insulating film MZ and the control gate electrode CG2, the insulating film HK is interposed. Also, between the control gate electrode CG2 and the semiconductor substrate SB (p-type well PW1), the insulating films G1 and HK are interposed. The insulating film G1 is located adjacent to the semiconductor substrate SB (p-type well PW1), while the insulating film HK is located adjacent to the control gate electrode CG2. That is, the state is provided where, over the semiconductor substrate SB (p-type well PW1), the insulating film G1, the insulating film HK, and the control gate CG2 are stacked in this order. The insulating film HK extends so as to cover the lower surface and both side walls of the control gate electrode CG2.

The insulating films G1 and HK formed between the control gate electrode CG2 and the semiconductor substrate SB (p-type well PW1), i.e., the insulating films G1 and HK under the control gate electrode CG2 function as the gate insulating film of the control transistor. On the other hand, the insulating film MZ between the memory gate electrode MG and the semiconductor substrate SB (p-type well PW1), i.e., the insulating film MZ under the memory gate electrode MG functions as the gate insulating film (gate insulating film having an internal charge storage portion) of the memory transistor. The insulating film MZ between the memory gate electrode MG and the semiconductor substrate SUB (p-type well PW1) functions as the gate insulating film of the memory transistor. On the other hand, the insulating film MZ between the memory gate electrode MG and the control gate electrode CG2 functions as an insulating film for providing insulation (electrical isolation) between the memory gate electrode MG and the control gate electrode CG2. The insulating film HK between the control gate CG2 and the semiconductor substrate SB (p-type well PW1) functions as the gate insulating film of the control transistor. On the other hand, the insulating film HK between the control gate electrode CG2 and the memory gate electrode MG functions as an insulating film for providing insulation (electrical isolation) between the control gate electrode CG2 and the memory gate electrode MG.

Of the insulating film MZ, the silicon nitride film MZ2 is an insulating film for storing charges and functions as a charge storage layer (charge storage portion). In other words, the silicon nitride film MZ2 is a trapping insulating film formed in the insulating film MZ. Accordingly, the insulating film MZ can be regarded as an insulating film having an internal charge storage portion (which is the silicon nitride film MZ2 herein).

Each of the silicon dioxide films MZ3 and MZ1 located over and under the silicon nitride film MZ2 can function as a charge block layer or a charge confinement layer. By providing the insulating film MZ between the memory gate electrode MG and the semiconductor substrate SB with a structure in which the silicon nitride film MZ2 is interposed between the silicon dioxide films MZ3 and MZ1, it is possible to store charges in the silicon nitride film MZ2.

Each of the semiconductor regions MS and MD is a source/drain semiconductor region. That is, the semiconductor region MS functions as one of a source region and a drain region and the semiconductor region MD functions as the other of the source region and the drain region. Here, the semiconductor region MS functions as the source region and the semiconductor region MD functions as the drain region. Each of the semiconductor regions MS and MD is made of a semiconductor region into which an n-type impurity has been introduced and includes an LDD structure. That is, the source semiconductor region MS has the $n^-$-type semiconductor region EX1 (extension region), and the $n^+$-type semiconductor region SD1 (source region) having an impurity concentration higher than that of the $n^-$-type semiconductor region EX1. Also, the drain semiconductor region MD has the $n^-$-type semiconductor region EX2 (extension region), and the $n^+$-type semiconductor region SD2 (drain region) having an impurity concentration higher than that of the $n^-$-type semiconductor region EX2.

The semiconductor region MS is a source or drain semiconductor region and formed in the portion of the semiconductor substrate SB which is located adjacent to the memory gate electrode MG in the gate length direction (gate length direction of the memory gate electrode MG). The semiconductor region MD is a source or drain semiconductor region and formed in the portion of the semiconductor substrate SB which is located adjacent to the control gate electrode CG2 in the gate length direction (gate length direction of the control gate electrode CG2).

Over the respective side walls of the memory gate electrode MG and the control gate electrode CG2 which are not adjacent to each other, the sidewall spacers SW each made of an insulator (insulating film) are formed. Note that, between the control gate electrode CG2 and the sidewall spacer SW, the insulating film HK is interposed.

In the source portion, the $n^-$-type semiconductor region EX1 is formed self-alignedly with the memory gate electrode MG and the $n^+$-type semiconductor region SD1 is formed self-alignedly with the side wall spacer SW over the side wall of the memory gate electrode MG. Accordingly, in the manufactured semiconductor device, the lower-concentration $n^-$-type semiconductor region EX1 is formed under the sidewall spacer SW over the side wall of the memory gate electrode MG and the higher-concentration $n^+$-type semiconductor region SD1 is formed externally of the lower-concentration $n^-$-type semiconductor region EX1. Consequently, the lower-concentration $n^-$-type semiconductor region EX1 is formed to be adjacent to the channel region of the memory transistor, while the higher-concentration $n^+$-type semiconductor region SD1 is formed to be adjacent to the lower-concentration $n^-$-type semiconductor region EX1 and spaced apart from the channel region of the memory transistor by the distance corresponding to the $n^-$-type semiconductor region EX1.

In the drain portion, the $n^-$-type semiconductor region EX2 is formed self-alignedly with the foregoing dummy control gate electrode CG1 and consequently formed also self-alignedly with the control gate electrode CG2. Also, in the drain portion, the $n^+$-type semiconductor region SD2 is formed self-alignedly with the side wall spacer SW over the side wall of the control gate electrode CG2. Accordingly, in the manufactured semiconductor device, the lower-concentration $n^-$-type semiconductor region EX2 is formed under the sidewall spacer SW over the side wall of the control gate electrode CG2 and the higher-concentration $n^+$-type semiconductor region SD2 is formed externally of the lower-concentration $n^-$-type semiconductor region EX2. Consequently, the lower-concentration $n^-$-type semiconductor region EX2 is formed to be adjacent to the channel region of the control transistor, while the higher-concentration $n^+$-type semiconductor region SD2 is formed to be adjacent to the lower-concentration $n^-$-type semiconductor region EX2 and spaced apart from the channel region of the control transistor by the distance corresponding to the $n^-$-type semiconductor region EX2.

Under the insulating film MZ under the memory gate electrode MG, the channel region of the memory transistor is formed. On the other hand, under the insulating film G1 under the control gate electrode CG2, the channel region of the control transistor is formed.

In the respective upper portions of the $n^-$-type semiconductor regions SD1 and SD2 and the memory gate electrode MG, the metal salicide layers SL have been formed using a salicide technique or the like.

In the present embodiment, the memory gate electrode MG is formed of the silicon film (PS1). Accordingly, the memory gate electrode MG is a silicon gate electrode (gate electrode made of silicon), and the memory transistor is a silicon-gate MISFET. On the other hand, the control gate electrode CG2 is formed of the metal film ME. Accordingly, the control gate electrode CG2 is a metal gate electrode, and the control transistor is a metal-gate MISFET. Thus, in the present embodiment, the memory cell MC of the nonvolatile memory is formed of the memory transistor having the silicon gate electrode (which is the memory gate electrode MG herein), and the control transistor having the metal gate electrode (which is the control gate electrode CG2 herein).

<About Operations in Nonvolatile Memory>

Next, a description will be given of an example of operations in the nonvolatile memory with reference to FIG. 35.

FIG. 35 is a table showing an example of conditions under which voltages are applied to the individual portions of the selected memory cell during "Write", "Erase", and "Read" operations in the present embodiment. In the table of FIG. 35, a voltage Vmg applied to the memory gate electrode MG of a memory cell as shown in FIGS. 33 and 34, a voltage Vs applied to the source region (semiconductor region MS) thereof, a voltage Vcg applied to the control gate electrode CG2 thereof, a voltage Vd applied to the drain region (semiconductor region MD) thereof, a base voltage Vb applied to the p-type well PW1 thereof during each of the "Write", "Erase", and "Read" operations are shown. Note that what is shown in the table of FIG. 35 is a preferred example of the conditions for voltage application and is not limited thereto. The conditions for voltage application can variously be changed as necessary. In the present embodiment, the injection of electrons into the silicon nitride film MZ2 as the internal charge storage portion in the insulating film MZ of the memory transistor is defined as the "Write" operation, and the injection of holes into the silicon nitride film MZ2 is defined as the "Erase" operation.

Note that, in the table of FIG. 35, the row A corresponds to the case where an SSI method is used as a write method and a BTBT method is used as an erase method. The row B corresponds to the case where the SSI method is used as the write method and an FN method is used as the erase method. The row C corresponds to the case where the FN method is used as the write method and the BTBT method is used as the erase method. The row D corresponds to the case where the FN method is used as the write method and the FN method is used as the erase method.

The SSI method can be regarded as an operation method which injects hot electrons into the silicon nitride film MZ2 to perform a write operation to the memory cell. The BTBT method can be regarded as an operation method which injects hot holes into the silicon nitride film MZ2 to perform an erase operation to the memory cell. The FN method can be regarded as an operation method which uses the tunneling of electrons or holes to perform a write operation or an erase operation. In other words, a write operation in accordance with the FN method can be regarded as an operation method which injects electrons into the silicon nitride film MZ2 using an FN tunnel effect to perform a write operation to the memory cell, and an erase operation in accordance with the FN method can be regarded as an operation method which injects holes into the silicon nitride film MZ2 using the FN tunnel effect to perform an erase operation to the memory cell. A specific description will be given below.

A write method is subdivided into a write method (hot-electron-injection write method) called the SSI (Source Side Injection) method which performs a write operation by performing hot electron injection in accordance with source side injection, and a write method (tunneling write method) called the FN (Fowler Nordheim) method which performs a write operation using FN tunneling.

A write operation in accordance with the SSI method is performed by applying, e.g., voltages (Vmg=10 V, Vs=5 V, Vcg=1 V, Vd=0.5 V, and Vb=0 V) as shown as "Write Operation Voltages" in the row A or B in the table of FIG. 35 to the individual portions of the selected memory cell to which the write operation is to be performed and injecting electrons into the silicon nitride film MZ2 in the insulating film MZ of the selected memory cell. At this time, hot electrons are generated in the channel region (between the source and drain) under the space between the two gate electrodes (memory gate electrode MG and control gate electrode CG2) and injected into the silicon nitride film MZ2 as the charge storage portion in the insulating film MZ under the memory gate electrode MG. The injected hot electrons (electrons) are trapped by the trap level in the silicon nitride film MZ2 in the insulating film MZ, resulting in an increase in the threshold of the memory transistor. That is, the memory transistor is brought into a written state.

A write operation in accordance with the FN method is performed by applying, e.g., voltages (Vmg=−12 V, Vs=0 V, Vcg=0 V, Vd=0 V, and Vb=0 V) as shown as "Write Operation Voltages" in the row C or D in the table of FIG. 35 to the individual portions of the selected memory cell to which the write operation is to be performed and causing tunneling of electrons from the memory gate electrode MG in the selected memory cell and injection thereof into the silicon nitride film MZ2 in the insulating film MZ. At this time, the electrons from the memory gate electrode MG tunnel through the silicon dioxide film MZ3 by FN tunneling (under the FN tunnel effect) to be injected into the insulating film MZ and trapped by the trap level in the silicon nitride film MZ2 in the insulating film MZ, resulting in an increase in the threshold voltage of the memory transistor. That is, the memory transistor is brought into the written state.

Note that the write operation in accordance with the FN method can also be performed by causing tunneling of electrons from the semiconductor substrate SB and injection thereof into the silicon nitride film MZ2 in the insulating film MZ. In this case, the write operation voltage can be, e.g., voltages obtained by inverting the positive/negative signs of the "Write Operation Voltages" in the row C or D in the table of FIG. 35.

An erase method is subdivided into an erase method (hot-hole-injection erase method) called the BTBT (Band-To-Band Tunneling phenomenon) method which performs an erase operation using the BTBT, and an erase method (tunneling erase method) called the FN (Fowler Nordheim) method which performs an erase operation using the FN tunneling.

An erase operation in accordance with the BTBT method is performed by injecting holes generated by the BTBT into the charge storage portion (silicon nitride film MZ2 in the insulating film MZ). For example, voltages (Vmg=−6 V, Vs=6 V, Vcg=0 V, Vd=open, and Vb=0 V) as shown as "Erase Operation Voltages" in the row A or C in the table of FIG. 35 are applied to the individual portions of the selected memory cell to which the erase operation is to be performed. Thus, the holes are generated using the BTBT phenomenon and subjected to electric field acceleration to be injected into the silicon nitride film MZ2 in the insulating film MZ of the selected memory cell, thus reducing the threshold voltage of the memory transistor. That is, the memory transistor is brought into an erased state.

An erase operation in accordance with the FN method is performed by applying, e.g., voltages (Vmg=12 V, Vs=0 V, Vcg=0 V, Vd=0 V, and Vb=0 V) as shown as "Erase Operation Voltages" in the row B or D in the table of FIG. 35 to the individual portions of the selected memory cell to which the erase operation is to be performed and causing tunneling of holes from the memory gate electrode MG in the selected memory cell and injection thereof into the silicon nitride film MZ2 in the insulating film MZ. At this time, the holes from the memory gate electrode MG tunnel through the silicon dioxide film MZ3 by the FN tunneling (under the FN tunnel effect) to be injected into the insulating film MZ and trapped by the trap level in the silicon nitride film MZ2 in the insulating film MZ, resulting in a reduction in the threshold voltage of the memory transistor. That is, the memory transistor is brought into an erased state.

Note that the erase operation in accordance with the FN method can also be performed by causing tunneling of holes from the semiconductor substrate SB and injection thereof into the silicon nitride film MZ2 in the insulating film MZ. In this case, as the erase operation voltages, e.g., voltages obtained by inverting the positive/negative signs of the "Erase Operation Voltages" in the row B or D in the table of FIG. 35 can be applied.

In the case where the write or erase operation is performed in accordance with the FN method (i.e., in the case of using the operation method B, C, or D), when charges are caused to tunnel from the memory gate electrode MG and injected into the silicon nitride film MZ2, it is preferable to set the thickness of the silicon dioxide film MZ3 smaller than the thickness of the silicon dioxide film MZ1. On the other hand, in the case where the write or erase operation is performed in accordance with the FN method (i.e., in the case of using the operation method B, C, or D), when charges are caused to tunnel from the semiconductor substrate SB and injected into the silicon nitride film MZ2, it is preferable to set the thickness of the silicon dioxide film MZ1 smaller than the thickness of the silicon dioxide film MZ3. In the case where the write operation is performed in accordance with the SSI method and the erase operation is performed in accordance with the BTBT method (i.e., in the case of using the operation method A), it is preferable to set the thickness of the silicon dioxide film MZ3 equal to or larger than the thickness of the silicon dioxide film MZ1.

During a read operation, e.g., voltages as shown as "Read Operation Voltages" in the row A, B, C, or D in the table of FIG. 35 are applied to the individual portions of the selected memory cell to which the read operation is to be performed. By setting the voltage Vmg to be applied to the memory gate electrode MG during the read operation to a value between the threshold voltage of the memory transistor in the written state and the threshold voltage thereof in the erased state, the written state or the erased state can be determined.

<About Main Characteristic Features and Effect>

The semiconductor device in the present embodiment is a semiconductor device including the memory cells MC of the nonvolatile memory. Each of the memory cells MC has the memory gate electrode MG, and the control gate electrode CG2.

To improve the performance of the semiconductor device including the nonvolatile memory and reduce the size of the semiconductor device, it is effective to use a metal gate electrode as the control gate electrode of each of the memory cells of the nonvolatile memory. On the other hand, in terms of improving the reliability, it is advantageous to use a silicon gate electrode, not a metal gate electrode, as the memory gate electrode of each of the memory cells of the nonvolatile memory. In the case where the erase method (FN method) which injects holes from the memory gate electrode (corresponding to the memory gate electrode MG) into the memory gate insulating film (corresponding to the insulating film MZ) is used for an erase operation in the nonvolatile memory, the erase operation is easily and properly performed when the silicon gate electrode, not the metal gate electrode, is used as the memory gate electrode.

Accordingly, in the present embodiment, as the memory gate electrode MG and the control gate electrode CG2 which form each of the memory cells MC of the nonvolatile memory, the metal gate electrode and the silicon gate electrode are used respectively. This can achieve improvements in the general performance and reliability of the semiconductor device including the nonvolatile memory. This can also achieve a reduction in the size of the semiconductor device. In the case where the erase method (FN method) which injects holes from the memory gate electrode MG into the memory gate insulating film (corresponding to the insulating film MZ) is used for an erase operation in the nonvolatile memory, it is also possible to obtain the advantage that, by using the silicon gate electrode as the control gate electrode CG2, the erase operation is easily and properly performed.

Thus, the study has been conducted on the manufacturing method when the metal gate electrode is used only as the control gate electrode forming each of the memory cells of the nonvolatile memory, and not as the memory gate electrode forming the memory cell. As a result, in the present embodiment, a technique is used which forms the dummy control gate electrode CG1 and the memory gate electrode MG first and then replaces the dummy control gate electrode CG1 with the control gate electrode CG2 as the metal gate electrode. When the technique which replaces the dummy control gate electrode CG1 with the control gate electrode CG2 as the metal gate electrode is used, various advantages can be obtained. For example, since the step of patterning the metal film for the metal gate electrode is no longer needed, the advantage of easier processing of the metal gate electrode is offered. In addition, since the metal gate electrode is formed after the formation of the source/drain regions, the advantage that the metal gate electrode remains unaffected by activation anneal (heat treatment) after the formation of the source/drain regions is offered. This can improve the performance of the semiconductor device including the nonvolatile memory. This can also improve the manufacturing yield of the semiconductor device including the nonvolatile memory.

Accordingly, in the present embodiment, a manufacturing process as shown below is used. That is, over the semiconductor substrate SB, the dummy control gate electrode CG1 (first dummy gate electrode) is formed via the insulating film G1 (first insulating film) (corresponding to Step S7). Then, over the semiconductor substrate SB, the memory gate electrode MG (first gate electrode) for each of the memory cells MC is formed via the insulating film MZ (second insulating film) having the internal charge storage portion so as to be adjacent to the dummy control gate electrode CG1 (corresponding to Step S10). Then, the insulating film IL3 (first interlayer insulating film) is formed so as to cover the dummy control gate electrode CG1 and the memory gate electrode MG (corresponding to Step S19). Then, the insulating film IL3 is polished to expose the dummy control gate electrode CG1 (corresponding to Step S20). Then, the dummy control gate electrode CG1 is removed (corresponding to Step S21). Then, in the trench TR1 (first trench) as the region resulting from the removal of the dummy control gate electrode CG1, the control gate electrode CG2 (second gate electrode) for the memory cell MC is formed (corresponding to Steps S23 and S24). The control gate electrode CG2 is a metal gate electrode.

One of the main characteristic features of the present embodiment is that the height ($h_2$) of the memory gate electrode MG formed in Step S10 is lower than the height ($h_1$) of the dummy control gate electrode CG1 and, in Step S20, the dummy control gate electrode CG1 is exposed, but the memory gate electrode MG is not exposed. Another main characteristic features of the present embodiment is that, after the dummy control gate electrode CG1 is removed, the control gate electrode CG2 is formed in the trench TR1 as the region resulting from the removal of the dummy control gate electrode CG1.

In the present embodiment, the height ($h_2$) of the memory gate electrode MG formed in Step S10 is set lower than the height ($h_1$) of the dummy control gate electrode CG1. This can be achieved by etching back the silicon film PS2 until the height ($h_2$) of the memory gate electrode MG becomes lower than the height ($h_1$) of the dummy control gate electrode CG1 (i.e., until $h_1 > h_2$ is satisfied). In the present embodiment, the height ($h_2$) of the memory gate electrode MG is set lower than the height ($h_1$) of the dummy control gate electrode CG1 such that, while the dummy control gate electrode CG1 is exposed in Step S20, the memory gate electrode MG is not exposed.

In the case where the height ($h_2$) of the memory gate electrode MG is equal to or larger than the height ($h_1$) of the dummy control gate electrode CG1 unlike in the present embodiment, when the dummy control gate electrode CG1 is exposed in the polishing step in Step S20, the memory gate electrode MG is also inevitably exposed. When not only the dummy control gate electrode CG1, but also the memory gate electrode MG is exposed in Step S20, during the removal of the dummy control gate electrode CG1 in Step S21, the memory gate electrode MG may also be removed. In this case, to prevent the memory gate electrode MG from being removed, it may also be considered to cover the memory gate electrode MG with a mask layer corresponding to the foregoing insulating film IL4 and then etch and remove the dummy control gate electrode CG1. However, since the memory gate electrode MG is adjacent to the dummy control gate electrode CG1 (more specifically, adjacent thereto via the insulating film MZ), it is not easy to form the mask layer which covers the memory gate electrode MG, but does not cover the dummy control gate electrode CG1. When the mask layer covering the memory gate electrode MG also covers the dummy control gate electrode CG1, the removal of the dummy control gate electrode CG1 and the formation of the control gate electrode CG2 is not successively accomplished. This reduces the manufacturing yield of the semiconductor device. This also makes it hard to manage the manufacturing process of the semiconductor device.

By contrast, in the present embodiment, the height ($h_2$) of the memory gate electrode MG formed in Step S10 is set lower than the height ($h_1$) of the dummy control gate electrode CG1. As a result, it is possible prevent the memory gate electrode MG from being exposed, while allowing the dummy control gate electrode CG1 to be exposed. This can be achieved by ending polishing treatment in the polishing step in Step S20 at the stage where the dummy control gate electrode CG1 has been exposed, but the memory gate electrode MG has not been exposed yet. In the present embodiment, by setting the height ($h_2$) of the memory gate electrode MG formed in Step S10 lower than the height ($h_1$) of the dummy control gate electrode CG1, it is possible to easily and reliably realize the situation where, in Step S20, the dummy control gate electrode CG1 is exposed, but the memory gate electrode MG is not exposed.

In the present embodiment, in Step S20, the dummy control gate electrode CG1 is exposed, while the memory gate electrode MG is not exposed. As a result, when the dummy control gate electrode CG1 is removed in Step S21, it is possible to easily and reliably prevent even the memory gate electrode MG from being removed. That is, since the dummy control gate electrode CG1 is exposed but the memory gate electrode MG is not exposed in Step S20, even when the memory gate electrode MG is not covered with the mask layer corresponding to the foregoing insulating film IL4 during the removal of the dummy control gate electrode CG1 in Step S21, the memory gate electrode MG can be protected. Consequently, it is possible to remove the dummy control gate electrode CG1, while protecting the memory gate electrode MG, and form the control gate electrode CG2 in the trench TR1 as the region resulting from the removal of the dummy control gate electrode CG1. Therefore, it is possible to easily and reliably manufacture the semiconductor device including the memory cells MC of the nonvolatile memory each having the memory gate electrode MG and the control gate electrode CG2 made of the metal gate electrode. This can improve the manufacturing yield of the semiconductor device. This also allows easy management of the process of manufacturing the semiconductor device. This can also improve the performance of the semiconductor device.

Thus, in the present embodiment, after the dummy control gate electrode CG1 is removed, the control gate electrode CG2 is formed in the trench TR1 as the region resulting from the removal of the dummy gate electrode CG1. Consequently, in Step S20, the memory gate electrode MG needs to be protected from being exposed, while the dummy control gate electrode CG1 is exposed. To achieve this, the height ($h_2$) of the memory gate electrode MG formed in Step S10 is set lower than the height ($h_1$) of the dummy control gate electrode CG1. Therefore, in the present embodiment, it is important to satisfy each of the two conditions that the height ($h_2$) of the memory gate electrode MG is set lower than the height ($h_1$) of the dummy control gate electrode CG1 and that, after the dummy control gate electrode CG1 is removed, the control gate electrode CG2 is formed in the trench TR1 as the region resulting from the removal of the dummy gate electrode CG1. As a result, after the dummy control gate electrode CG1 and the memory gate electrode MG are formed, the dummy control gate electrode CG1 can easily and properly be replaced with the control gate electrode CG2 as the metal gate electrode.

Also, in the present embodiment, in the metal-gate MISFET formation region RG2a of the peripheral circuit region RG2, the metal-gate MISFET is formed. In addition, each of the metal gate electrode (which is the gate electrode GE3 herein) in the metal-gate MISFET formation region RG2a and the metal gate electrode (which is the control gate electrode CG2 herein) in the memory cell region RG1 is formed by a gate last process. Accordingly, it is possible to reliably manufacture the semiconductor device including the nonvolatile memory using the metal gate electrode as the control gate electrode (CG2), and the metal-gate MISFET forming the peripheral circuit. It is also possible to reduce the number of manufacturing process steps. Moreover, by using the metal-gate MISFET as the MISFET forming the peripheral circuit, the performance of the semiconductor device can be improved.

Also, in the present embodiment, the description has been given of the case where both of the metal-gate MISFET and the silicon-gate MISFET are formed in the peripheral circuit region RG2. In another embodiment, there may also be a case where the metal-gate MISFET is formed, but the silicon-gate MISFET is not formed. In this case, each of the MISFETs forming the peripheral circuit is formed of the metal-gate MISFET, and the peripheral circuit region RG2 has the metal-gate MISFET formation region RG2a where the metal-gate MISFETs are formed, but does not have the silicon-gate MISFET formation region RG2b where the silicon-gate MISFET is formed.

Embodiment 2

FIGS. 36 to 41 are main-portion cross-sectional views of a semiconductor device in Embodiment 2 during a manufacturing process thereof. FIGS. 36 to 41 show substantially the same cross-sectional regions as shown in FIGS. 4 to 8, 10 to 13, and 15 to 32 described above.

In the manufacturing process in Embodiment 2, a method of forming the $n^+$-type semiconductor region SD1 is different from that used in Embodiment 1 described above. The manufacturing process in Embodiment 2 is otherwise substantially the same as the manufacturing process in Embodiment 1 described above. Accordingly, in Embodiment 2, a description will be given mainly of the difference between the manufacturing process in Embodiment 2 and the manufacturing process in Embodiment 1 described above.

In Embodiment 2 also, in the same manner as in Embodiment 1 described above, by performing the manufacturing process up to Step S7 described above, the structure shown in FIG. 7 described above is obtained.

Figure 36:
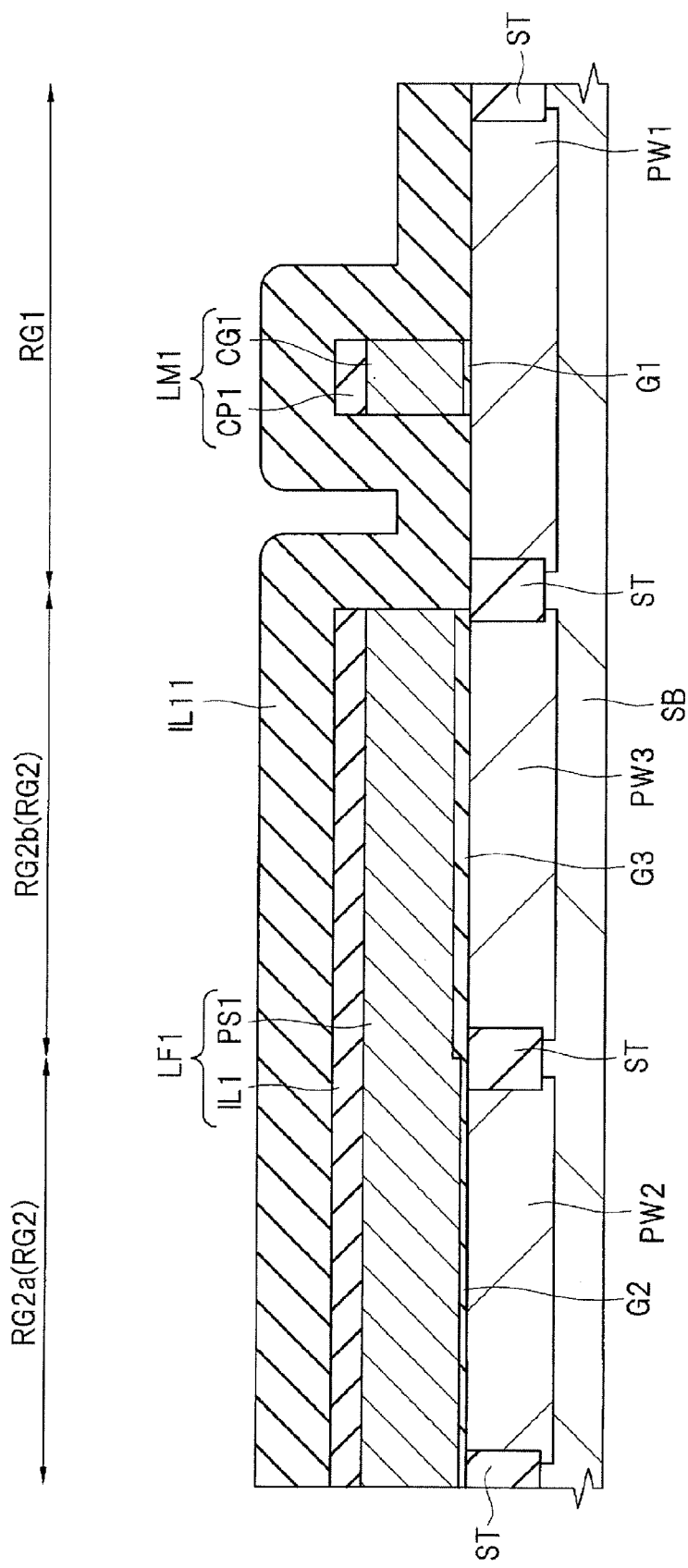
FIG. 36 is a main-portion cross-sectional view of a semiconductor device in another embodiment during a manufacturing process thereof.

Then, in Embodiment 2, as shown in FIG. 36, over the semiconductor substrate SB, an insulating film IL11 is formed (deposited) so as to cover the multi-layer body LM1 and the multi-layer film LF1. Preferably, the insulating film IL11 is made of an insulating material different from that of the insulating film IL1 (and that of the cap insulating film CP1). For example, the insulating film IL1 is made of a silicon nitride film, and the insulating film IL11 is made of a silicon dioxide film. The insulating film IL11 can be formed using a CVD method or the like.

Figure 37:
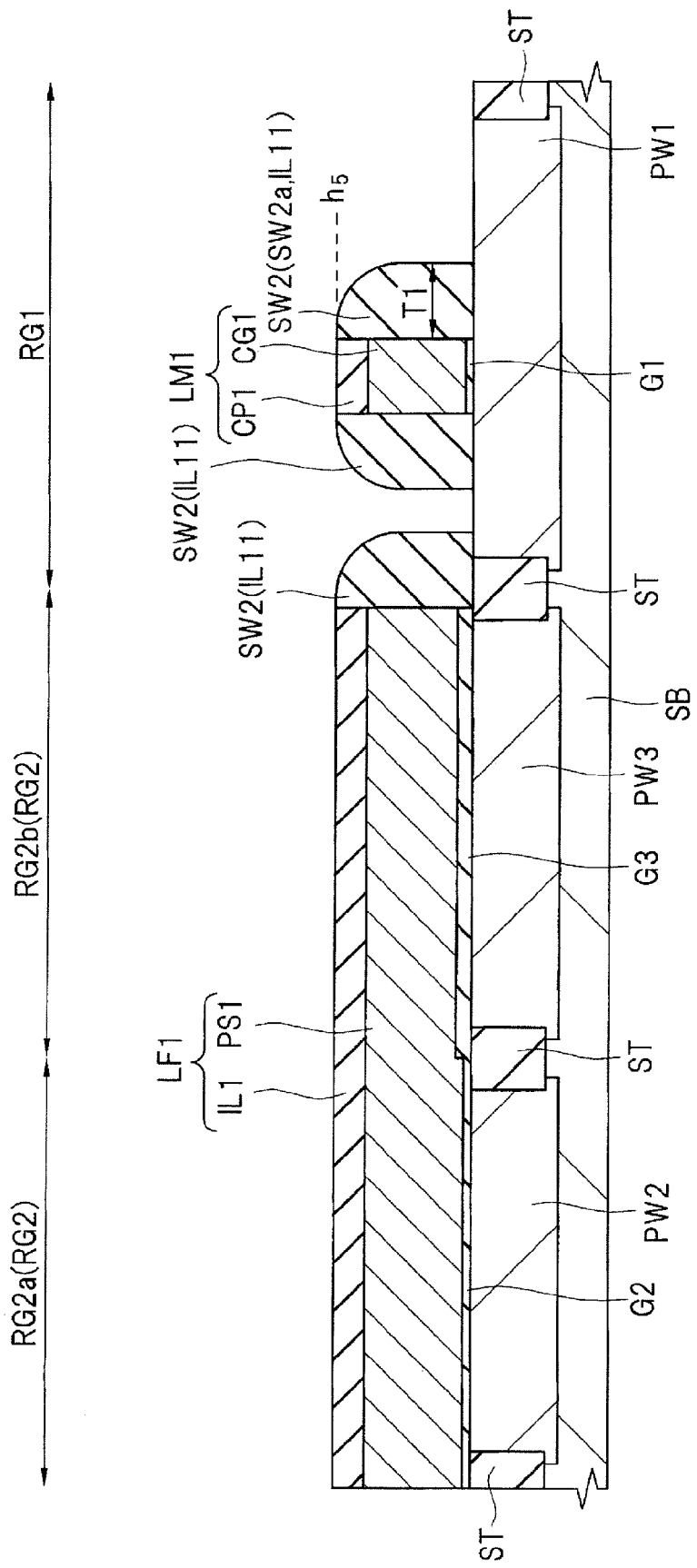
FIG. 37 is a main-portion cross-sectional view of the semiconductor device during the manufacturing process thereof, which is subsequent to FIG. 36.

Then, using an anisotropic etching technique, the insulating film IL11 is etched back (etched, dry-etched, or anisotropically etched). Thus, as shown in FIG. 37, over the respective side walls of the multi-layer body LM1 and the multi-layer film LF1, the insulating film IL11 is selectively left to form sidewall spacers (sidewalls or side-wall insulating films) SW2. The sidewall spacers SW2 are formed over the both side walls of the multi-layer body LM1. Here, the sidewall spacer SW2 formed over the side wall of the multi-layer body LM1 over which the memory gate electrode MG is to be formed later is designated by a reference numeral SW2a and hereinafter referred to as the sidewall spacer SW2a. The two-dimensional region where the sidewall spacer SW2a is formed substantially corresponds to the two-dimensional region where the memory gate electrode MG is to be formed later.

Figure 38:
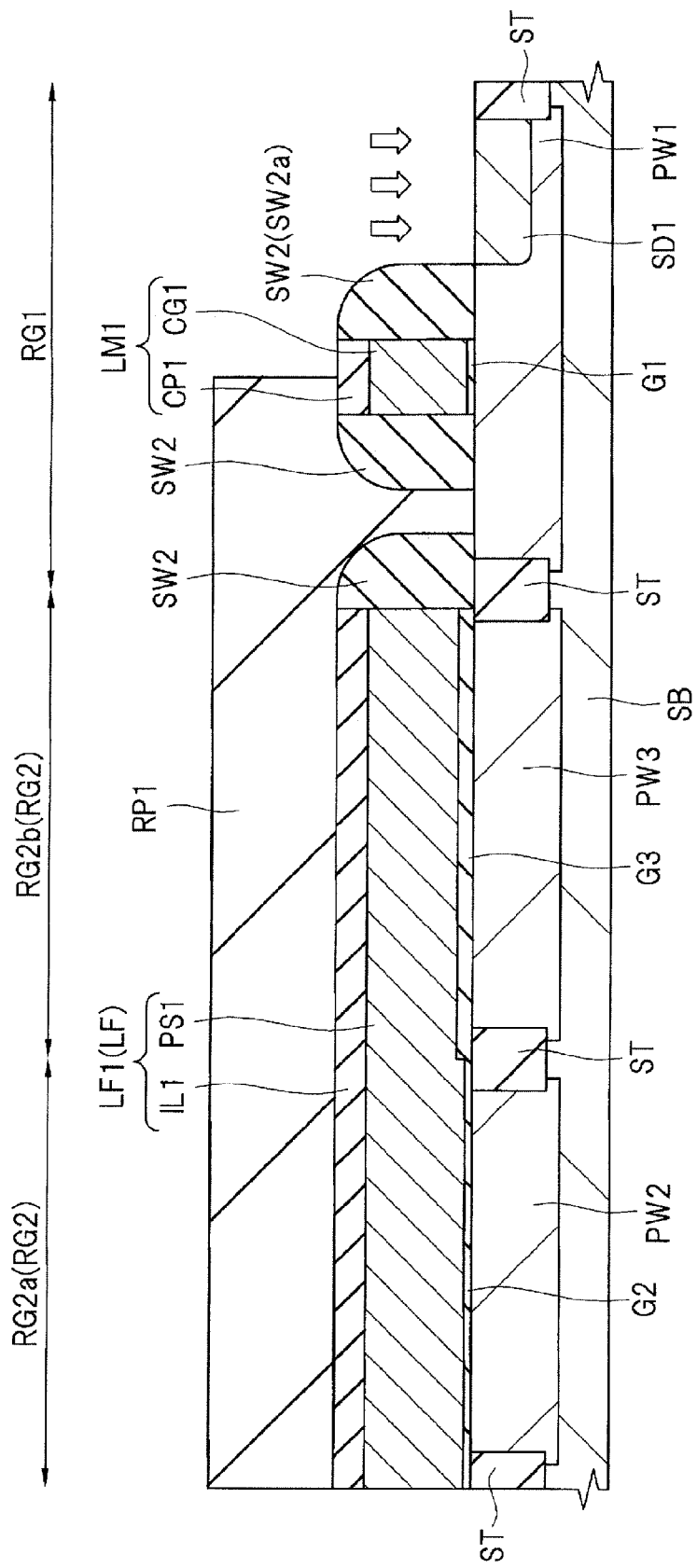
FIG. 38 is a main-portion cross-sectional view of the semiconductor device during the manufacturing process thereof, which is subsequent to FIG. 37.

Then, as shown in FIG. 38, over the semiconductor substrate SB, a photoresist layer (photoresist pattern, resist layer, resist pattern, or mask layer) RP1 is formed using a photolithographic technique. The photoresist layer RP1 is formed so as to cover the entire peripheral circuit formation region RG2 and cover the area of the memory cell region RG1 where the $n^-$-type semiconductor region EX2 and the $n^+$-type semiconductor region SD2 (one of the source and the drain, which corresponds to the drain semiconductor region herein) are to be formed. Of the memory cell region RG1, the area where the $n^+$-type semiconductor region SD1 (the other of the source and the drain, which corresponds to the source semiconductor region herein) is to be formed is uncovered with the photoresist layer RP1 and exposed from the photoresist layer RP1. As a result, over the multi-layer body LM1, the end portion (side surface) of the photoresist layer RP1 is located, while the sidewall spacer SW2a is uncovered with the photoresist layer RP1 and exposed. However, there may also be a case where the sidewall spacer SW2a is partly covered with the photoresist layer RP1.

Then, as shown in FIG. 38, using the photoresist layer RP1, the multi-layer body LM1, and the sidewall spacer SW2a as a mask (ion implantation inhibiting mask), an n-type impurity (such as, e.g., arsenic (As) or phosphorus (P)) is introduced into the semiconductor substrate SB (p-type well PW1) by an ion implantation method to form the $n^+$-type semiconductor region (impurity diffusion layer) SD1. In FIG. 38, ion implantation for forming the $n^+$-type semiconductor region SD1 is schematically shown by the arrows.

In the memory cell region RG1, the sidewall spacer SW2a over the side wall of the multi-layer body LM1 functions as a mask (ion implantation inhibiting mask) to allow the $n^+$-type semiconductor region SD1 to be formed by self-alignment with the sidewall spacer SW2a over the side wall of the multi-layer body LM1. That is, during the ion implantation for forming the $n^+$-type semiconductor region SD1, the injection of impurity ions into the substrate region located immediately under the side wall spacer SW2a is inhibited. Consequently, the $n^+$-type semiconductor region SD1 is formed to be spaced apart from the multi-layer body LM1 (dummy control gate electrode CG1) by the distance corresponding to a thickness T1 of the sidewall spacer SW2a. Here, the thickness T1 of the sidewall spacer SW2a corresponds to the dimension (thickness) of the sidewall spacer SW2a in a direction along the gate length direction of the memory gate electrode MG to be formed later and is shown in FIG. 37.

During the ion implantation for forming the $n^+$-type semiconductor region SD1, the photoresist layer RP1 also functions as the mask (ion implantation inhibiting mask). As a result, into the area of the semiconductor substrate SB in the memory cell region RG1 where the $n^-$-type semiconductor region EX2 and the $n^+$-type semiconductor region SD2 are to be formed later, the impurity ions are not implanted. The impurity ions are also not implanted into the semiconductor substrate SB in the peripheral circuit region RG2.

Figure 39:
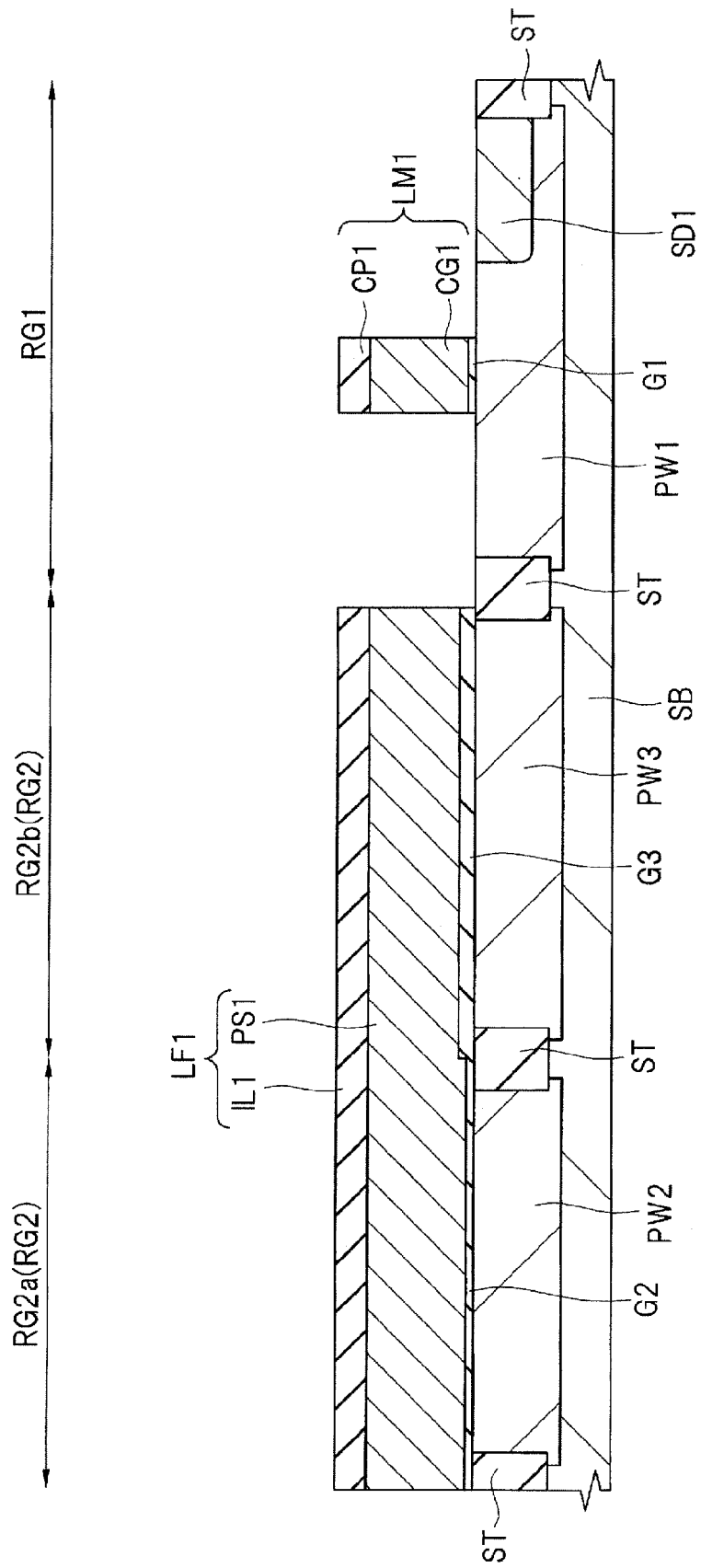
FIG. 39 is a main-portion cross-sectional view of the semiconductor device during the manufacturing process thereof, which is subsequent to FIG. 38.

After the ion implantation for forming the $n^+$-type semiconductor region SD1, the photoresist layer RP1 is removed. Then, the sidewall spacers SW2 are removed by etching or the like. FIG. 39 shows the stage where the sidewall spacers SW2 have been removed. In an etching step for removing the sidewall spacers SW2, etching is preferably performed under conditions under which the insulating film ILL the silicon film PS1, the cap insulating film CP1, the dummy control gate electrode CG1, and the semiconductor substrate SB are less likely to be etched than the sidewall spacers SW2. That is, the sidewall spacers SW2 are preferably etched under conditions under which the speed of etching the insulating film IL1, the silicon film PS1, the cap insulating film CP1, the dummy control gate electrode CG1, and the semiconductor substrate SB is lower than the speed of etching the sidewall spacers SW2. This allows the sidewall spacers SW2 to be selectively etched. As the etching for removing the sidewall spacers SW2, wet etching can be used appropriately.

The subsequent steps in Embodiment 2 are basically the same as those in Embodiment 1 so that Step S8 described above and the steps subsequent thereto are performed.

However, in Embodiment 2, after Step S7 and before Step S8, the n$^+$-type semiconductor region SD1 is formed. Accordingly, in Embodiment 2, it is sufficient to form the foregoing n$^-$-type semiconductor regions EX2, EX3, and EX4 in Step S14, and the n$^-$-type semiconductor region EX1 is not formed in Step S14. That is, in Embodiment 2, the ion implantation for forming the n$^-$-type semiconductor region EX1 is not performed. Also, in Embodiment 2, it is sufficient to form the foregoing n$^-$-type semiconductor regions SD2, SD3, and SD4 in Step S16, and the n$^+$-type semiconductor region SD1 is not formed in Step S16. That is, in Embodiment 2, the ion implantation for forming the n$^+$-type semiconductor region SD1 is not performed.

Figure 40:
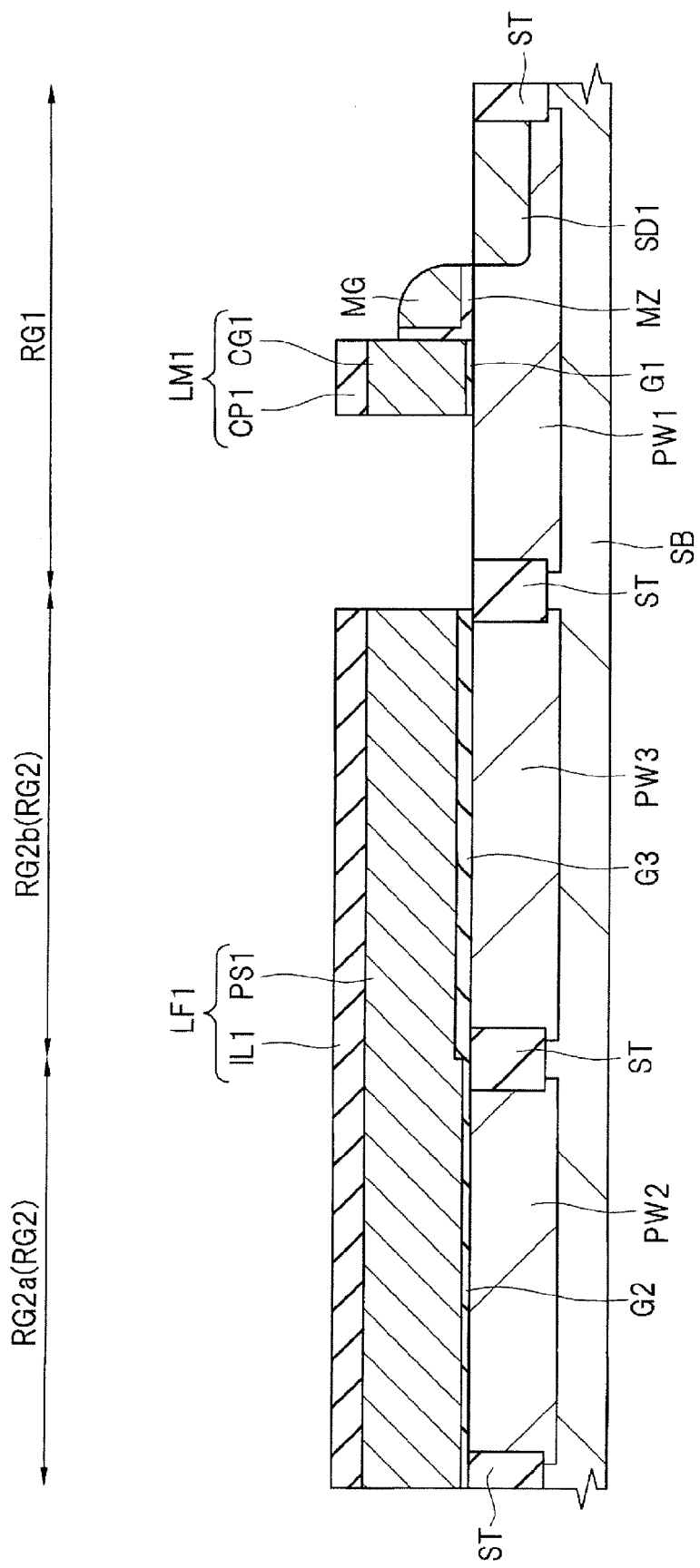
FIG. 40 is a main-portion cross-sectional view of the semiconductor device during the manufacturing process thereof, which is subsequent to FIG. 39.

Note that FIG. 40 shows the stage where, in Embodiment 2, the steps preceding and including Step S12 have been performed. The thickness T1 of the sidewall spacer SW2$a$ substantially corresponds to the total sum of the gate length of the memory gate electrode MG and the thickness of the insulating film MZ (corresponding to the thickness of the portion the insulating film MZ which is interposed between the memory gate electrode MG and the dummy control gate electrode CG1). Consequently, the n$^+$-type semiconductor region SD1 is formed by substantial alignment with the side wall (side wall opposite to the side wall adjacent to the dummy control gate electrode CG1 via the insulating film MZ) of the memory gate electrode MG.

Figure 41:
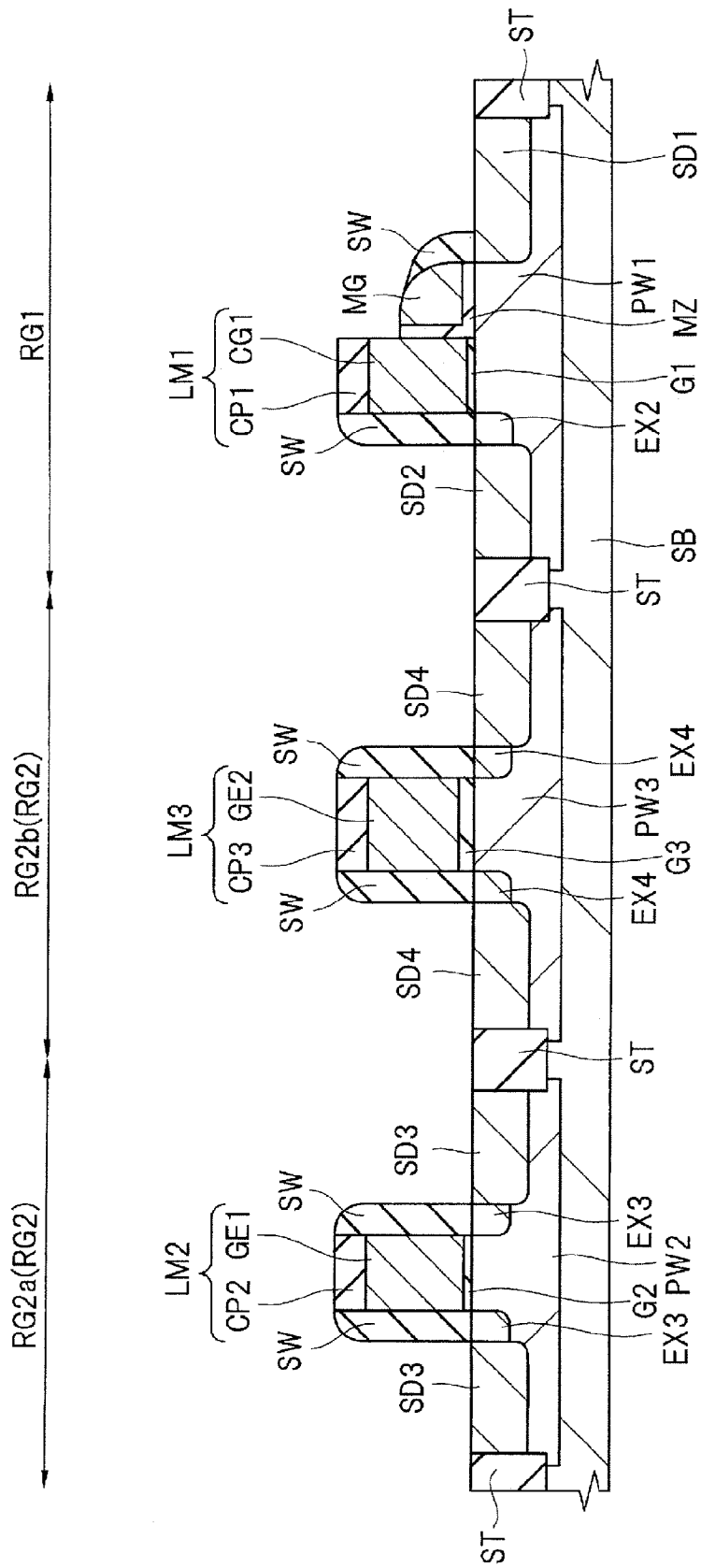
FIG. 41 is a main-portion cross-sectional view of the semiconductor device during the manufacturing process thereof, which is subsequent to FIG. 40.

FIG. 41 shows the stage where, in Embodiment 2, the steps preceding and including Step S16 have been performed. As shown in FIG. 41, the drain semiconductor region (corresponding to the foregoing semiconductor region MD) is formed of the lower-concentration n$^-$-type semiconductor region EX2 and the higher-concentration n$^+$-type semiconductor region SD2. On the other hand, as shown in FIG. 41, the source semiconductor region (corresponding to the foregoing semiconductor region MS) is formed of the higher-concentration n$^+$-type semiconductor region SD1 and has no LDD structure.

In Embodiment 2, in addition to the effect obtained in Embodiment 1 described above, the following effect can further be obtained.

That is, in Embodiment 1 described above, the height ($h_2$) of the memory gate electrode MG formed in Step S10 is lower than the height ($h_1$) of the dummy control gate electrode CG1. When the height of the memory gate electrode MG is low, during the ion implantation for forming the n$^+$-type semiconductor region SD1 in Step S16, a phenomenon may occur in which impurity ions penetrate the memory gate electrode MG to be implanted also into the substrate region immediately under the gate electrode MG. The phenomenon may cause the degradation of characteristics and therefore needs be prevented. However, to prevent the phenomenon, it is necessary to strictly control the etch-back step in Step S10 to strictly control the height of the memory gate electrode MG or strictly control the ion implantation step for forming the n$^+$-type semiconductor region SD1 in Step S16. This may increase the difficulty of management of the manufacturing process of the semiconductor device.

By contrast, in Embodiment 2, not the memory gate electrode MG, but the sidewall spacer SW2$a$ is caused to function as the mask (ion implantation inhibiting mask) to form the n$^+$-type semiconductor region SD1 by ion implantation. In the same manner as in Embodiment 1 described above, in Embodiment 2 also, the height ($h_2$) of the memory gate electrode MG needs to be set lower than the height ($h_1$) of the dummy control gate electrode CG1. However, there is no such limitation to the height of the sidewall spacer SW2$a$.

As a result, it is possible to ensure a sufficient height to the sidewall spacer SW2$a$. This can reliably prevent the occurrence of the phenomenon in which, during the ion implantation for forming the n$^+$-type semiconductor region SD1, impurity ions penetrate the sidewall spacer SW2$a$ to be implanted also into the substrate region immediately under the sidewall spacer SW2$a$. Therefore, it is possible to further improve the performance of the semiconductor device. In addition, since there is no need to strictly control the etch-back step for the sidewall spacers SW2 to strictly control the heights of the sidewall spacers SW2 or strictly control the ion implantation step for forming the n$^-$-type semiconductor region EX1, the management of the manufacturing process of the semiconductor device is more easily performed.

Accordingly, in Embodiment 2, the height of each of the sidewall spacers SW2 is preferably higher than the height ($h_2$) of the memory gate electrode MG formed in Step S10. In particular, a height ($h_5$) of the sidewall spacer SW2$a$ is preferably higher than the height ($h_2$) of the memory gate electrode MG formed in Step S10 ($h_5 > h_2$). This allows the sidewall spacer SW2$a$ having the height higher than that of the memory gate electrode MG, which will be formed later, to function as the mask (ion implantation inhibiting mask) and allows the n$^+$-type semiconductor region SD1 to be formed by ion implantation. In this manner, it is possible to fully enjoy the advantage provided by preventing the phenomenon in which impurity ions are implanted into the substrate region immediately under the sidewall spacer SW2$a$ and causing the sidewall spacer SW2$a$, not the memory gate electrode MG, to function as the mask (ion implantation inhibiting mask) to form the n$^+$-type semiconductor region SD1.

Note that, as described above, when a height is mentioned, it refers to a height in a direction generally perpendicular to the main surface of the semiconductor substrate SB. Accordingly, the height ($h_5$) of the sidewall spacer SW2$a$ corresponds to a distance (height) from the main surface (top surface of the p-type well PW1) of the semiconductor substrate SB to the uppermost portion (top portion) of the sidewall spacer SW2$a$.

More preferably, the height of each of the sidewall spacers SW2, particularly the height ($h_5$) of the sidewall spacer SW2$a$, is set substantially equal to the height of the multi-layer body LM1. This can more reliably prevent impurity ions from being implanted into the substrate region immediately under the sidewall spacer SW2$a$ during the ion implantation for forming the n$^+$-type semiconductor region SD1.

Embodiment 3

When the sidewall spacers SW are formed in Step S15, in the memory cell region RG1, the sidewall spacers SW are formed over the side wall (side wall opposite to the side wall adjacent to the memory gate electrode MG via the insulating film MZ) of the multi-layer body LM1 and over the side wall (side wall opposite to the side wall adjacent to the multi-layer body LM1 via the insulating film MZ) of the memory gate electrode MG. However, when the height of the memory gate electrode MG is set lower than the height of the dummy control gate electrode CG1, there may be a case where the sidewall spacer SW is formed also over the memory gate electrode MG or where the sidewall spacer SW is not formed over the memory gate electrode MG.

In Embodiment 1 described above, as shown in FIG. 18 described above, the description has been given of the case where the sidewall spacer SW is not formed over the memory gate electrode MG. Accordingly, in the case shown in FIG. 18, when the sidewall spacers SW are formed in Step S15, the side wall of the memory gate electrode MG is covered with the sidewall spacer SW, but the upper surface of the memory gate electrode MG is uncovered with the sidewall spacer SW and exposed. In this case (the case shown in FIG. 18), when the metal silicide layers SL are formed in Step S18, as shown in FIG. 21, the metal silicide layer SL is formed in the top surface of the portion of the memory gate electrode MG (i.e., in the upper portion of the memory gate electrode MG) which is uncovered with the sidewall spacer SW. When the metal silicide layer SL is formed in the top surface (upper portion) of the memory gate electrode MG, it is possible to reduce the resistance of the memory gate electrode MG using the metal silicide layer SL. As a result, even when the memory gate electrode MG is formed of a non-doped silicon film (polysilicon film), no problem arises with respect to the resistance of the memory gate electrode MG.

Figure 42:
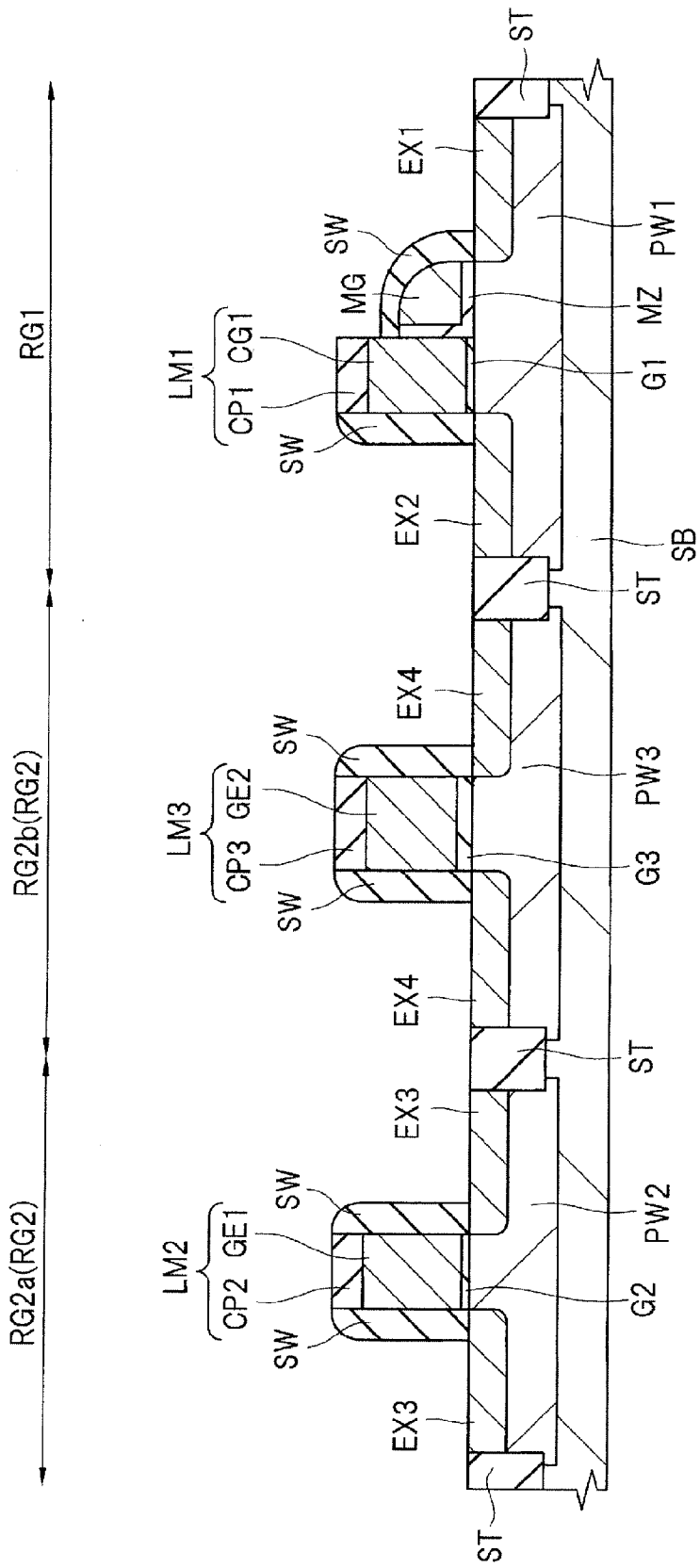
FIG. 42 is a main-portion cross-sectional view of a semiconductor device in still another embodiment during a manufacturing process thereof.
Figure 43:
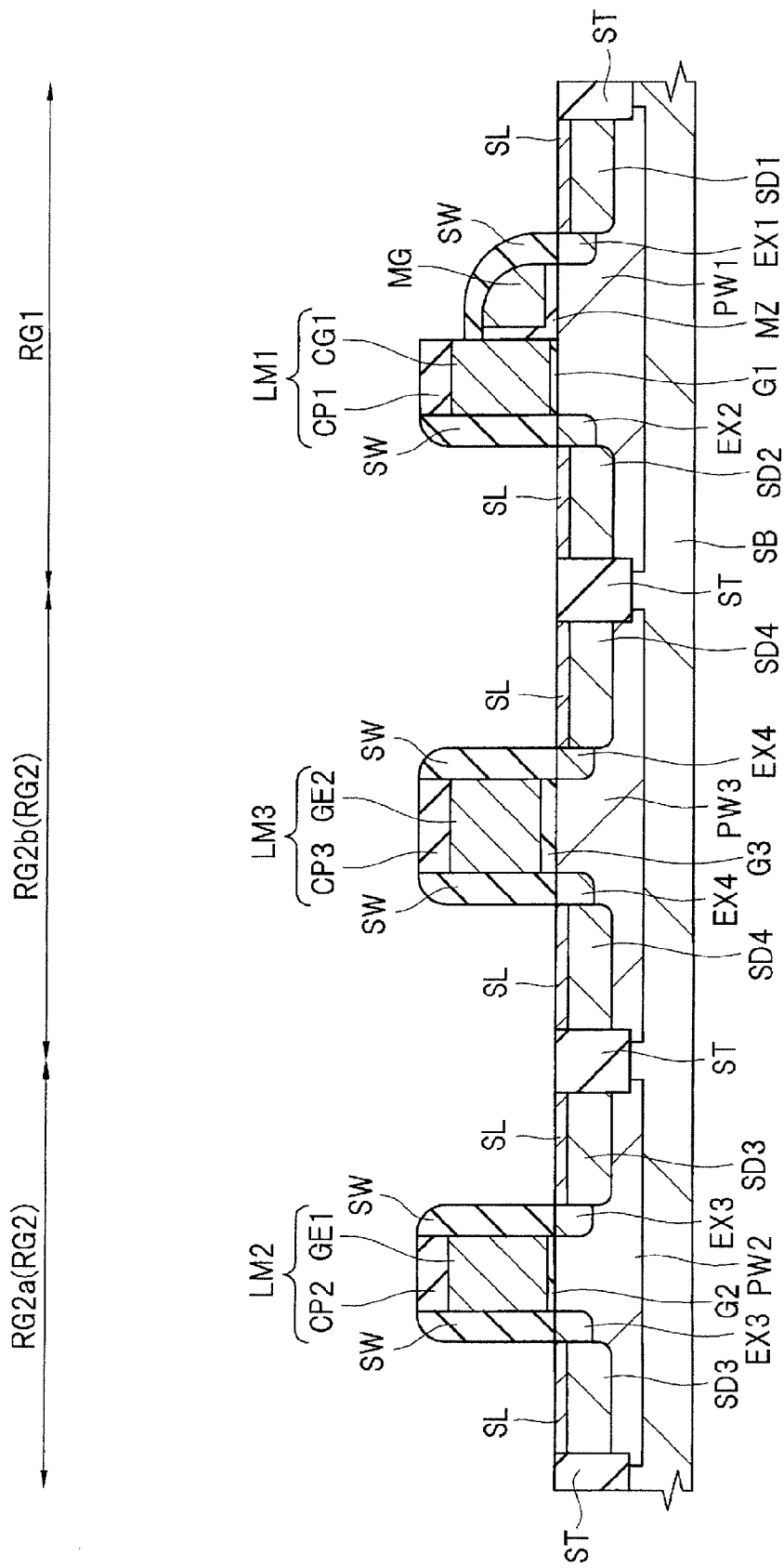
FIG. 43 is a main-portion cross-sectional view of the semiconductor device during the manufacturing process thereof, which is subsequent to FIG. 42.

On the other hand, when the sidewall spacer SW is formed in Step S15, as shown in FIG. 42, a state may also be provided where the entire memory gate electrode MG is covered with the sidewall spacer SW and the memory gate electrode MG has no exposed portion. That is, in the case shown in FIG. 42, the memory gate electrode MG is in a state covered with the sidewall spacer SW except for the portion thereof in contact with the insulating film MZ. In this case (case shown in FIG. 42), even when the metal silicide layers SL are formed in Step S18, as shown in FIG. 43, the metal silicide layer SL is not formed in the top surface of the memory gate electrode MG. Here, FIGS. 42 and 43 are main-portion cross sectional views of a semiconductor device in Embodiment 3 during a manufacturing process thereof. FIG. 42 corresponds to the same process stage as shown in FIG. 18 described above. FIG. 43 corresponds to the same process stage as shown in FIG. 21 described above.

Figure 44:
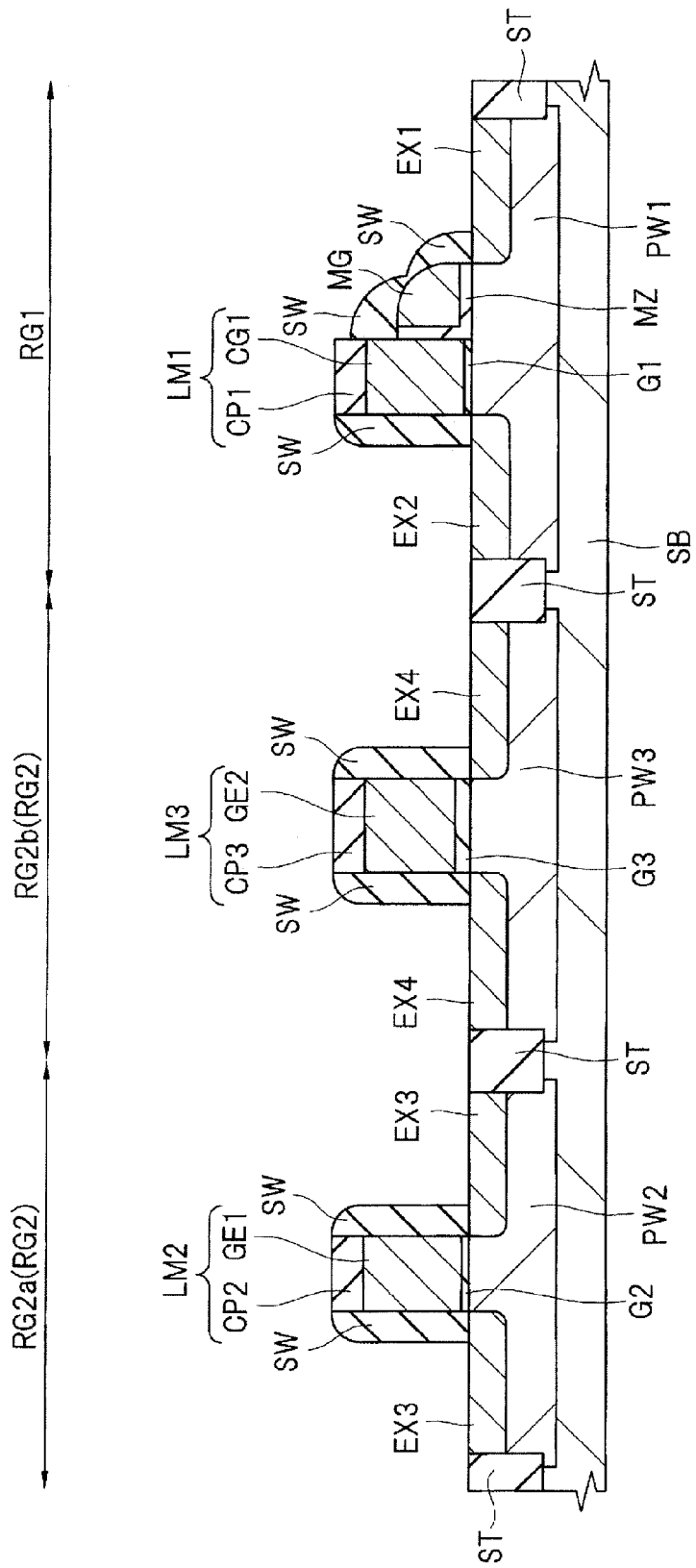
FIG. 44 is a main-portion cross-sectional view of the semiconductor device in the still other embodiment during the manufacturing process thereof.
Figure 45:
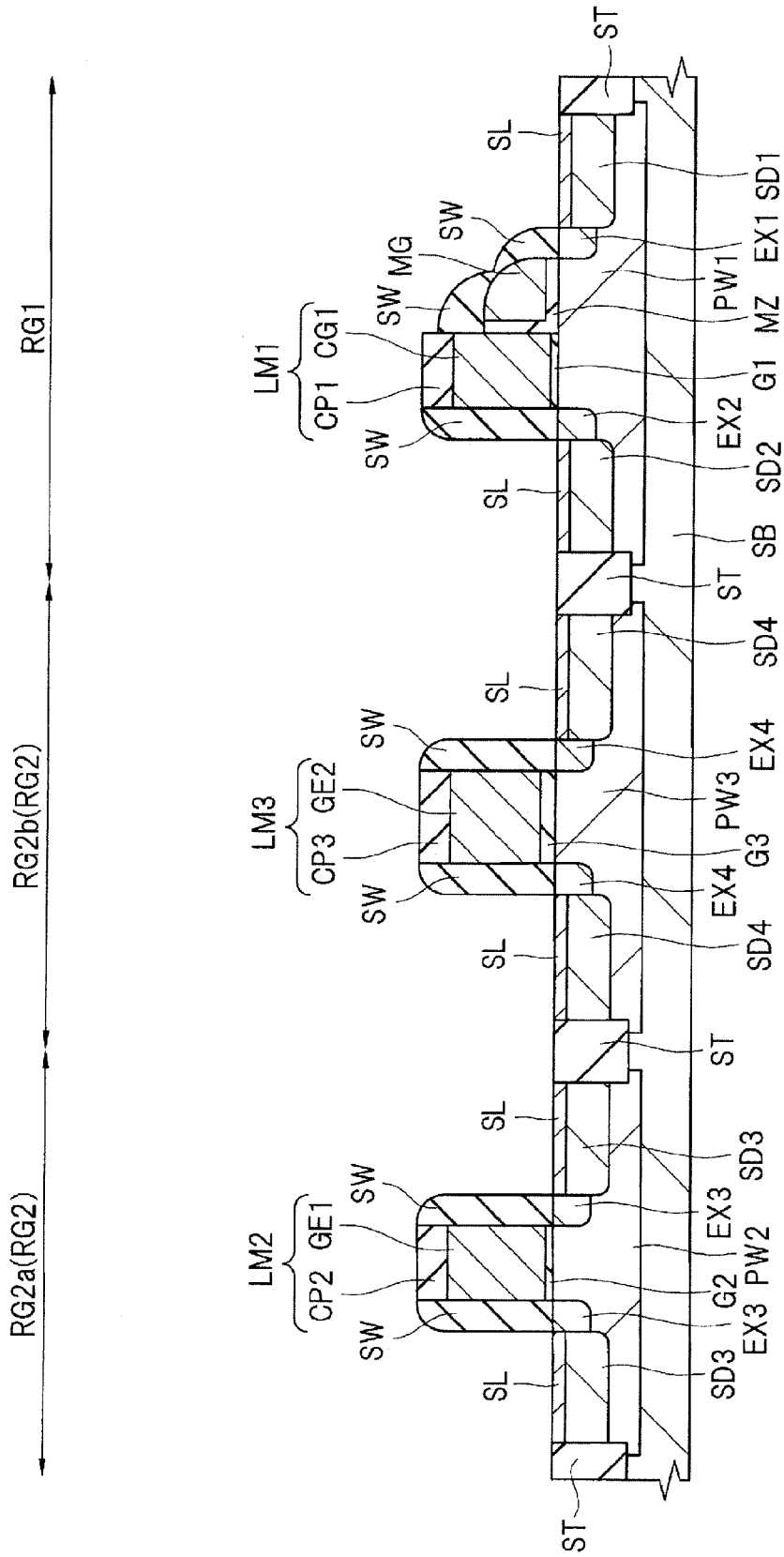
FIG. 45 is a main-portion cross-sectional view of the semiconductor device during the manufacturing process thereof, which is subsequent to FIG. 44.

When the sidewall spacers SW are formed in Step S15, as shown in FIG. 44, a state may also be provided where, while the entire memory gate electrode MG is covered with the sidewall spacer SW and the memory gate electrode MG has no exposed portion, the sidewall spacer SW covering the memory gate electrode MG is formed to have two humps. However, in the case shown in FIG. 44, the sidewall spacer SW covering the memory gate electrode MG is not divided into two parts. Accordingly, in the case shown in FIG. 44 also, in the same manner as in the case shown in FIG. 42 described above, the memory gate electrode MG is in a state covered with the side wall spacer SW except for the portion thereof in contact with the insulating film MZ. In this case (case shown in FIG. 44), even when the metal silicide layers SL are formed in Step S18, as shown in FIG. 45, the metal silicide layer SL is not formed in the top surface of the memory gate electrode MG. Here, FIGS. 44 and 45 are main-portion cross-sectional views of the semiconductor device in Embodiment 3 during the manufacturing process thereof. FIG. 44 corresponds to the same process stage as shown in FIG. 18 described above. FIG. 45 corresponds to the same process stage as shown in FIG. 21 described above.

When the metal silicide layer SL is not formed in the top surface of the memory gate electrode MG (the case shown in FIG. 43 and the case shown in FIG. 45), it is impossible to reduce the resistance of the memory gate electrode MG using the metal silicide layer SL. Accordingly, the memory gate electrode MG is more preferably formed of a silicon film (doped polysilicon film) into which an impurity (n-type or p-type impurity) has been introduced. This allows a reduction in the resistance of the memory gate electrode MG. Note that, when the metal silicide layer SL is not formed in the top surface of the memory gate electrode MG (the case shown in FIG. 43 and the case shown in FIG. 45), the manufactured semiconductor device also has a structure in which the metal silicide layer (SL) is not formed in the top surface of the memory gate electrode MG.

In the case shown in FIG. 42 and the case shown in FIG. 44, the sidewall spacer SW is formed not only over the side wall of the memory gate electrode MG, but also over the upper surface of the memory gate electrode MG. Accordingly, in the polishing treatment in Step S20, it is also possible to cause the sidewall spacer SW covering the upper surface of the memory gate electrode MG to function as a protective film (polishing protective film or polishing stopper film). As a result, even when excessive polishing occurs in the polishing treatment in Step S20, it is possible to prevent the memory gate electrode MG from being exposed. This can improve the manufacturing yield of the semiconductor device. This also allows the management of the manufacturing process of the semiconductor device to be easily performed.

Figure 46:
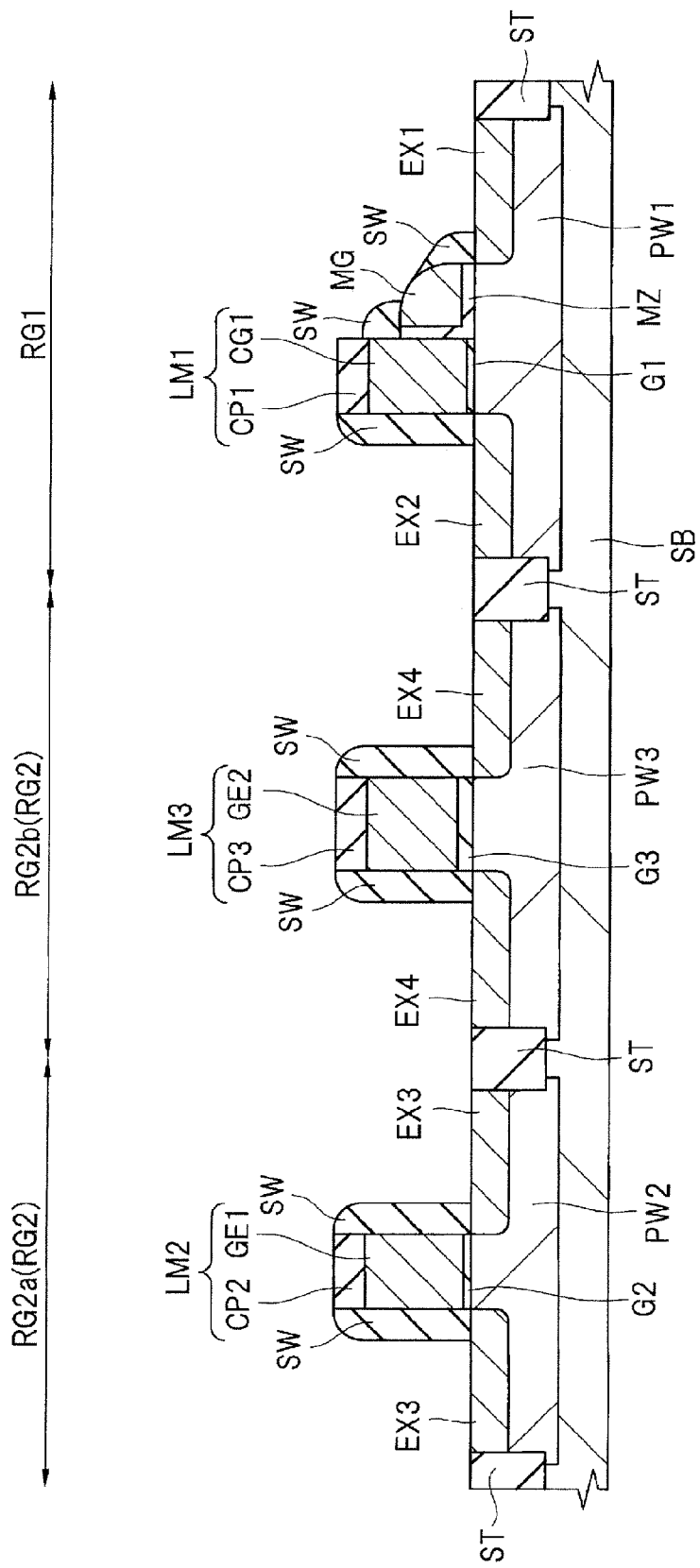
FIG. 46 is a main-portion cross-sectional view of the semiconductor device in the still other embodiment during the manufacturing process thereof.
Figure 47:
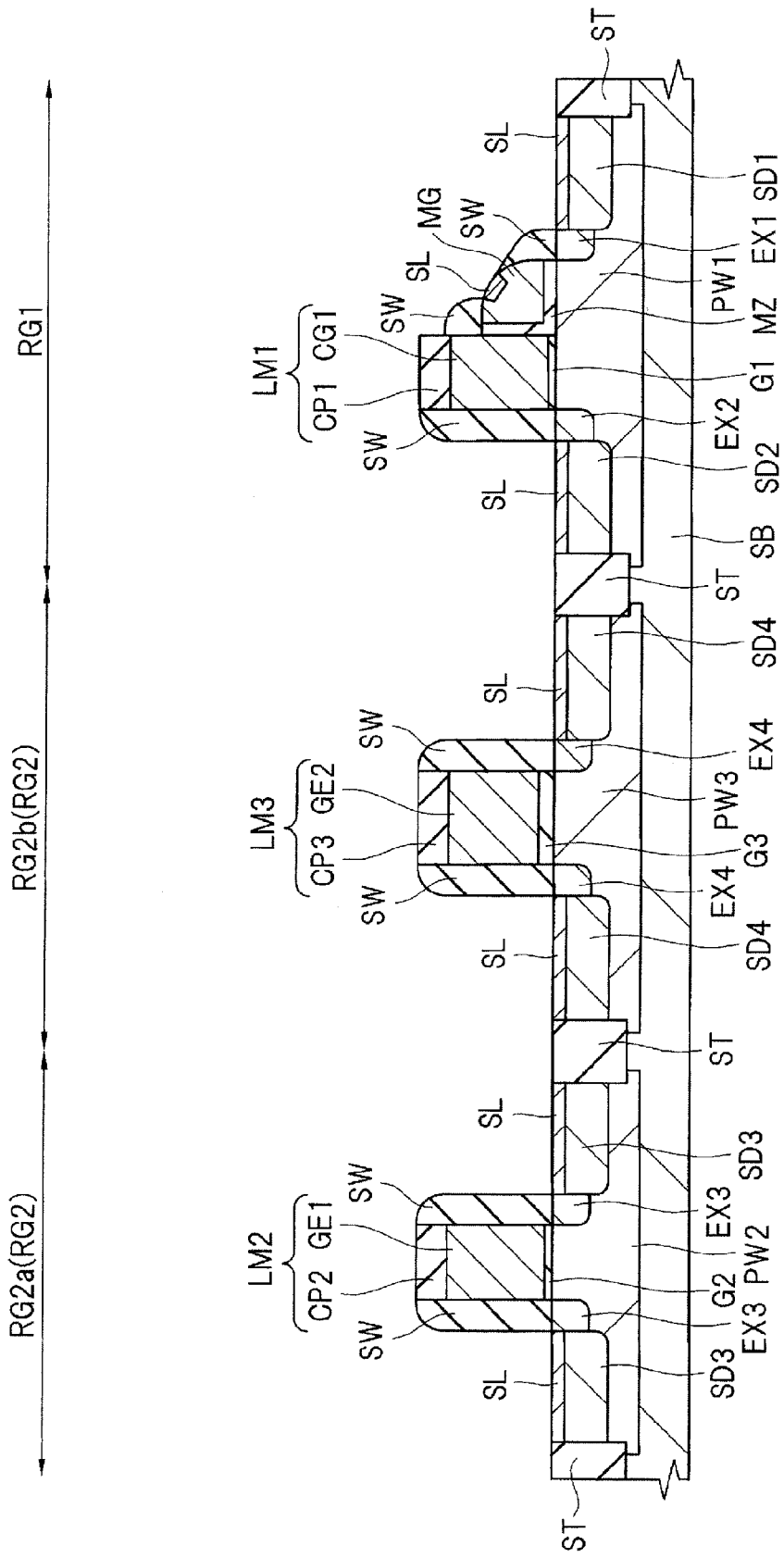
FIG. 47 is a main-portion cross-sectional view of the semiconductor device during the manufacturing process thereof, which is subsequent to FIG. 46.

When the sidewall spacers SW are formed in Step S15, as shown in FIG. 46, a state may also be provided where the sidewall spacer SW covering the memory gate electrode MG is formed and divided in two parts. That is, the case shown in FIG. 46 corresponds to the case where the respective sidewall spacers SW are formed over the side wall and upper surface of the memory gate electrode MG, and the sidewall spacer SW formed over the side wall of the memory gate electrode MG is separate from the sidewall spacer SW formed over the upper surface thereof. On the other hand, the case shown in FIG. 44 described above corresponds to the case where the sidewall spacer SW formed over the side wall of the memory gate electrode MG is not separate from the sidewall spacer SW formed over the upper surface thereof and is integrally connected thereto so that the memory gate electrode MG is not exposed. Here, FIGS. 46 and 47 are main-portion cross-sectional views of the semiconductor device in Embodiment 3. FIG. 46 corresponds to the same process stage as shown in FIG. 18 described above. FIG. 47 corresponds to the same process stage as shown in FIG. 21 described above.

In the case shown FIG. 46, the sidewall spacer SW formed over the side wall of the memory gate electrode MG is separate from the sidewall spacer SW formed over the upper surface thereof. Consequently, a part of the top surface of the memory gate electrode MG is uncovered with the sidewall spacer SW and exposed. In this case (the case shown in FIG. 46), when the metal silicide layers SL are formed in Step S18, as shown in FIG. 47, the metal silicide layer SL is formed in the top surface of the portion of the memory gate electrode MG which is uncovered with the sidewall spacer SW. As shown in FIG. 47, when the metal silicide layer SL is formed in the top surface of the memory gate electrode MG, it is possible to reduce the resistance of the memory gate electrode MG using the metal silicide layer SL. As a result, even when the memory gate electrode MG is formed of a non-doped silicon film (polysilicon film), no problem arises with respect to the resistance of the memory gate electrode MG.

In the case shown in FIG. 46 also, the sidewall spacer SW is formed not only over the side wall of the memory gate electrode MG, but also over the upper surface of the memory gate electrode MG. Accordingly, in the polishing treatment in Step S20, it is also possible to cause the sidewall spacer SW over the upper surface of the memory gate electrode MG to function as a protective film (polishing protective film or polishing stopper film). As a result, even when excessive polishing occurs in the polishing treatment in Step S20, it is possible to prevent the memory gate electrode MG from being exposed. This can improve the manufacturing yield of the semiconductor device. This also allows the management of the manufacturing process of the semiconductor device to be easily performed.

For example, when the gate length of the memory gate electrode MG is reduced (to, e.g., about 30 to 40 nm) and the deposited film thickness of the insulating film IL2 is increased to be larger than the gate length of the memory gate electrode MG, the thickness of the sidewall spacer SW is larger than the gate length of the memory gate electrode MG. As a result, as shown in FIG. 42, a state is likely to be reached where the upper surface of the memory gate electrode MG and the side wall thereof are entirely covered with the sidewall spacer SW. When the thickness of the sidewall spacer SW is small, as shown in FIG. 44, the sidewall spacer SW covering the memory gate electrode MG is likely to have a two-part configuration. When the gate length of the memory gate electrode MG is large, as shown in FIG. 46, the sidewall spacer SW formed over the side wall of the memory gate electrode MG is likely to be separated from the sidewall spacer SW formed over the upper surface of the memory gate electrode MG.

Figure 48:
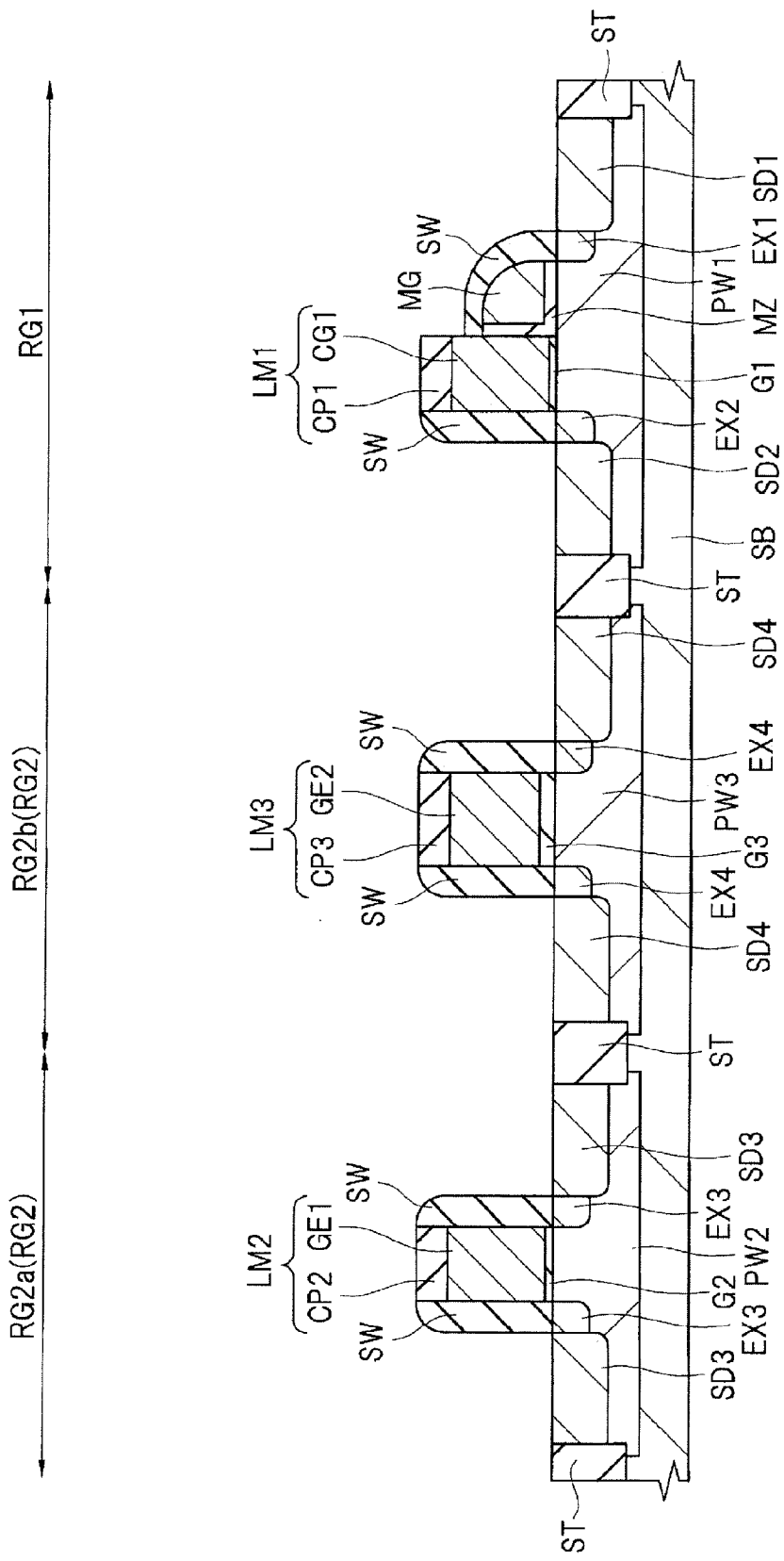
FIG. 48 is a main-portion cross-sectional view of the semiconductor device in the still other embodiment during the manufacturing process thereof.

FIG. 48 shows the stage where, after the sidewall spacers SW were formed in Step S15 and the structure shown in FIG. 42 described above was obtained, Step S16 (step of forming the n$^+$-type semiconductor regions SD1, SD2, SD3, and SD4) and Step S17 (activation anneal) have been performed. The case where, after the structure shown in FIG. 48 was obtained, the metal salicide layers SL have been formed by a salicide process corresponds to FIG. 43 described above.

Figure 49:
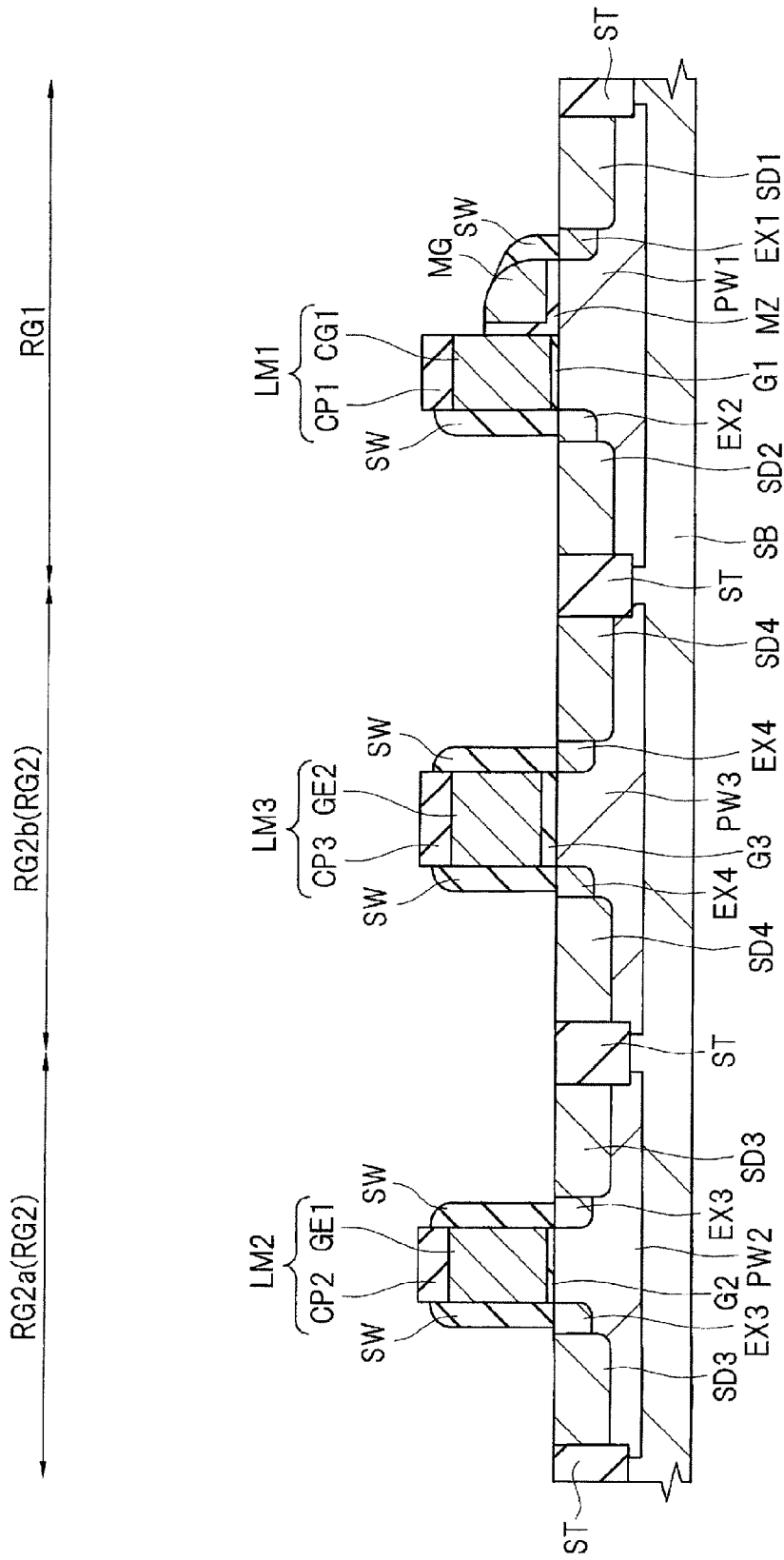
FIG. 49 is a main-portion cross-sectional view of the semiconductor device during the manufacturing process thereof, which is subsequent to FIG. 48.
Figure 50:
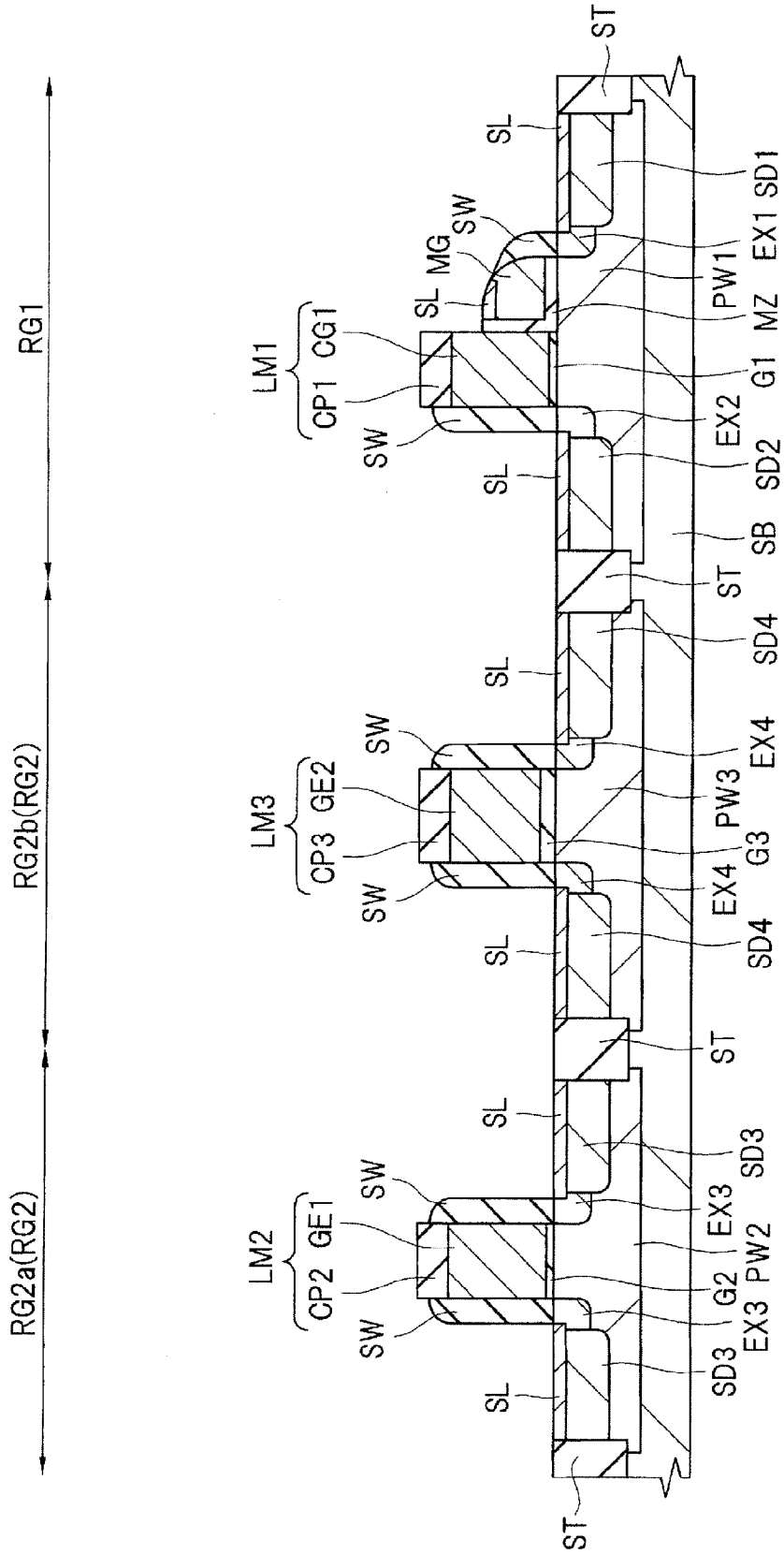
FIG. 50 is a main-portion cross-sectional view of the semiconductor device during the manufacturing process thereof, which is subsequent to FIG. 49.

FIG. 49 shows the state where, after the structure shown in FIG. 48 was obtained, the surface layer portion of each of the sidewall spacers SW has been cut (removed) by wet etching to reduce the thickness of the sidewall spacer SW. At the stage shown in FIG. 48, the memory gate electrode MG is covered with the sidewall spacer SW and therefore has no exposed portion. However, as a result of cutting (removing) the surface layer portion of the sidewall spacer SW by wet etching, at the stage shown in FIG. 49, a part (upper surface) of the memory gate electrode MG is exposed. Note that, in the wet etching, the sidewall spacer SW is not entirely removed, but a part of the sidewall spacer SW (corresponding to a part of the thickness thereof) is removed so as to expose a part (upper surface) of the memory gate electrode MG. Accordingly, the thicknesses of the sidewall spacers SW at the stage shown in FIG. 49 are smaller than the thicknesses of the sidewall spacers SW at the stage shown in FIG. 48. However, at the stage shown in FIG. 49 also, the sidewall spacers SW still remain over the side walls of the multi-layer bodies LM1, LM2, and LM3. Also, at the stage shown in FIG. 49, a part (upper surface) of the memory gate electrode MG is uncovered with the sidewall spacer SW and exposed, while another part (side wall) of the memory gate electrode MG retains the state covered with the sidewall spacer SW. Here, FIGS. 48 to 50 are main-portion cross-sectional views of the semiconductor device in Embodiment 3 during the manufacturing process thereof. FIG. 48 corresponds to the same process stage as shown in FIG. 19 described above. FIG. 50 corresponds to the same process stage as shown in FIG. 21 described above.

At the stage shown in FIG. 48, the memory gate electrode MG is covered with the sidewall spacer SW, and therefore has no exposed portion. As a result, even when a salicide process is performed in this state, the metal silicide layer SL is not formed in the top surface of the memory gate electrode MG, as shown in FIG. 43 described above. However, when a part (upper surface) of the memory gate electrode MG is exposed by wet-etching the surface layer portion of the sidewall spacer SW as shown in FIG. 49, and then the metal silicide layers SL are formed in Step S18, the metal silicide layer SL is formed in the top surface of the portion of the memory gate electrode MG (i.e., in the upper portion of the memory gate electrode MG) which is uncovered with the sidewall spacer SW, as shown in FIG. 50. Here, FIG. 50 corresponds to the same process stage as shown in FIG. 43 described above. When the metal silicide layer SL is formed in the top surface (upper portion) of the memory gate electrode MG as shown in FIG. 50, it is possible to reduce the resistance of the memory gate electrode MG using the metal silicide layer SL. As a result, even when the memory gate electrode MG is formed of a non-doped silicon film (polysilicon film), no problem arises with respect to the resistance of the memory gate electrode MG.

Embodiment 4

Embodiment 4 relates to a technique related to sidewall spacers (corresponding to the foregoing sidewall spacers SW).

Figure 51:
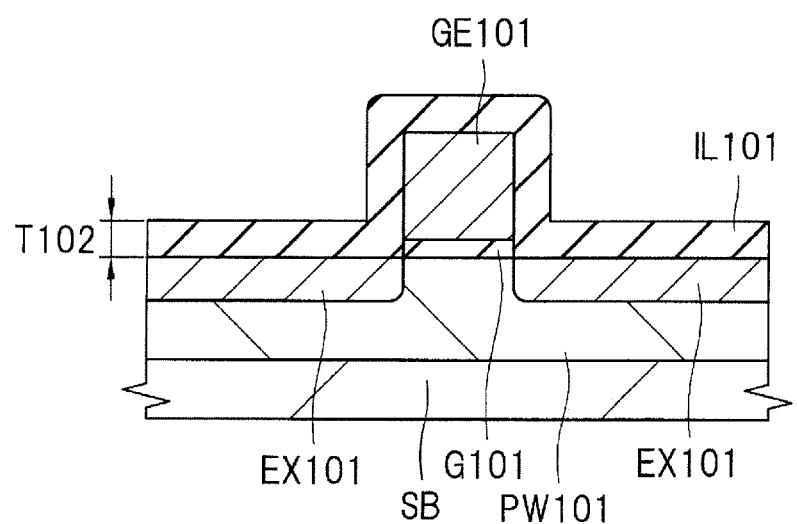
FIG. 51 is an illustrative view for illustrating a problem to be solved in yet another embodiment.
Figure 52:
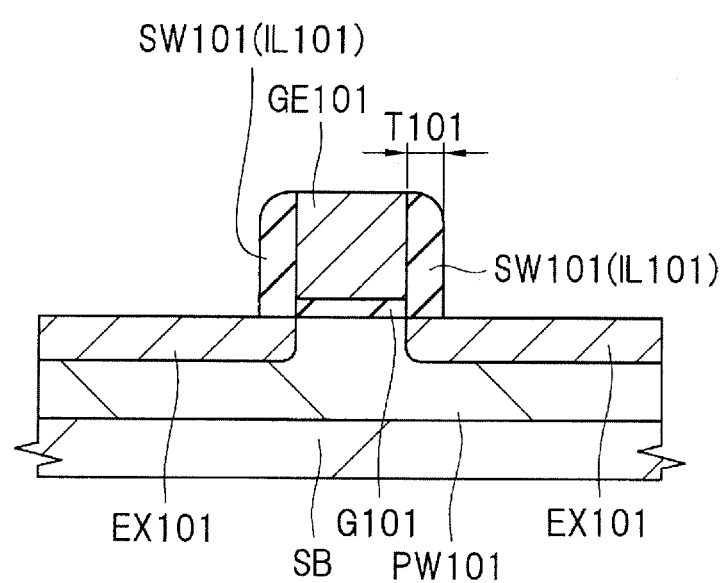
FIG. 52 is an illustrative view for illustrating the problem to be solved in the yet other embodiment.
Figure 53:
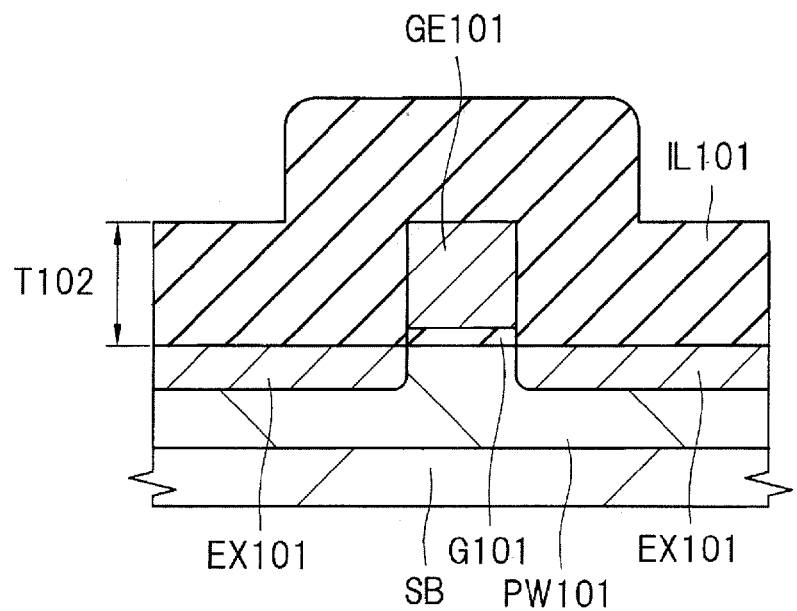
FIG. 53 is an illustrative view for illustrating the problem to be solved in the yet other embodiment.
Figure 54:
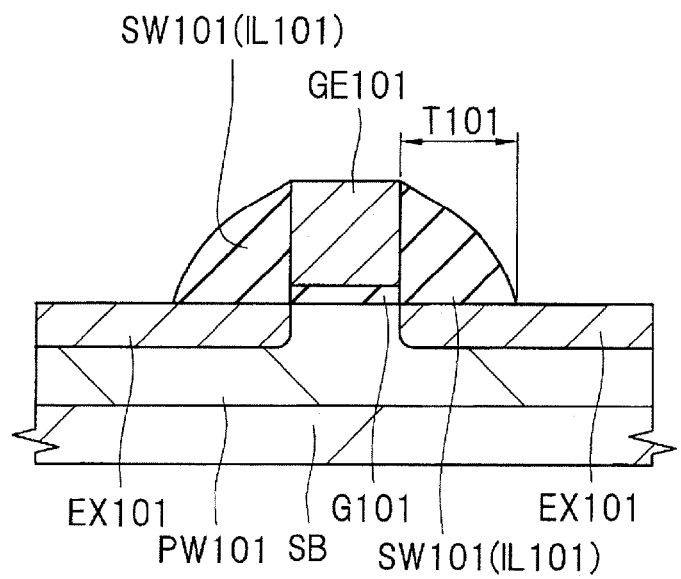
FIG. 54 is an illustrative view for illustrating the problem to be solved in the yet other embodiment.
Figure 55:
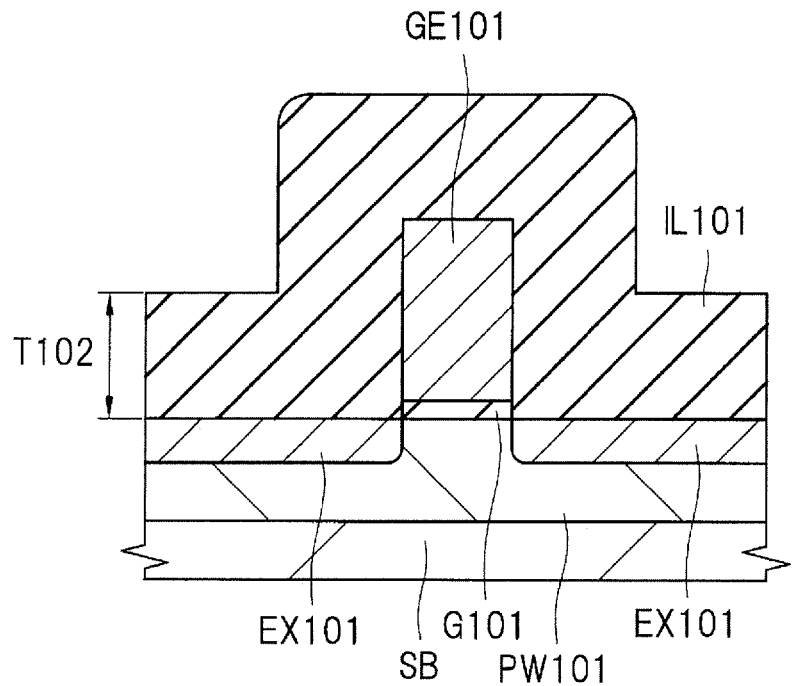
FIG. 55 is an illustrative view for illustrating the problem to be solved in the yet other embodiment.
Figure 56:
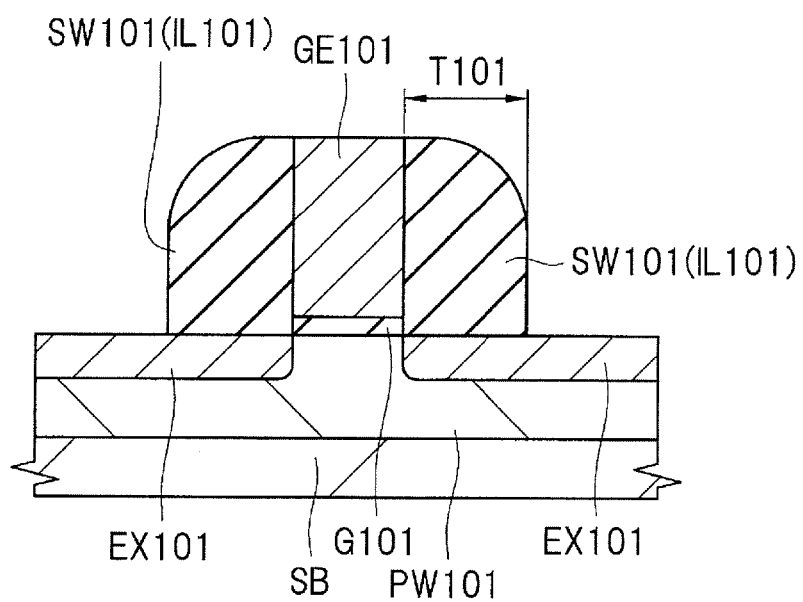
FIG. 56 is an illustrative view for illustrating the problem to be solved in the yet other embodiment.

FIGS. 51 to 56 are illustrative views for illustrating a problem to be solved in Embodiment 4. FIGS. 51 to 56 show cross-sectional views during the formation of a MISFET. FIGS. 51, 53, and 55 correspond to the stage where an insulating film IL101 for forming the sidewall spacers has been formed. FIGS. 52, 54, and 56 show the stage where sidewall spacers SW101 have been formed by etching back the insulating film IL101. Note that FIG. 52 shows the process stage subsequent to that shown in FIG. 51, FIG. 54 shows the process stage subsequent to that shown in FIG. 53, and FIG. 56 shows the process stage subsequent to that shown in FIG. 55.

That is, to form the MISFET, as shown in FIG. 51, a p-type well PW101 is formed in the semiconductor substrate SB and, over the p-type well PW101, a gate electrode GE101 is formed via a gate insulating film G101. Then, using the gate electrode GE101 as a mask, ion implantation is performed to form n$^-$-type semiconductor regions EX101. Subsequently, as shown in FIG. 51, over the main surface of the semiconductor substrate SB, the insulating film IL101 for forming the sidewall spacers is formed so as to cover the gate electrode GE101. The n$^-$-type semiconductor regions EX101 are lower-concentration semiconductor regions for source/drain LDD structures and correspond to the foregoing n$^-$-type semiconductor regions EX4. After the formation of the insulating film IL101, as shown in FIG. 52, the insulating film IL101 is etched back using an anisotropic etching technique to form the sidewall spacers SW101 over the side walls of the gate electrode GE101.

In the case shown in FIGS. 53 and 54 also, the same steps as those performed in the case shown in FIGS. 51 and 52 are performed. That is, as shown in FIG. 53, the insulating film IL101 for forming the sidewall spacers is formed and then etched back using an anisotropic etching technique to form the sidewall spacers SW101 over the side walls of the gate electrode GE101, as shown in FIG. 54. In the case shown in FIGS. 55 and 56 also, the same steps as those performed in the case shown in FIGS. 51 and 52 are performed. That is, as shown in FIG. 55, the insulating film IL101 for forming the sidewall spacers is formed and then etched back using an anisotropic etching technique to form the sidewall spacers SW101 over the side walls of the gate electrode GE101, as shown in FIG. 56. After the sidewall spacers SW101 are formed as shown in FIGS. 52, 54, and 56, ion implantation is performed using the gate electrode GE101 and the sidewall spacers SW101 as an ion implantation inhibiting mask, though not shown herein, to form higher-concentration source/drain semiconductor regions (corresponding to the foregoing n$^+$-type semiconductor regions SD4).

However, the insulating film IL101 has a deposited film thickness T102 which is larger in the case shown in FIGS. 53 and 54 than in the case shown in FIGS. 51 and 52. Accordingly, each of the sidewall spacers SW101 has a larger thickness T101. On the other hand, the deposited film thickness T102 of the insulating film IL101 in the case shown in FIGS. 55 and 56 is the same as in the case shown in FIGS. 53 and 54. Accordingly, the thickness T101 of each of the sidewall spacers SW101 is substantially the same. However, the height of the gate electrode GE101 is larger in the case shown in FIGS. 55 and 56 than in the case shown in FIGS. 53 and 54 and, accordingly, each of the sidewall spacers SW101 in the case shown in FIGS. 55 and 56 has a larger height. Here, the thickness T101 of each of the sidewall spacers SW101 corresponds to the dimension (thickness) of the sidewall spacer SW101 in a direction along the gate length direction of the gate electrode GE101.

Depending on the specifications (required characteristics) of the MISFET, the thickness T101 of each of the sidewall spacers SW101 needs to be increased. For example, when the thickness T101 of each of the sidewall spacers SW101 is increased, the positions of the higher-concentration source/drain semiconductor regions (corresponding to the foregoing n$^+$-type semiconductor regions SD4) can be brought farther away from the side walls of the gate electrode GE101. This can enhance the breakdown voltage of the MISFET. Accordingly, in the case of forming a high-breakdown-voltage MISFET or the like, the thickness T101 of each of the sidewall spacers SW101 needs to be increased.

However, in the case where the thickness T101 of each of the sidewall spacers SW101 is large as shown in FIG. 54, the following problem may arise.

That is, in the case where the thickness T101 of each of the sidewall spacers SW101 is small as shown in FIG. 52, even at a position distant from the gate electrode GE101 in the sidewall spacer SW101, the height of the sidewall spacer SW101 is not so reduced. Accordingly, in the case where the thickness T101 of each of the sidewall spacers SW101 is small as shown in FIG. 52, substantially the entire sidewall spacer SW101 can function as the ion implantation inhibiting mask. However, in the case where the thickness T101 of each of the sidewall spacer SW101 is large as shown in FIG. 54, when the height of the gate electrode GE101 is low, the height of each of the sidewall spacers SW101 decreases with increasing distance from the gate electrode GE101 in the sidewall spacer SW101. Consequently, in the case where the thickness T101 of each of the sidewall spacers SW101 is large as shown in FIG. 54, the portion of the sidewall spacer SW101 having a reduced height cannot function as the ion implantation inhibiting mask and may undesirably allow impurity ions to pass therethrough.

Accordingly, in the case of increasing the thickness of each of the sidewall spacers SW formed over the side walls of the gate electrode GE101, as shown in FIGS. 55 and 56, it is effective to increase the height of the gate electrode GE101. By increasing the height of the gate electrode GE101, even when the thickness T101 of each of the sidewall spacers SW101 formed over the side walls of the gate electrode GE101 is increased, it is possible to ensure the height of the sidewall spacer SW101 even at a position distant from the gate electrode GE101 in the sidewall spacer SW101. By thus increasing the height of the gate electrode GE101, as shown in FIG. 56, even when the thickness T101 of the sidewall spacer SW101 is large, it is possible to allow substantially the entire sidewall spacer SW101 to function as the ion implantation inhibiting mask and allow the phenomenon in which impurity ions pass through the sidewall spacer SW101 to be more easily prevented.

However, an increase in the height of the gate electrode GE101 as shown in FIG. 56 leads to an increase in the thickness of the interlayer insulating film and consequently to an increase in the aspect ratio of each of the contact holes to be formed in the interlayer insulating films. The increased aspect ratio of the contract hole leads to difficult formation of the contact hole and consequently to difficult embedding of a plug in the contact hole. As a result, it becomes difficult to perform a manufacturing process of the semiconductor device. In addition, the increased aspect ratio of the contract hole also leads to a reduction in the manufacturing yield of the semiconductor device. In the case of increasing the thickness of the interlayer insulating film as a result of increasing the height of the gate electrode GE101, it can be considered to increase the diameter of the contact hole so as to reduce the aspect ratio of the contact hole. However, this leads to increases in the two-dimensional dimensions of the semiconductor device, which is disadvantageous in terms of reducing the size (area) of the semiconductor device.

Accordingly, in the case of increasing the thickness T101 of each of the sidewall spacers SW101, to form the sidewall spacers SW101 which are so shaped as to be able to properly function as the ion implantation inhibiting mask, it is desirable to increase the height of the gate electrode GE101. However, to properly form the contact hole and the plug to be embedded in the contact hole, it is desirable not to increase the height of the gate electrode GE101. Thus, it is not easy to accomplish each of the formation of the sidewall spacers SW101 which are so shaped as to be able to properly function as the ion implantation inhibiting mask and proper formation of the contact hole and the plug to be embedded in the contact hole.

By contrast, in Embodiment 1 described above, even in the case of increasing a width T2 of each of the sidewall spacers SW formed over the side walls of the gate electrode GE2, by increasing the height $h_3$ (height $h_3$ is shown in FIGS. 16 and 18 described above) of the foregoing multi-layer body LM3, the sidewall spacers SW can be so shaped as to be able to properly function as the ion implantation inhibiting mask. For example, the height $h_3$ of the foregoing multi-layer body LM3 is increased to be larger than the width T2 of each of the sidewall spacers SW ($h_3$>T2), thereby allowing the sidewall spacers SW to be so shaped as to be able to properly function as the ion implantation inhibiting mask. By thus allowing the sidewall spacers SW to properly function as the ion implantation inhibiting mask, the ion implantation step can be performed. Therefore, it is possible to more properly form the foregoing n$^+$-type semiconductor regions SD4 and more reliably improve the performance of the semiconductor device.

Here, the thickness T2 of each of the sidewall spacers SW corresponds to the dimension (thickness) of the sidewall spacer SW in a direction along the gate length direction of the gate electrode having the side walls over which the sidewall spacers SW are formed, and is shown in FIG. 18 described above. The height $h_3$ of the multi-layer body LM3 corresponds to a height (distance) from the interface between the semiconductor substrate SE (p-type well PW3) and the insulating film G3 to the upper surface of the cap insulating film CP3 forming the multi-layer body LM3, and is shown in FIGS. 16 and 18 described above. Accordingly, the height $h_3$ of the multi-layer body LM3 substantially corresponds to the total sum of the respective thicknesses of the insulating film G3, the gate electrode GE2, and the cap insulating film CP3. The height $h_3$ of the multi-layer body LM3 can be adjusted using the thickness (deposited film thickness) of the silicon film PS1 formed in Step S5 described above or the thickness (deposited film thickness) of the insulating film IL1 formed in Step S6 described above. On the other hand, the width T2 of the sidewall spacer SW can be adjusted using the deposited film thickness of the insulating film IL2.

The height $h_3$ of the multi-layer body LM3 can also be increased by increasing the thickness of the cap insulating film CP3. However, in the polishing step in Step S20 described above, the cap insulating films CP1, CP2 and CP3 are removed. Accordingly, even when the thicknesses of the cap insulating films CP1, CP2, and CP3 are increased to increase the height $h_3$ of the multi-layer body LM3, the increased thicknesses of the cap insulating films CP1, CP2, and CP3 do not lead to an increase in the thickness of the interlayer insulating films. This allows a reduction in the total thickness of the insulating films IL3 and IL6. Since it is possible to reduce the total thickness of the insulating films IL3 and IL6, it is possible to reduce the aspect ratio of each of the contact holes CT formed in the insulating films IL3 and IL6. This allows easy formation of the contact holes CT and easy embedding of the plugs PG in the contact holes CT. As a result, the manufacturing process of the semiconductor device is easily performed and the manufacturing yield of the semiconductor device can be improved. In addition, since it is possible to reduce the total thickness of the insulating films IL3 and IL6, it is possible to reduce the aspect ratio of each of the contact holes CT without increasing the diameter of the contact hole CT, which is advantageous in terms of reducing the size (area) of the semiconductor device.

That is, in Embodiment 1 described above, it is possible to increase the height $h_3$ of the foregoing multi-layer body LM3 and also reduce the total thickness of the insulating films IL3 and IL6. Accordingly, it is possible to reliably accomplish each of the formation of the sidewall spacers SW which are so shaped as to properly function as the ion implantation inhibiting mask and proper formation of the contact holes CT and the plugs PG to be embedded in the contact holes CT.

Next, referring to FIGS. 57 to 67, a description will be given of a method of selectively forming the sidewall spacers SW having different thicknesses. FIGS. 57 to 67 are main-portion cross-sectional views of the semiconductor device in Embodiment 4 during the manufacturing process thereof. FIGS. 57 to 67 show substantially the same cross-sectional regions as shown in FIGS. 4 to 8, 10 to 13, and 15 to 32 each described above.

The manufacturing process in Embodiment 4, which will be described below with reference to FIGS. 57 to 67, is different from the manufacturing process in Embodiment 1 described above in a method of forming the sidewall spacers SW and otherwise substantially the same as the manufacturing process in Embodiment 1 described above. Accordingly, a description will be given mainly of the difference between the manufacturing process in Embodiment 4 and the manufacturing process in Embodiment 1 described above.

In Embodiment 4 also, by performing the steps preceding and including Step S14 described above in the same manner as in Embodiment 1 described above, the structure shown in FIG. 16 described above is obtained.

Figure 57:
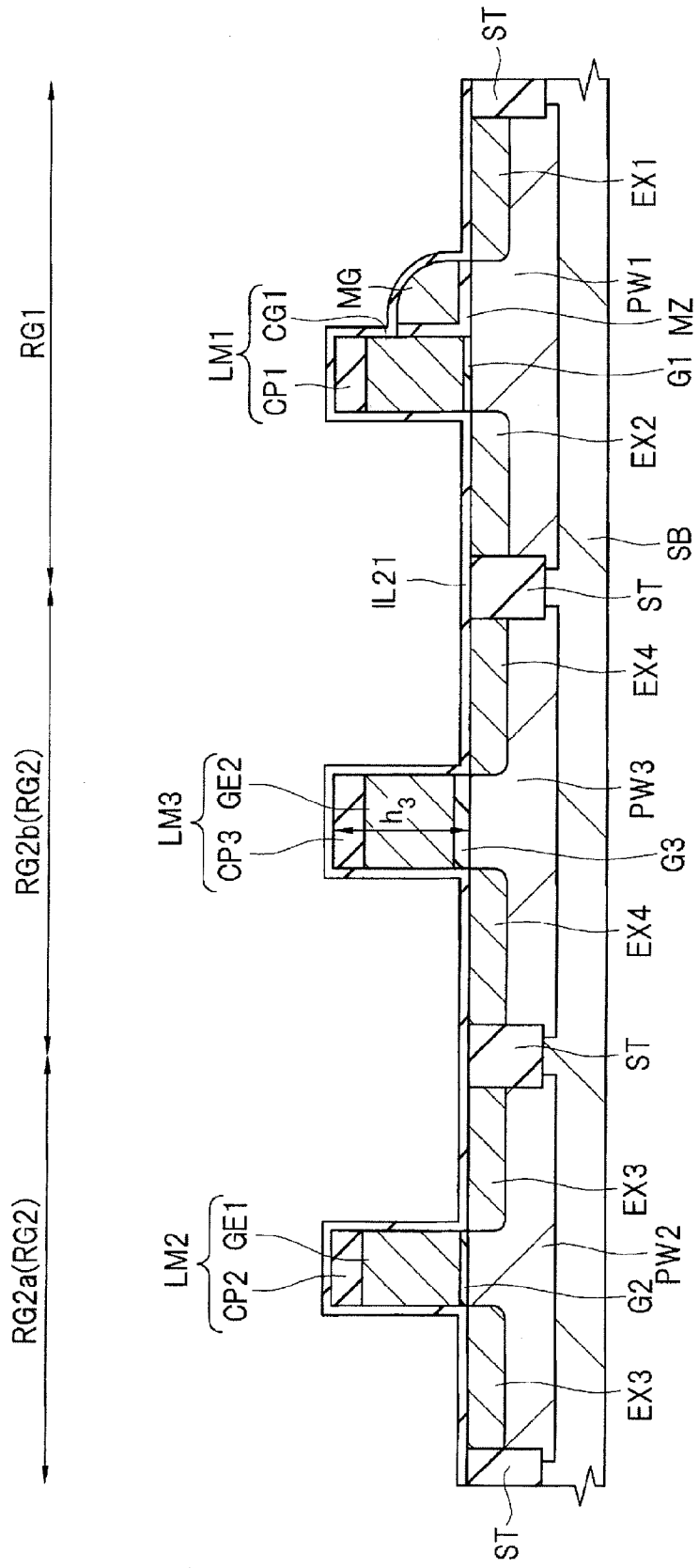
FIG. 57 is a main-portion cross-sectional view of the semiconductor device in the yet other embodiment during a manufacturing process thereof.

Then, in Embodiment 4, as shown in FIG. 57, an insulating film IL21 is formed (deposited) over the entire main surface of the semiconductor substrate SB. The insulating film IL21 is made of, e.g., a silicon nitride film or the like and can be formed using a CVD method or the like. The insulating film IL21 is formed so as to protect the semiconductor substrate SB in the subsequent etch-back step. The insulating film IL21 is formed over the semiconductor substrate SB so as to cover the memory gate electrode MG and the multi-layer bodies LM1, LM2, and LM3.

Figure 58:
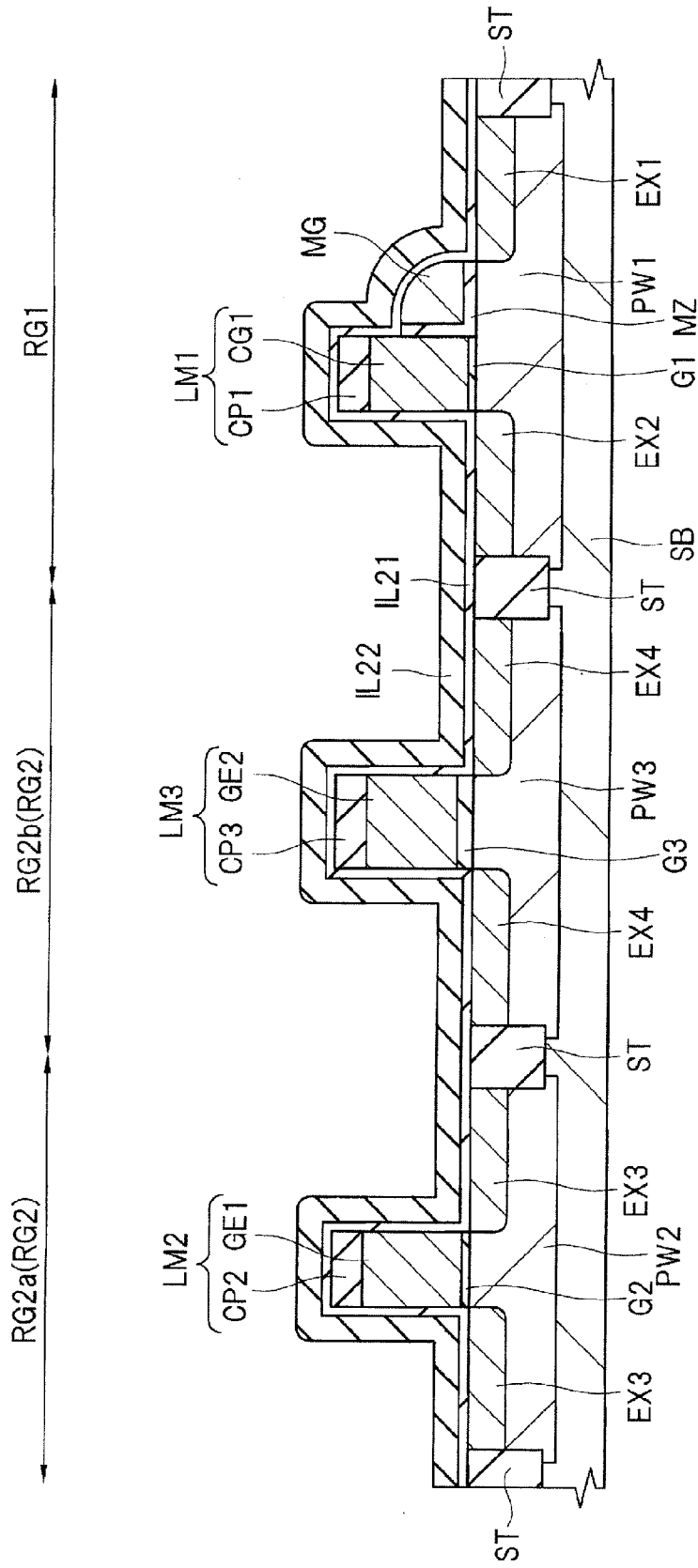
FIG. 58 is a main-portion cross-sectional view of the semiconductor device during the manufacturing process thereof, which is subsequent to FIG. 57.

Then, as shown in FIG. 58, over the main surface of the semiconductor substrate SB, i.e., over the insulating film IL21, an insulating film IL22 is formed. The insulating film IL22 is for forming sidewall spacers SW3 described later. The insulating film IL22 is made of an insulating material different from that of the insulating film IL21 such as, e.g., a silicon dioxide film and can be formed using a CVD method or the like.

Figure 59:
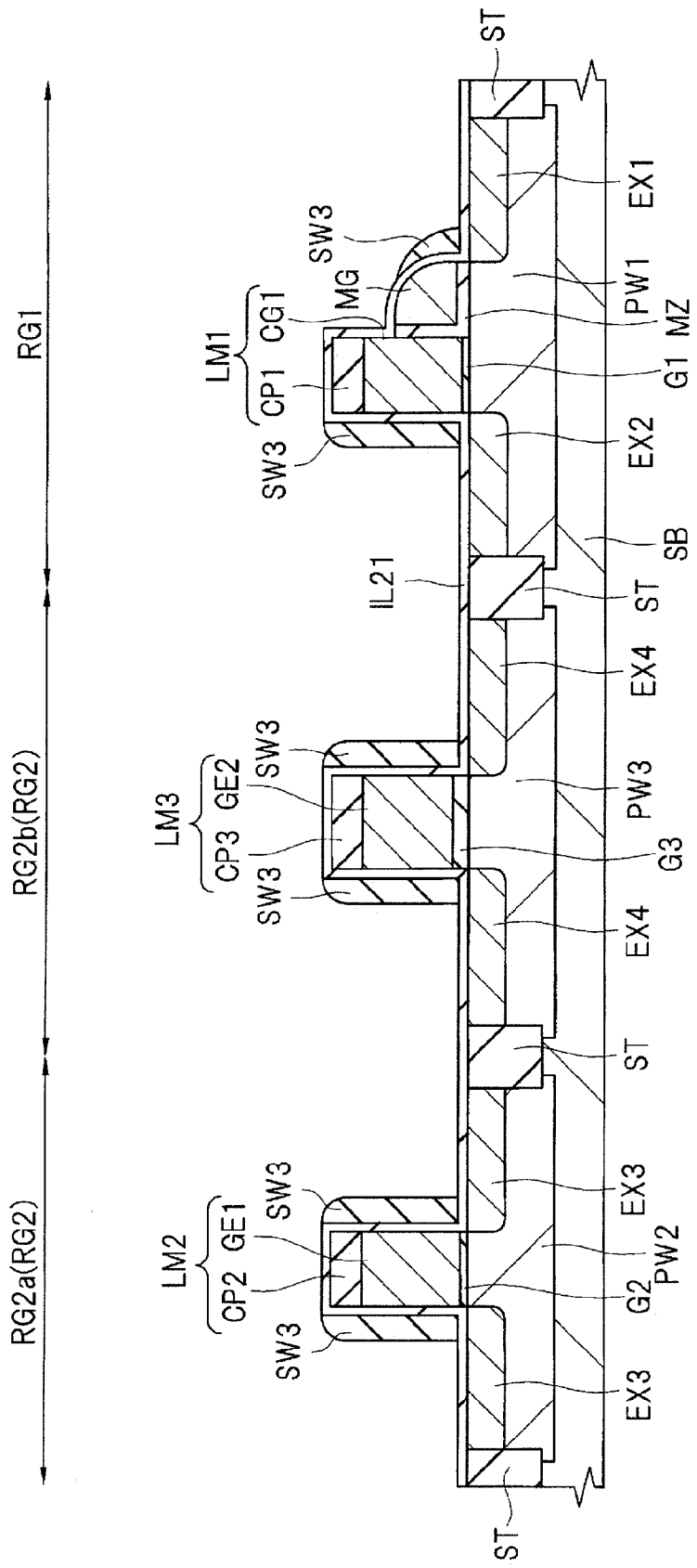
FIG. 59 is a main-portion cross-sectional view of the semiconductor device during the manufacturing process thereof, which is subsequent to FIG. 58.

Then, the insulating film IL22 is etched back (etched, dry-etched, or anisotropically etched) using an anisotropic etching technique. As a result, as shown in FIG. 59, over each of the respective side walls (side walls opposite to the side walls adjacent to each other via the insulating film MZ) of the multi-layer body LM1 and the memory gate electrode MG, the side walls of the multi-layer body LM2, and the side walls of the multi-layer body LM3, the insulating film IL22 is selectively left to form the sidewall spacers (sidewalls or side-wall insulating films) SW3. Note that the sidewall spacers SW3 are formed over the insulating film IL21. Consequently, the sidewall spacers SW3 are formed via the insulating film IL21 over the both side walls of the multi-layer body LM2, over the both side walls of the multi-layer body LM3, over the side wall of the multi-layer body LM1 opposite to the side wall thereof adjacent to the memory gate electrode MG via the insulating film MZ, and over the side wall of the memory gate electrode MG opposite to the side wall thereof adjacent to the multi-layer body LM1 via the insulating film MZ.

When the insulating film IL22 is etched back to form the sidewall spacers SW3, an etch-back step is preferably performed under etching conditions under which the insulating film IL21 is less likely to be etched than the insulating film IL22. That is, the etch-back step is preferably performed under conditions (etching conditions) under which the speed of etching the insulating film IL22 is smaller (lower) than the speed of etching the insulating film IL22. This allows the insulating film IL21 to function as an etching stopper. To prevent the substrate region (Si region) of the semiconductor substrate SB from being etched, the insulating film IL21 is preferably left in the foam of a layer.

When the insulating film IL22 is etched back to form the sidewall spacers SW3, it is preferable to use etching conditions under which the insulating film IL22 can be etched, but the insulating film IL21 is least likely to be etched. Therefore, it is preferable to choose, for the insulating film IL22, a material which can increase the etching selectivity of the insulating film IL22 to the insulating film IL21. From this viewpoint, it is appropriate to use a silicon nitride film as the insulating film IL21 and use a silicon dioxide film as the insulating film IL22.

Figure 60:
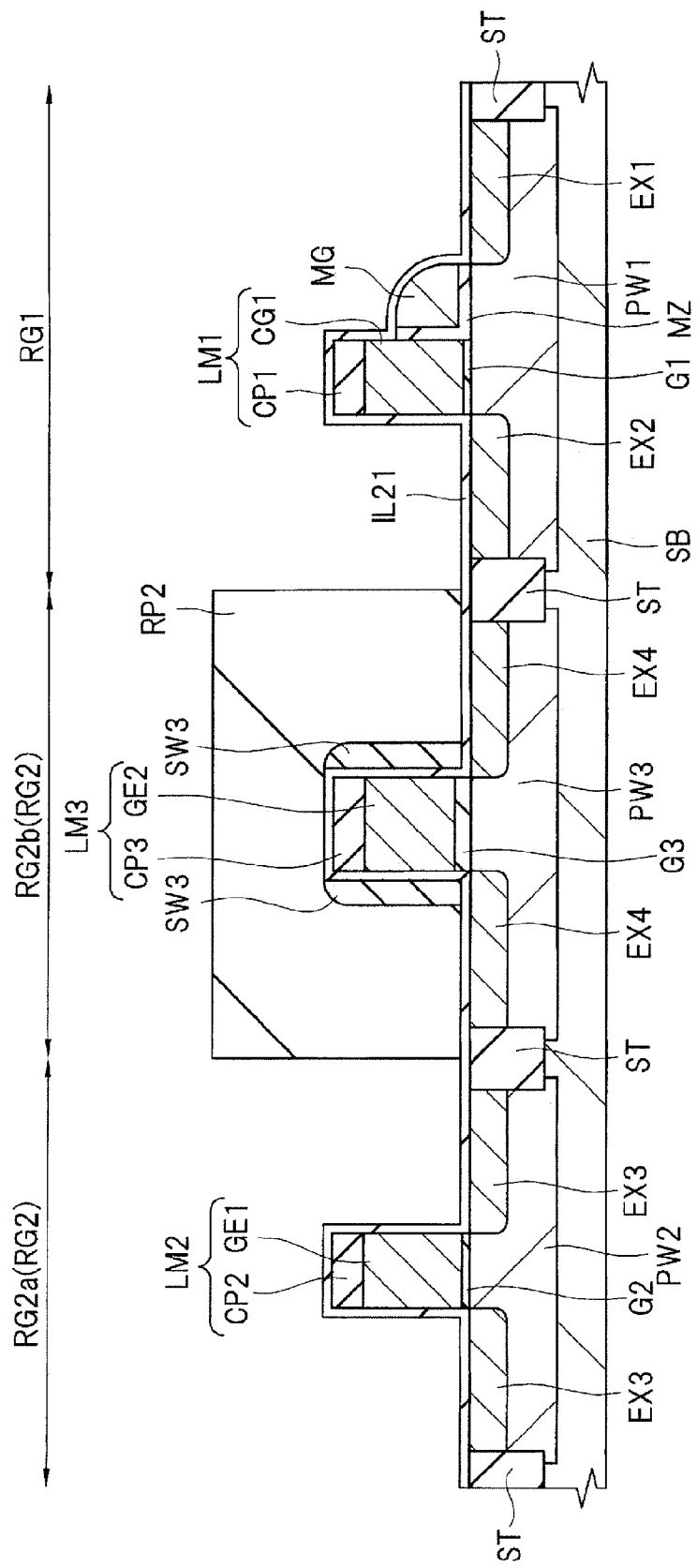
FIG. 60 is a main-portion cross-sectional view of the semiconductor device during the manufacturing process thereof, which is subsequent to FIG. 59.

Then, the sidewall spacers SW3 are removed from the memory cell region RG1 and the metal-gate MISFET formation region RG2a, while the sidewall spacers SW3 are left in the silicon-gate MISFET formation region RG2b. This can be performed as follows. That is, as shown in FIG. 60, a photoresist layer (photoresist pattern, resist layer, resist pattern, or mask layer) RP2 covering the silicon-gate MISFET formation region RG2b and exposing the memory cell region RG1 and the metal-gate MISFET formation region RG2a is formed first over the semiconductor substrate SB using a photolithographic technique. Then, the sidewall spacers SW3 formed in the memory cell region RG1 and the metal-gate MISFET formation region RG2a are removed by etching. At this time, since the sidewall spacers SW3 in the memory cell region RG1 and the metal-gate MISFET formation region RG2a are uncovered with the photoresist layer RP2 and exposed, the sidewall spacers SW3 are removed from the memory cell region RG1 and the metal-gate MISFET formation region RG2a by etching. However, since the sidewall spacers SW3 in the silicon-gate MISFET formation region RG2b are covered with the photoresist layer RP2, the sidewall spacers SW3 are not removed from the silicon-gate MISFET formation region RG2b and remain therein. This stage is shown in FIG. 60. Thereafter, the photoresist layer RP2 is removed.

The etching for removing the sidewall spacers SW3 from the memory cell region RG1 and the metal-gate MISFET formation region RG2a is preferably performed under etching conditions under which the insulating film IL21 is less likely to be etched than the sidewall spacers SW3. That is, the etching is preferably performed under conditions (etching conditions) under which the speed of etching the insulating film IL21 is smaller (lower) than the speed of etching the sidewall spacers SW3. This allows the insulating film IL21 to function as an etching stopper. To prevent the substrate region (Si region) of the semiconductor substrate SB from being etched, the insulating film IL21 is preferably left in the form of a layer.

Figure 61:
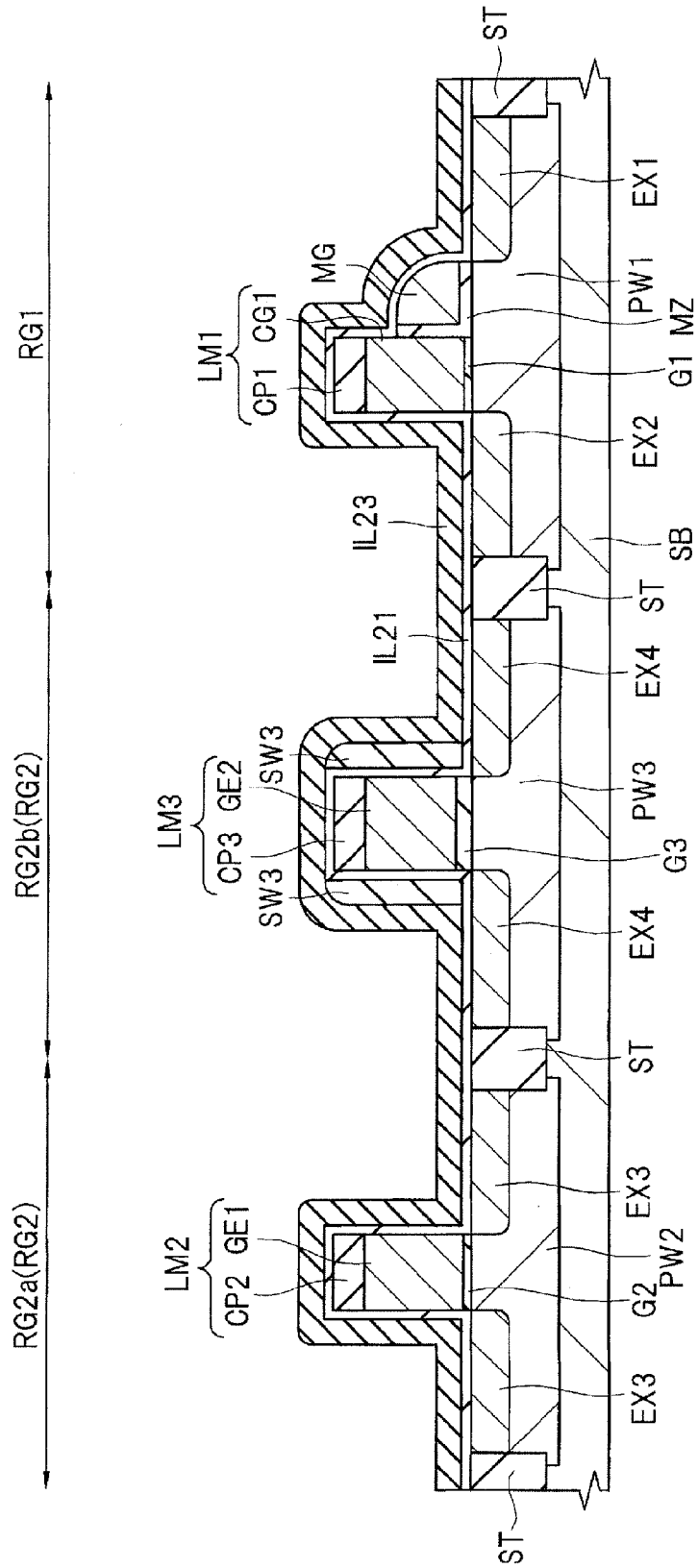
FIG. 61 is a main-portion cross-sectional view of the semiconductor device during the manufacturing process thereof, which is subsequent to FIG. 60.

Then, as shown in FIG. 61, over the main surface of the semiconductor substrate SB, i.e., over the insulating film IL21, an insulating film IL23 is formed so as to cover the sidewall spacers SW3. The insulating film IL23 is for forming sidewall spacers SW4 described later. The insulating film IL23 is made of an insulating material different from that of the insulating film IL21 such as, e.g., a silicon dioxide film and can be formed using a CVD method or the like.

Figure 62:
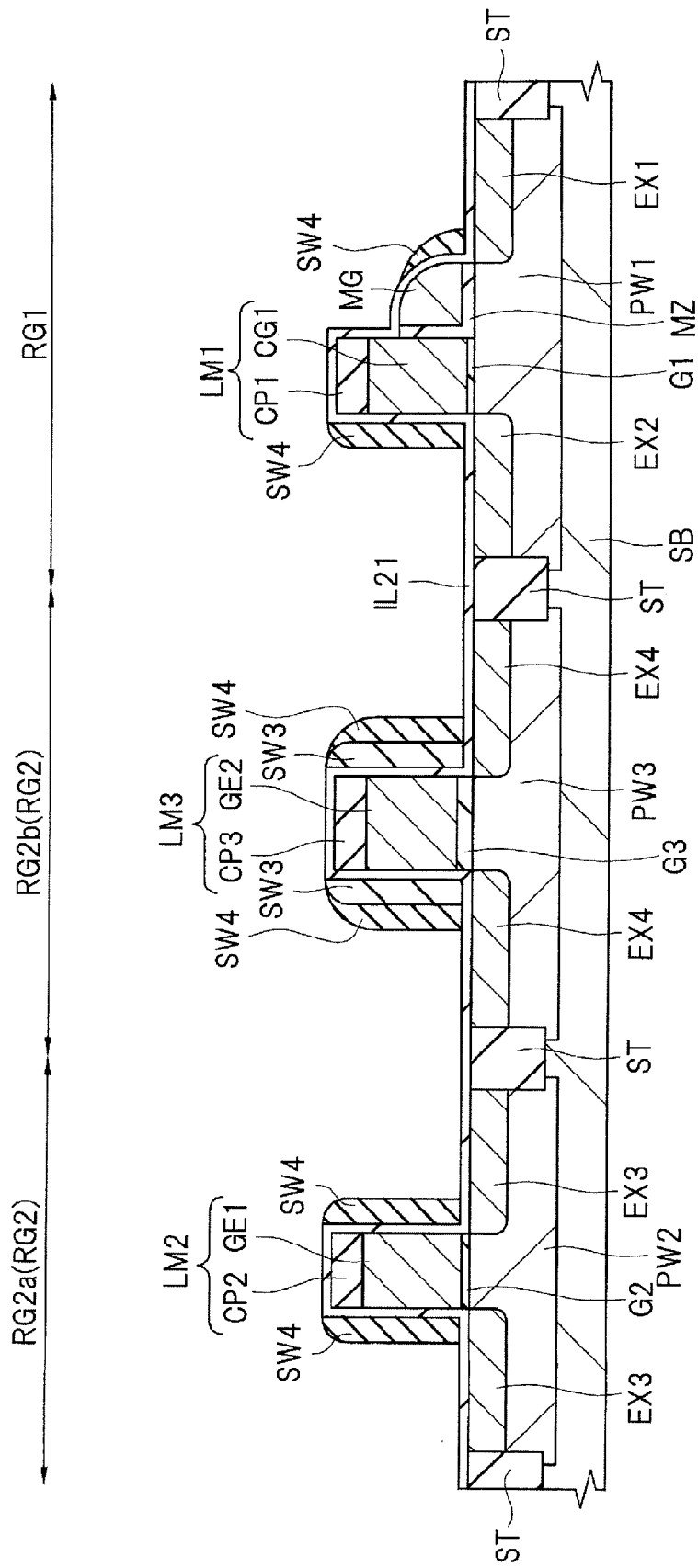
FIG. 62 is a main-portion cross-sectional view of the semiconductor device during the manufacturing process thereof, which is subsequent to FIG. 61.

Then, the insulating film IL23 is etched back (etched, dry-etched, or anisotropically etched) using an anisotropic etching technique. As a result, as shown in FIG. 62, over each of the respective side walls (side walls opposite to the side walls adjacent to each other via the insulating film MZ) of the multi-layer body LM1 and the memory gate electrode MG, the side walls of the multi-layer body LM2, and the side walls of the multi-layer body LM3, the insulating film IL23 is selectively left to form the sidewall spacers (sidewalls or sidewall insulating films) SW4. Note that the sidewall spacers SW4 are formed over the insulating film IL21. Consequently, the sidewall spacers SW4 are formed over the both side walls of the multi-layer body LM2 via the insulating film IL21 and also formed over the both side walls of the multi-layer body LM3 via the insulating film IL21 and the sidewall spacers SW3. Over the side wall of the multi-layer body LM1 opposite to the side wall thereof adjacent to the memory gate electrode MG via the insulating film MZ, the sidewall spacer SW4 is formed via the insulating film IL21. On the other hand, over the side wall of the memory gate electrode MG opposite to the side wall thereof adjacent to the multi-layer body LM1 via the insulating film MZ, the sidewall spacer SW4 is formed via the insulating film IL21.

When the insulating film IL23 is etched back to form the sidewall spacers SW4, an etch-back step is preferably performed under etching conditions under which the insulating film IL21 is less likely to be etched than the insulating film IL23. That is, the etch-back step is preferably performed under conditions (etching conditions) under which the speed of etching the insulating film IL21 is smaller (lower) than the speed of etching the insulating film IL23. This allows the insulating film IL21 to function as an etching stopper. To prevent the substrate region (Si region) of the semiconductor substrate SB from being etched, the insulating film IL21 is preferably left in the form of a layer.

Figure 63:
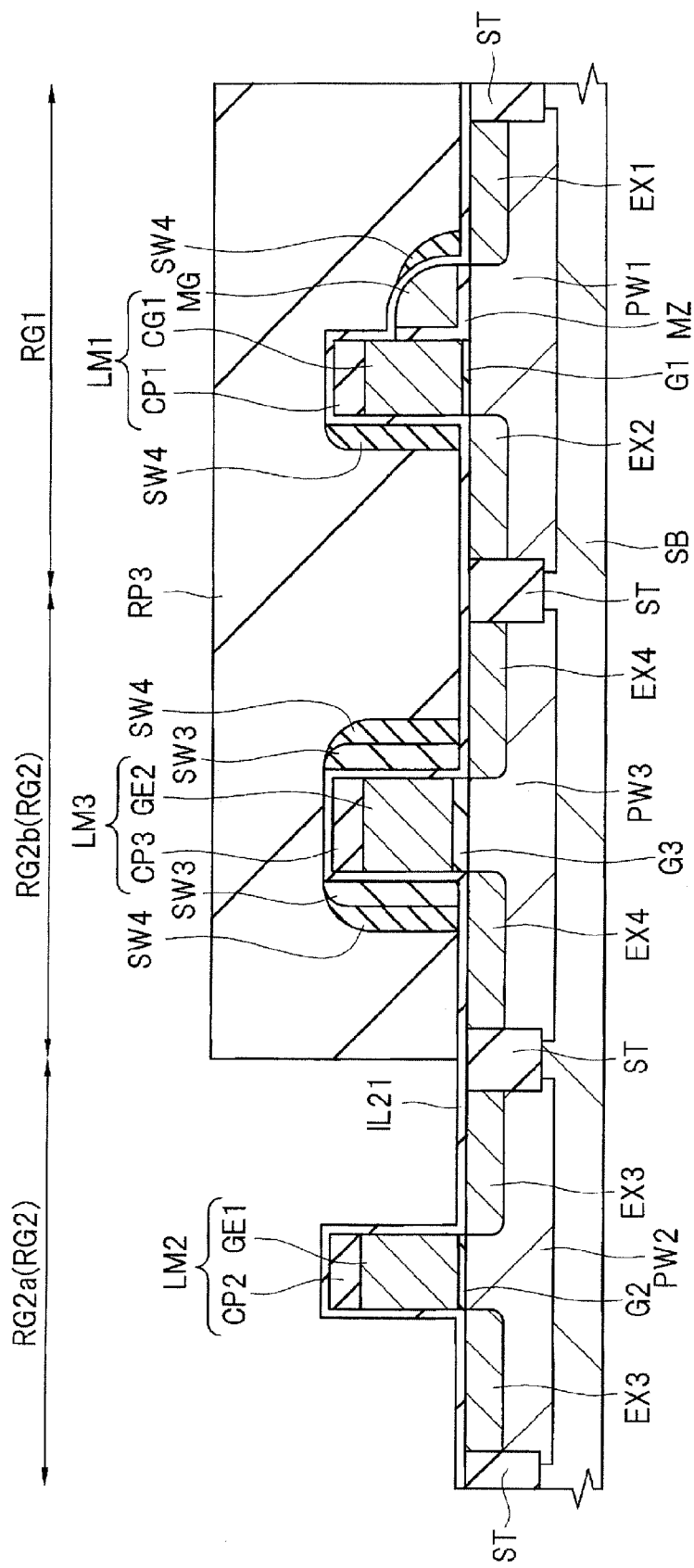
FIG. 63 is a main-portion cross-sectional view of the semiconductor device during the manufacturing process thereof, which is subsequent to FIG. 62.

Then, the sidewall spacers SW4 are removed from the metal-gate MISFET formation region RG2a, while the sidewall spacers SW4 are left in the memory cell region RG1 and the silicon-gate MISFET formation region RG2b. This can be performed as follows. That is, as shown in FIG. 63, a photoresist layer (photoresist pattern, resist layer, resist pattern, or mask layer) RP3 covering the memory cell region RG1 and the silicon-gate MISFET formation region RG2b and exposing the metal-gate MISFET formation region RG2a is formed first over the semiconductor substrate SB using a photolithographic technique. Then, the sidewall spacers SW4 formed in the metal-gate MISFET formation region RG2a are removed by etching. At this time, since the sidewall spacers SW4 in the metal-gate MISFET formation region RG2a are uncovered with the photoresist layer RP3 and exposed, the sidewall spacers SW4 are removed from the metal-gate MISFET formation region RG2a by etching. However, since the sidewall spacers SW4 in the memory cell region RG1 and the silicon-gate MISFET formation region RG2b are covered with the photoresist layer RP3, the sidewall spacers SW4 are not removed from the memory cell region RG1 and the silicon-gate MISFET formation region RG2b and remain therein. This stage is shown in FIG. 63. Thereafter, the photoresist layer RP3 is removed.

The etching for removing the sidewall spacers SW4 from the metal-gate MISFET formation region RG2a is preferably performed under etching conditions under which the insulating film IL21 is less likely to be etched than the sidewall spacers SW4. That is, the etching is preferably performed under conditions (etching conditions) under which the speed of etching the insulating film IL21 is smaller (lower) than the speed of etching the sidewall spacers SW4. This allows the insulating film IL21 to function as an etching stopper. To prevent the substrate region (Si region) of the semiconductor substrate SB from being etched, the insulating film IL21 is preferably left in the form of a layer.

Figure 64:
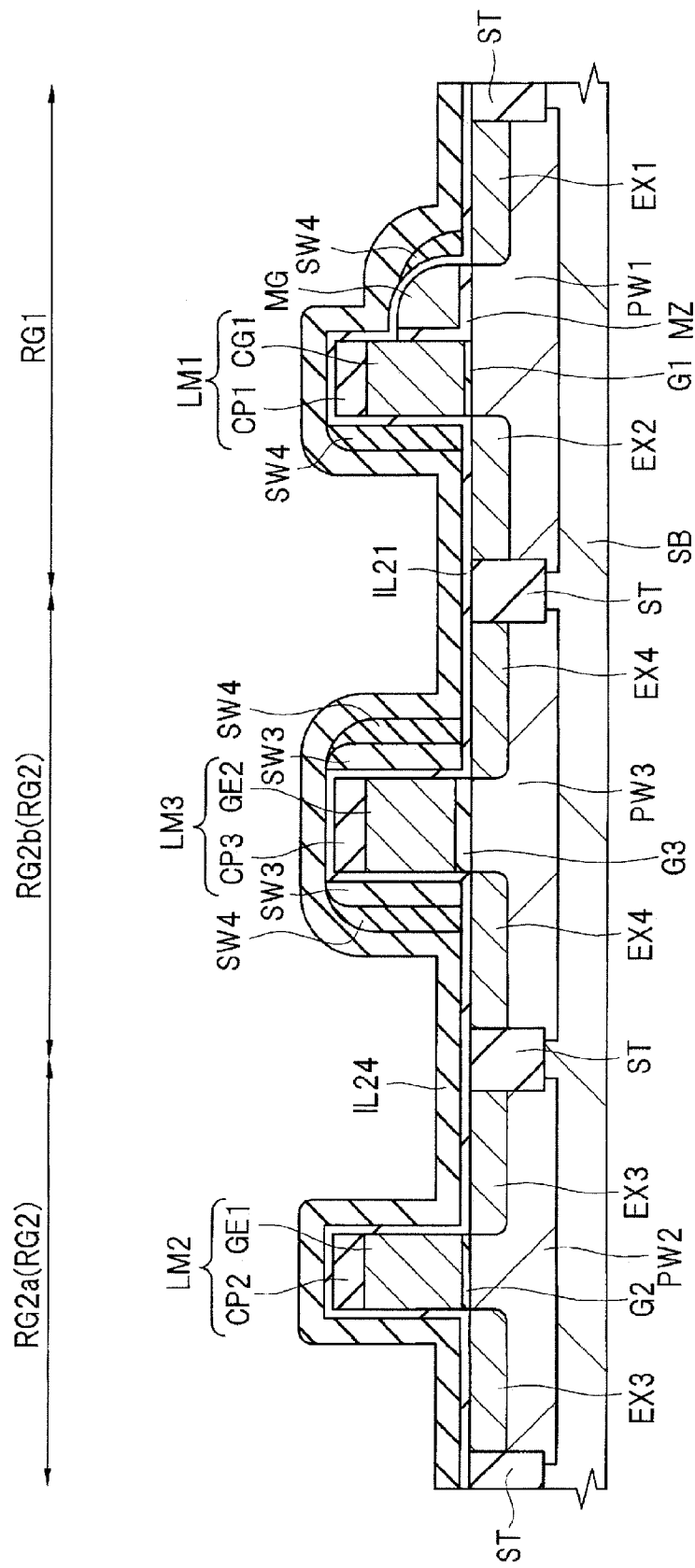
FIG. 64 is a main-portion cross-sectional view of the semiconductor device during the manufacturing process thereof, which is subsequent to FIG. 63.

Then, as shown in FIG. 64, over the main surface of the semiconductor substrate SB, i.e., over the insulating film IL21, an insulating film IL24 is formed so as to cover the sidewall spacers SW3 and SW4. The insulating film IL24 is for forming sidewall spacers SW5 described later. The insulating film IL24 is made of an insulating material different from that of the insulating film IL21 such as, e.g., a silicon dioxide film and can be formed using a CVD method or the like.

Figure 65:
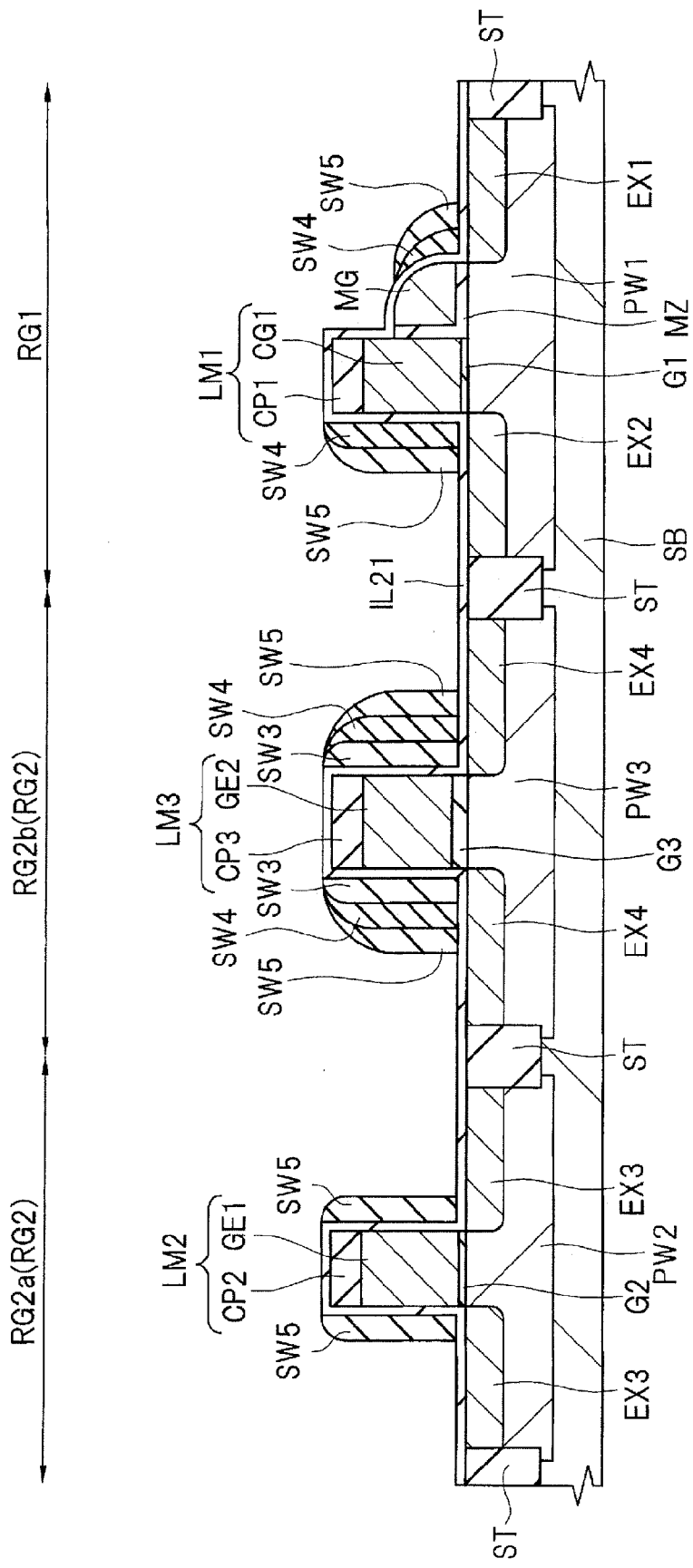
FIG. 65 is a main-portion cross-sectional view of the semiconductor device during the manufacturing process thereof, which is subsequent to FIG. 64.

Then, the insulating film IL24 is etched back (etched, dry-etched, or anisotropically etched) using an anisotropic etching technique. As a result, as shown in FIG. 65, over each of the respective side walls (sidewalls opposite to the side walls adjacent to each other via the insulating film MZ) of the multi-layer body LM1 and the memory gate electrode MG, the side walls of the multi-layer body LM2, and the side walls of the multi-layer body LM3, the insulating film IL24 is selectively left to form the sidewall spacers (side walls or sidewall insulating films) SW5. Note that the sidewall spacers SW5 are formed over the insulating film IL21. Consequently, the sidewall spacers SW5 are formed over the both side walls of the multi-layer body LM2 via the insulating film IL21 and also formed over the both side walls of the multi-layer body LM3 via the insulating film IL21 and the sidewall spacers SW3 and SW4. Over the side wall of the multi-layer body LM1 opposite to the side wall thereof adjacent to the memory gate electrode MG via the insulating film MZ, the sidewall spacer SW5 is formed via the insulating film IL21 and the sidewall spacer 4. On the other hand, over the side wall of the memory gate electrode MG opposite to the side wall thereof adjacent to the multi-layer body LM1 via the insulating film MZ, the sidewall spacer SW5 is formed via the insulating film IL21 and the sidewall spacer SW5.

When the insulating film IL24 is etched back to form the sidewall spacers SW5, an etch-back step is preferably performed under etching conditions under which the insulating film IL21 is less likely to be etched than the insulating film IL24. That is, the etch-back step is preferably performed under conditions (etching conditions) under which the speed of etching the insulating film IL21 is smaller (lower) than the speed of etching the insulating film IL24. This allows the insulating film IL21 to function as an etching stopper. To prevent the substrate region (Si region) of the semiconductor substrate SB from being etched, the insulating film IL21 is preferably left in the form of a layer.

Figure 66:
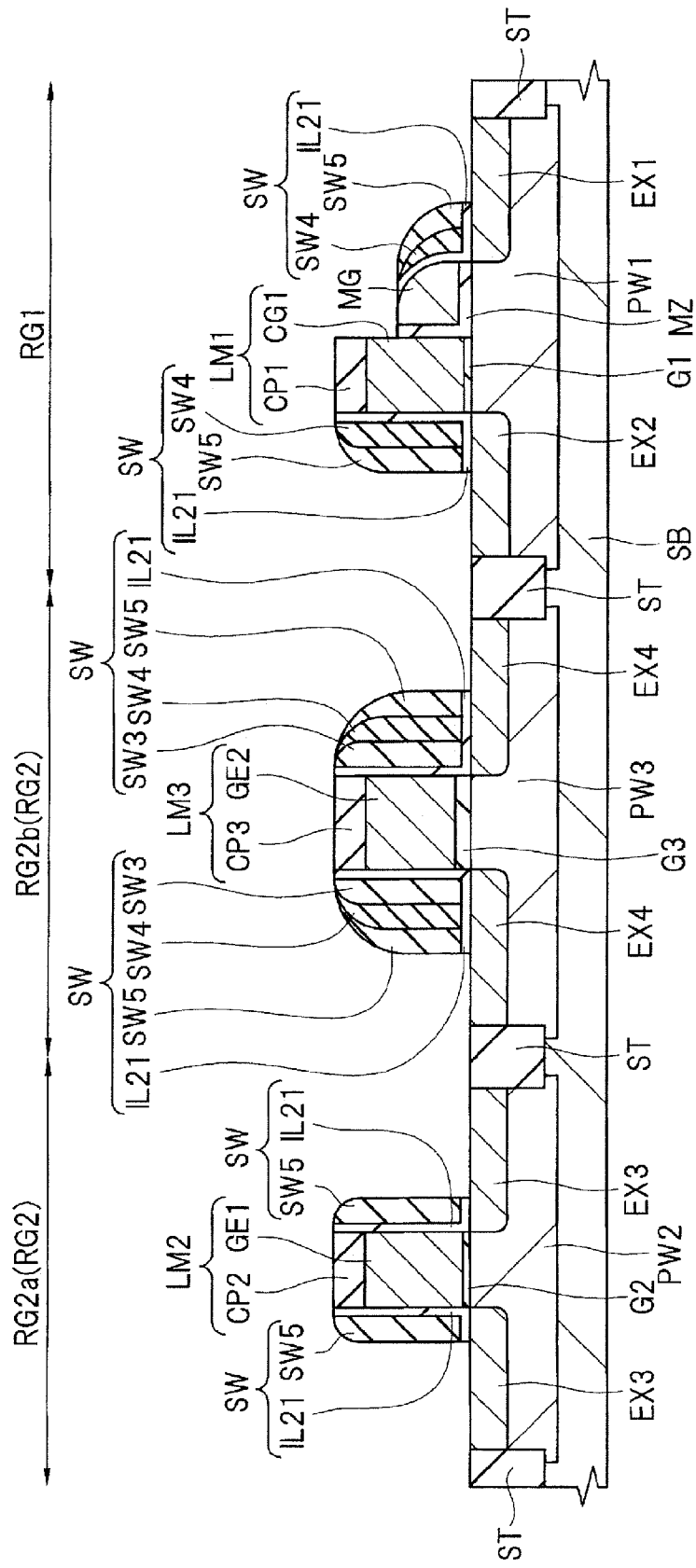
FIG. 66 is a main-portion cross-sectional view of the semiconductor device during the manufacturing process thereof, which is subsequent to FIG. 65.

Then, as shown in FIG. 66, of the insulating films IL21, the portion uncovered with the sidewall spacers SW3, SW4, and SW5 and exposed is removed by etching (e.g., wet etching).

Thus, over the both side walls of the multi-layer body LM2, over the both side walls of the multi-layer body LM3, over the side wall of the multi-layer body LM1 opposite to the side wall thereof adjacent to the memory gate electrode MG via the insulating film MZ, and over the sidewall of the memory gate electrode MG opposite to the side wall thereof adjacent to the multi-layer body LM1 via the insulating film MZ, the sidewall spacers SW are formed.

Note that each of the sidewall spacers SW formed in the metal-gate MISFET formation region RG2a, i.e., the sidewall spacers SW formed over the both side walls of the multi-layer body LM2 is formed of the insulating film IL2 and the sidewall spacer SW5. Also, each of the sidewall spacers SW formed in the silicon-gate MISFET formation region RG2b, i.e., the sidewall spacers SW formed over the both side walls of the multi-layer body LM3 is formed of the insulating film IL2 and the sidewall spacers SW3, SW4, and SW5. Also, each of the sidewall spacers SW formed in the memory cell region RG1, i.e., the sidewall spacers SW formed over the respective side walls (side walls opposite to the sidewalls adjacent to each other via the insulating film MZ) of the multi-layer body LM1 and the memory gate electrode MG is formed of the insulating film IL2 and the sidewall spacers SW4 and SW5.

Accordingly, in Embodiment 4, each of the sidewall spacers SW formed in the memory cell region RG1, each of the sidewall spacers SW formed in the metal-gate MISFET formation region RG2a, and each of the sidewall spacers SW formed in the silicon-gate MISFET formation region RG2b have different thicknesses. Specifically, the thickness T2 of each of the sidewall spacers SW formed in the memory cell region RG1 is larger than the thickness T2 of each of the sidewall spacers SW formed in the metal-gate MISFET formation region RG2a. Also, the thickness T2 of each of the sidewall spacers SW formed in the silicon-gate MISFET formation region RG2b is larger than the thickness T2 of each of the sidewall spacers SW formed in the metal-gate MISFET formation region RG2a and the thickness T2 of each of the sidewall spacers SW formed in the memory cell region RG1.

Figure 67:
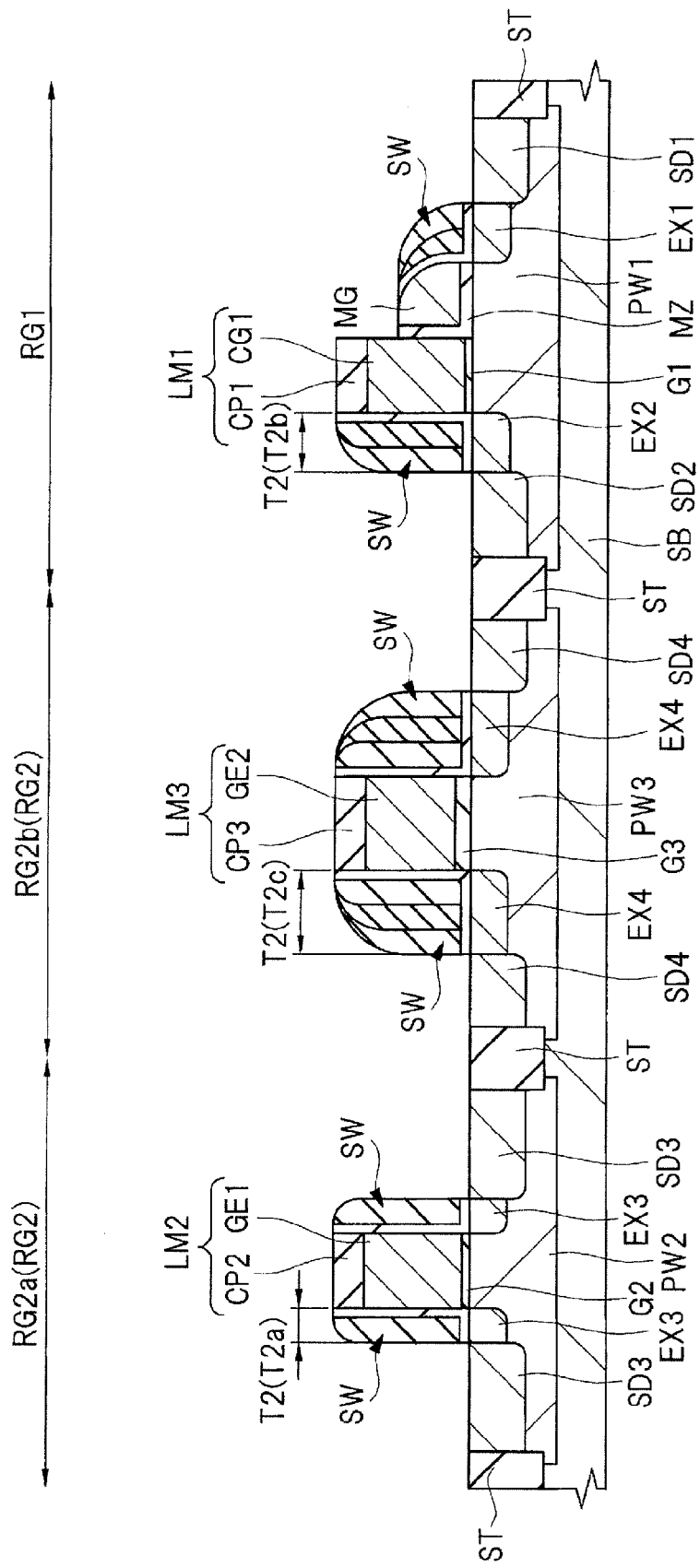
FIG. 67 is a main-portion cross-sectional view of the semiconductor device during the manufacturing process thereof, which is subsequent to FIG. 66.

That is, when it is assumed that the thickness T2 of each of the sidewall spacers SW formed in the metal-gate MISFET formation region RG2a is a thickness T2a, the thickness T2 of each of the sidewall spacers SW formed in the memory cell region RG1 is a thickness T2b, and the thickness T2 of each of the sidewall spacers SW formed in the silicon-gate MISFET formation region RG2b is a thickness T2c, T2a<T2b<T2c is satisfied. Note that the thicknesses T2 of the sidewall spacers SW are shown in FIG. 67. The sidewall spacers SW formed in the metal-gate MISFET formation region RG2a correspond to the sidewall spacers SW formed over the side walls of the multi-layer body LM2. The sidewalls SW formed in the memory cell region RG1 correspond to the sidewall spacers SW formed over the respective side walls of the multi-layer body LM1 and the memory gate electrode MG. The sidewall spacers SW formed in the silicon-gate MISFET formation region RG2b correspond to the sidewall spacers SW formed over the side walls of the multi-layer body LM3.

The subsequent steps in Embodiment 4 are the same as those in Embodiment 1 described above. That is, in Embodiment 4 also, Step S16 described above is performed in the same manner as in Embodiment 1 described above to form the n$^+$-type semiconductor regions SD1, SD2, SD3, and SD4, as shown in FIG. 67. Then, in Embodiment 4 also, Step S17 (activation anneal) described above and the steps subsequent thereto are performed in the same manner as in Embodiment 1 described above. However, the depiction and description thereof is omitted herein.

By the steps described with reference to FIGS. 57 to 67, the sidewall spacers SW having the different thicknesses T2 can selectively be formed. This allows the thicknesses T2 of the sidewall spacers SW to be set depending on the characteristics required of the individual transistors. Therefore, it is possible to improve the general performance of the semiconductor device.

For example, by increasing the thickness T2 of the sidewall spacer SW, the dimension (dimension in a direction along the gate length direction) of a lower-concentration region in an LDD structure can be increased. This can enhance the breakdown voltage. Accordingly, in the silicon-gate MISFET formation region RG2b, the thickness T2 of each of the sidewall spacers SW is increased to thus allow an increase in the dimension (dimension in a direction along the gate length direction of the gate electrode GE2) of each of the n$^-$-type semiconductor regions EX4. This can enhance the breakdown voltage of the MISFET. On the other hand, it is sufficient for the MISFET formed in the metal-gate MISFET formation region RG2a to have a breakdown voltage lower than the breakdown voltage of the MISFET formed in the silicon-gate MISFET formation region RG2b. Accordingly, the thickness T2 of each of the sidewall spacers SW formed in the metal-gate MISFET formation region RG2a is set smaller than the thickness T2 of each of the sidewall spacers SW formed in the silicon-gate MISFET formation region RG2b. However, when the thickness T101 of each of the sidewall spacers SW101 is large as has been described above with reference to FIG. 54, it is not easy to accomplish the formation of the sidewall spacers SW101 which are so shaped as to be able to properly function as the ion implantation inhibiting mask and proper formation of the contact holes and the plugs to be embedded in the contact holes.

By contrast, in Embodiment 4, as shown in FIGS. 57 to 67, the sidewall spacers SW each having the large width T2 are formed in the silicon-gate MISFET formation region RG2b. By increasing the height $h_3$ of the foregoing multi-layer body LM3 ($h_3$ is shown in FIG. 57 described above), the sidewall spacers SW can be so shaped as to be able to properly function as the ion implantation inhibiting mask. For example, by setting the height $h_3$ of the foregoing multi-layer body LM3 larger than the width T2 of each of the sidewall spacers SW formed over the side walls of the multi-layer body LM3 (height $h_3$>T2), the sidewall spacers SW formed over the side walls of the multi-layer body LM3 can be so shaped as to be able to properly function as the ion implantation inhibiting mask. By thus allowing the sidewall spacers SW formed over the side walls of the multi-layer body LM3 to properly function as the ion implantation inhibiting mask, the ion implantation step can be performed. Therefore, it is possible to more properly form the n$^+$-type semiconductor regions SD4 and more reliably improve the performance of the semiconductor device.

The height $h_3$ of the multi-layer body LM3 can also be increased by increasing the thickness of the cap insulating film CP3. However, as shown in FIG. 23 described above, in the polishing step in Step S20 described above, the cap insulating films CP1, CP2 and CP3 are removed. Accordingly, even when the thicknesses of the cap insulating films CP1, CP2, and CP3 are increased to increase the height $h_3$ of the multi-layer body LM3, the increased thicknesses of the cap insulating films CP1, CP2, and CP3 do not lead to an increase in the thickness of the interlayer insulating films. This allows a reduction in the total thickness of the insulating films IL3 and IL6 shown in FIG. 29 described above. In short, it is possible to achieve each of an increase in the height $h_3$ of the multi-layer body LM3 and a reduction in the total thickness of the insulating films IL3 and IL6. Since it is possible to reduce the total thickness of the insulating films IL3 and IL6, it is possible to reduce the aspect ratio of each of the contact holes CT formed in the insulating films IL3 and IL6. This allows easy formation of the contact holes CT and easy embedding of the plugs PG in the contact holes CT. As a result, the manufacturing process of the semiconductor device is easily performed and the manufacturing yield of the semiconductor device can be improved. In addition, since it is possible to reduce the total thickness of the insulating films IL3 and IL6, it is possible to reduce the aspect ratio of each of the contact holes CT without increasing the diameter of the contact hole CT, which is advantageous in terms of reducing the size (area) of the semiconductor device.

Thus, it is possible to reliably accomplish each of the formation of the sidewall spacers SW which are so shaped as to be able to properly function as the ion implantation inhibiting mask and proper formation of the contact hole CT and the plugs PG to be embedded in the contact holes CT.

When the sidewall spacers SW are formed by the steps shown in FIGS. 57 to 67, the height $h_3$ of the multi-layer body LM3 is set larger than the width T2 of each of the sidewall spacers SW formed over the side walls of the multi-layer body LM3 ($h_3$>T2). Since the cap insulating film CP3 is removed in the polishing step in Step S20 described above, when the contact hole CT is formed in Step S27 described above, the height $h_4$ of the gate electrode GE2 can be set smaller than the width T2 of each of the sidewall spacers SW formed over the side walls of the gate electrode GE2 ($h_4$<T2). Thus, when the sidewall spacers SW are formed, the height $h_3$ of the multi-layer body LM3 can be adjusted to be larger than the width T2 of each of the sidewall spacers SW formed over the side walls of the multi-layer body LM3 ($h_3$>T2). Also, in the manufactured semiconductor device, the height $h_4$ of the gate electrode GE2 can be adjusted to be smaller than the width T2 of each of the sidewall spacers SW formed over the side walls of the gate electrode GE2 ($h_4$<T2). The same applies to the case where the sidewall spacers SW are formed by the steps shown in FIGS. 68 to 77 described later.

Here, the height $h_4$ of the gate electrode GE2 corresponds to a height (distance) from the interface between the semiconductor substrate SB (p-type well PW3) and the insulating film G3 to the upper surface of the gate electrode GE2, which is shown in FIG. 29 described above. When the metal silicide layer SL2 is formed over the gate electrode GE2, the height $h_4$ of the gate electrode GE2 corresponds to a height (distance) from the interface between the semiconductor substrate SB (p-type well PW3) and the insulating film G3 to the upper surface of the metal silicide layer SL2 over the gate electrode GE2. Accordingly, when the metal silicide layer SL2 is not formed over the gate electrode GE2, the height $h_4$ of the gate electrode GE2 corresponds to the total sum of the thickness of the insulating film G3 and the thickness of the gate electrode GE2. On the other hand, when the metal silicide layer SL2 is formed over the gate electrode GE2, the height $h_4$ of the gate electrode GE2 corresponds to the total sum of the thickness of the insulating film G3, the thickness of the gate electrode GE2, and the thickness of the metal silicide layer SL2.

Next, referring to FIGS. 68 to 77, a description will be given of another method of selectively forming the sidewall spacers SW having different thicknesses. FIGS. 68 to 77 are main-portion cross-sectional views of the semiconductor device in Embodiment 4 during the manufacturing process thereof and show substantially the same cross-sectional regions as those shown in FIGS. 57 to 67 described above.

Figure 68:
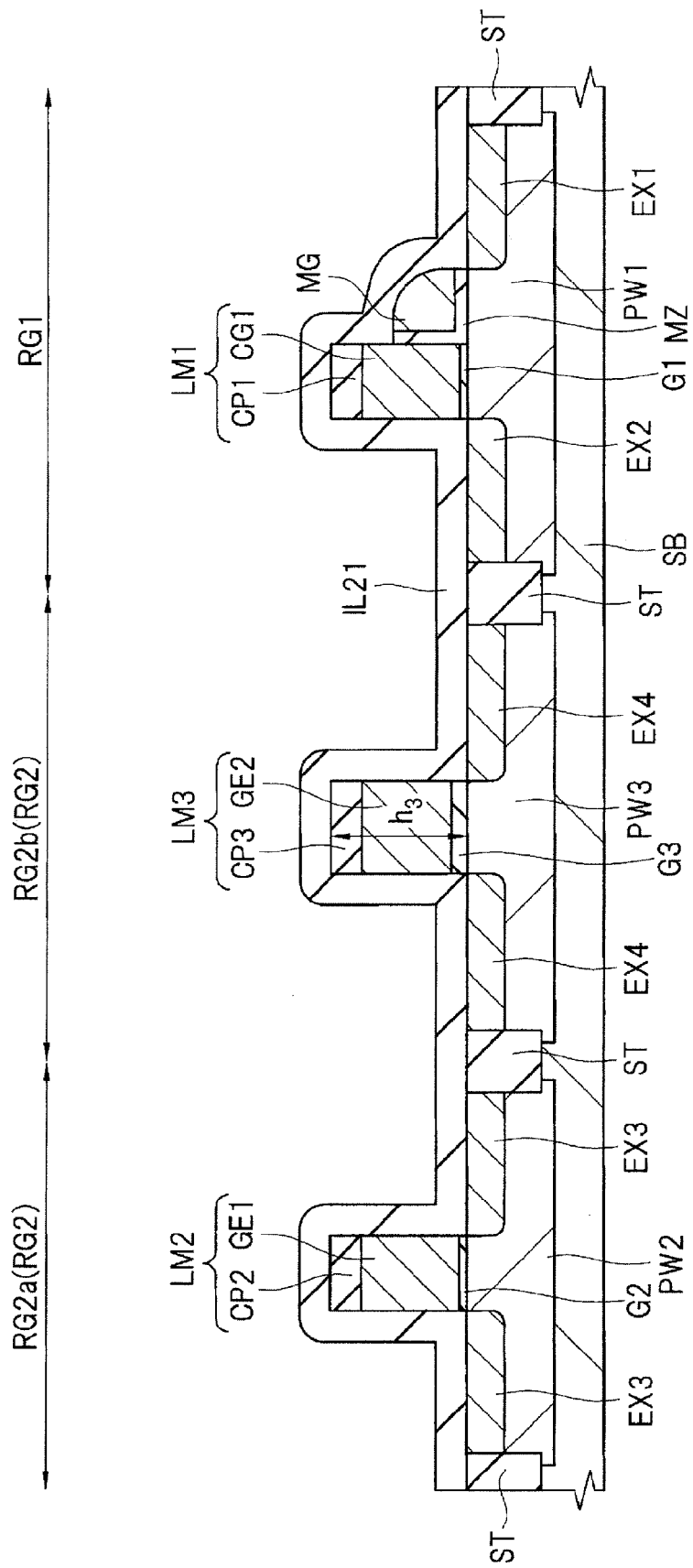
FIG. 68 is a main-portion cross-sectional view of the semiconductor device in the yet other embodiment during the manufacturing process thereof.

After the structure shown in FIG. 16 described above is obtained by performing the steps preceding and including Step S14 described above in the same manner as in Embodiment 1 described above, as shown in FIG. 68, the insulating film IL21 is formed (deposited) over the entire main surface of the semiconductor substrate SB. In the same manner as in the case shown in FIG. 57 described above, in the case shown in FIG. 68 also, the insulating film IL21 is formed over the semiconductor substrate SB so as to cover the memory gate electrode MG and the multi-layer bodies LM1, LM2, and LM3. The material of the insulating film IL21 and the method of depositing the insulating film IL21 in the case shown FIG. 68 are the same as in the case shown in FIG. 57. However, the thickness of the insulating film IL21 is larger in the case shown in FIG. 68 than in the case shown in FIG. 57. In the case of the steps shown in FIGS. 68 to 77, the insulating film IL21 functions as an insulating film for covering the semiconductor substrate SB in the subsequent etch-back step and also functions as an insulating film for forming the sidewall spacers SW5 described later.

Figure 69:
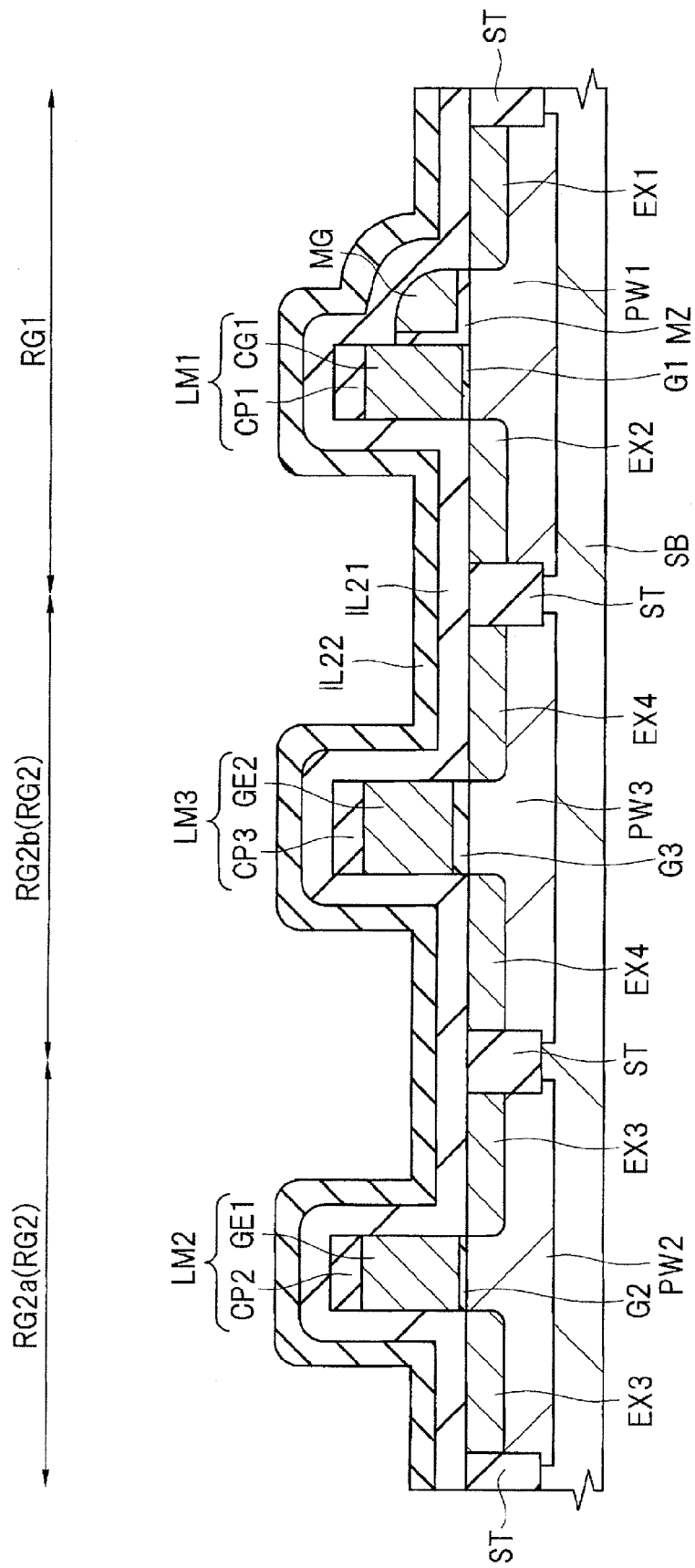
FIG. 69 is a main-portion cross-sectional view of the semiconductor device during the manufacturing process thereof, which is subsequent to FIG. 68.

Then, in the same manner as in the case shown in FIG. 58 described above, as shown in FIG. 69, the insulating film IL22 is formed over the main surface of the semiconductor substrate SB, i.e., over the insulating film IL21. The insulating film IL22 in the case shown in FIG. 69 is basically the same as in the case shown in FIG. 58 described above so that a repeated description thereof is omitted herein.

Figure 70:
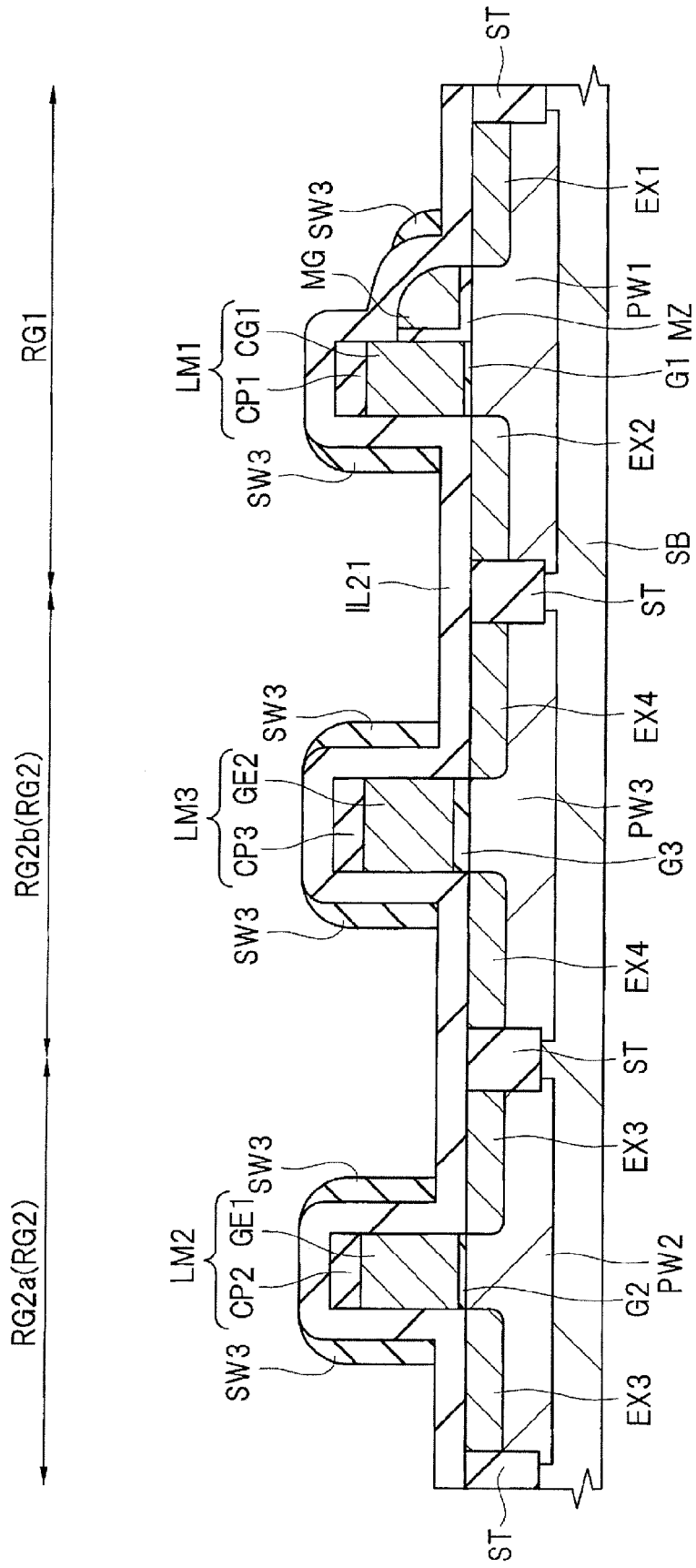
FIG. 70 is a main-portion cross-sectional view of the semiconductor device during the manufacturing process thereof, which is subsequent to FIG. 69.

Then, in the same manner as in the case shown in FIG. 59, as shown in FIG. 70, the insulating film IL22 is etched back using an anisotropic etching technique to form the sidewall spacers SW3. The step shown in FIG. 70 is basically the same as the step described above with reference to FIG. 59 so that a repeated description thereof is omitted herein.

Figure 71:
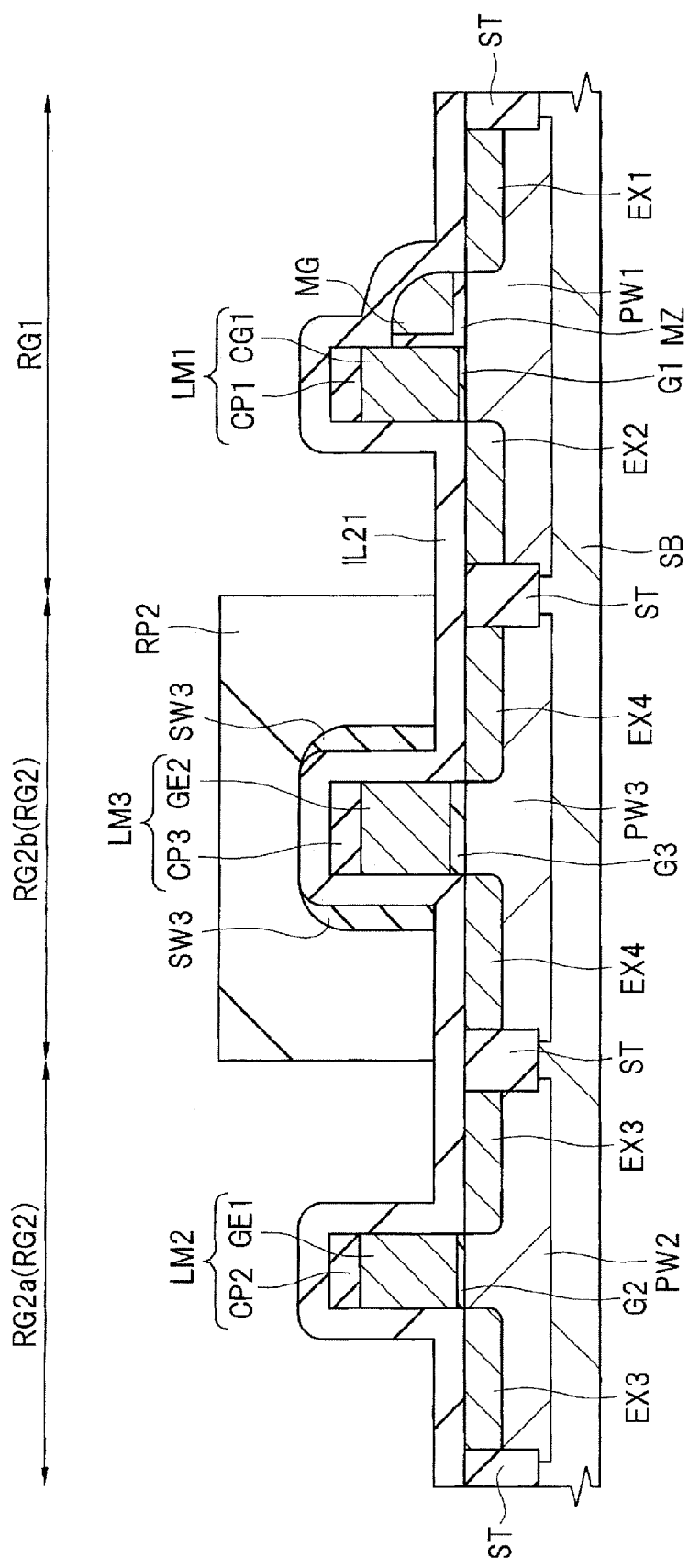
FIG. 71 is a main-portion cross-sectional view of the semiconductor device during the manufacturing process thereof, which is subsequent to FIG. 70.

Then, in the same manner as in FIG. 60 described above, as shown in FIG. 71, the photoresist layer RP2 is formed to cover the silicon-gate MISFET formation region RG2b and expose the memory cell region RG1 and the metal-gate MISFET formation region RG2a. Then, the sidewall spacers SW3 are removed from the memory cell region RG1 and the metal-gate MISFET formation region RG2a by etching. The step shown in FIG. 71 is basically the same as the step described above with reference to FIG. 60 so that a repeated description thereof is omitted herein.

Figure 72:
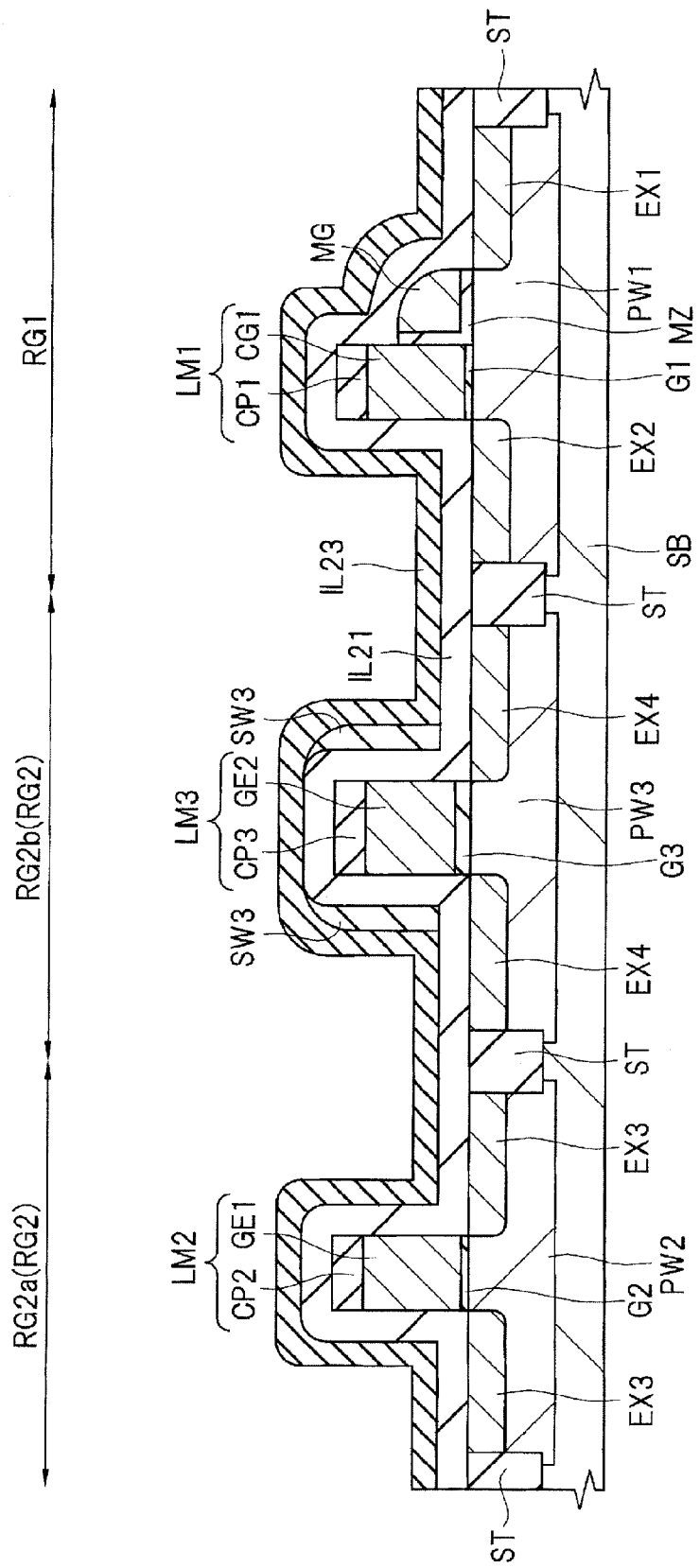
FIG. 72 is a main-portion cross-sectional view of the semiconductor device during the manufacturing process thereof, which is subsequent to FIG. 71.

Then, in the same manner as in the case shown in FIG. 61 described above, as shown in FIG. 72, the insulating film IL23 is formed over the main surface of the semiconductor substrate SB, i.e., over the insulating film IL21 so as to cover the sidewall spacers SW3. The insulating film IL23 in the case shown in FIG. 72 is basically the same as in the case shown in FIG. 61 described above so that a repeated description thereof is omitted herein.

Figure 73:
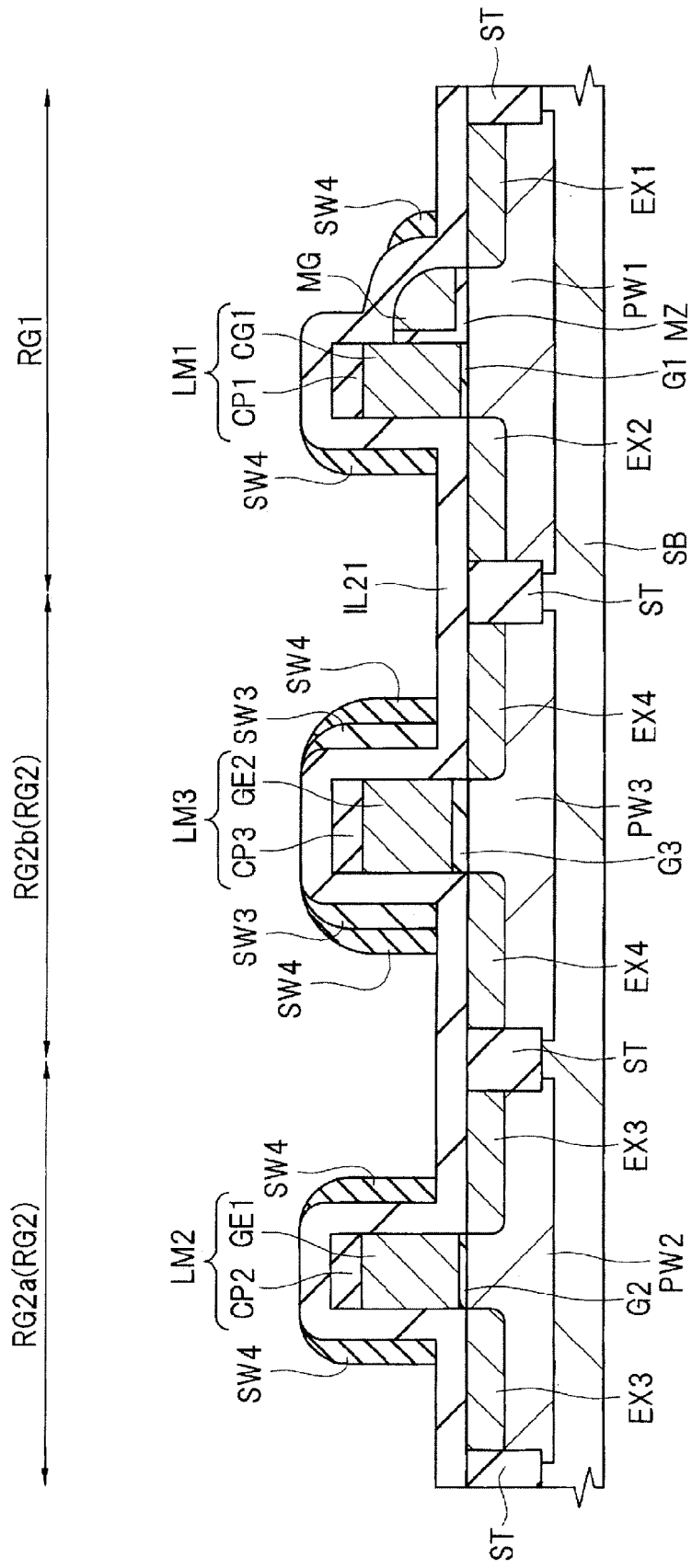
FIG. 73 is a main-portion cross-sectional view of the semiconductor device during the manufacturing process thereof, which is subsequent to FIG. 72.

Then, in the same manner as in the case shown in FIG. 62 described above, as shown in FIG. 73, the insulating film IL23 is etched back using an anisotropic etching technique to form the sidewall spacers SW4. The step shown in FIG. 73 is basically the same as the step described above with reference to FIG. 62 so that a repeated description thereof is omitted herein.

Figure 74:
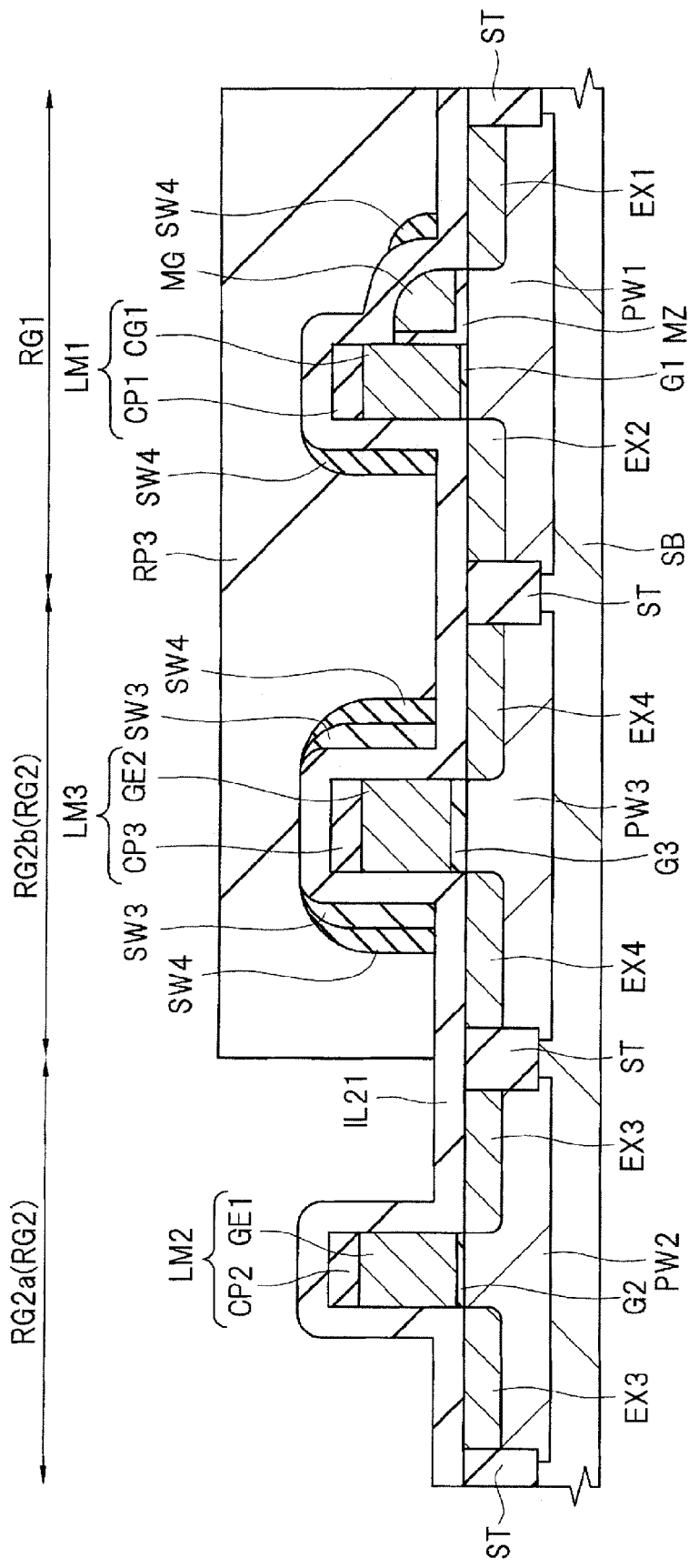
FIG. 74 is a main-portion cross-sectional view of the semiconductor device during the manufacturing process thereof, which is subsequent to FIG. 73.
Figure 75:
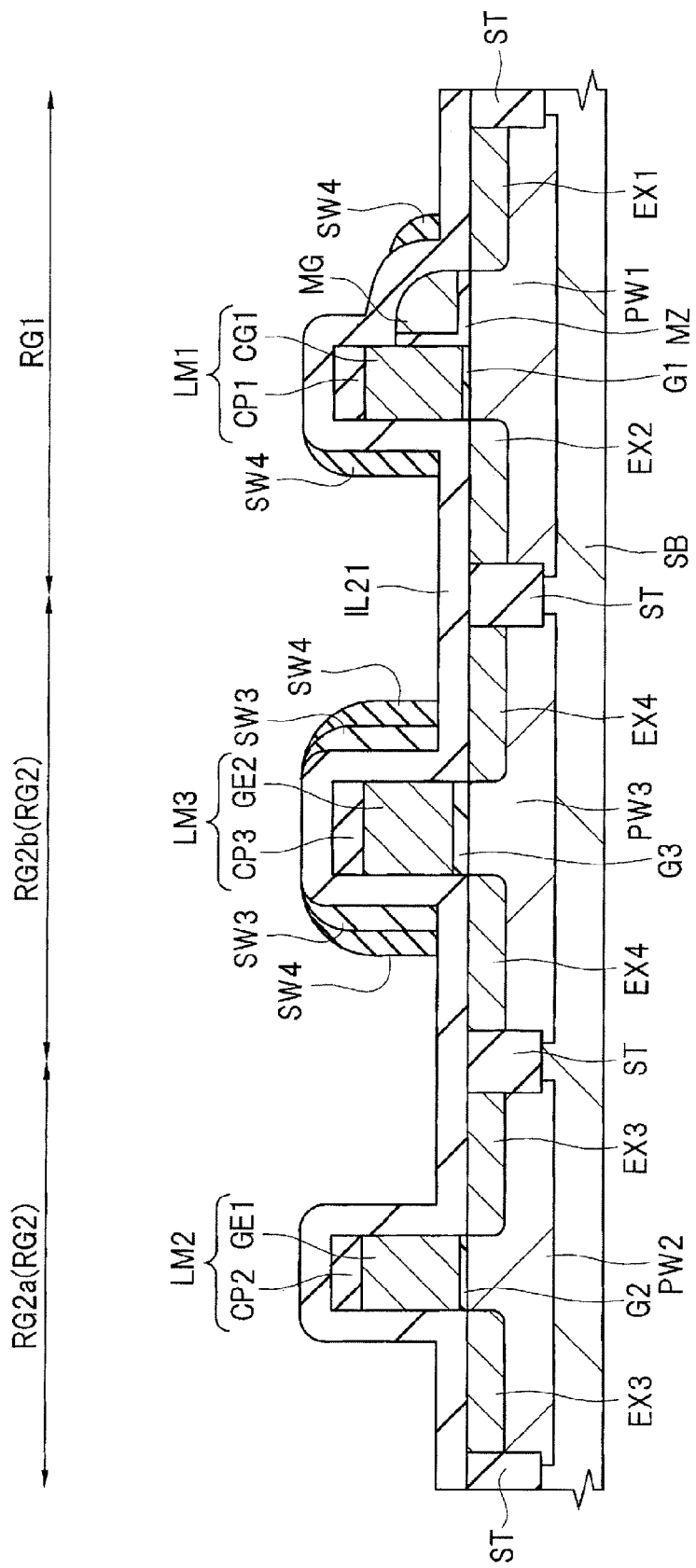
FIG. 75 is a main-portion cross-sectional view of the semiconductor device during the manufacturing process thereof, which is subsequent to FIG. 74.

Then, in the same manner as in the case shown in FIG. 63 described above, as shown in FIG. 74, the photoresist layer RP3 covering the memory cell region RG1 and the silicon-gate MISFET formation region RG2b and exposing the metal-gate MISFET formation region RG2a is formed. Then, the sidewall spacers SW3 are removed from the metal-gate MISFET formation region RG2a by etching. The step shown in FIG. 74 is basically the same as the step described above with reference to FIG. 63 so that a repeated description thereof is omitted herein. Thereafter, as shown in FIG. 75, the photoresist layer RP3 is removed.

Figure 76:
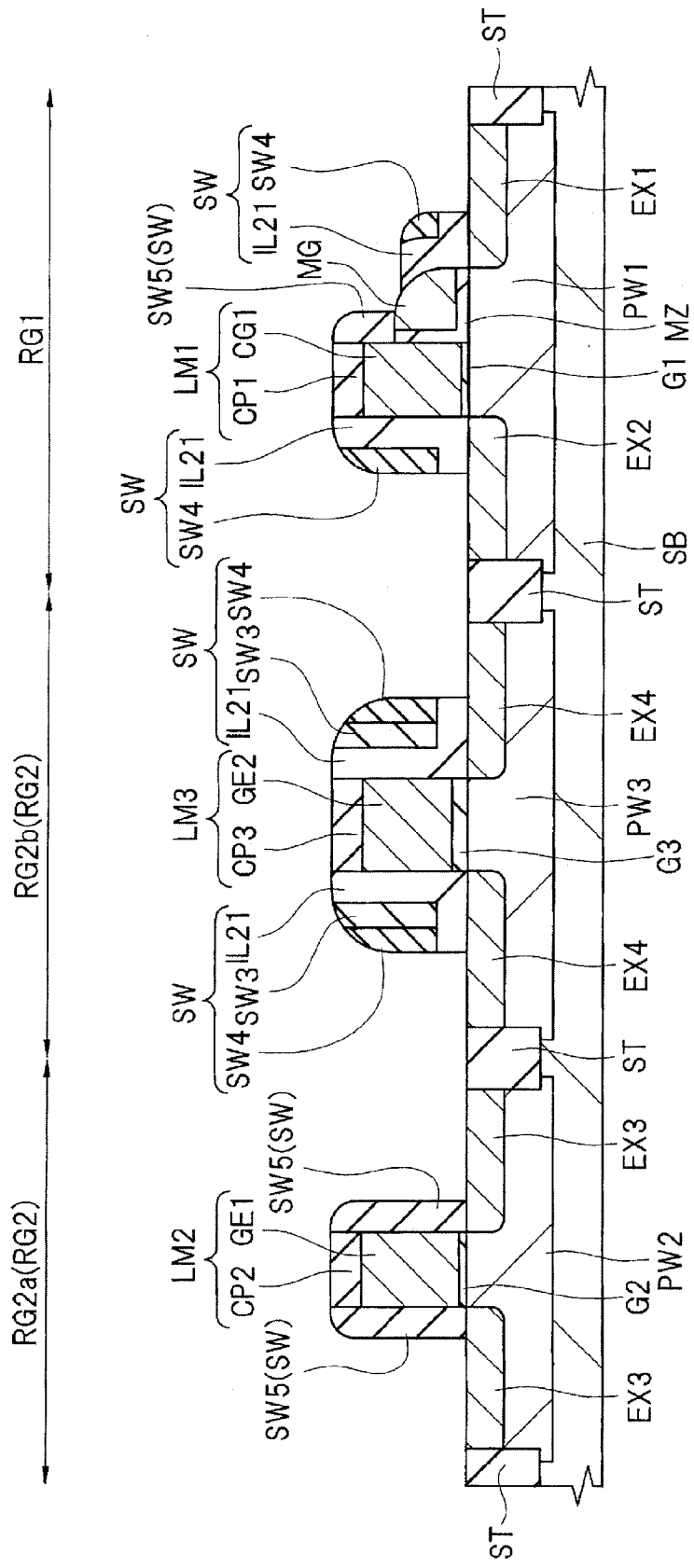
FIG. 76 is a main-portion cross-sectional view of the semiconductor device during the manufacturing process thereof, which is subsequent to FIG. 75.

Then, as shown in FIG. 76, the insulating film IL21 is etched back (etched, dry-etched, or anisotropically etched) using an anisotropic etching technique. That is, after the removal of the photoresist layer RP3, in the case of performing the steps shown in FIGS. 57 to 67 described above, the foregoing insulating film IL24 is formed and then etched back. By contrast, in the case of performing the steps shown in FIGS. 68 to 77, the insulating film IL21 is etched back without forming the foregoing insulating film IL24. As a result, as shown in FIG. 76, in the metal-gate MISFET formation region RG2a, the insulating film IL21 is selectively left over the both side walls of the multi-layer body LM2 to form the sidewall spacers SW5. In the silicon-gate MISFET formation region RG2b, the insulating film IL21 partly remains between the sidewall spacers SW3 and SW4 and the multi-layer body LM3 and between the sidewall spacers SW3 and SW4 and the semiconductor substrate SW, while the other part of the insulating film IL21 is removed. In the memory cell region RG1, the insulating film IL21 partly remains between the sidewall spacer SW4 and the multi-layer body LM1, between the sidewall spacer SW4 and the memory gate electrode MG, and between the sidewall spacers SW4 and the semiconductor substrate SB, while the other part of the insulating film IL21 is removed. There may also be a case where, in the memory cell region RG1, the insulating film IL21 remains at a position adjacent to the upper portion of the side wall (side wall adjacent to the memory gate electrode MG via the insulating film MZ) of the multi-layer body LM1 to form the sidewall spacer SW5.

When the insulating film IL21 is etched back, the etch-back step is preferably performed under etching conditions under which the cap insulating films CP1, CP2, and CP3 and the semiconductor substrate SB are less likely to be etched than the insulating film IL21.

Thus, over the both side walls of the multi-layer body LM2, over the both side walls of the multi-layer body LM3, over the side wall of the multi-layer body LM1 opposite to the side wall thereof adjacent to the memory gate electrode MG via the insulating film MZ, and over the side wall of the memory gate electrode MG opposite to the side wall thereof adjacent to the multi-layer body LM1 via the insulating film MZ, the respective sidewall spacers SW are formed.

Note that each of the sidewall spacers SW formed in the metal-gate MISFET formation region RG2a, i.e., the sidewall spacers SW formed over the both side walls of the multi-layer body LM2 is made of the sidewall spacer SW5 formed of the insulating film IL21. Also, each of the sidewall spacers SW formed in the silicon-gate MISFET formation region RG2b, i.e., the sidewall spacers SW formed over the both side walls of the multi-layer body LM3 is made of the insulating film IL21 and the sidewall spacers SW3 and SW4. Also, each of the sidewall spacers SW formed in the memory cell region RG1, i.e., the sidewall spacers SW formed over the respective side walls (side walls opposite to the side walls adjacent to each other via the insulating film MZ) of the multi-layer body LM1 and the memory gate electrode MG is made of the insulating film IL21 and the sidewall spacer SW4.

Figure 77:
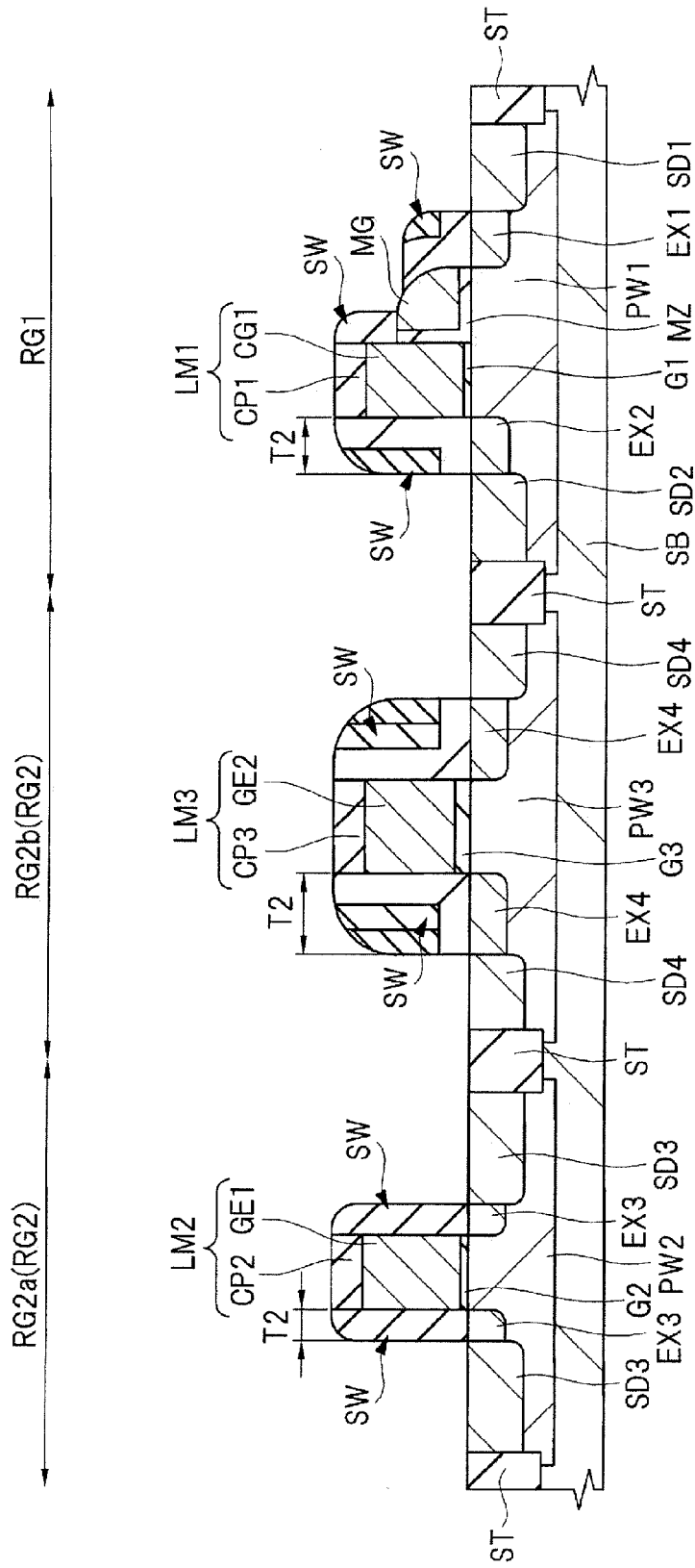
FIG. 77 is a main-portion cross-sectional view of the semiconductor device during the manufacturing process thereof, which is subsequent to FIG. 76.

Accordingly, in the same manner as in the case of performing the steps shown in FIGS. 57 to 67 described above, in the case of performing the steps shown in FIGS. 68 to 77 also, the sidewall spacers SW formed in the memory cell region RG1, the sidewall spacers SW formed in the metal-gate MISFET formation region RG2a, and the sidewall spacers SW formed in the silicon-gate MISFET formation region RG2b have different thicknesses. Specifically, the thickness T2 of each of the sidewall spacers SW formed in the memory cell region RG1 is larger than the thickness T2 of each of the sidewall spacers SW formed in the metal-gate MISFET formation region RG2a. Also, the thickness T2 of each of the sidewall spacers SW formed in the silicon-gate MISFET formation region RG2b is larger than the thickness T2 of each of the sidewall spacers SW formed in the memory cell region RG1. Note that the thicknesses T2 of the sidewall spacers SW are shown in FIG. 77.

The subsequent steps are the same as in Embodiment 1 described above. That is, in the same manner as in Embodiment 1 described above, Step S16 described above is performed to form the n$^+$-type semiconductor regions SD1, SD2, SD3, and SD4, as shown in FIG. 77. Then, in the same manner as in Embodiment 1 described above, Step S17 (activation anneal) described above and the steps subsequent thereto are performed, but the depiction and description thereof is omitted herein.

In the same manner as in the case of performing the steps shown in FIGS. 57 to 67 described above, in the case of performing the steps shown in FIGS. 68 to 77 also, the sidewall spacers SW having the different thicknesses T2 can selectively be formed. This allows the thicknesses T2 of the sidewall spacers SW to be set depending on the characteristics required of the individual transistors. Therefore, it is possible to improve the general performance of the semiconductor device.

In the same manner as in the case of performing the steps shown in FIGS. 57 to 67 described above, in the case of performing the steps shown in FIGS. 68 to 77 also, the sidewall spacers SW each having the large width T2 are formed in the silicon-gate MISFET formation region RG2b. By thus increasing the height h₃ of the foregoing multi-layer body LM3 (e.g., setting the height h₃ of the multi-layer body LM3 larger than the width T2 of each of the sidewall spacers SW formed over the side walls of the multi-layer body LM3), the sidewall spacers SW formed over the side walls of the multi-layer body LM3 can be so shaped as to be able to properly function as the ion implantation inhibiting mask. Since the cap insulating film CP3 is removed in the polishing step in Step S20 described above, even when the thickness of the cap insulating film CP3 is increased to increase the height h₃ of the multi-layer body LM3, the increased thickness of the cap insulating film CP3 does not lead to an increase in the thickness of the interlayer insulating films. In short, it is possible to achieve each of an increase in the height h₃ of the multi-layer body LM3 and a reduction in the total thickness of the insulating films IL3 and IL6. Since it is possible to reduce the total thickness of the insulating films IL3 and IL6, it is possible to reduce the aspect ratio of each of the contact holes CT formed in the insulating films IL3 and IL6. This allows easy formation of the contact holes CT and easy embedding of the plugs PG in the contact holes CT. As a result, the manufacturing process of the semiconductor device is easily performed and the manufacturing yield of the semiconductor device can be improved. In addition, since it is possible to reduce the total thickness of the insulating films IL3 and IL6, it is possible to reduce the aspect ratio of each of the contact holes CT without increasing the diameter of the contact hole CT, which is advantageous in terms of reducing the size (area) of the semiconductor device.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device including a memory cell of a nonvolatile memory, comprising the steps of:
   (a) providing a semiconductor substrate;
   (b) forming a first dummy gate electrode over the semiconductor substrate via a first insulating film;
   (c) forming a first gate electrode for the memory cell over the semiconductor substrate via a second insulating film having an internal charge storage portion such that the first gate electrode for the memory cell is adjacent to the first dummy gate electrode;
   (d) forming a first interlayer insulating film so as to cover the first dummy gate electrode and the first gate electrode therewith;
   (e) polishing the first interlayer insulating film to expose the first dummy gate electrode;
   (f) after the step (e), removing the first dummy gate electrode; and
   (g) forming a second gate electrode for the memory cell in a first trench as a region resulting from the removal of the first dummy gate electrode in the step (f),
   wherein the second gate electrode is a metal gate electrode,
   wherein a height of the first gate electrode formed in the step (c) is lower than a height of the first dummy gate electrode, and
   wherein, in the step (e), the first gate electrode is not exposed.

2. The method of manufacturing a semiconductor device according to claim 1,
   wherein the first gate electrode is made of silicon.

3. The method of manufacturing a semiconductor device according to claim 2,
   wherein the first dummy gate electrode is made of silicon.

4. The method of manufacturing a semiconductor device according to claim 3,
   wherein the first gate electrode formed in the step (c) is adjacent to the first dummy gate electrode via the second insulating film.

5. The method of manufacturing a semiconductor device according to claim 1,
   wherein, in the step (g), a first conductive film is embedded in the first trench via a high-dielectric-constant insulating film to form the second gate electrode.

6. The method of manufacturing a semiconductor device according to claim 1,
   wherein, in the step (b), a first multi-layer body including the first dummy gate electrode, and a first cap insulating film over the first dummy gate electrode is formed over the semiconductor substrate via the first insulating film,
   wherein, in the step (d), the first interlayer insulating film is formed so as to cover the first multi-layer body and the first gate electrode, and
   wherein, in the step (e), the first interlayer insulating film and the first cap insulating film are polished to expose the first dummy gate electrode.

7. The method of manufacturing a semiconductor device according to claim 1,
   wherein the step (c) includes the steps of:
   (c1) forming the second insulating film over the semiconductor substrate so as to cover the first dummy gate electrode therewith;
   (c2) forming a first silicon film for the first gate electrode over the second insulating film; and
   (c3) etching back the first silicon film to form the first gate electrode.

8. The method of manufacturing a semiconductor device according to claim 1, further comprising, after the step (c) and before the step (d), the step of:
   (c4) forming a first side-wall insulating film over each of respective side walls of the first dummy gate electrode and the first gate electrode.

9. The method of manufacturing a semiconductor device according to claim 8, further comprising, after the step (c4) and before the step (d), the step of:
   (c5) forming a first semiconductor region for a source or drain of the memory cell in the semiconductor substrate by an ion implantation method.

10. The method of manufacturing a semiconductor device according to claim 9, further comprising, after the step (c) and before the step (c4), the step of:
    (c6) forming a second semiconductor region for the source or drain of the memory cell in the semiconductor substrate by an ion implantation method,
    wherein the first semiconductor region has an impurity concentration higher than that of the second semiconductor region.

11. The method of manufacturing a semiconductor device according to claim 1, further comprising, after the step (b) and before the step (c), the steps of:

(b1) forming a second side-wall insulating film over a side wall of the first dummy gate electrode over which the first gate electrode is to be formed later;

(b2) after the step (b1), forming a third semiconductor region for a source or drain of the memory cell in the semiconductor substrate by an ion implantation using the second side-wall insulating film as an ion implantation inhibiting mask; and (b3) after the step (b2), removing the second side-wall insulating film.

12. The method of manufacturing a semiconductor device according to claim 11, wherein a height of the second side-wall insulating film formed in the step (b1) is larger than a height of the first gate electrode formed in the step (c).

13. The method of manufacturing a semiconductor device according to claim 1, further comprising, after the step (c) and before the step (d), the step of:

(c7) forming a second dummy gate electrode over the semiconductor substrate via a third insulating film, wherein, in the step (d), the first interlayer insulating film is formed so as to cover the first dummy gate electrode, the second dummy gate electrode, and the first gate electrode, wherein, in the step (e), the first interlayer insulating film is polished to expose the first and second dummy gate electrodes, wherein, in the step (f), the first and second dummy gate electrodes are removed, and wherein, in the step (g), the second gate electrode is formed in the first trench and a third gate electrode for a MISFET other than that of the memory cell is formed in a second trench as a region resulting from the removal of the second dummy gate electrode in the step (f).

14. The method of manufacturing a semiconductor device according to claim 13, wherein each of the second and third gate electrodes is a metal gate electrode.

15. The method of manufacturing a semiconductor device according to claim 14, wherein the first and second dummy gate electrodes are formed of the same silicon film.

16. The method of manufacturing a semiconductor device according to claim 15, wherein, in the step (c7), over the semiconductor substrate, the second dummy gate electrode is formed via the third insulating film and a fourth gate electrode for the MISFET other than that of the memory cell is formed via a fourth insulating film, wherein the first dummy gate electrode, the second dummy gate electrode, and the fourth gate electrode are formed of the same silicon film, wherein, in the step (d), the first interlayer insulating film is formed so as to cover the first dummy gate electrode, the first gate electrode, the second dummy gate electrode, and the fourth gate electrode, wherein, in the step (e), the first interlayer insulating film is polished to expose the first dummy gate electrode, the second dummy gate electrode, and the fourth gate electrode, and wherein, in the step (f), the fourth gate electrode is not removed.

17. The method of manufacturing a semiconductor device according to claim 16, further comprising, after the step (c) and before the step (d), the step of:

(c8) forming a first side-wall insulating film over each of respective side walls of the first dummy gate electrode, the first gate electrode, the second dummy gate electrode, and the fourth gate electrode, wherein a thickness of the first side-wall insulating film formed over the side wall of the fourth gate electrode is larger than a thickness of the first side-wall insulating film formed over each of the respective side walls of the first dummy gate electrode, the first gate electrode, and the second dummy gate electrode.

18. The method of manufacturing a semiconductor device according to claim 17, wherein, in the step (b), over the semiconductor substrate, a first multi-layer body including the first dummy gate electrode, and a first cap insulating film over the first dummy gate electrode is formed via the first insulating film, wherein, in the step (c7), over the semiconductor substrate, a second multi-layer body including the second dummy gate electrode, and a second cap insulating film over the second dummy gate electrode is formed via the third insulating film and a third multi-layer body including the fourth gate electrode, and a third cap insulating film over the fourth gate electrode is formed via the fourth insulating film, wherein, in the step (d), the first interlayer insulating film is formed so as to cover the first gate electrode, the first multi-layer body, the second multi-layer body, and the third multi-layer body, wherein, in the step (e), the first interlayer insulating film, the first cap insulating film, the second cap insulating film, and the third cap insulating film are polished to expose the first dummy gate electrode, the second dummy gate electrode, and the fourth gate electrode, and wherein a height of the first multi-layer body formed in the step (b) is larger than a thickness of the first side-wall insulating film formed over the side wall of the fourth gate electrode in the step (c8).

* * * * *